(12) United States Patent
Ueba et al.

(10) Patent No.: US 9,810,981 B2
(45) Date of Patent: Nov. 7, 2017

(54) PATTERN FORMATION METHOD, ETCHING METHOD, ELECTRONIC DEVICE MANUFACTURING METHOD, AND ELECTRONIC DEVICE

(71) Applicant: FUJIFILM Corporation, Tokyo (JP)

(72) Inventors: Ryosuke Ueba, Haibara-gun (JP); Naoya Iguchi, Haibara-gun (JP); Tsukasa Yamanaka, Haibara-gun (JP); Naohiro Tango, Haibara-gun (JP); Michihiro Shirakawa, Haibara-gun (JP); Keita Kato, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 15/229,247

(22) Filed: Aug. 5, 2016

(65) Prior Publication Data

US 2016/0342083 A1 Nov. 24, 2016

Related U.S. Application Data

(63) Continuation of application No. PCT/JP2015/053058, filed on Feb. 4, 2015.

(30) Foreign Application Priority Data

Feb. 17, 2014 (JP) .................................. 2014-027793
Dec. 19, 2014 (JP) .................................. 2014-257489

(51) Int. Cl.
*G03F 7/20* (2006.01)
*G03F 7/00* (2006.01)
(Continued)

(52) U.S. Cl.
CPC .......... *G03F 7/0035* (2013.01); *G03F 7/2053* (2013.01); *G03F 7/325* (2013.01);
(Continued)

(58) Field of Classification Search
CPC .......................... G03F 7/0035; G03F 7/70466
See application file for complete search history.

(56) References Cited

U.S. PATENT DOCUMENTS

| | | | |
|---|---|---|---|
| 5,215,861 A | 6/1993 | Agostino et al. | |
| 5,877,076 A * | 3/1999 | Dai | H01L 21/0274 257/E21.027 |

(Continued)

FOREIGN PATENT DOCUMENTS

| | | |
|---|---|---|
| JP | 55-95324 A | 7/1980 |
| JP | 6-83065 A | 3/1994 |

(Continued)

OTHER PUBLICATIONS

International Search Report of PCT/JP2015/053058 dated Apr. 7, 2015.

(Continued)

*Primary Examiner* — Kathleen Duda
(74) *Attorney, Agent, or Firm* — Sughrue Mion, PLLC

(57) ABSTRACT

A pattern formation method includes step (i) of forming a first negative type pattern on a substrate by performing step (i-1) of forming a first film on the substrate using an actinic ray-sensitive or radiation-sensitive resin composition, step (i-2) of exposing the first film and step (i-3) of developing the exposed first film in this order; step (iii) of forming a second film at least on the first negative type pattern using an actinic ray-sensitive or radiation-sensitive resin composition (2); step (v) of exposing the second film; and step (vi) of developing the exposed second film and forming a second negative type pattern at least on the first negative type pattern.

13 Claims, 3 Drawing Sheets

(51) Int. Cl.
*G03F 7/32* (2006.01)
*H01L 21/027* (2006.01)
*H01L 21/311* (2006.01)
*G03F 7/40* (2006.01)

(52) U.S. Cl.
CPC ............ *G03F 7/40* (2013.01); *H01L 21/0271* (2013.01); *H01L 21/31144* (2013.01)

(56) References Cited

U.S. PATENT DOCUMENTS

| | | | |
|---|---|---|---|
| 9,429,840 B2* | 8/2016 | Yamamoto | ............ G03F 7/0397 |
| 2008/0214011 A1 | 9/2008 | Colburn | |
| 2010/0062380 A1* | 3/2010 | Takemura | ............. G03F 7/0035 |
| | | | 430/326 |
| 2013/0004739 A1 | 1/2013 | Odani et al. | |
| 2014/0080066 A1 | 3/2014 | Meya et al. | |
| 2014/0227643 A1 | 8/2014 | Hatakeyama et al. | |

FOREIGN PATENT DOCUMENTS

| | | |
|---|---|---|
| JP | 2005-091863 A | 4/2005 |
| JP | 2007-173826 A | 7/2007 |
| JP | 2010-60693 A | 3/2010 |
| JP | 2013-33210 A | 2/2013 |
| JP | 2014-178671 A | 9/2014 |
| JP | 2015-031706 A | 2/2015 |
| KR | 10-2007-0022803 A | 2/2007 |
| WO | 2012/157433 A1 | 11/2012 |
| WO | 2012173215 A1 | 12/2012 |

OTHER PUBLICATIONS

Communication dated Sep. 21, 2016 from the Korean Intellectual Property Office in counterpart Application No. 10-2016-7021234.
Communication dated Jan. 4, 2017 from the Japanese Patent Office in counterpart Application No. 2014-257489.
Communication dated Jan. 11, 2017 from State Intellectual Property Office of People's Republic of China issued in corresponding Application No. 201580007419.2.
Written Opinion of PCT/JP2015/053058 dated Apr. 7, 2015.
Communication dated May 25, 2017 from the State Intellectual Property Office of the P.R.C. in counterpart Application No. 201580007419.2.
Office Action dated Aug. 1, 2017 from the Japanese Patent Office in counterpart Japanese Application No. 2014-257489.
Office Action dated Aug. 21, 2017 from the State Intellectual Property Office of the P.R.C. in counterpart Chinese Application No. 201580007419.2.

* cited by examiner

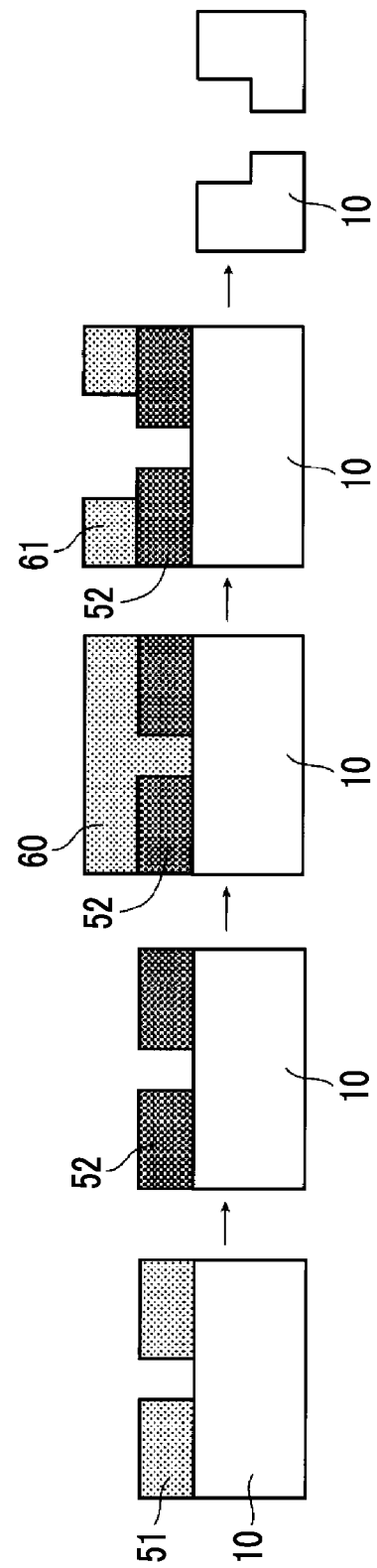

PATTERN FORMATION METHOD, ETCHING METHOD, ELECTRONIC DEVICE MANUFACTURING METHOD, AND ELECTRONIC DEVICE

CROSS-REFERENCE TO RELATED APPLICATIONS

This application is a Continuation of PCT International Application No. PCT/JP2015/053058 filed on Feb. 4, 2015, which claims priority under 35 U.S.C §119(a) to Japanese Patent Application No. 2014-027793 filed on Feb. 17, 2014 and Japanese Patent Application No. 2014-257489 filed on Dec. 19, 2014. Each of the above application(s) is hereby expressly incorporated by reference, in its entirety, into the present application.

BACKGROUND OF THE INVENTION

1. Field of the Invention

The present invention relates to a pattern formation method, an etching method using the same, an electronic device manufacturing method including the same, and an electronic device manufactured using the manufacturing method. In more detail, the present invention relates to a pattern formation method and to an etching method which uses this pattern formation method which are favorably used for steps of manufacturing semiconductors such as IC, steps of manufacturing circuit substrates such as liquid crystals and thermal heads and of manufacturing MEMS and the like, and other photofabrication lithography steps. In particular, the present invention relates to a pattern formation method which is favorable for exposure using a KrF or ArF exposure apparatus and an ArF liquid immersion type projection exposure apparatus in which far ultraviolet ray light with a wavelength of 300 nm or less is set as the light source, to an etching method which uses this pattern formation method, to an electronic device manufacturing method which includes this pattern formation method, and to an electronic device which is manufactured using this manufacturing method.

2. Description of the Related Art

In the related art, in order to form a trench pattern or the like with high resolution, a negative type development process (a negative tone imaging process) has been proposed which combines a positive type actinic ray-sensitive or a radiation-sensitive resin composition, which is excellent in various characteristics and which also has versatility, with a developer which contains an organic solvent.

Here, in recent years, along with the demands for variation and increased functionality in electronic devices, there is a demand for forming fine patterns with various shapes by etching or the like and, for example, as disclosed in FIG. 1 to FIG. 7 in JP2007-173826A, a method for forming a multi-stage structure in a photoresist layer is known.

SUMMARY OF THE INVENTION

In the same manner as the invention described in JP2007-173826A, the present invention has an object of providing a pattern formation method capable of forming a multi-stage resist pattern (for example, a pattern in which a line pattern is laminated on a hole pattern) and an etching method which uses this pattern formation method.

The present invention has the configuration described below and solves the above-mentioned problems of the present invention.

[1] A pattern formation method comprising: step (i) of forming a first negative type pattern on a substrate by performing step (i-1) below, step (i-2) below and step (i-3) below in this order; step (i-1) of forming a first film on the substrate using an actinic ray-sensitive or radiation-sensitive resin composition (1) which contains a resin of which, due to a polarity being increased by an action of an acid, a solubility decreases with respect to a developer which includes an organic solvent; step (i-2) of exposing the first film; step (i-3) of developing the exposed first film using the developer which includes an organic solvent to form the first negative type pattern; step (iii) of forming a second film on at least the first negative type pattern using an actinic ray-sensitive or radiation-sensitive resin composition (2) which contains a resin of which, due to a polarity being increased by an action of an acid, a solubility decreases with respect to the developer which includes an organic solvent; step (v) of exposing the second film; and step (vi) of developing the exposed second film using the developer which includes an organic solvent to form a second negative type pattern on at least the first negative type pattern.

[2] The pattern formation method according to [1], further comprising: a heating step (ii) between the step (i) and the step (iii).

[3] The pattern formation method according to [1] or [2], further comprising: a heating step (ii)' after the step (vi).

[4] The pattern formation method according to any one of [1] to [3], wherein the actinic ray-sensitive or radiation-sensitive resin composition (1) is different from the actinic ray-sensitive or radiation-sensitive resin composition (2).

[5] The pattern formation method according to any one of [1] to [3], wherein the actinic ray-sensitive or radiation-sensitive resin composition (1) is the same as the actinic ray-sensitive or radiation-sensitive resin composition (2).

[6] The pattern formation method according to any one of [1] to [5], wherein the step (i) of forming the first negative type pattern includes a plurality of pattern forming step having the step (i-1), the step (i-2) and the step (i-3) in this order.

[7] The pattern formation method according to [6], wherein step (i) of forming the first negative type pattern further has a heating step (i-4), and has the step (i-3), the step (i-4), and the step (i-1) in this order.

[8] An etching method for performing an etching process with respect to the substrate by setting a pattern formed by pattern formation method according to any one of [1] to [7] as a mask.

[9] An electronic device manufacturing method comprising: the pattern formation method according to any one of [1] to [7].

[10] An electronic device which is manufactured by the electronic device manufacturing method according to [9].

According to the present invention, it is possible to provide a pattern formation method capable of forming a multi-stage resist pattern and an etching method which uses this pattern formation method.

BRIEF DESCRIPTION OF THE DRAWINGS

FIGS. 2A to 2E are respectively schematic cross-sectional diagrams for illustrating a pattern formation method and an etching method according to an embodiment of the present invention.

DESCRIPTION OF THE PREFERRED EMBODIMENTS

Figures 1A, 1B, 1C, 1D, 1E:
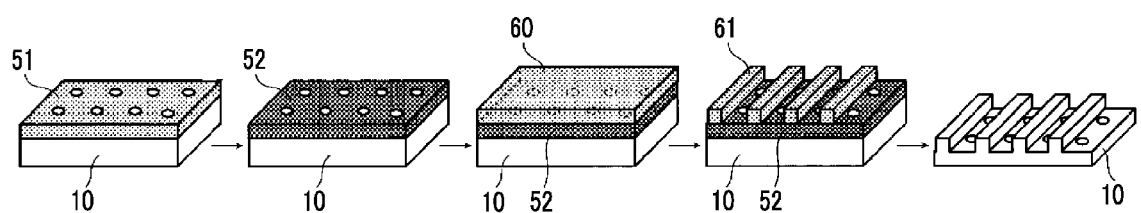
FIGS. 1A to 1E are respectively schematic perspective diagrams for illustrating a pattern formation method and an etching method according to an embodiment of the present invention.

Detailed description will be given below of embodiments of the present invention.

In the notation of the groups (atomic groups) in the present specification, notation which does not indicate whether a group is substituted or unsubstituted encompasses having a substituent group as well as not having a substituent group. For example, an "alkyl group" encompasses not only an alkyl group which does not have a substituent group (an unsubstituted alkyl group), but also an alkyl group which has a substituent group (a substituted alkyl group).

The "actinic ray" or "radiation" in the present specification has the meaning of, for example, the bright line spectrum of a mercury lamp, far ultraviolet rays which are represented by an excimer laser, extreme ultraviolet (EUV light) rays, X-rays, electron beams (EB), and the like. In addition, "light" in the present invention has the meaning of actinic rays or radiation.

In addition, unless otherwise stated, "exposure" in the present specification includes not only exposure using a mercury lamp, far ultraviolet rays which are represented by an excimer laser, extreme ultraviolet rays (EUV), X-rays, and the like, but the exposure also includes drawing using particle beams such as electron beams and ion beams.

<Pattern Formation Method and Etching Method>

Description will be given below of the pattern formation method of the present invention and an etching method which uses this pattern formation method.

First of all, a pattern formation method of the present invention has step (i) of forming a first negative type pattern on a substrate by performing step (i-1) below, step (i-2) below and step (i-3) below in this order, step (i-1) of forming a first film on the substrate, using an actinic ray-sensitive or radiation-sensitive resin composition (1) which contains a resin of which, due to a polarity being increased by an action of an acid, a solubility decreases with respect to a developer which includes an organic solvent, step (i-2) of exposing the first film, step (i-3) of developing the exposed first film using the developer which includes an organic solvent to form the first negative pattern, step (iii) of forming a second film at least on the first negative type pattern using an actinic ray-sensitive or radiation-sensitive resin composition (2) which contains a resin of which, due to a polarity being increased by an action of an acid, a solubility decreases with respect to the developer which includes an organic solvent, step (v) of exposing the second film, and step (vi) of developing the exposed second film using the developer which includes an organic solvent to form a second negative type pattern at least on the first negative type pattern, in which the steps are carried out in this order.

The reason why it is possible to easily form a multi-stage resist pattern using the pattern formation method of the present invention is assumed to be as follows.

Firstly, the pattern formation method of the present invention contains at least 2 patternings including a patterning according to step (i) (steps (i-1) to (i-3)) and a patterning according to steps (iii), (v) and (vi).

Here, since the second negative type pattern which is formed by steps (iii), (v) and (vi) is obtained from the second film which is formed on the first negative type pattern which is formed by step (i), it is possible to independently design each of the size and the shape of the first negative type pattern and the size and the shape of the second negative type pattern.

Accordingly, for example, it is possible to form a pattern which has a multi-stage structure, such as where a line pattern (the second negative type pattern) is laminated on a hole pattern (the first negative type pattern).

Here, in a method for forming a negative type pattern by forming a resist film using an actinic ray-sensitive or radiation-sensitive resin composition which contains a cross-linking agent and, after exposure, dissolving an un-exposed portion in an alkali developer, the exposed portion consisting of a cross-linked body easily swells due to the alkali developer and there is a possibility that it is difficult to form a fine pattern.

On the other hand, in the present invention, since resins which are included in actinic ray-sensitive or radiation-sensitive resin compositions (1) and (2) are both a resin of which, due to a polarity being increased by an action of an acid, a solubility decreases with respect to a developer which includes an organic solvent (also simply referred to below as "an organic-type developer") and a negative type pattern is formed using the difference of the dissolving speed of the exposed portion and the un-exposed portion with respect to the organic-type developer, it is possible to easily form even fine patterns.

In the pattern formation method of the present invention, it is possible to perform each of step (i), step (iii), step (v), and step (vi) using a method known in the art.

FIGS. 1A to 1E are respectively schematic perspective diagrams for illustrating a pattern formation method and an etching method according to an embodiment of the present invention. In addition, FIGS. 2A to 2E are respectively schematic cross-sectional diagrams for illustrating a pattern formation method and an etching method according to an embodiment of the present invention.

<Step (i): Formation of First Negative Type Pattern>

In the present embodiment, first, as shown in FIG. 1A and FIG. 2A, step (i-1) below, step (i-2) below and step (i-3) below are performed in this order and, for example, a first negative type pattern 51 having a plurality of hole portions arranged in a line direction and a row direction at equal intervals is formed on a substrate 10 (step (i)).

(i-1) step of forming a first film using the actinic ray-sensitive or radiation-sensitive resin composition (1) which contains a resin of which, due to a polarity being increased by an action of an acid, a solubility decreases with respect to a developer which includes an organic solvent on the substrate (i-2) step of exposing the first film (i-3) step of developing the exposed first film using a developer which includes an organic solvent to form a first negative type pattern 51

<Step (i-1): Formation of First Film>

The substrate on which the first film is formed is not particularly limited and it is possible to use substrates which are generally used in a step of manufacturing semiconductors such as IC such as an inorganic substrate such as silicon, $SiO_2$, or SiN, or a coated inorganic substrate such as Spin on Glass (SOG), a step of manufacturing a circuit substrate such as liquid crystal or a thermal head, and a lithography step for other types of photofabrication. Furthermore, an under layer film such as an antireflection film may be formed as necessary between the first film and the substrate. It is possible to appropriately select an organic antireflection film, an inorganic antireflection film, or others as the under layer film. It is possible to obtain the under layer film material from Brewer Science Inc., Nissan Chemical Industries, Ltd. and the like. Examples of an under layer film which is favorable in a developing process using a developer which includes an organic solvent include the under layer films described in WO2012/039337A.

In step (i-1), a method for forming the first film using the actinic ray-sensitive or radiation-sensitive resin composition (1) can be typically performed by coating the actinic ray-sensitive or radiation-sensitive resin composition (1) on the substrate, it is possible to use a spin coating method, a spraying method, a roller coating method, a dipping method, or the like which are known in the art as a coating method, and the actinic ray-sensitive or radiation-sensitive resin composition (1) is preferably coated using the spin coating method.

Here, detailed description will be given below of the actinic ray-sensitive or radiation-sensitive resin composition (1).

The film thickness of the first film is preferably 20 nm to 1500 nm, more preferably 50 nm to 1500 nm, and even more preferably 60 nm to 1500 nm.

In particular, in a case of using a light source with a wavelength of 1 nm to 200 nm (specifically, an ArF excimer laser or the like which will be described below), the film thickness of the first film is preferably 20 nm to 160 nm, more preferably 50 nm to 140 nm, and even more preferably 60 nm to 120 nm.

In addition, in a case of using a light source with wavelength of 200 nm or more to 250 nm or less (specifically, a KrF excimer laser or the like which will be described below), the film thickness of the first film is preferably 200 nm to 1500 nm, more preferably 300 nm to 1200 nm, and even more preferably 300 nm to 1000 nm.

<Prebake Step and Post Exposure Bake Step>

Here, in the pattern formation method of the present invention, it is also preferable to include a prebake (PB) step between step (i-1) and step (i-2).

In addition, the pattern formation method of the present invention, it is also preferable to include a post exposure bake (PEB) step between step (i-2) and step (i-3).

The heating is preferably performed at a heating temperature of 70° C. to 130° C. in both the PB and PEB, and more preferably performed at 80° C. to 120° C.

The heating time is preferably 30 seconds to 300 seconds, more preferably 30 seconds to 180 seconds, and even more preferably 30 seconds to 90 seconds.

The heating is able to be performed by means which is provided in an ordinary exposure and developing apparatus and may be performed using a hot plate or the like.

The baking promotes the reaction of the exposed portion and improves the sensitivity or pattern profile.

At least one of the prebake step or the post exposure bake step may include the heating step a plurality of times.

<Step (i-2): Exposure of First Film>

In the exposure of step (i-2), there is no limit on the wavelength of light source which is used in the exposure apparatus; however, examples thereof include infrared light, visible light, ultraviolet light, far ultraviolet light, extreme ultraviolet light, X-rays, electron beams, and the like, and far ultraviolet light with a wavelength of preferably 250 nm or less, more preferably 220 nm or less, and particularly preferably 1 to 200 nm, specifically, a KrF excimer laser (248 nm), an ArF excimer laser (193 nm), a $F_2$ excimer laser (157 nm), X-rays, EUV (13 nm), electron beams and the like, and a KrF excimer laser, an ArF excimer laser, EUV, or electron beams are preferable.

Step (i-2) may include the exposure step a plurality of times.

In addition, for example, in a case where the light source is a KrF excimer laser, an ArF excimer laser, or EUV, it is preferable to irradiate (that is, carry out the exposure) with the actinic rays or radiation via a mask.

At this time, in the present embodiment, for example, it is possible to use a hole pattern mask (not shown in the diagram) having a plurality of hole portions arranged in a line direction and a row direction at equal intervals as a light shielding portion.

However, the mask which is used in step (i-2) of the present invention is not limited, it is possible to appropriately select the mask according to the desired shape of the first negative type pattern, for example, it is possible to use a mask which has a line and space pattern which has line portions as light shielding portions and space portions as light transmitting portions, in which the ratio of the width of the line portion and the width of the space portion is 1:1, or the like.

In addition, in exposure of step (i-2), it is possible to apply a liquid immersion exposure method.

The liquid immersion exposure method is a technique for increasing the resolving power in which a liquid (also referred to below as an "immersion liquid") with a high refractive index is filled between a projection lens and a sample and exposure is carried out. In addition, it is possible to combine the liquid immersion exposure with a super-resolution technique such as a phase shift method or a modified lighting method.

In a case of performing the liquid immersion exposure, a step of cleaning the surface of the first film with a water-based chemical liquid may be carried out before step (1) of carrying out exposure after forming the first film on a substrate and/or before step (2) of heating the first film after the step of carrying out exposure on the first film via an immersion liquid.

The immersion liquid is preferably a liquid which is transparent with respect to the exposure wavelength and where the temperature coefficient of the refractive index is as small as possible in order to keep the deformation of the optical image which is projected on the first film to a minimum. It is preferable to use water in terms of ease of availability and ease of handling.

In a case of using water, an additive agent (a liquid) which increases the surface activity in addition to reducing the surface tension of the water may be added in a small ratio. The additive agent preferably does not dissolve a resist layer on a wafer and any influence with respect to an optical coating on a lower surface of a lens element is preferably negligible.

The additive agent is preferably, for example, an aliphatic-based alcohol which has substantially the same refractive index as water and specific examples thereof include methyl alcohol, ethyl alcohol, isopropyl alcohol, and the like. By adding alcohol which has substantially the same refractive index as water, even when the alcohol components in the water evaporate and the content concentration changes, an advantage is obtained in that it is possible to make changes in the refractive index throughout the entirety of the liquid extremely small.

On the other hand, distilled water is preferable as the water to be used since deformation of the optical image which is projected on the resist is caused in a case where a substance, which is opaque with respect to 193 nm light, or impurities with a refractive index greatly different from that of water are mixed therein. Furthermore, pure water filtered through an ion exchange filter or the like may be used.

In addition, it is possible to increase the lithographic performance by increasing the refractive index of the immersion liquid. From this point of view, an additive agent which increases the refractive index may be added to the water, or heavy water ($D_2O$) may be used instead of water.

In a case where the first film which is formed using the actinic ray-sensitive or radiation-sensitive resin composition (1) is exposed via a liquid immersion medium, it is possible to further add a hydrophobic resin (D) which will be described below as necessary. Adding the hydrophobic resin (D) improves the receding contact angle of the surface. The receding contact angle of the first film is preferably 60° to 90°, and more preferably 70° or more.

In the liquid immersion exposure step, since it is necessary for the immersion liquid to move on the wafer following the movement of an exposure head scanning on the wafer at high speed and forming an exposure pattern, the contact angle of the immersion liquid with respect to the resist film (the first film) in a dynamic state is important and a performance which follows the exposing head during a high speed scan without liquid droplets remaining is required for the resist.

A sparingly immersion liquid-soluble film (also referred to below as a "top coat") may be provided between the first film, which is formed using the actinic ray-sensitive or radiation-sensitive resin composition (1), and the immersion liquid in order for the film to not directly come into contact with the immersion liquid. Examples of functions necessary for the top coat include coating suitability for a resist upper layer portion, transparency with respect to radiation, in particular, radiation with a wavelength of 193 nm, and sparing immersion liquid-solubility. It is preferable that the top coat is not mixed with a resist and, moreover, that the top coat is able to be evenly coated on the resist upper layer.

From the point of view of the transparency at 193 nm, the top coat is preferably a polymer which does not contain an aromatic group.

Specific examples thereof include a hydrocarbon polymer, an acrylic acid ester polymer, a polymethacrylic acid, a polyacrylic acid, a polyvinyl ether, a silicon-containing polymer, a fluorine-containing polymer, and the like. The hydrophobic resin (D) described above is also favorable as a top coat. Since the optical lens is contaminated when impurities elute from the top coat into the immersion liquid, the residual monomer components of the polymer which is included in the top coat are preferably small amounts.

When peeling the top coat, a developer may be used or a separate peeling agent may be used. The peeling agent is preferably a solvent of which the permeation into the first film is small. In terms of being able to carry out the peeling step at the same time as the first film developing step, it is preferable to be able to carry out the peeling using an alkali developer. From the point of view of peeling using an alkali developer, the top coat is preferably acidic; however, from the point of view of the property of non-intermixing with the first film, the top coat may be neutral or may be alkaline.

It is preferable that there is no difference or a small difference in the refractive index between the top coat and the immersion liquid. In this case, it is possible to improve the resolving power. In a case where the exposure light source is an ArF excimer laser (wavelength: 193 nm), since it is preferable to use water as the immersion liquid, the top coat for the ArF liquid immersion exposure is preferably close to the refractive index of water (1.44). In addition, from the point of view of the transparency and the refractive index, the top coat is preferably a thin film.

It is preferable that the top coat is not mixed with the first film and, moreover, that the top coat is also not mixed with the immersion liquid. From this point of view, in a case where the immersion liquid is water, the solvent which is used for the top coat is preferably sparingly soluble in the solvent which is used for the actinic ray-sensitive or radiation-sensitive resin composition of the present invention (also referred to below as a "resin composition") as well as being a water-insoluble medium. Furthermore, in a case where the immersion liquid is an organic solvent, the top coat may be water-soluble or may be water-insoluble.

<Step (i-3): Development of First Film>

In step (i-3), as the developer in the step of forming a negative type pattern by developing the first film using a developer which contains an organic solvent, it is possible to use polar solvents such as a ketone-based solvent, an ester-based solvent, an alcohol-based solvent, an amide-based solvent, an ether-based solvent, and a hydrocarbon-based solvent.

Examples of the ketone-based solvent include 1-octanone, 2-octanone, 1-nonanone, 2-nonanone, acetone, 2-heptanone (methyl amyl ketone), 4-heptanone, 1-hexanone, 2-hexanone, diisobutyl ketone, cyclohexanone, methyl cyclohexanone, phenyl acetone, methyl ethyl ketone, methyl isobutyl ketone, acetylacetone, acetonylacetone, ionone, diacetonyl alcohol, acetyl carbinol, acetophenone, methyl naphthyl ketone, isophorone, and the like.

Examples of the ester-based solvent include methyl acetate, butyl acetate, ethyl acetate, isopropyl acetate, pentyl acetate, isopentyl acetate, isoamyl acetate, cyclohexyl acetate, isobutyl isobutyrate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, methyl formate, ethyl formate, butyl formate, propyl formate, ethyl lactate, butyl lactate, propyl lactate, butyl butanoate, and the like.

Examples of the alcohol-based solvent include alcohols such as methyl alcohol, ethyl alcohol, n-propyl alcohol, isopropyl alcohol, n-butyl alcohol, sec-butyl alcohol, tert-butyl alcohol, isobutyl alcohol, n-hexyl alcohol, n-heptyl alcohol, n-octyl alcohol, and n-decanol, glycol-based solvents such as ethylene glycol, diethylene glycol, and triethylene glycol, glycol ether-based solvents such as ethylene glycol monomethyl ether, propylene glycol monomethyl ether, ethylene glycol monoethyl ether, propylene glycol monoethyl ether, diethylene glycol monomethyl ether, triethylene glycol monoethyl ether, and methoxymethyl butanol and the like.

Examples of the ether-based solvents include dioxane, tetrahydrofuran, phenetole, dibutyl ether, and the like other than the glycol-based solvents described above.

Examples of the amide-based solvents include N-methyl-2-pyrrolidone, N,N-dimethylacetamide, N,N-dimethylformamide, hexamethylphosphoric triamide, 1,3-dimethyl-2-imidazolidinone, and the like.

Examples of the hydrocarbon-based solvents include aromatic hydrocarbon-based solvents such as toluene and xylene and aliphatic hydrocarbon-based solvents such as pentane, hexane, octane, decane, and undecane.

Examples of other solvents include propylene carbonate.

The solvents described above may be used by mixing a plurality thereof or may be used after being mixed with a solvent other than the solvents described above or water. However, in order to sufficiently exhibit the effects of the present invention, the moisture content of the developer as a whole is preferably less than 10 mass %, and moisture is more preferably substantially not contained.

That is, the usage amount of the organic solvent with respect to an organic-type developer is preferably 90 mass % or more to 100 mass % or less with respect to all of the developer and more preferably 95 mass % or more to 100 mass % or less.

In particular, the organic-type developer is preferably a developer which contains at least one type of organic solvent which is selected from a group consisting of a ketone-based solvent, an ester-based solvent, an alcohol-based solvent, an amide-based solvent, and an ether-based solvent.

The vapor pressure of the organic-type developer is preferably 5 kPa or less at 20° C., more preferably 3 kPa or less, and particularly preferably 2 kPa or less. Setting the vapor pressure of the organic-type developer to 5 kPa or less suppresses the evaporation of the developer on a substrate or inside a developing cup and improves the temperature uniformity on the wafer surface, and, as a result, the uniformity of the dimensions in the wafer surface is improved.

Specific examples having a vapor pressure of 5 kPa or less include ketone-based solvents such as 1-octanone, 2-octanone, 1-nonanone, 2-nonanone, 2-heptanone (methyl amyl ketone), 4-heptanone, 2-hexanone, diisobutyl ketone, cyclohexanone, methyl cyclohexanone, phenyl acetone, and methyl isobutyl ketone, ester-based solvents such as butyl acetate, pentyl acetate, isopentyl acetate, amyl acetate, cyclohexyl acetate, isobutyl isobutyrate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxy butyl acetate, 3-methyl-3-methoxy-butyl acetate, butyl formate, propyl formate, ethyl lactate, butyl lactate, and propyl lactate, alcohol-based solvents such as n-propyl alcohol, isopropyl alcohol, n-butyl alcohol, sec-butyl alcohol, tert-butyl alcohol, isobutyl alcohol, n-hexyl alcohol, n-heptyl alcohol, n-octyl alcohol, n-decanol, glycol-based solvents such as ethylene glycol, diethylene glycol, triethylene glycol, glycol ether-based solvents such as ethylene glycol monomethyl ether, propylene glycol monomethyl ether, ethylene glycol monoethyl ether, propylene glycol monoethyl ether, diethylene glycol monomethyl ether, triethylene glycol monoethyl ether, and methoxymethyl butanol, ether-based solvents such as tetrahydrofuran, phenetole, and dibutyl ether, amide-based solvents such as N-methyl-2-pyrrolidone, N,N-dimethylacetamide, and N,N-dimethylformamide, aromatic hydrocarbon-based solvents such as toluene and xylene, aliphatic hydrocarbon-based solvents such as octane and decane.

Specific examples having a vapor pressure of 2 kPa or less, which is a particularly preferable range, include ketone-based solvents such as 1-octanone, 2-octanone, 1-nonanone, 2-nonanone, 4-heptanone, 2-hexanone, diisobutyl ketone, cyclohexanone, methyl cyclohexanone, and phenyl acetone, ester-based solvents such as butyl acetate, amyl acetate, cyclohexyl acetate, isobutyl isobutyrate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, ethyl lactate, butyl lactate, and propyl lactate, alcohol-based solvents such as n-butyl alcohol, sec-butyl alcohol, tert-butyl alcohol, isobutyl alcohol, n-hexyl alcohol, n-heptyl alcohol, n-octyl alcohol, and n-decanol, glycol-based solvents such as ethylene glycol, diethylene glycol, and triethylene glycol, glycol ether-based solvents such as ethylene glycol monomethyl ether, propylene glycol monomethyl ether, ethylene glycol monoethyl ether, propylene glycol monoethyl ether, diethylene glycol monomethyl ether, triethylene glycol monoethyl ether, and methoxymethyl butanol, ether-based solvents such as phenetole and dibutyl ether, amide-based solvents such as N-methyl-2-pyrrolidone, N,N-dimethylacetamide, and N,N-dimethylformamide, aromatic hydrocarbon-based solvents such as xylene, and aliphatic hydrocarbon-based solvents such as octane and decane.

It is possible to add an appropriate amount of a surfactant to the organic-type developer as necessary.

The surfactant is not particularly limited; however, for example, it is possible to use ionic or non-ionic fluorine-based and/or silicon-based surfactants and the like. Examples of the fluorine-based and/or silicon-based surfactants include the surfactants which are described in JP1987-36663A (JP-S62-36663A), JP1986-226746A (JP-S61-226746A), JP1986-226745A (JP-S61-226745A), JP1987-170950A (JP-S62-170950A), JP1988-34540A (JP-S63-34540A), JP1995-230165A (JP-H7-230165A), JP1996-62834A (JP-H8-62834A), JP1997-54432A (JP-H9-54432A), JP1997-5988A (JP-H9-5988A), U.S. Pat. Nos. 5,405,720, 5,360,692, 5,529,881, 5,296,330, 5,436,098, 5,576,143, 5,294,511, and 5,824,451, and a non-ionic surfactant is preferable. The non-ionic surfactant is not particularly limited; however, it is more preferable to use a fluorine-based surfactant or a silicon-based surfactant.

The usage amount of the surfactant is generally 0.001 mass % to 5 mass % with respect to all of the developer, preferably 0.005 mass % to 2 mass %, and more preferably 0.01 mass % to 0.5 mass %.

In addition, it is also possible to preferably use an aspect in which a nitrogen-containing compound (such as amine) is added to the organic-type developer as the invention according to claims in JP5056974B.

<Alkali Development Step>

In addition, the pattern formation method of the present invention may further have a step of carrying out developing using an alkali developer between step (i-2) and step (i-3) or between step (i-3) and step (iii) (between step (i-3) and step (ii) in a case of carrying out step (ii) which will be described below).

In a case where the pattern formation method of the present invention further has a step of carrying out developing using an alkali developer, it is possible to use an alkali aqueous solution as an alkali developer, for example, inorganic alkalis such as sodium hydroxide, potassium hydroxide, sodium carbonate, sodium silicate, sodium metasilicate, and ammonia water, primary amines such as ethylamine and n-propyl amine, secondary amines such as diethylamine and di-n-butylamine, tertiary amines such as trimethylamine and methyldiethylamine, alcohol amines such as dimethyl ethanol amine and triethanolamine, quaternary ammonium salts such as tetramethyl ammonium hydroxide and tetraethyl ammonium hydroxide, cyclic amines such as pyrrole and piperidine.

Furthermore, use is also possible by adding an appropriate amount of alcohols and a surfactant to the alkali aqueous solution described above. Examples of the surfactants include the surfactants described above. The alkali concentration of the alkali developer is generally 0.1 mass % to 20 mass %.

The pH of the alkali developer is generally 10.0 to 15.0.

In particular, a tetramethylammonium hydroxide aqueous solution of 2.38 mass % is desirable.

As a developing method, it is possible to apply, for example, a method for dipping a substrate in a tank which is filled with a developer for a certain time (a dipping method), a method for carrying out developing by raising the developer onto the substrate surface using surface tension and leaving the substrate to stand for a certain time (a paddle method), a method for spraying the developer onto the substrate surface (a spraying method), a method for carrying on discharging the developer onto a substrate which is rotating at a certain speed while scanning a developer discharging nozzle at a certain speed (a dynamic dispensing method), and the like.

In a case where the various types of the developing methods described above include a step of discharging the developer from the developing nozzle of the developing apparatus toward the resist film, the discharge pressure of the discharged developer (the flow rate of the discharged developer per unit area) is preferably 2 mL/sec/mm$^2$ or less, more preferably 1.5 mL/sec/mm$^2$ or less, and even more preferably 1 mL/sec/mm$^2$ or less. There is no particular lower limit on the flow rate; however, when considering throughput, 0.2 mL/sec/mm$^2$ or more is preferable.

Setting the discharge pressure of the discharged developer to the ranges described above makes it possible to remarkably reduce pattern defects deriving from the resist residue after developing. The details thereof are described in JP2010-232550A.

Here, the discharge pressure (mL/sec/mm$^2$) of the developer is the value at the developing nozzle opening in the developing apparatus.

Examples of the method for adjusting the discharge pressure of the developer include a method for adjusting the discharge pressure using a pump or the like, a method for changing the pressure by adjusting the pressure in the supply from a pressure tank, or the like.

In addition, after step (i-3) of carrying out developing using a developer which includes an organic solvent, a step of stopping developing while carrying out substitution with another solvent may be carried out.

<Rinsing Step>

The pattern formation method of the present invention preferably includes a step (a rinsing step) of carrying out cleaning using a rinsing liquid which contains an organic solvent between step (i-3) and step (iii) (between step (i-3) and step (ii) in a case of carrying out step (ii) which will be described below), that is, after step (i-3) of carrying out developing using a developer which contains an organic solvent.

The rinsing liquid which is used in the rinsing step after step (i-3) of developing using a developer which includes an organic solvent is not particularly limited as long as the rinsing liquid does not dissolve a resist pattern and it is possible to use a solution which includes a general organic solvent. As the rinsing liquid, it is preferable to use a rinsing liquid which contains at least one type of an organic solvent selected from a group consisting of a hydrocarbon-based solvent, a ketone-based solvent, an ester-based solvent, an alcohol-based solvent, an amide-based solvent, and an ether-based solvent.

Specific examples of the hydrocarbon-based solvent, the ketone-based solvent, the ester-based solvent, the alcohol-based solvent, the amide-based solvent, and the ether-based solvent include the same solvents as described for the developer which includes an organic solvent.

After the step of carrying out developing using a developer which includes an organic solvent, a step of carrying out cleaning using a rinsing liquid which contains at least one type of an organic solvent selected from a group consisting of a hydrocarbon-based solvent, a ketone-based solvent, an ester-based solvent, an alcohol-based solvent, and an amide-based solvent is more preferably performed, a step of carrying out cleaning using a rinsing liquid which contains a hydrocarbon-based solvent, an alcohol-based solvent, or an ester-based solvent is even more preferably performed, a step of carrying out cleaning using a rinsing liquid which contains a hydrocarbon-based solvent or monovalent alcohol is particularly preferably performed, and a step of carrying out cleaning using a rinsing liquid which contains monovalent alcohol with 5 or more carbon atoms is most preferably performed.

Here, examples of the monovalent alcohol which is used in the rinsing step include straight-chain, branched, or cyclic monovalent alcohols and, specifically, it is possible to use 1-butanol, 2-butanol, 3-methyl-1-butanol, tert-butyl alcohol, 1-pentanol, 2-pentanol, 1-hexanol, 4-methyl-2-pentanol, 1-heptanol, 1-octanol, 2-hexanol, cyclopentanol, 2-heptanol, 2-octanol, 3-hexanol, 3-heptanol, 3-octanol, 4-octanol, and, as particularly preferable monovalent alcohols with 5 or more carbon atoms, it is possible to use 1-hexanol, 2-hexanol, 4-methyl-2-pentanol, 1-pentanol, 3-methyl-1-butanol, and the like.

Here, as examples of the hydrocarbon-based solvents which are used in the rinsing step, aliphatic hydrocarbon-based solvents such as pentane, hexane, octane, decane, and undecane are preferable, and among these, aliphatic hydrocarbon-based solvents with 10 or more carbon atoms such as undecane are more preferable.

Each of the components may be used by mixing a plurality thereof or after being mixed with an organic solvent other than the solvents described above.

The water content in the rinsing liquid is preferably 10 mass % or less, more preferably 5 mass % or less, and particularly preferably 3 mass % or less. It is possible to obtain favorable developing characteristics by setting the moisture content to 10 mass % or less.

The vapor pressure of the rinsing liquid which is used in the rinsing step is preferably 0.05 kPa or more to 5 kPa or less at 20° C., more preferably 0.1 kPa or more to 5 kPa or less, and most preferably 0.12 kPa or more to 3 kPa or less. Setting the vapor pressure of the rinsing liquid to 0.05 kPa or more to 5 kPa or less improves the temperature uniformity on the wafer surface, moreover, swelling which is caused by the permeation of the rinsing liquid is suppressed, and the uniformity of the dimensions in the wafer surface is improved.

The pattern formation method of the present invention also preferably includes a step (a rinsing step) of carrying out cleaning using a rinsing liquid in a case of further having a step of carrying out developing using an alkali developer. As the rinsing liquid in this case, it is possible to use pure water and also to add an appropriate amount of a surfactant thereto.

The method for the cleaning process in the rinsing step described above is not particularly limited; however, for example, it is possible to apply a method which carries on discharging a rinsing liquid onto a substrate which is rotated at a certain speed (a rotary coating method), a method for dipping a substrate in a tank which is filled with a rinsing liquid for a certain period (a dipping method), a method for spraying a rinsing liquid onto a substrate surface (a spraying method), and the like, and it is preferable to perform the cleaning process using the rotary coating method among these methods, to rotate the substrate at rotation speed of 2000 rpm to 4000 rpm after cleaning, and to remove the rinsing liquid from the substrate. In addition, it is also preferable to include a heating step (Post Bake) after the rinsing step. The developer and the rinsing liquid which remain between the patterns and in the patterns are removed by the baking. The heating step after the rinsing step is generally performed at 40° C. to 160° C., preferably 70° C. to 95° C., and generally for 10 seconds to 3 minutes, preferably 30 seconds to 90 seconds.

In addition, after the developing process or the rinsing process, it is possible to perform a process of removing the developer or the rinsing liquid which is attached on the patterns using a supercritical fluid.

<Step (ii): Heating Step>

As shown in FIGS. 1B and 2B, the heating step (ii) may be further carried out between step (i-3) and step (iii) which will be described below in detail.

Due to this, it is possible to further improve the solvent resistance of the first negative type pattern 51 which is formed in step (i-3), and it is possible to be carry out conversion to a first negative type pattern 52 which is not easily damaged even when a liquid consisting of the actinic ray-sensitive or radiation-sensitive resin composition (2) is coated on the first negative type pattern in the subsequent step (iii).

The temperature in the heating step is preferably 150° C. or more and more preferably 170° C. or more. The temperature is generally 240° C. or less. In addition, the heating time in the heating step is approximately 30 seconds to 120 seconds. It is considered that carrying out the heating step at this time and in such a temperature range volatilizes and insolubilizes the organic matter residue and the like with respect to a solvent, which is favorable.

Here, since the first negative type pattern 51 contains a resin of which, due to a polarity being increased by an action of an acid, a solubility decreases with respect to a developer which includes an organic solvent and has sufficient solvent resistance, the application of a freezing material is not necessary; however, the present invention does not exclude the application of freezing material known in the art with respect to the first negative type pattern 51 or the first negative type pattern 52.

<Step (iii): Formation of Second Film>

Subsequently, as shown in FIG. 1C and FIG. 2C, a resist film (a second film) 60 is formed (step (iii)) using the actinic ray-sensitive or radiation-sensitive resin composition (2) which contains a resin of which, due to a polarity being increased by an action of an acid, a solubility decreases with respect to a developer which includes an organic solvent on the first negative type pattern 52.

Detailed description will be given below of the actinic ray-sensitive or radiation-sensitive resin composition (2).

Here, in step (iii), it is sufficient if the second film 60 is a film which is formed at least on the film part of the first negative type pattern 52 and the second film 60 may be formed or may not be formed in a region on the substrate 10 in which the film part of the first negative type pattern 52 is not formed.

However, as will be described below, a method for forming a second film using the actinic ray-sensitive or radiation-sensitive resin composition (2) is typically able to be carried out by coating the actinic ray-sensitive or radiation-sensitive resin composition (2). Therefore, in step (iii), there is a possibility that the process will become more complicated if the second film 60 is not formed in a region on the substrate 10 in which the film part of the first negative type pattern 52 is not formed.

Accordingly, in step (iii), as shown in FIG. 2C, the second film 60 is preferably formed even in a region on the substrate 10 in which the film part of the first negative type pattern 52 is not formed.

In addition, even if not formed on the entire surface of the film part of the first negative type pattern 52, the second film 60 may be formed only on a part of the surface of the film part of the first negative type pattern 52.

In step (iii), a method for forming a second film using the actinic ray-sensitive or radiation-sensitive resin composition (2) is the same as the method for forming a first film using the actinic ray-sensitive or radiation-sensitive resin composition (1) in step (i-1) described above.

The preferable range of the film thickness of the second film is also the same as described as the preferable range of the film thickness of the first film; however, the film thickness of the second film may be the same as or may be different from the thickness of the first film.

Here, the film thickness of the second film here has the meaning of the film thickness of the second film which is formed on the first negative type pattern, and the second film which is formed in a region on the substrate where the film part of the first negative type pattern is not formed is not considered.

<Prebake Step and Post Exposure Bake Step>

The pattern formation method of the present invention preferably includes a prebake (PB) step between step (iii) and step (v).

In addition, the pattern formation method of the present invention also preferably includes a post exposure bake (PEB) step between step (v) and step (vi). The heating is preferably performed at a heating temperature of 70° C. to 130° C. in both the PB and PEB, and more preferably performed at 80° C. to 120° C.

The heating time is preferably 30 seconds to 300 seconds, more preferably 30 seconds to 180 seconds, and even more preferably 30 seconds to 90 seconds.

The heating is able to be performed by means which is provided in an ordinary exposure apparatus and/or developing apparatus and may be performed using a hot plate and the like.

The reaction of the exposed portion is promoted by the baking and the sensitivity or pattern profile is improved.

At least one of the prebake step or the post exposure bake step may include the heating step a plurality of times.

<Step (v): Exposure of Second Film>

Subsequently, an exposed second film 60 is obtained (step (v)) by irradiating the second film 60 with active rays or radiation (that is, carry out the exposure).

In the same manner as described above, for example, in a case where the light source is a KrF excimer laser, an ArF excimer laser, or EUV, it is preferable to irradiate (that is, carry out the exposure) with the actinic rays or radiation via a mask (not shown in the diagram).

The mask pattern in the mask in step (v) is not particularly limited; however, in the present embodiment, a mask which is different from the one which was used in step (i-2) is used.

In particular, a mask which is a mask which has a line and space pattern which has a line portion as a light shielding portion and a space portion as a light transmitting portion and of which the ratio of the width of the line portion and the width of the space portion is 1:1 (which is not shown in the diagram) is used in a state where the light shielding portion of the mask covers each of the hole portion of the first negative type pattern 52.

However, as with the mask which is used in step (i-2), a mask which is used in step (v) is not limited to the mask described above, it is possible to appropriately select the mask according to the desired shape of the second negative type pattern or the like.

With regard to the method for exposure in step (v), it is possible to adopt the method described in the exposure in step (i-2) in the same manner. From the point of view of improving throughput, the exposure light source in step (v) is preferably the same exposure light source as in step (i-2).

<Step (vi): Development of Second Film (Formation of Second Negative Type Pattern)>

Subsequently, the exposed second film 60 is developed using a developer which includes an organic solvent and a second negative type pattern 61 is formed (step (vi)) as shown in FIG. 1D and FIG. 2D.

Here, with regard to the organic-type developer in step (vi), it is possible to use the developers described as the organic-type developers in step (i-3) in the same manner.

As described above, the second film 60 is formed at least on the first negative type pattern 52. For this reason, in step (vi), a second negative type pattern 61 is also formed at least on the first negative type pattern 52 in the same manner.

In the present embodiment, as shown in FIG. 1D and FIG. 2D, a line and space pattern (a second negative type pattern 61) is formed on the hole pattern which has a plurality of hole portions (the first negative type pattern 52) so as to position the space portions on the hole portions and expose the hole portions.

In this manner, according to the present embodiment, a multi-stage resist pattern having a multi-stage structure, which consists of the first negative type pattern 52 which is a hole pattern and the second negative type pattern 61 which is a line and space pattern, is formed on the substrate 10.

Here, it goes without saying that the multi-stage resist pattern which is formed according to the pattern formation method of the present invention is not limited thereto.

<Alkali Development Step>

Here, the pattern formation method of the present invention may further have a step of carrying out developing using an alkali developer between step (v) and step (vi) or after step (vi).

The development using an alkali developer may be carried out between step (i-2) and step (i-3) or between step (i-3) and step (iii) (between step (i-3) and step (ii) in a case of carrying out step (ii)), and it is possible to use the developer which was used in the development step described as the alkali developer in the same manner.

With regard to the developing method which is performed in step (vi) and the developing method in the step of developing using an alkali developer which may be performed before and after step (vi), it is possible to adopt the methods described in step (i-3) in the same manner.

<Rinsing Step>

In addition, the pattern formation method of the present invention preferably includes a step (a rinsing step) of carrying out cleaning using a rinsing liquid which contains an organic solvent after step (vi), that is, after a step of carrying out developing using a developer which contains an organic solvent. As the rinsing liquid of this case, it is possible to use the rinsing liquid described in the step (a rinsing step) of carrying out cleaning using a rinsing liquid which contains an organic solvent which may be present after the step of carrying out developing using a developer which contains an organic solvent, in the same manner.

In addition, the pattern formation method of the present invention preferably includes a step (a rinsing step) of carrying out cleaning using a rinsing liquid between step (v) and step (vi), or after step (vi), and after the step of carrying out developing using an alkali developer in a case of further having a step of carrying out developing using an alkali developer. As the rinsing liquid in this case, it is also possible to use pure water and to add an appropriate amount of a surfactant thereto.

Examples of the method of the cleaning process in the rinsing step include the methods described above in the same manner.

<Heating Step (ii)'>

The pattern formation method of the present invention may have a heating step (ii)' after step (vi), that is, after the step of carrying out developing using a developer which contains an organic solvent. The heating step (ii)' is preferably performed after step (vi) and before an etching process which will be described below.

The various conditions (heating temperature, heating time, or the like) of the heating step (ii)' can be adopted as described in heating step (ii) described above.

<Etching Process>

Subsequently, an etching process is performed with respect to the substrate 10 using a pattern which is formed as described above (that is, a multi-stage resist pattern which consists of the first negative type pattern 52 and the second negative type pattern 61) as a mask.

At this time, by carrying out an etching process known in the art (for example, a dry etching process) in which the substrate 10 is etched using the multiple-stage resist pattern which consists of the first negative type pattern 52 and the second negative type pattern 61, as shown in FIG. 1E and FIG. 2E, the substrate 10 of which holes are punched at the positions which correspond to the hole portions of the first negative type pattern 52 and the space portions of the second negative type pattern 61 is obtained.

Here, the method for the etching process is not particularly limited, it is possible to use any method known in the art, and various conditions and the like are appropriately determined according to the type, use, and the like of the substrate. For example, it is also possible to carry out the etching process on the basis of the proceedings of The International Society for Optical Engineering (Proc. Of SPIE) Vol. 6924, 692420 (2008), JP2009-267112A, and the like.

<Modification Examples>

In addition, the first negative type pattern of the present embodiment described above may be formed by carrying out resist film patterning 2 or more times.

In other words, step (i) of forming the first negative type pattern may include a pattern forming step which has step (i-1), step (i-2), and step (i-3) in this order a plurality of times (this form is also referred to below as "modification example").

In this case, the plurality of pattern forming steps may further have a heating step (i-4) between 2 continuous pattern forming steps. That is, step (i) of forming the first negative type pattern may further have the heating step (i-4), and may have step (i-3), step (i-4), and step (i-1) in this order.

Specific description will be given below of the modification examples described above.

Firstly, by carrying out a pattern forming step having step (i-1), step (i-2), and step (i-3) in this order using the same method described above, a line and space pattern (which is not shown in the diagram) of which, for example, the line width and the space width are 1:3 is formed on the substrate as the first negative type pattern.

Subsequently, a heating step (i-4) may be carried out and, due to this, it is possible to improve the solvent resistance of the line and space pattern more, and subsequently, it is possible to form a line and space pattern which is not easily damaged even when another actinic ray-sensitive or radiation-sensitive resin composition (1) is coated in a region of the substrate where a film part of the line and space pattern is not formed. Here, the various conditions and the like of the heating step can be adopted as described for the heating step (ii) described above.

Subsequently, a line and space pattern of which, for example, the line width and the space width are 1:3 is formed as a first negative type pattern by carrying out a pattern forming step having step (i-1), step (i-2) and step (i-3) in this order in a region of the substrate where a film part of the line and space pattern is not formed.

As a result, for example, a first negative type pattern of which the line width and the space width are 1:1 and which is formed of the line and space pattern which is formed in the former pattern forming step and the line and space pattern which is formed in the latter pattern forming step is formed.

Subsequently, a heating step (i-4) may be carried out.

Then, it is possible to carry out the pattern formation method of the present invention by performing the process described after FIG. 1C and FIG. 2C with respect to the first negative type pattern which was obtained in this manner.

Description was given above of the pattern formation method and the etching method according to one embodiment of the present invention; however, according to the present invention, it is possible to form a multi-stage pattern with various shapes with respect to a substrate by etching and the like.

The pattern formation method of the present invention is favorably applied to, for example, a dual damascene step or the like which forms a pattern with a multi-stage structure.

In addition, it is also possible to apply the patterns which are obtained by the pattern formation method of the present invention to a core material (core) in a spacer process as described in JP1991-270227A (JP-H3-270227A) and JP2013-164509A. Furthermore, it is also possible to favorably use the patterns in guide pattern forming in Directed Self-Assembly (DSA) (for example, refer to ACS Nano Vol. 4 No. 8 Page 4815 to 4823). It is possible to apply the patterns to various other uses.

Here, the present invention also relates to an electronic device manufacturing method which includes the pattern formation method of the present invention described above, and to an electronic device which is manufactured using this manufacturing method.

The manufactured electronic device is favorably mounted on electrical and electronic equipment (household electrical appliances, OA and media-related apparatuses, optical equipment, telecommunication equipment, and the like).

<Actinic Ray-Sensitive or Radiation-Sensitive Resin Composition (1)>

Next, description will be given of each component of the actinic ray-sensitive or radiation-sensitive resin composition (1) which is used in the pattern formation method of the present invention (also simply referred to as "resin composition (1)").

The actinic ray-sensitive or radiation-sensitive resin composition (1) is typically a resist composition, which is a negative type resist composition (that is, a resist composition for organic solvent development). In addition, the actinic ray-sensitive or radiation-sensitive resin composition (1) is typically a chemical amplification type resist composition.

[1] A Resin of which, Due to a Polarity being Increased by an Action of an Acid, a Solubility Decreases with Respect to a Developer which Includes an Organic Solvent Examples of the resin of which, due to a polarity being increased by an action of an acid, a solubility decreases with respect to a developer which includes an organic solvent include a resin (also referred to below as an "acid-decomposable resin" or "resin (A)") which has a group (also referred to below as an "acid-decomposable group") which generates a polar group by being decomposed by an action of an acid in the main chain or the side chain of the resin or both the main chain and the side chain.

The acid-decomposable group preferably has a structure which is protected by a group which decomposes and desorbs a polar group by an action of an acid. Examples of preferable polar groups include a carboxyl group, a phenolic hydroxyl group, an alcoholic hydroxyl group (alcoholic means that it does not exhibit acidity such as a so-called phenolic hydroxyl group), and a sulfonic acid group.

A preferable group as the acid-decomposable group is a group in which hydrogen atoms of the groups are substituted with groups which are desorbed by an acid.

Examples of the groups which are desorbed by an acid include —C($R_{36}$)($R_{37}$)($R_{38}$), —C($R_{36}$)($R_{37}$)(O$R_{39}$), —C($R_{01}$)($R_{02}$)(O$R_{39}$), and the like.

In the formula, $R_{36}$ to $R_{39}$ each independently represent an alkyl group, a cycloalkyl group (monocyclic or polycyclic), an aryl group, an aralkyl group, or an alkenyl group. $R_{36}$ and $R_{37}$ may bond with each other to form a ring.

$R_{01}$ and $R_{02}$ each independently represent a hydrogen atom, an alkyl group (monocyclic or polycyclic), a cycloalkyl group, an aryl group, an aralkyl group, or an alkenyl group.

The acid-decomposable group is preferably a cumyl ester group, an enol ester group, an acetal ester group, a tertiary alkyl ester group, or the like. The tertiary alkyl ester group is more preferable. In addition, in a case of performing the pattern formation method of the present invention by exposure using KrF light or EUR light or by electron beam irradiation, an acid-decomposable group where a phenolic hydroxyl group is protected by an acid desorbed group is preferably used.

The resin (A) preferably has a repeating unit which has an acid-decomposable group.

Examples of the repeating unit include the following.

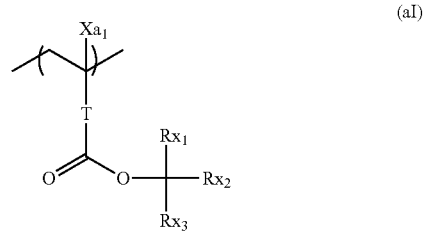

(aI)

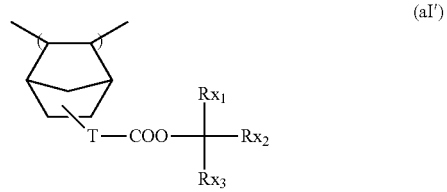

(aI')

In General Formula (aI) and (aI'), $Xa_1$ represents a hydrogen atom, an alkyl group, a cyano group, or a halogen atom.

T represents a single bond or divalent linking group.

$Rx_1$ to $Rx_3$ each independently represent an alkyl group or a cycloalkyl group. Two of $Rx_1$ to $Rx_3$ may bond with each other to form a ring structure. In addition, the ring structure may contain a hetero atom such as an oxygen atom in a ring.

Examples of a divalent linking group of T include an alkylene group, a —COO-Rt- group, a —O-Rt- group, a phenylene group, and the like. In the formula, Rt represents an alkylene group or a cycloalkylene group.

From the point of view of the resist being insoluble with respect to an organic solvent-based developer, T in General Formula (aI) is preferably a single bond or a —COO-Rt- group and more preferably a —COO-Rt- group. Rt is preferably an alkylene group with 1 to 5 carbon atoms, and more preferably a —$CH_2$— group, a —$(CH_2)_2$— group, and a —$(CH_2)_3$— group.

T in General Formula (aI') is preferably a single bond.

An alkyl group of $Xa_1$ may have a substituent group and examples of the substituent group include a hydroxyl group, a halogen atom (preferably a fluorine atom).

An alkyl group of $Xa_1$ is preferably a group with 1 to 4 carbon atoms, and a methyl group is more preferable.

$Xa_1$ is preferably a hydrogen atom or a methyl group.

An alkyl group of $Rx_1$, $Rx_2$, and $Rx_3$ may be straight-chain or may be branched.

A cycloalkyl group of $Rx_1$, $Rx_2$, and $Rx_3$ is preferably a monocyclic cycloalkyl group such as a cyclopentyl group and a cyclohexyl group, or a polycyclic cycloalkyl group such as a norbornyl group, a tetracyclodecanyl group, a tetracyclododecanyl group, and an adamantyl group.

A ring structure which 2 of $Rx_1$, $Rx_2$ and $Rx_3$ bond with each other to form is preferably a monocyclic cycloalkane ring such as a cyclopentyl ring and a cyclohexyl ring or a polycyclic cycloalkane ring such as a norbornane ring, a tetracyclodecane ring, a tetracyclododecane ring, and an adamantane ring. A monocyclic cycloalkane ring with 5 or 6 carbon atoms is particularly preferable.

$Rx_1$, $Rx_2$, and $Rx_3$ are each independently preferably an alkyl group, and more preferably a straight-chain or branched alkyl group with 1 to 4 carbon atoms.

Each of the groups described above may have a substituent group and examples of the substituent group include an alkyl group (with 1 to 4 carbon atoms), a cycloalkyl group (with 3 to 8 carbon atoms), a halogen atom, an alkoxy group (with 1 to 4 carbon atoms), a carboxyl group, an alkoxycarbonyl group (with 2 to 6 carbon atoms), and the like, and the number of carbon atoms is preferably 8 or less. Among these, from the point of view of further improving the dissolution contrast with respect to a developer which contains an organic solvent before and after being decomposed by an acid, a substituent group which does not have a hetero atom such as an oxygen atom, a nitrogen atom, and a sulfur atom is more preferable (for example, more preferably not an alkyl group or the like which is substituted with a hydroxyl group), a group which consists of only hydrogen atoms and carbon atoms is even more preferable, and a straight-chain or branched alkyl group and a cycloalkyl group are particularly preferable.

In a case of irradiating the composition of the present invention with KrF excimer laser light, electron beams, X-rays, and high energy rays (for example EUV) with a wavelength of 50 nm or less, the resin (A) preferably has a hydroxystyrene repeating unit. More preferable examples of the resin (A) include a copolymer of hydroxystyrene and hydroxystyrene which is protected by a group which desorbs due to an action of an acid, or a copolymer of hydroxystyrene and (meth)acrylic acid tertiary alkyl ester.

Examples of such resins include, in particular, a resin which has a repeating unit which is represented by General Formula (A) below.

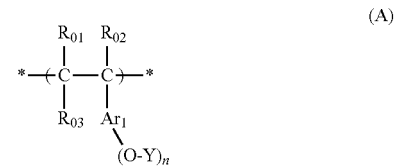

In the formula, $R_{01}$, $R_{02}$ and $R_{03}$ each independently represent for example, a hydrogen atom, an alkyl group, a cycloalkyl group, a halogen atom, a cyano group or an alkoxycarbonyl group. $Ar_1$ for example represents an aromatic ring group. Here, $R_{03}$ and $Ar_1$ are an alkylene group, and may bond with each other to form a 5-membered or 6-membered ring with the —C— chain.

n of Y each independently represent a group which desorbs by an effect of a hydrogen atom or an acid. However, at least one of Y represents a group which desorbs by an action of an acid.

n represents an integer of 1 to 4, 1 to 2 is preferable, and 1 is more preferable.

An alkyl group as $R_{01}$ to $R_{03}$ is, for example, an alkyl group with 20 carbon atoms or less, and preferably a methyl group, an ethyl group, a propyl group, an isopropyl group, an n-butyl group, a sec-butyl group, a hexyl group, a 2-ethylhexyl group, an octyl group or a dodecyl group. More preferably, the alkyl group is an alkyl group with 8 carbon atoms or less. Here, these alkyl groups may have a substituent group.

An alkyl group which is included in an alkoxycarbonyl group is preferably the same as the alkyl group in $R_{01}$ to $R_{03}$ described above.

The cycloalkyl group may be a monocyclic cycloalkyl group, or may be a polycyclic cycloalkyl group. Preferable examples include a monocyclic cycloalkyl group with 3 to 8 carbon atoms such as a cyclopropyl group, a cyclopentyl group, or a cyclohexyl group. Here, these cycloalkyl groups may have a substituent group.

Examples of the halogen atoms include a fluorine atom, a chlorine atom, a bromine atom, and an iodine atom, and a fluorine atom is more preferable.

In a case where $R_{03}$ represents an alkylene group, preferable examples of the alkylene group include alkylene groups with 1 to 8 carbon atoms such as a methylene group, an ethylene group, a propylene group, a butylene group, a hexylene group, or an octylene group.

The aromatic ring group as $Ar_1$ is preferably an aromatic group with 6 to 14 carbon atoms and examples thereof include a benzene ring group, a toluene ring group, and a naphthalene ring group. Here, these aromatic ring group may have a substituent group.

Examples of the group Y which desorbs due to an action of an acid include a group which is represented by —$C(R_{36})(R_{37})(R_{38})$, —$C(=O)$—$O$—$C(R_{36})(R_{37})(R_{38})$, —$C(R_{01})(R_{02})(OR_{39})$, —$C(R_{01})(R_{02})$—$C(=O)$—$O$—$C(R_{36})(R_{37})(R_{38})$, or —$CH(R_{36})(Ar)$.

In the formula, $R_{36}$ to $R_{39}$ each independently represent an alkyl group, a cycloalkyl group, an aryl group, an aralkyl group or an alkenyl group. $R_{36}$ and $R_{37}$ may bond with each other to form a ring structure.

$R_{01}$ and $R_{02}$ each independently represent a hydrogen atom, an alkyl group, a cycloalkyl group, an aryl group, an aralkyl group or an alkenyl group.

Ar represents an aryl group.

The alkyl group as $R_{36}$ to $R_{39}$, $R_{01}$, or $R_{02}$ is preferably an alkyl group with 1 to 8 carbon atoms, and examples thereof include a methyl group, an ethyl group, a propyl group, an n-butyl group, a sec-butyl group, a hexyl group, and an octyl group.

The cycloalkyl group as $R_{36}$ to $R_{39}$, $R_{01}$, or $R_{02}$ may be a monocyclic cycloalkyl group, or may be a polycyclic cycloalkyl group. The monocyclic cycloalkyl group is preferably a cycloalkyl group with 3 to 8 carbon atoms and examples thereof include a cyclopropyl group, a cyclobutyl group, a cyclopentyl group, a cyclohexyl group, and a cyclooctyl group. The polycyclic cycloalkyl group is preferably a cycloalkyl group with 6 to 20 carbon atoms and examples thereof include an adamantyl group, a norbornyl group, an isoboronyl group, a camphanyl group, a dicyclopentyl group, an α-pinanyl group, a tricyclodecanyl group, a tetracyclododecyl group, and an androstanyl group. Here, some of the carbon atoms in the cycloalkyl group may be substituted with hetero atoms such as an oxygen atom.

The aryl group as $R_{36}$ to $R_{39}$, $R_{01}$, $R_{02}$, or Ar is preferably an aryl group with 6 to 10 carbon atoms and examples thereof include a phenyl group, a naphthyl group, and an anthryl group.

An aralkyl group as $R_{36}$ to $R_{39}$, $R_{01}$, or $R_{02}$ is preferably an aralkyl group with 7 to 12 carbon atoms and examples thereof include a benzyl group, a phenethyl group, and a naphthylmethyl group.

An alkenyl group as $R_{36}$ to $R_{39}$, $R_{01}$, or $R_{02}$ is preferably an alkenyl group with 2 to 8 carbon atoms and examples thereof include a vinyl group, an allyl group, a butenyl group, and a cyclohexenyl group.

The ring which $R_{36}$ and $R_{37}$ bond with each other to form may be a monocyclic type or may be a polycyclic type. The monocyclic type is preferably a cycloalkane structure with 3 to 8 carbon atoms and examples thereof include a cyclopropane structure, a cyclobutane structure, a cyclopentane structure, a cyclohexane structure, a cycloheptane structure, and a cyclooctane structure. The polycyclic type is preferably a cycloalkane structure with 6 to 20 carbon atoms and examples thereof include an adamantane structure, a norbornane structure, a dicyclopentane structure, a tricyclodecane structure, and a tetracyclododecane structure. Here, one or more carbon atoms in the ring structure may be substituted with hetero atoms such as an oxygen atom or the like.

Each of the groups described above may have a substituent group. Examples of the substituent groups include an alkyl group, a cycloalkyl group, an aryl group, an amino group, an amide group, a ureido group, a urethane group, a hydroxyl group, a carboxyl group, a halogen atom, an alkoxy group, a thioether group, an acyl group, an acyloxy group, an alkoxycarbonyl group, a cyano group, and a nitro group. The number of carbon atoms of the substituent group is preferably 8 or less.

As the group Y which desorbs by an action of an acid, the structure which is represented by General Formula (B) below is more preferable.

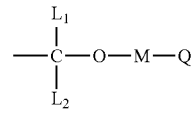

(B)

In the formula, $L_1$ and $L_2$ each independently represent a hydrogen atom, an alkyl group, a cycloalkyl group, an aryl group, or an aralkyl group.

M represents a single bond or a divalent linking group.

Q represents an alkyl group, a cycloalkyl group, a cyclic aliphatic group, an aromatic ring group, an amino group, an ammonium group, a mercapto group, a cyano group, or an aldehyde group. Here, the cyclic aliphatic group and the aromatic ring group may include a hetero atom.

Here, at least 2 of Q, M, or $L_1$ may bond with each other to form a 5-membered or 6-membered ring.

Examples of the alkyl groups as $L_1$ and $L_2$ include an alkyl group with 1 to 8 carbon atoms, in particular, a methyl group, an ethyl group, a propyl group, an n-butyl group, a sec-butyl group, a hexyl group, and an octyl group.

Examples of the cycloalkyl groups as $L_1$ and $L_2$ include a cycloalkyl group with 3 to 15 carbon atoms, in particular, a cyclopentyl group, a cyclohexyl group, a norbornyl group, and an adamantyl group.

Examples of the aryl groups as $L_1$ and $L_2$ include an aryl group with 6 to 15 carbon atoms, in particular, a phenyl group, a tolyl group, a naphthyl group, and an anthryl group.

Examples of the aralkyl groups as $L_1$ and $L_2$ include an aralkyl group with 6 to 20 carbon atoms, in particular, a benzyl group, and a phenethyl group.

The divalent linking group as M is, for example, an alkylene group (for example, a methylene group, an ethylene group, a propylene group, a butylene group, a hexylene group, or an octylene group), a cycloalkylene group (for example, a cyclopentylene group, or cyclohexylene group), an alkenylene group (for example, an ethenylene group, a propenylene group, or a butenylene group), an arylene group (for example, a phenylene group, a tolylene group, or a naphthylene group), —S—, —O—, —CO—, —SO$_2$—, —N($R_0$)—, or two or more thereof are combined. Here, $R_0$ is a hydrogen atom or an alkyl group. Examples of the alkyl groups as $R_0$ include an alkyl group with 1 to 8 carbon atoms, in particular, a methyl group, an ethyl group, a propyl group, an n-butyl group, a sec-butyl group, a hexyl group, and an octyl group.

The alkyl group and the cycloalkyl group as Q are the same as each of the groups as $L_1$ and $L_2$ described above.

Examples of the cyclic aliphatic groups and the aromatic ring groups as Q include a cycloalkyl group and an aryl group as L1 and L2 described above. The number of carbon atoms of the cycloalkyl group and aryl group is preferably 3 to 15.

Examples of the cyclic aliphatic groups and the aromatic ring groups which include a hetero atom as Q include groups which have a heterocyclic structure such as thiirane, cyclothiolane, thiophene, furan, pyrrole, benzothiophene, benzofuran, benzopyrrole, triazine, imidazole, benzimidazole, triazole, thiadiazole, thiazole, and pyrrolidone. However, the present invention is not limited thereto as long as the ring is a ring which is formed of carbon and hetero atoms, or a ring which is formed only of hetero atoms.

Examples of the ring structures which at least 2 of Q, M, or $L_1$ may bond with each other to form include a propylene group and a butylene group so as to form a 5 membered or 6 membered ring structure. Here, the 5 membered or 6 membered ring structure contains an oxygen atom.

Each of the groups which are represented by $L_1$, $L_2$, M, and Q in General Formula (B) may have a substituent group. Examples of the substituent groups include an alkyl group, a cycloalkyl group, an aryl group, an amino group, an amide group, a ureido group, a urethane group, a hydroxyl group, a carboxyl group, a halogen atom, an alkoxy group, a thioether group, an acyl group, an acyloxy group, an alkoxycarbonyl group, a cyano group, and a nitro group. The number of carbon atoms of the substituent group is preferably 8 or less.

As the group which is represented by -(M-Q), a group with 1 to 20 carbon atoms is preferable, a group with 1 to 10 carbon atoms is more preferable, and a group with 1 to 8 carbon atoms is even more preferable.

Specific examples of the repeating unit which has an acid-decomposable group will be given; however, the present invention is not limited thereto.

In the specific examples, Rx represents a hydrogen atom, $CH_3$, $CF_3$, or $CH_2OH$. Rxa and Rxb each represent an alkyl group with 1 to 4 carbon atoms. $Xa_1$ represents a hydrogen atom, $CH_3$, $CF_3$, or $CH_2OH$. Z represents a substituent group, and a plurality of Z may be the same as or may be different from each other in a case where a plurality thereof are present. p represents 0 or a positive integer. Specific examples and preferable examples of Z are the same as the specific examples and preferable examples of the substituent group which each group such as $Rx_1$ to $Rx_3$ may have.

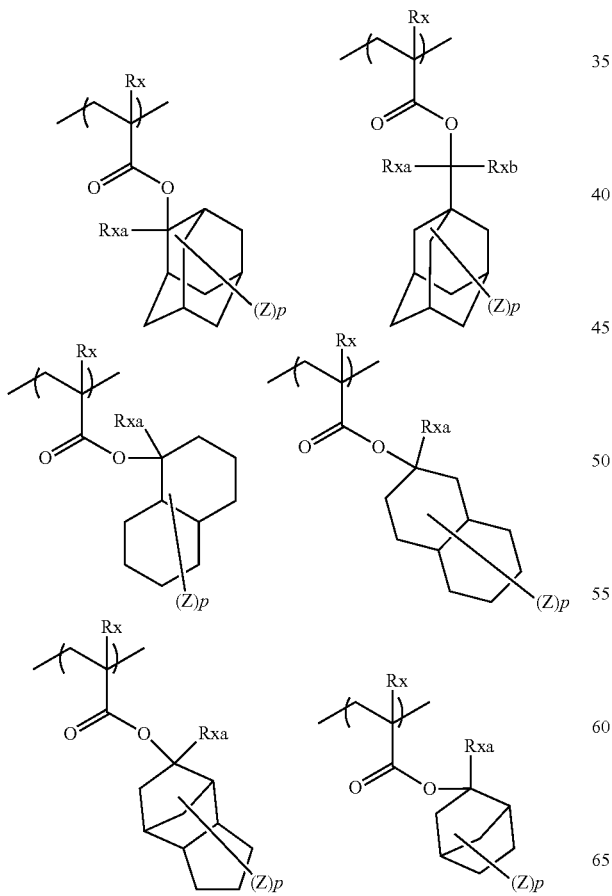
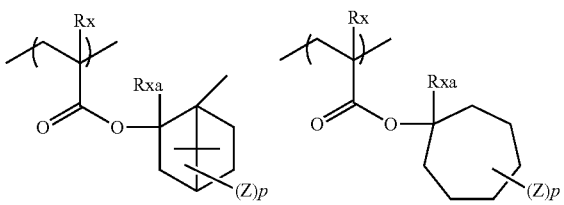
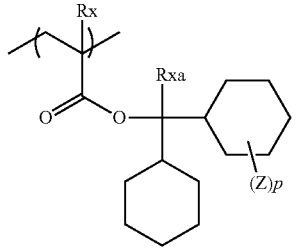
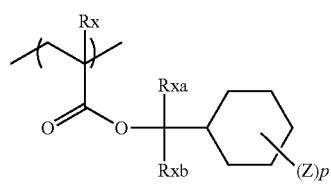
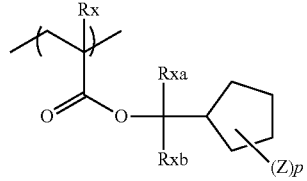
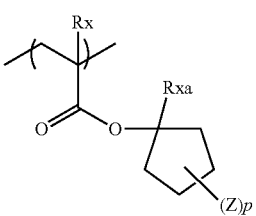
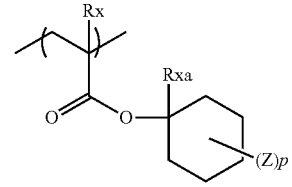
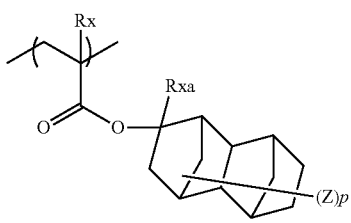
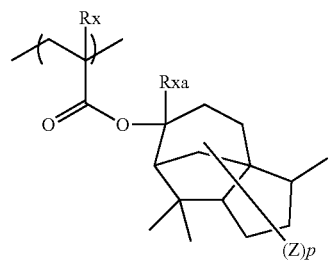
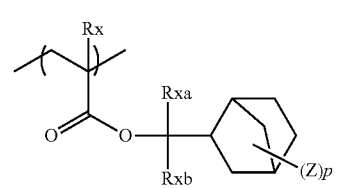
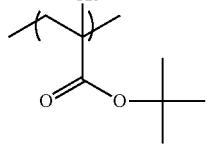

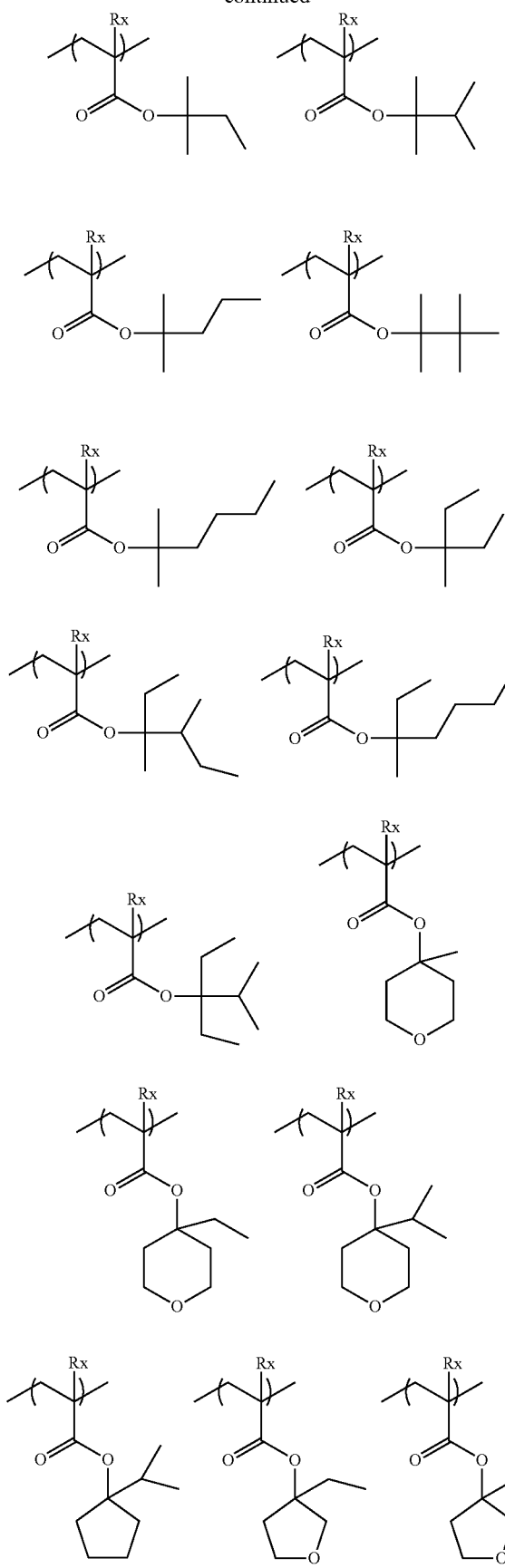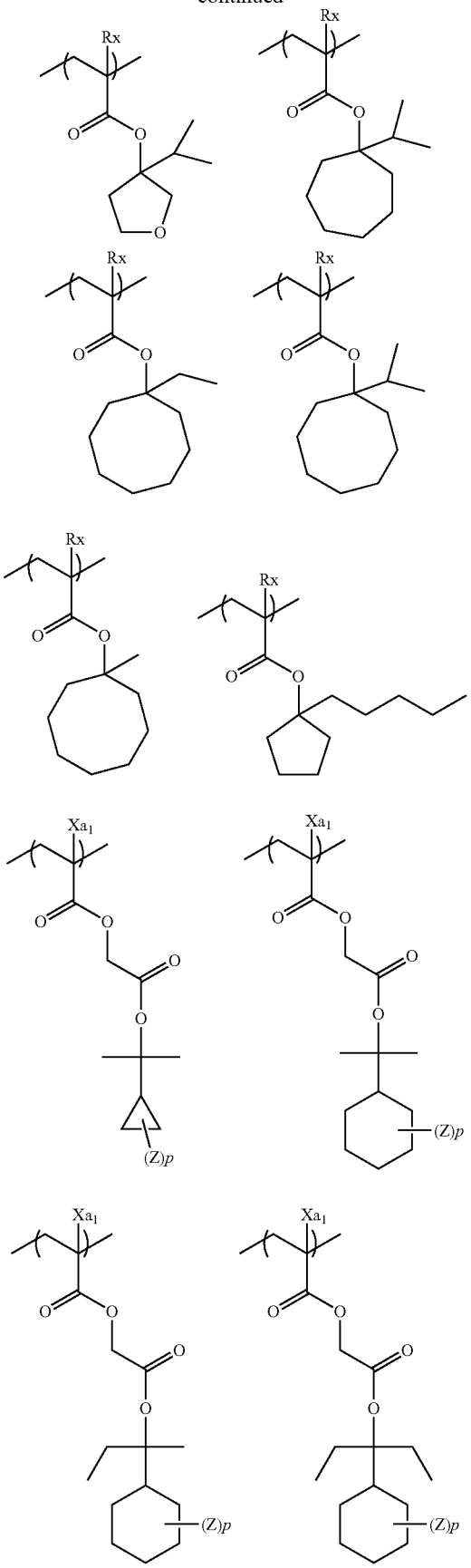

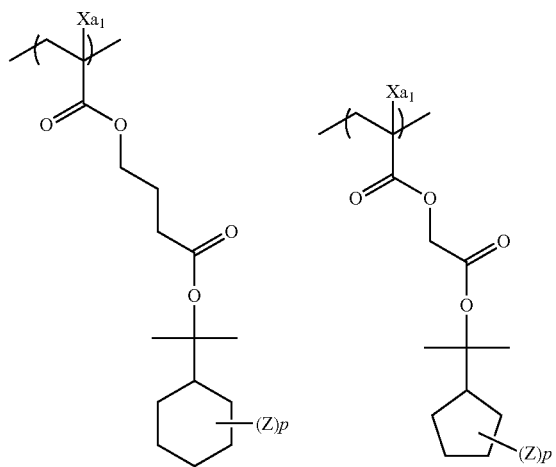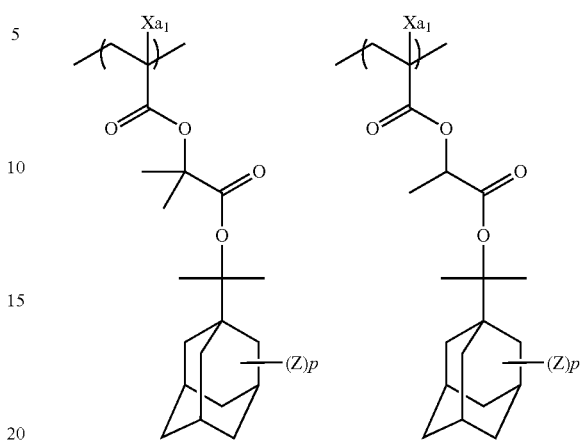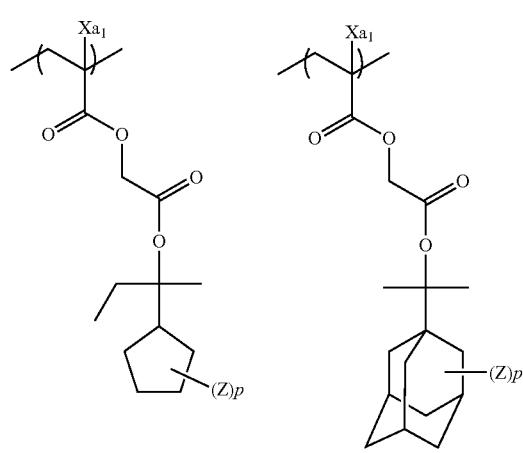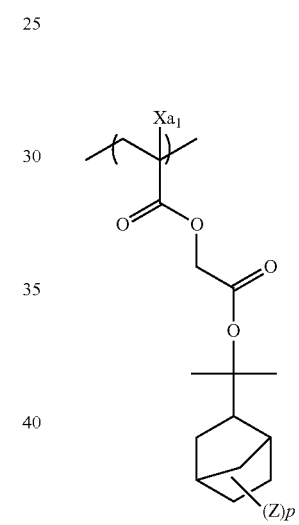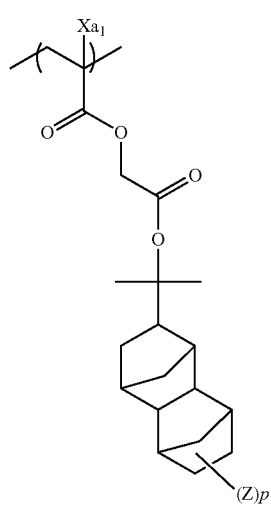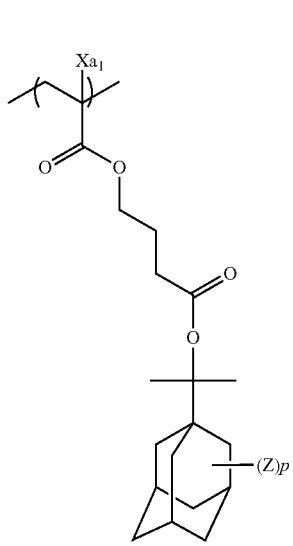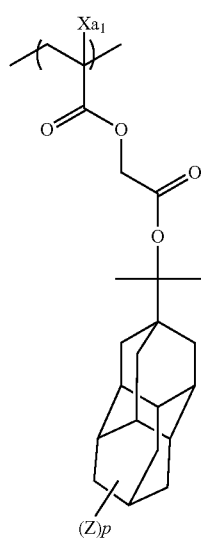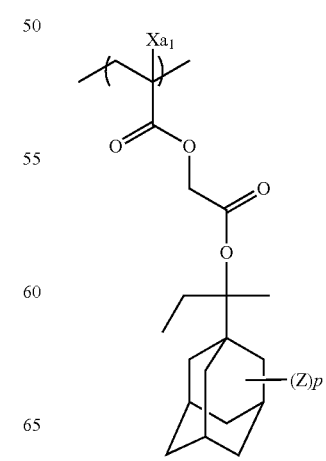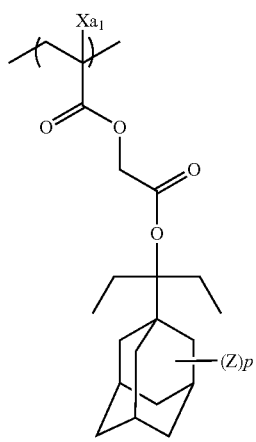

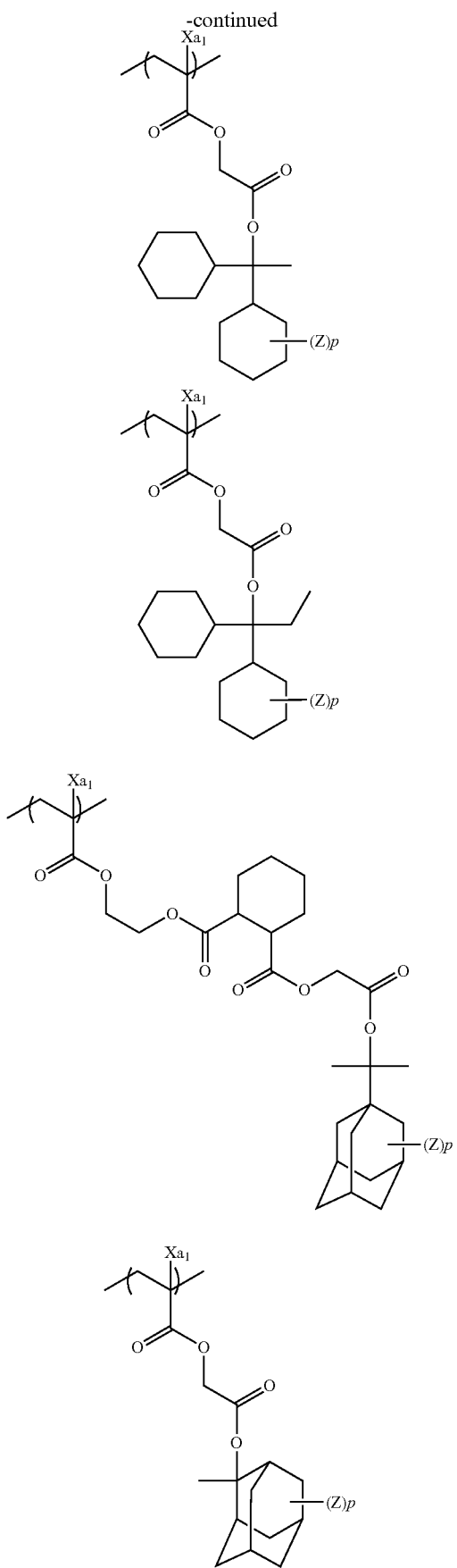
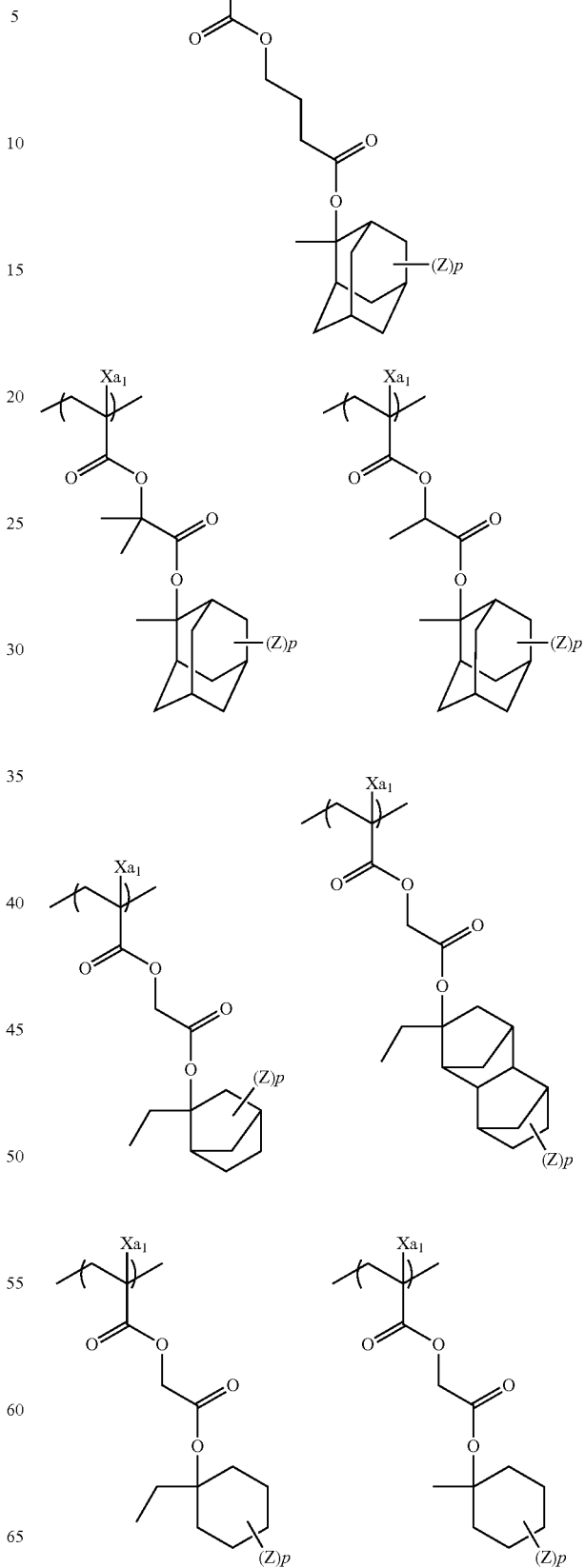

-continued
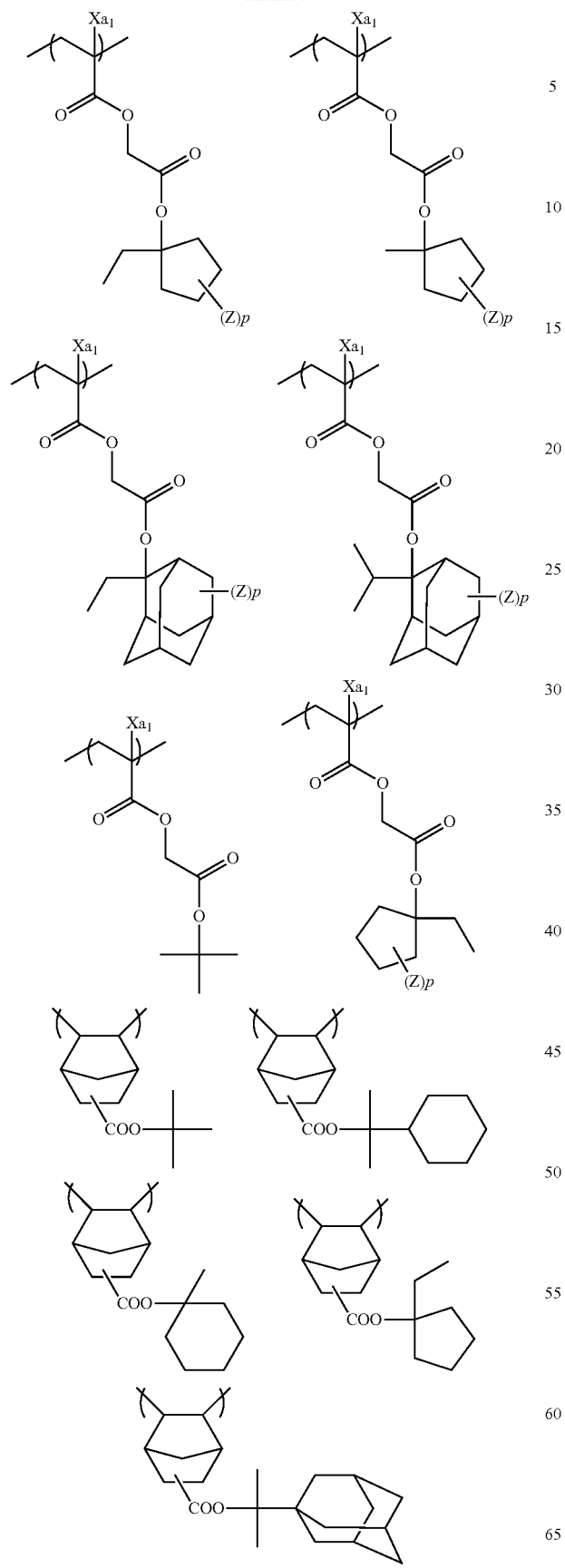
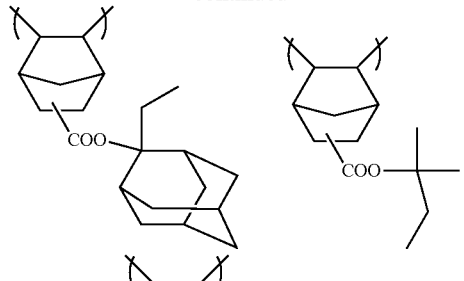
In the specific examples below, Xa represents a hydrogen atom, an alkyl group, a cyano group, or a halogen atom.
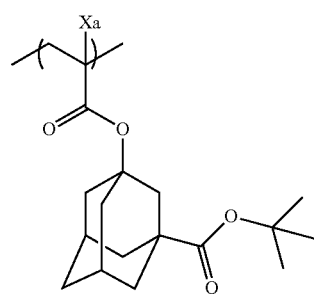
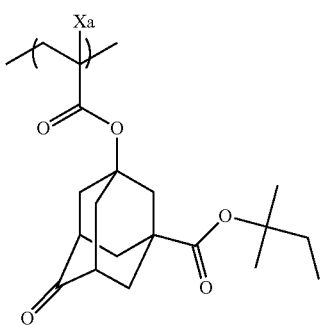
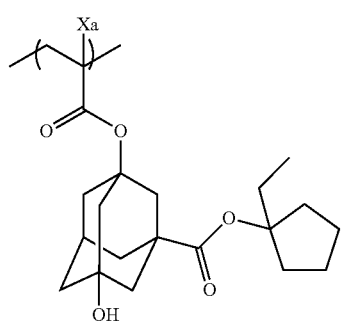

33
-continued
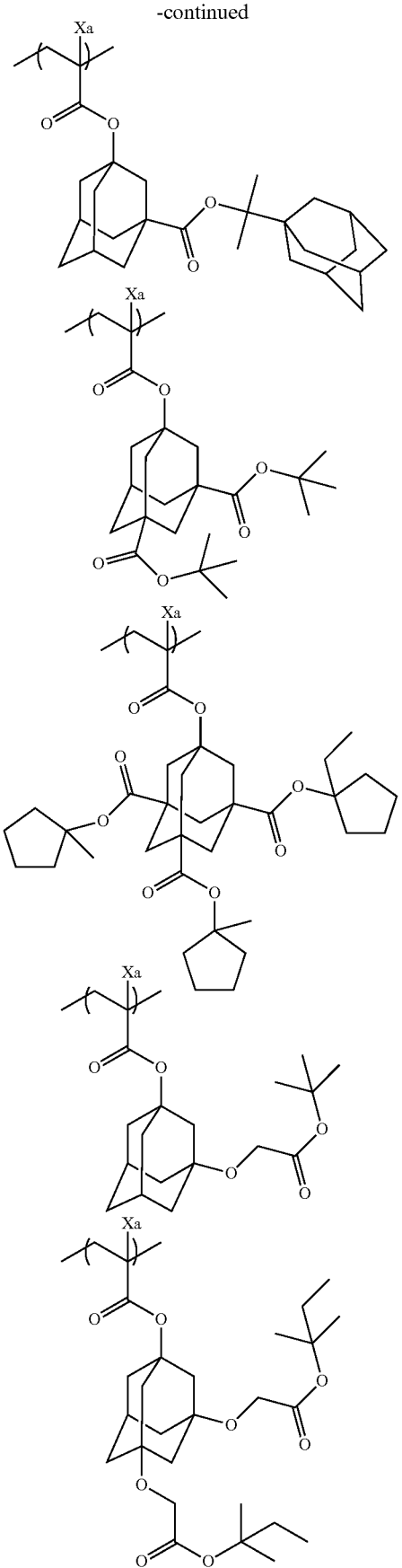
34
-continued
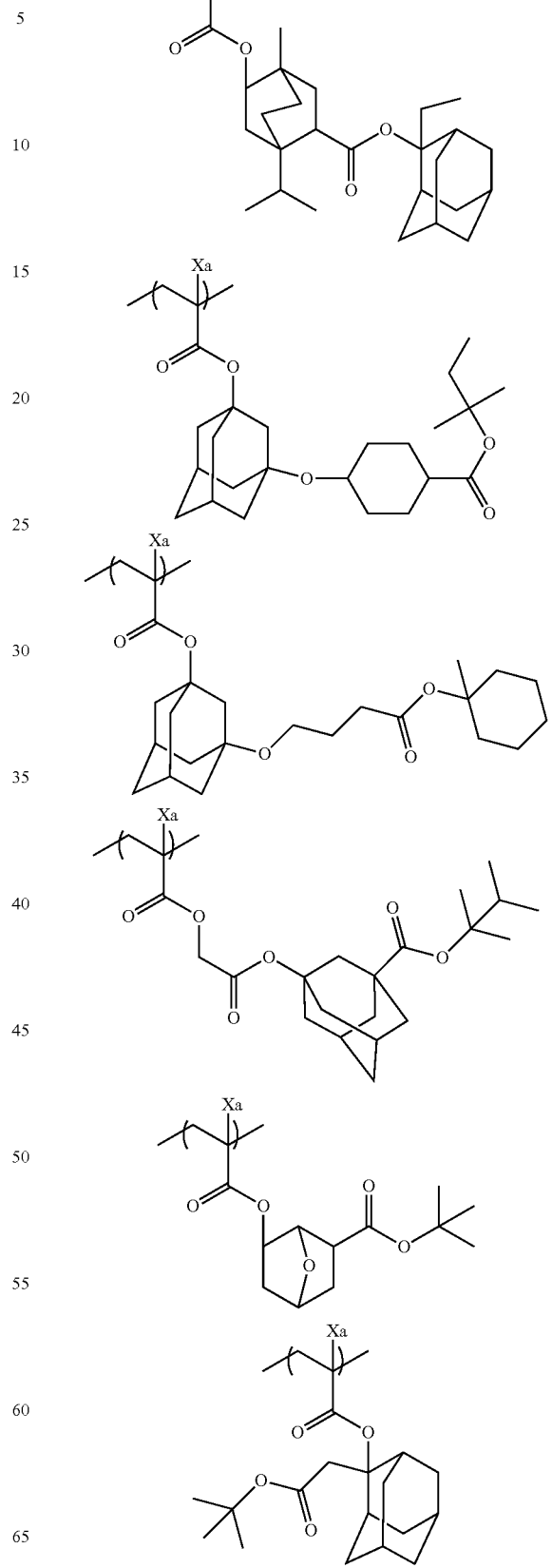

-continued
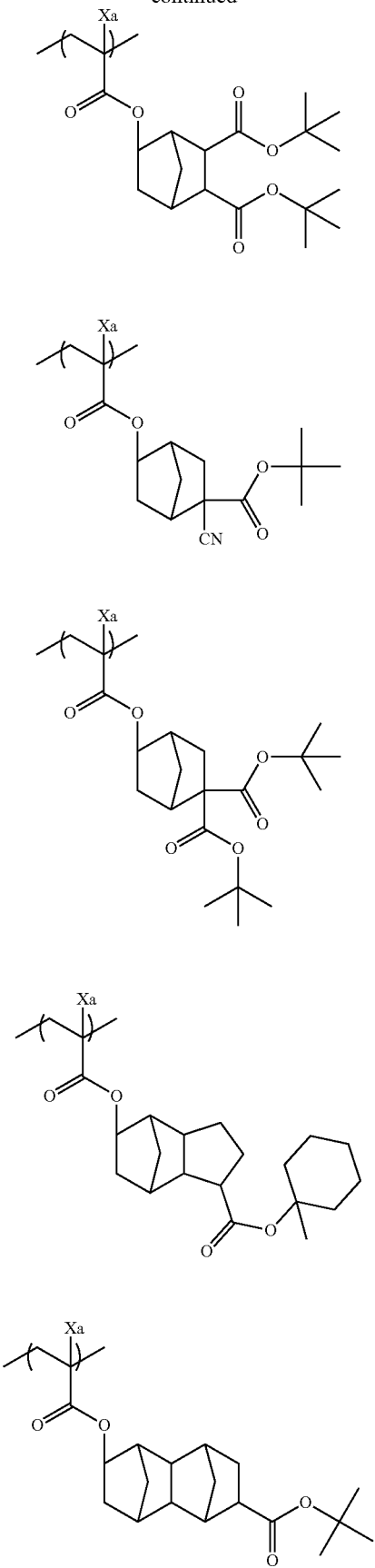
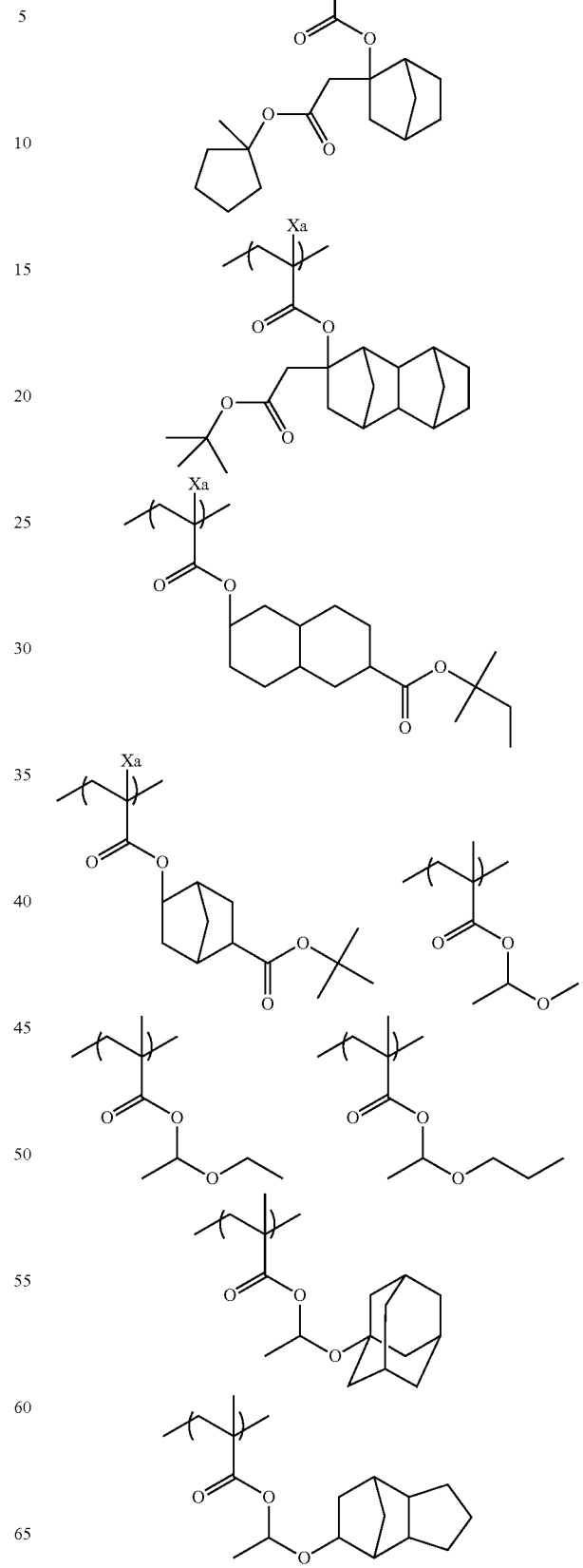

37
-continued
38
-continued
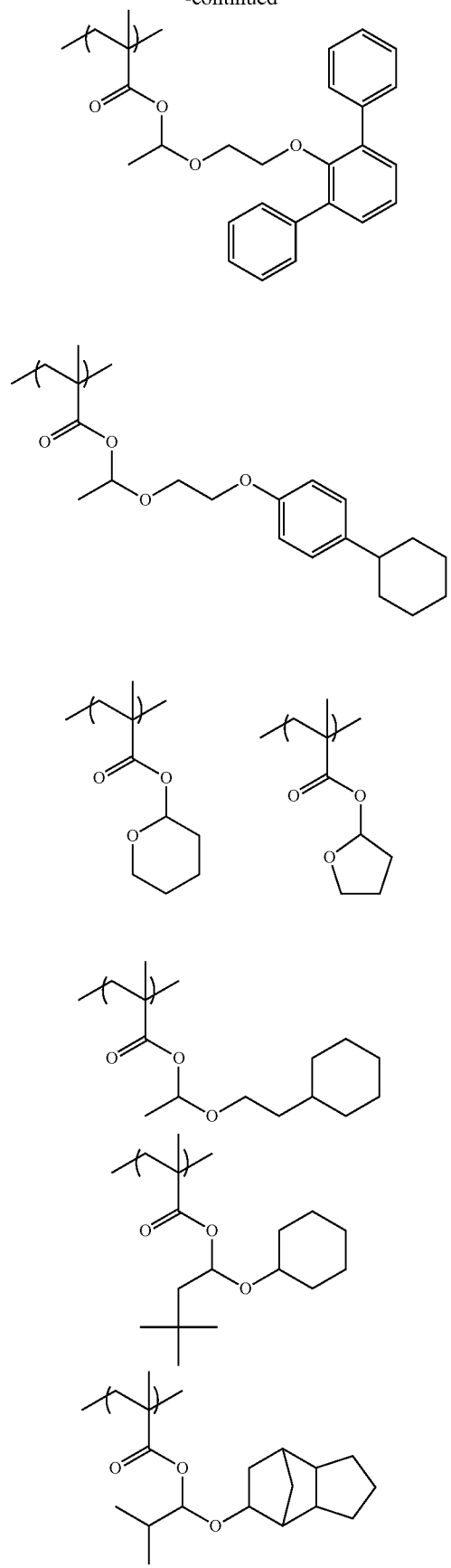
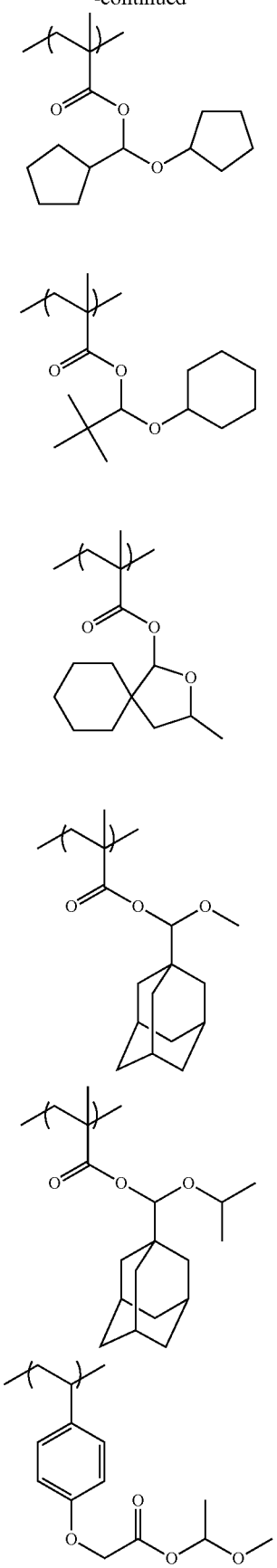

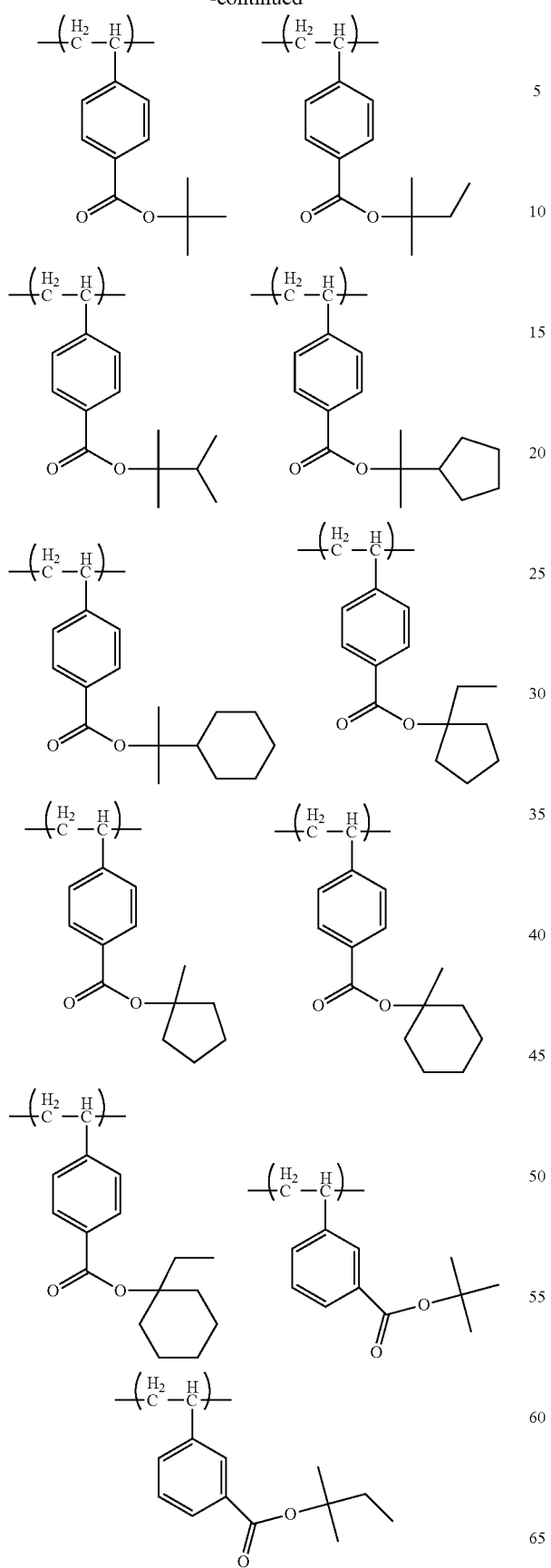
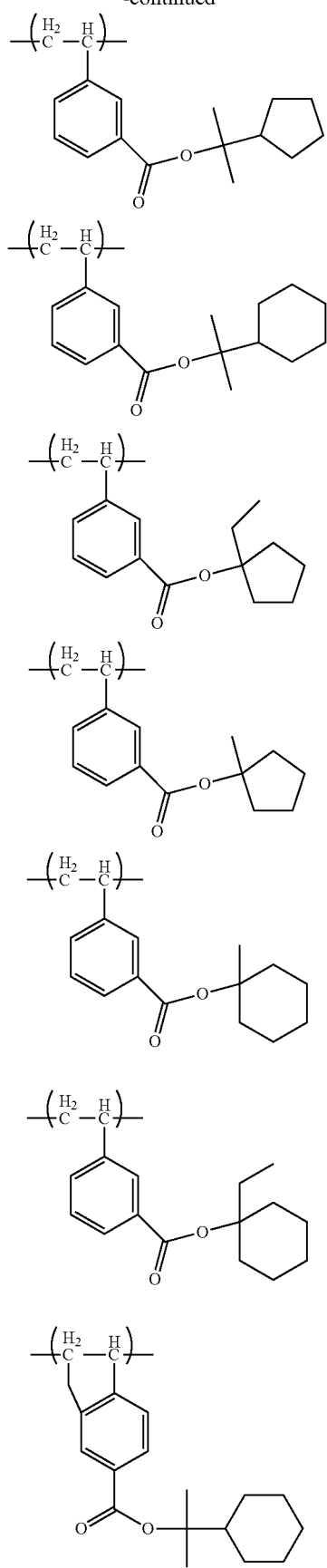

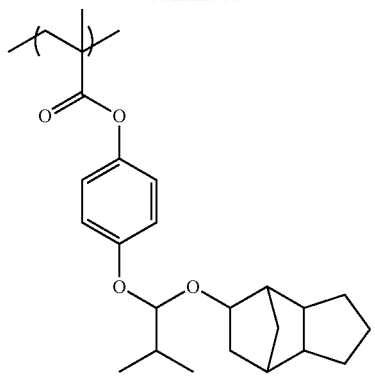
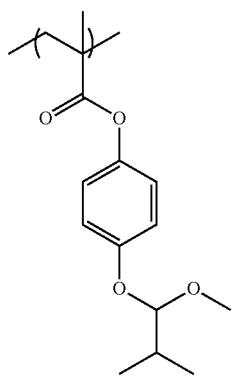 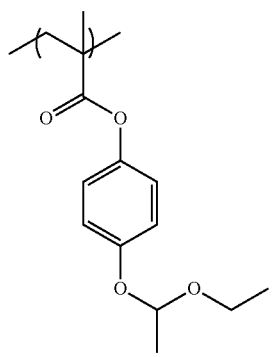
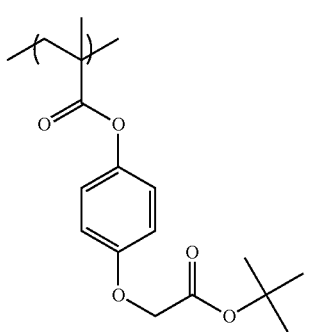 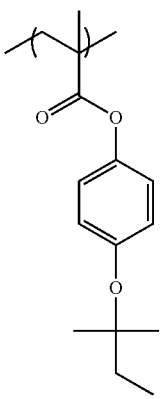
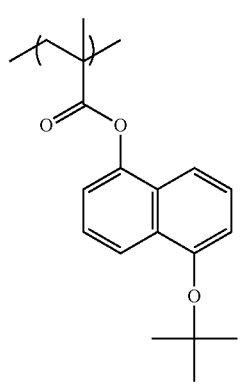 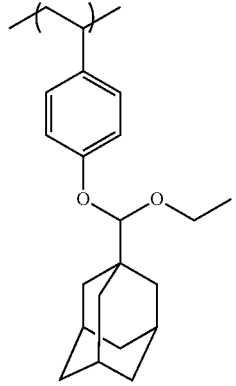
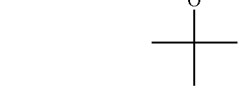
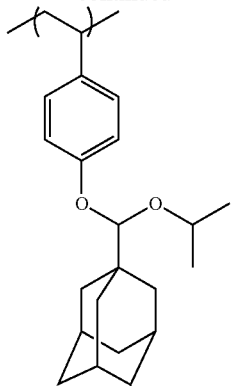
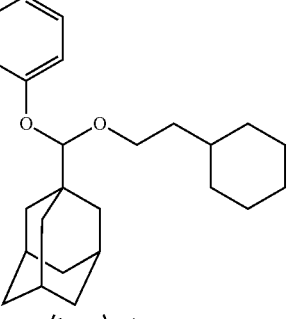
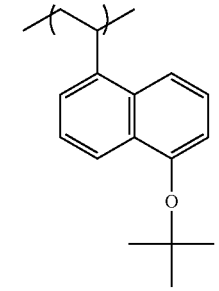
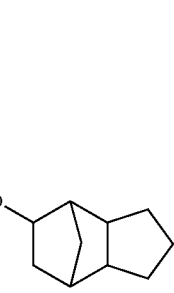 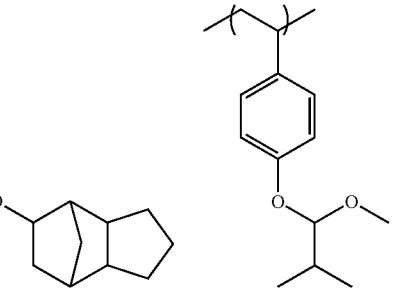
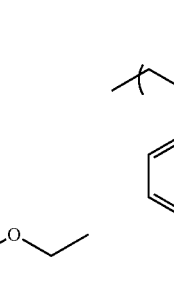
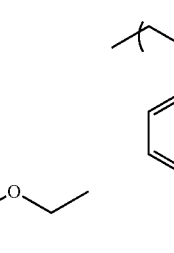
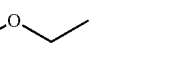

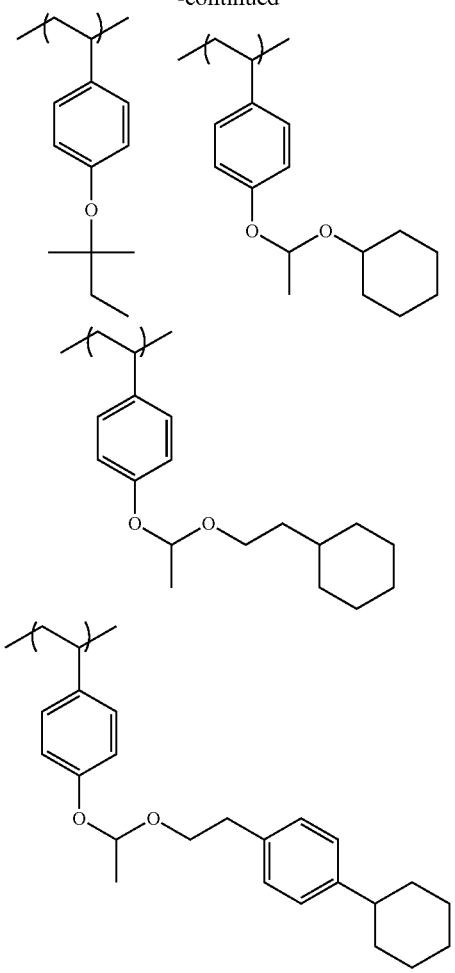
The specific examples below are repeating units which have a structure which is protected by a group which decomposes and desorbs an alcoholic hydroxyl group by an action of an acid. In the specific examples, $Xa_1$ represents a hydrogen atom, $CH_3$, $CF_3$, or $CH_2OH$.
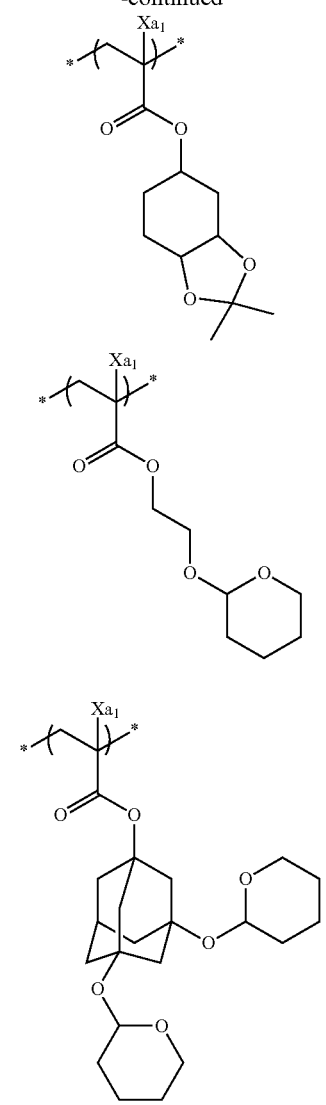
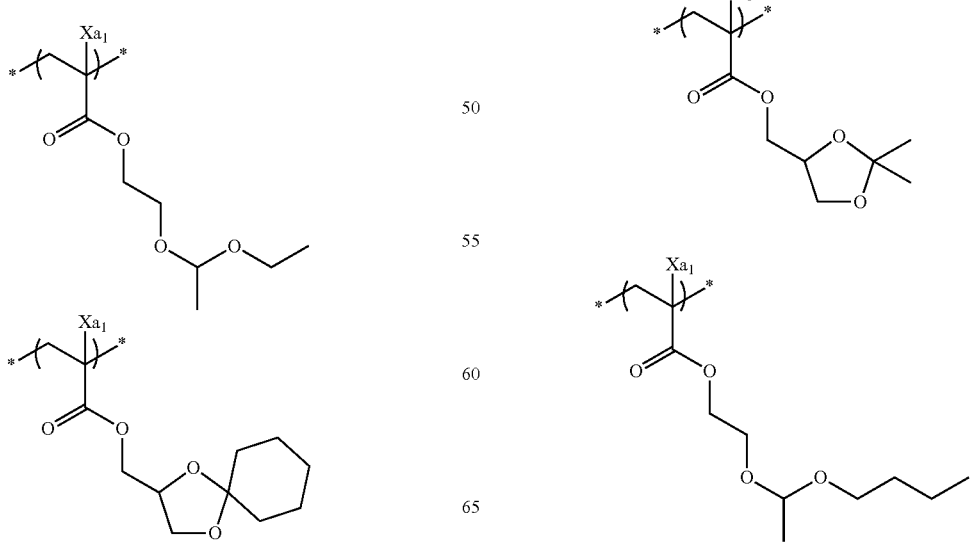

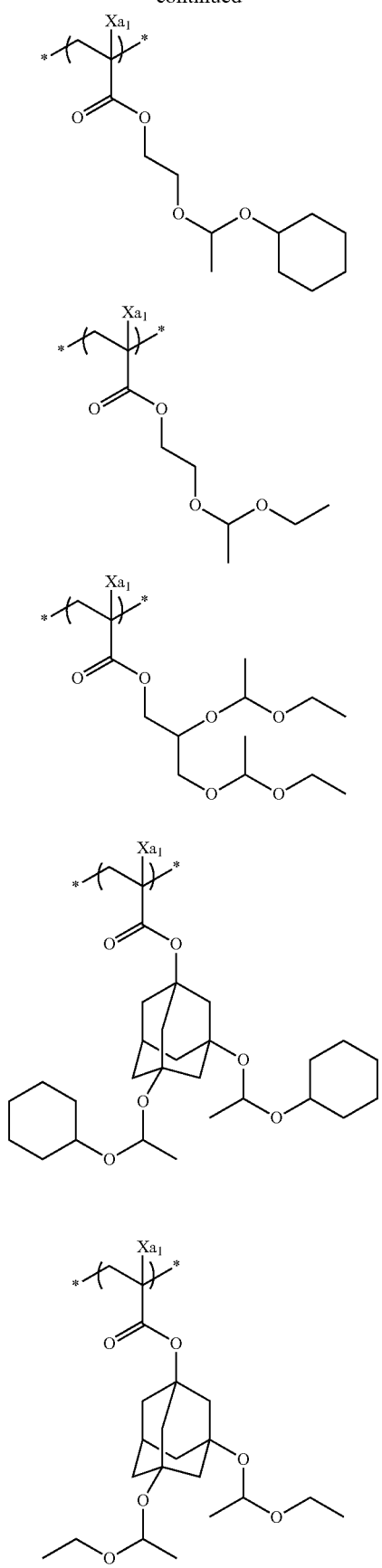
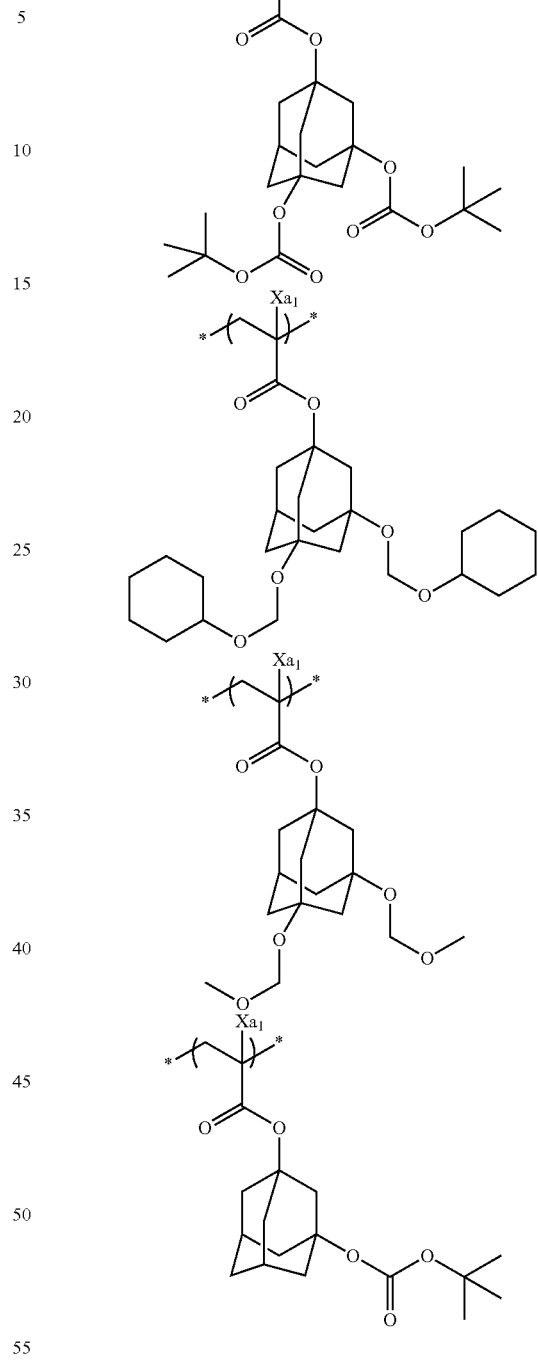

The repeating unit which has an acid-decomposable group may be one type or 2 or more types may be used together. In a case of using 2 types, the combination is not particularly limited and examples thereof include the following: (1) combination of a repeating unit which is decomposed by an action of an acid and generates a carboxyl group, and a repeating unit which is decomposed by an action of an acid and generates an alcoholic hydroxyl group, (2) combination of a repeating unit which is decomposed by an action of an acid and generates a carboxyl group, and a repeating unit which is decomposed by an action of an acid and generates a phenolic hydroxyl group, (3) combination of 2 types of repeating units (which have different structures from each other) which are decomposed by an action of an acid and generate a carboxyl group. Among these, favorable combinations in the case of (3) will be exemplified as a reference.
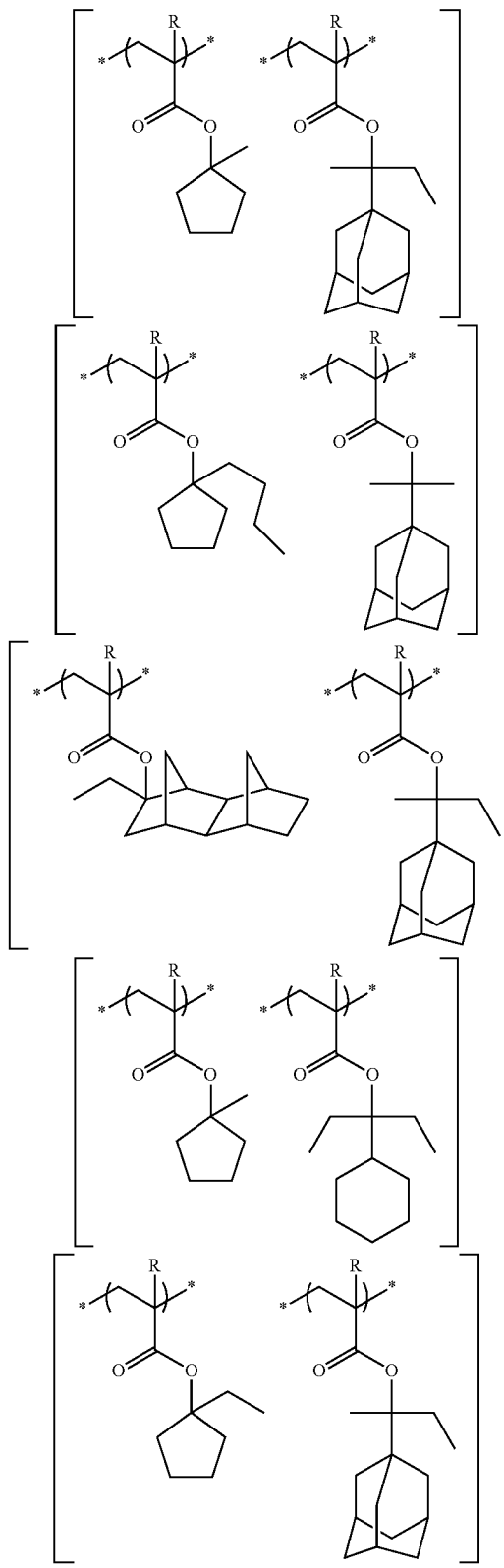
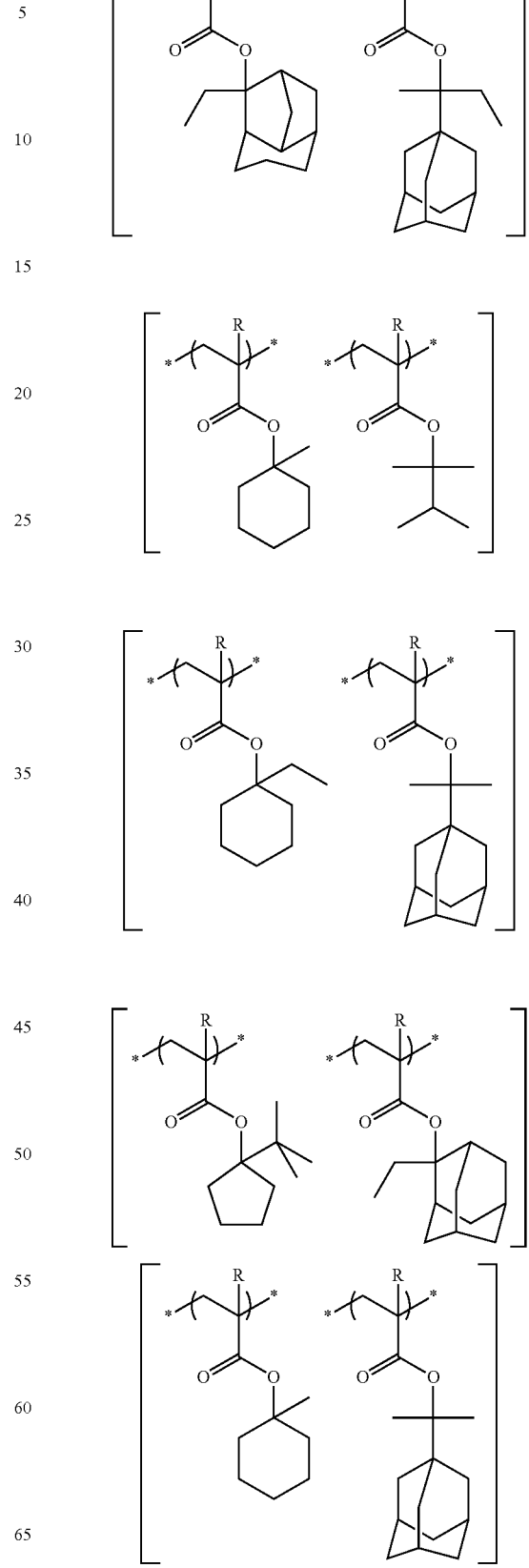

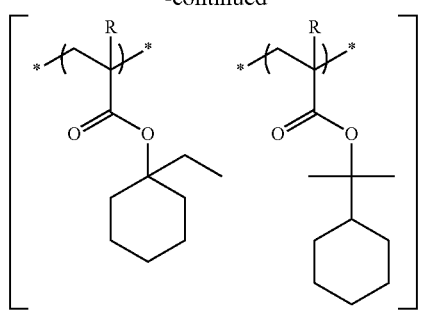
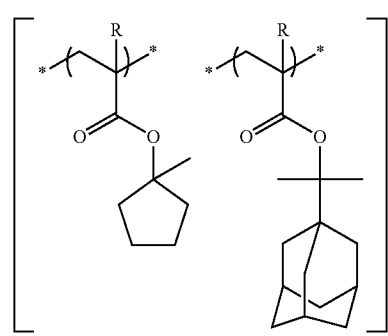
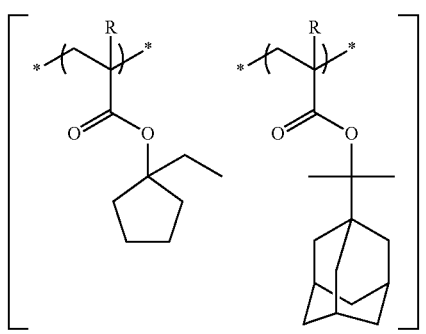
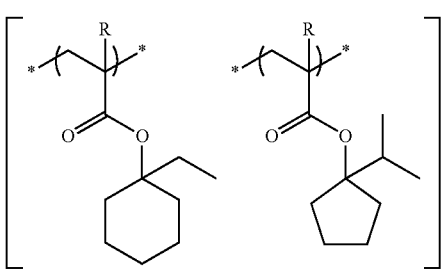
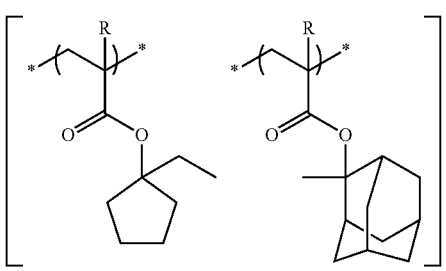
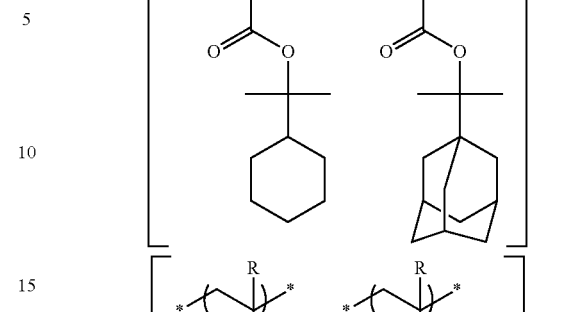
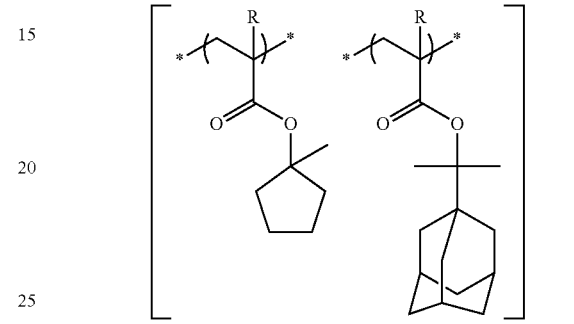
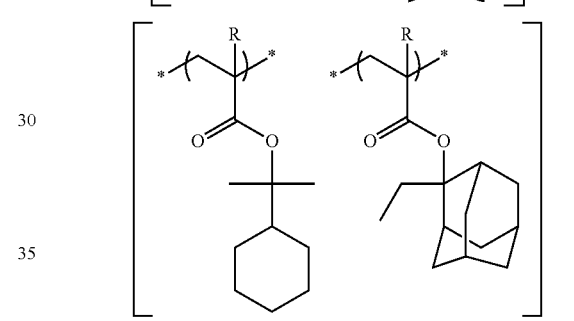
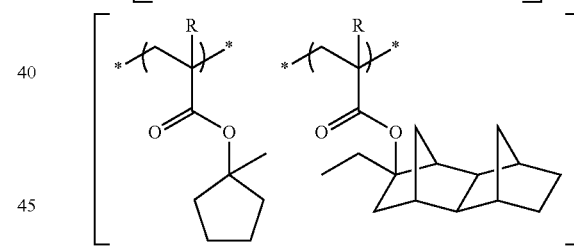
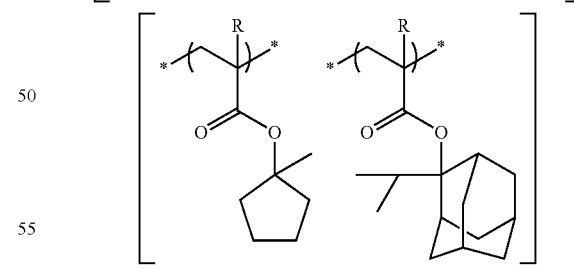
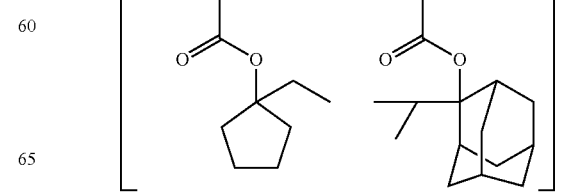

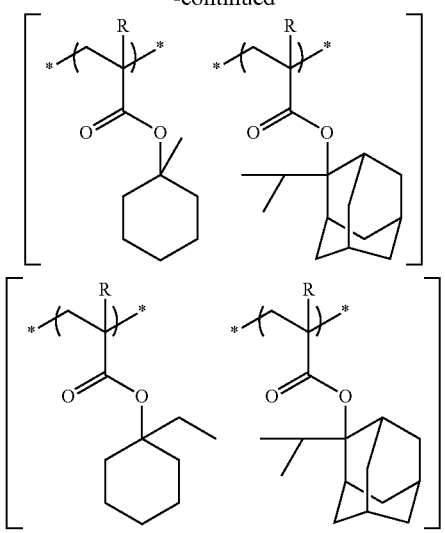

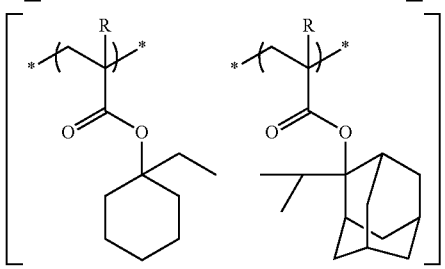

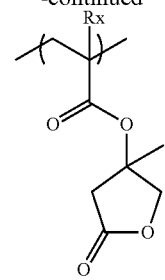

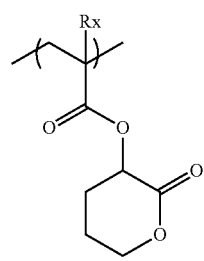

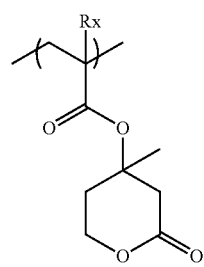

The content (the total in a case where a plurality of repeating units which have an acid-decomposable group exist) of the repeating unit which has an acid-decomposable group which is included in resin (A) is not particularly limited; however, the lower limit of the content is preferably 15 mol % or more with respect to all of the repeating units in resin (A), more preferably 20 mol % or more, even more preferably 25 mol % or more, and particularly preferably 40 mol % or more. In addition, the upper limit of the content is preferably 90 mol % or less, more preferably 75 mol % or less, and even more preferably 65 mol % or less.

The resin (A) may contain a repeating unit which has a group which has a lactone structure or a sultone structure.

Specific examples of the repeating unit which has a lactone structure or a sultone structure will be illustrated below; however, the present invention is not limited thereto. (In the formula, Rx represents H, CH$_3$, CH$_2$OH, or CF$_3$.)

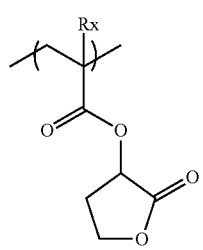

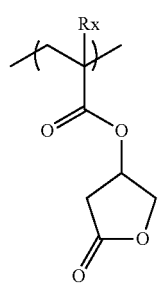

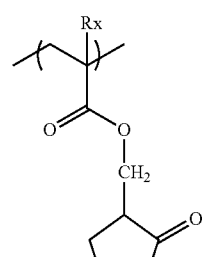

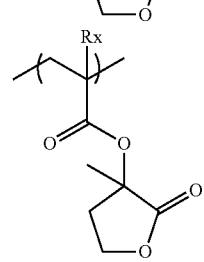

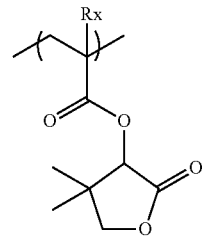

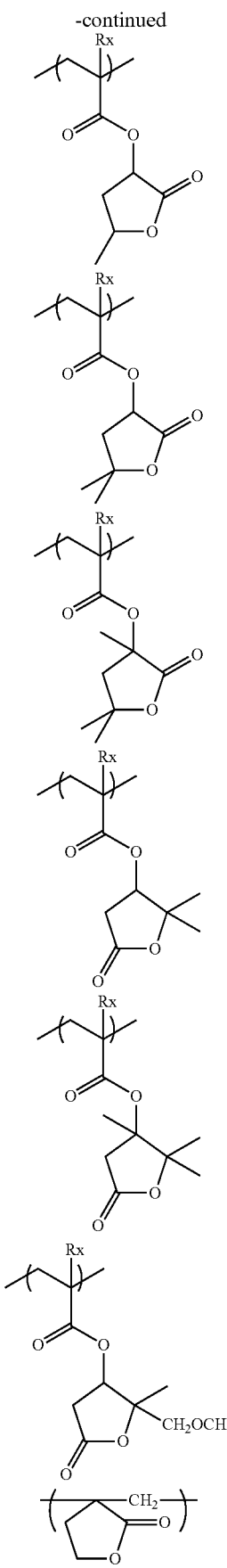
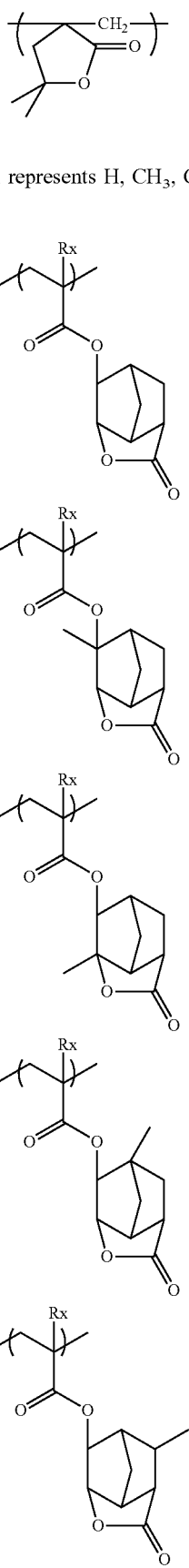
(In the formula, Rx represents H, CH₃, CH₂OH, or CF₃.)

55
-continued
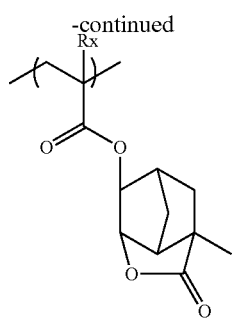
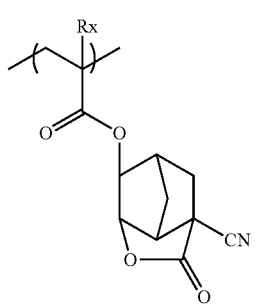
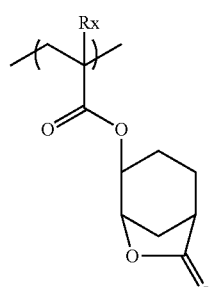
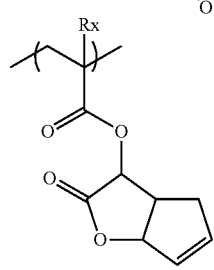
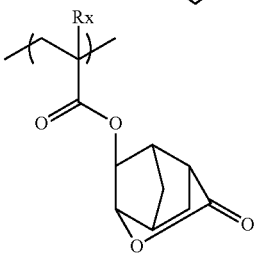
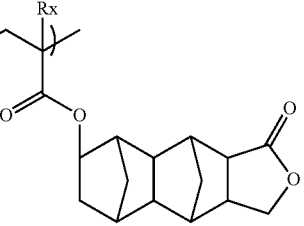
56
-continued
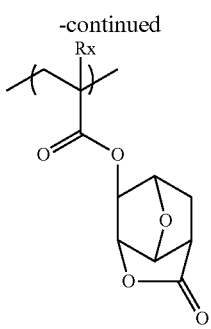
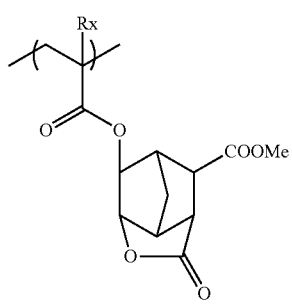
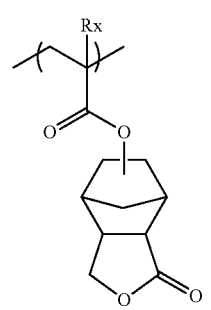
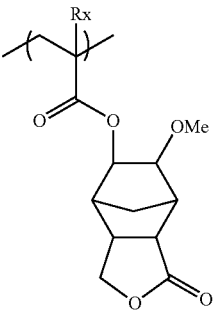
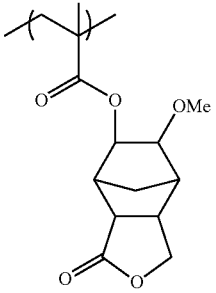

-continued
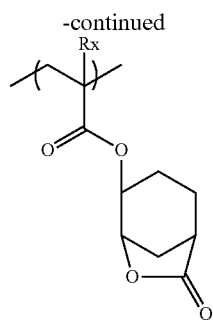
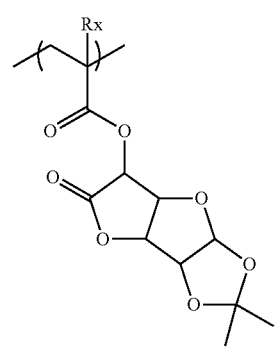
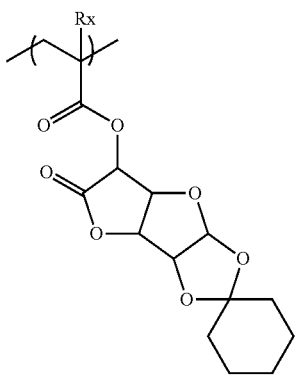
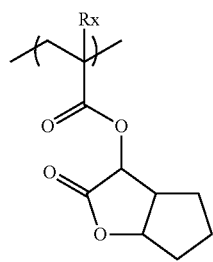
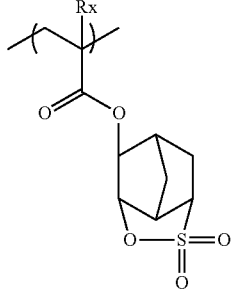
-continued
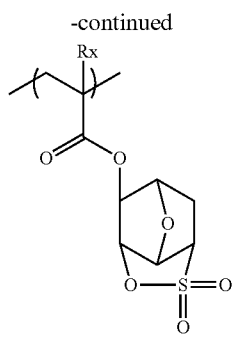
(In the formula, Rx represents H, $CH_3$, $CH_2OH$, or $CF_3$.)
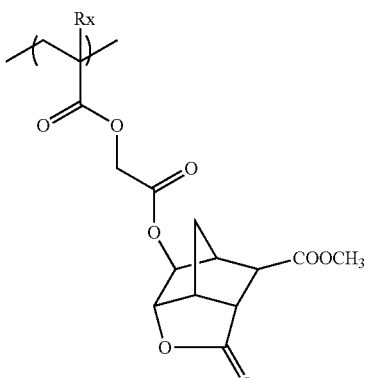
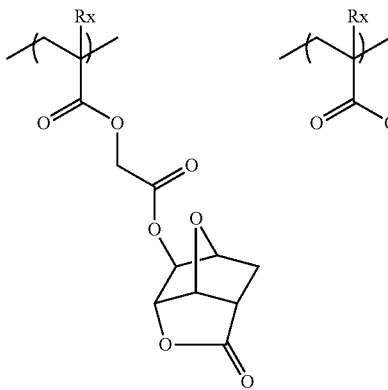

-continued
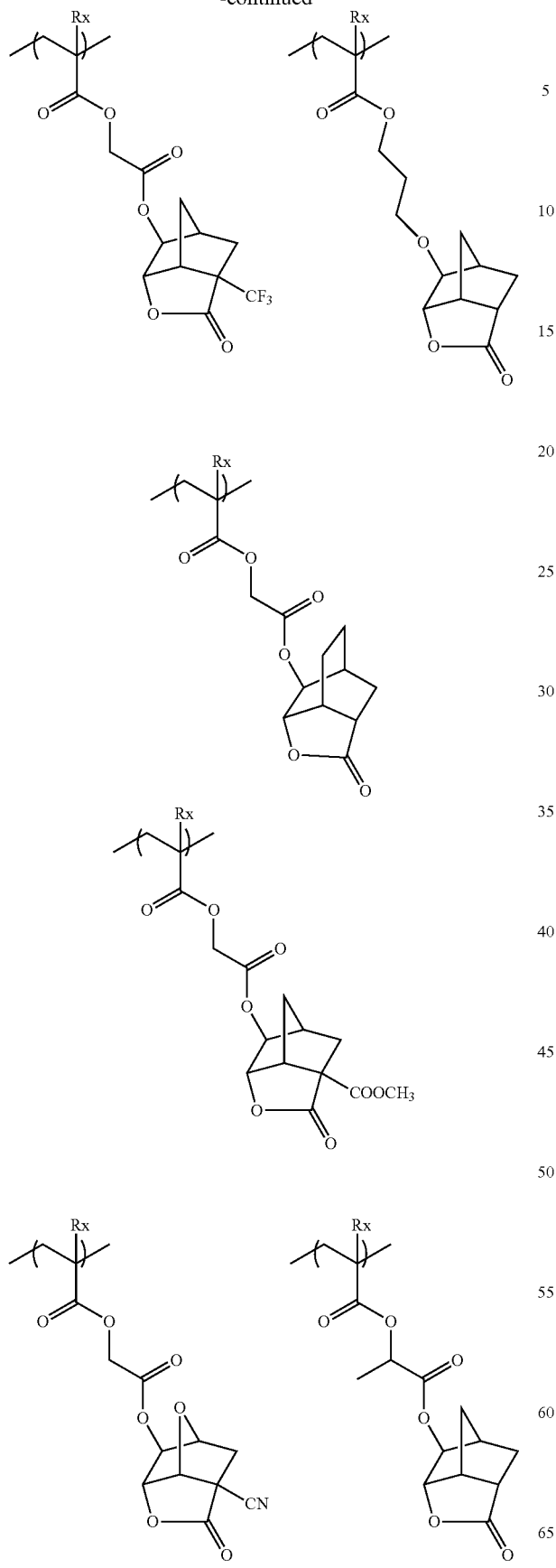
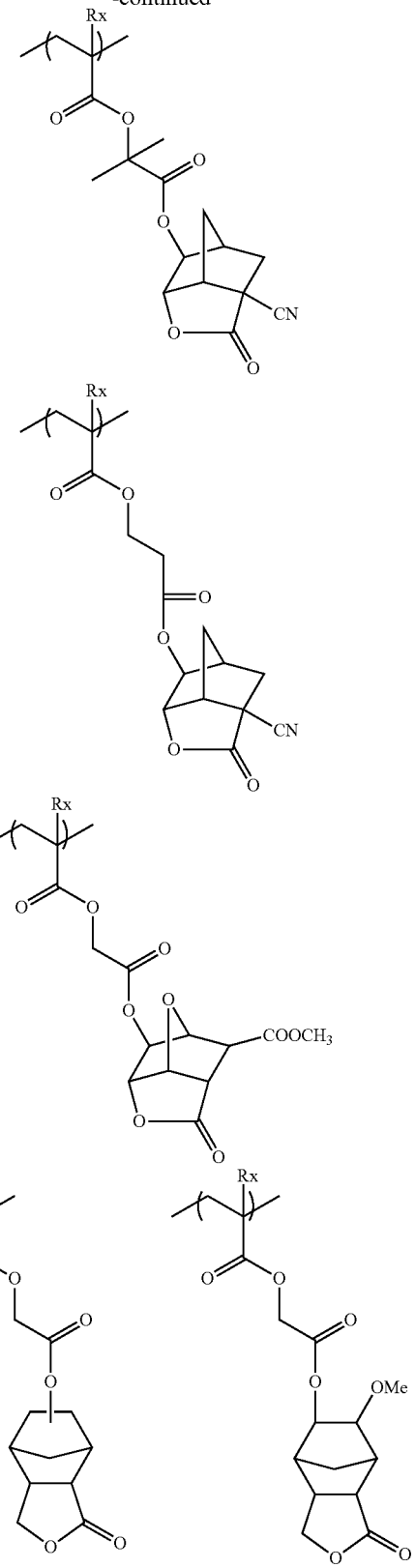
Repeating units which have two or more types of lactone structure or sultone structure may also be used together.
In a case where the resin (A) contains a repeating unit which has a lactone structure or a sultone structure, the content of the repeating unit which has a lactone structure or a sultone structure is preferably 5 mol % to 60 mol % with respect to all of the repeating units in the resin (A), more preferably 5 mol % to 55 mol %, and even more preferably 10 mol % to 50 mol %.

In addition, the resin (A) may have a repeating unit which has a cyclic carbonate ester structure. Specific examples thereof will be given below; however, the present invention is not limited thereto.

Here, $R_A^1$ in the specific examples below represents a hydrogen atom or an alkyl group (preferably a methyl group).

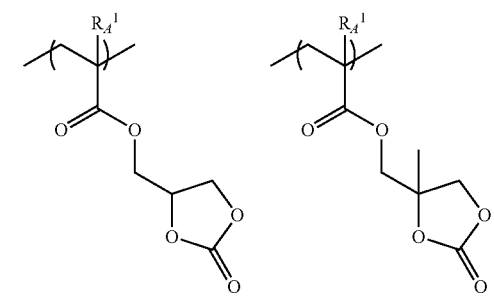
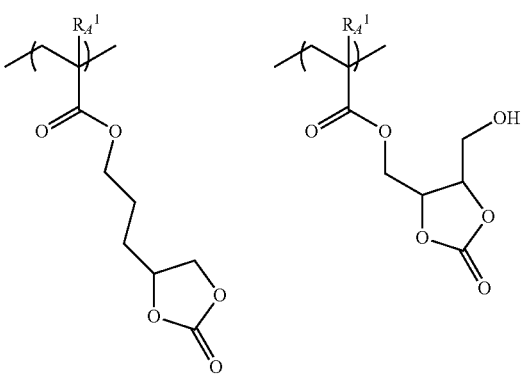
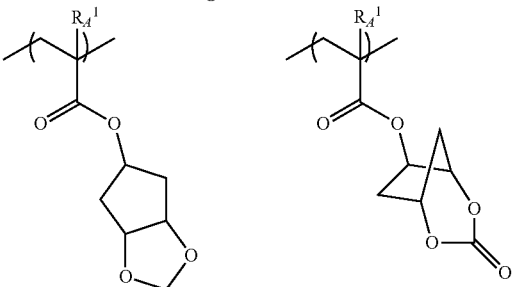
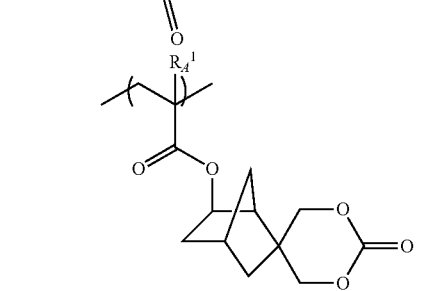
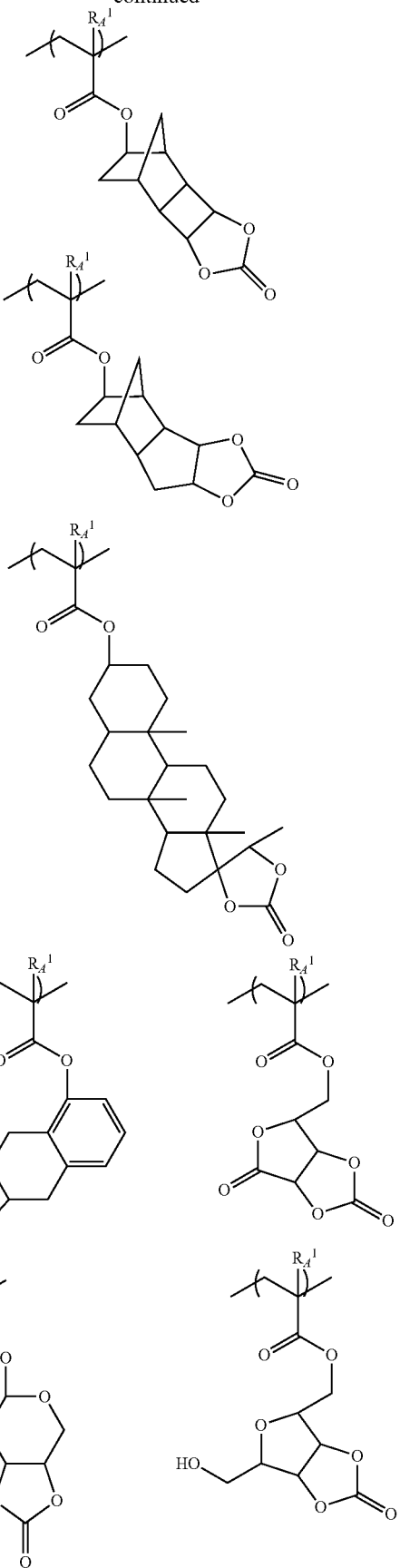

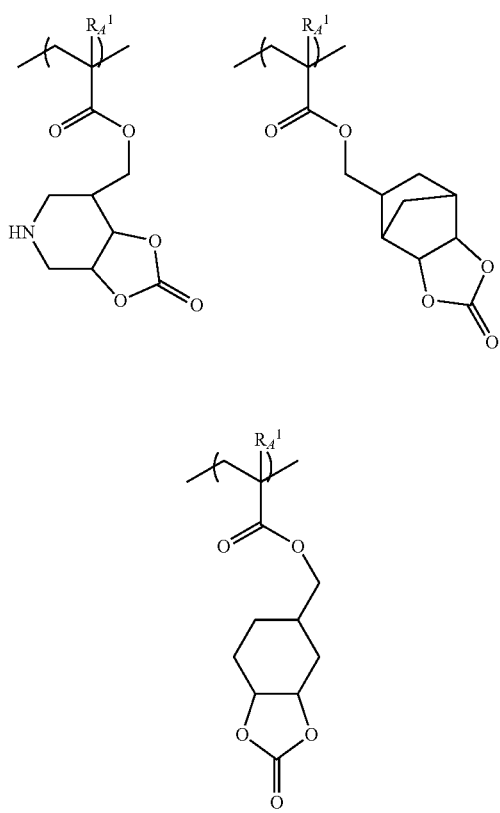

In a case where the resin (A) contains a repeating unit which has a cyclic carbonate structure, the content of the repeating unit which has a cyclic carbonate structure is preferably 5 mol % to 60 mol % with respect to all of the repeating units in the resin (A), more preferably 5 mol % to 55 mol %, and even more preferably 10 mol % to 50 mol %.

The resin (A) may have a repeating unit which has a hydroxyl group or a cyano group.

Specific examples of repeating units which have a hydroxyl group or a cyano group will be given below; however, the present invention is not limited thereto.

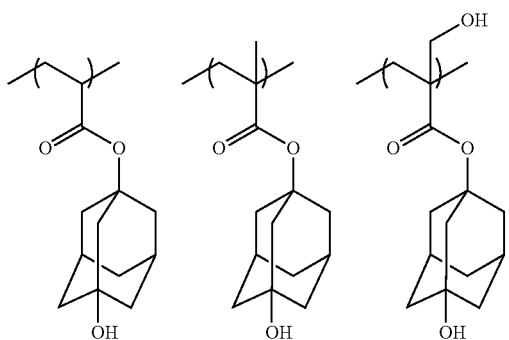

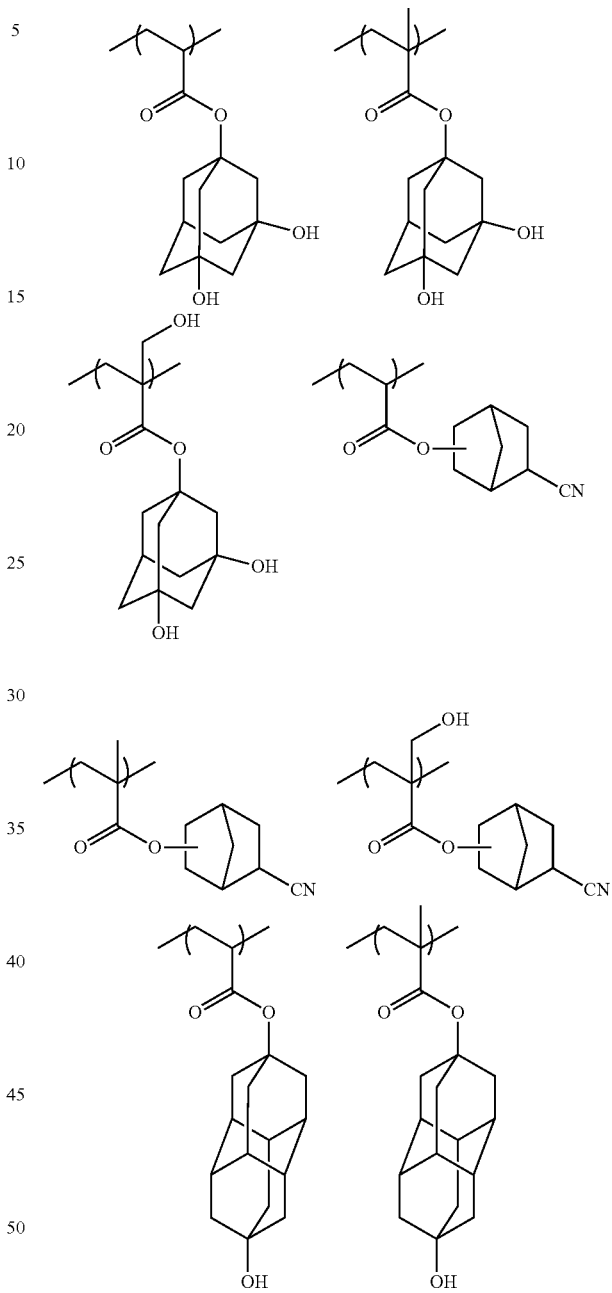

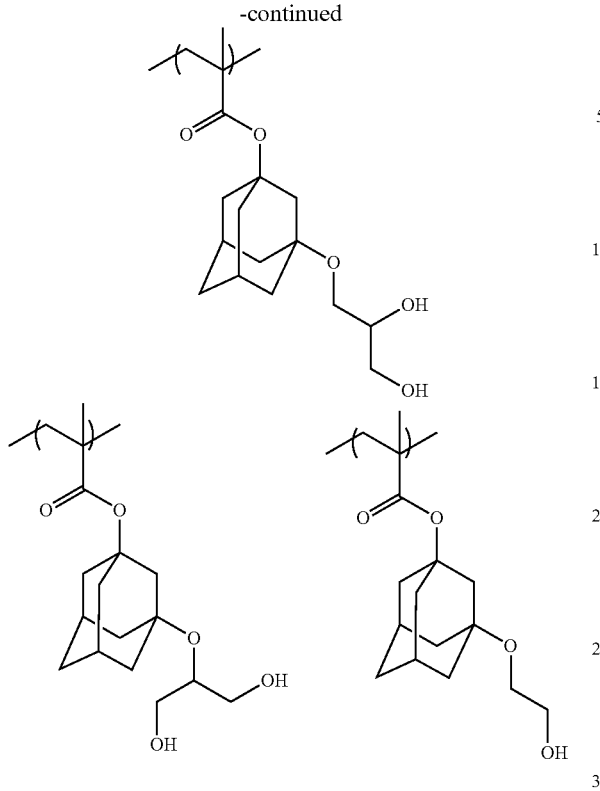

In a case where the resin (A) contains a repeating unit which has a hydroxyl group or a cyano group, the content of the repeating unit which has a hydroxyl group or a cyano group is preferably 3 mol % to 25 mol % with respect to all of the repeating units in the resin (A), and more preferably 5 mol % to 15 mol %.

The resin (A) may have a repeating unit which has an acid group.

The resin (A) may or may not contain a repeating unit which has an acid group; however, when contained, the content of the repeating unit which has an acid group is preferably 25 mol % or less with respect to all of the repeating units in the resin (A), and more preferably 20 mol % or less. In a case where the resin (A) contains a repeating unit which has an acid group, the content of the repeating unit which has an acid group in the resin (A) is generally 1 mol % or more.

Specific examples of the repeating unit which has an acid group will be given below; however, the present invention is not limited thereto.

In the specific examples, Rx represents H, $CH_3$, $CH_2OH$, or $CF_3$.

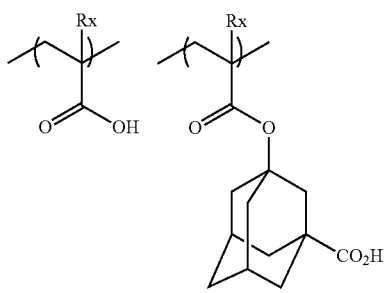

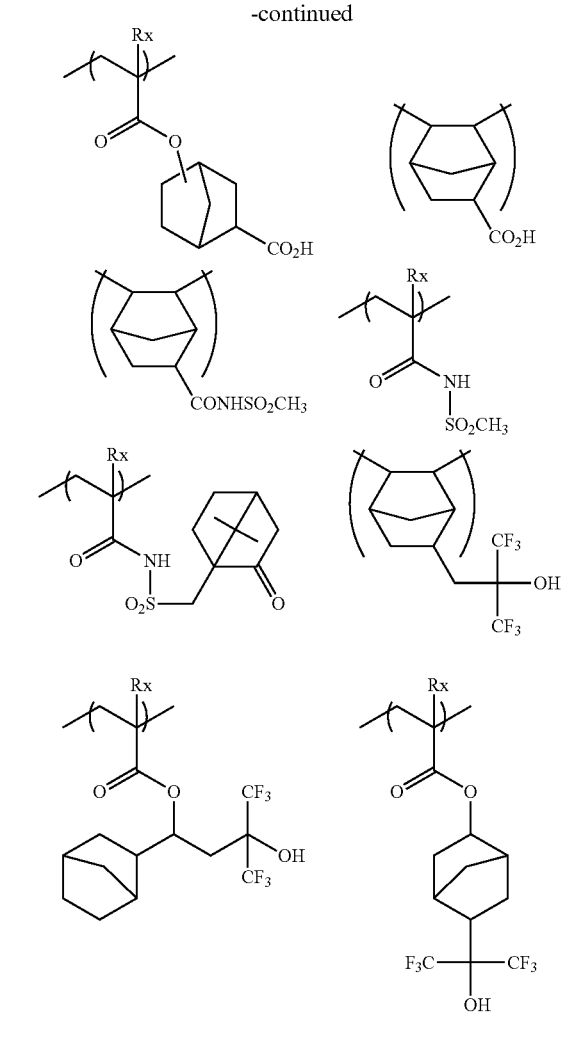

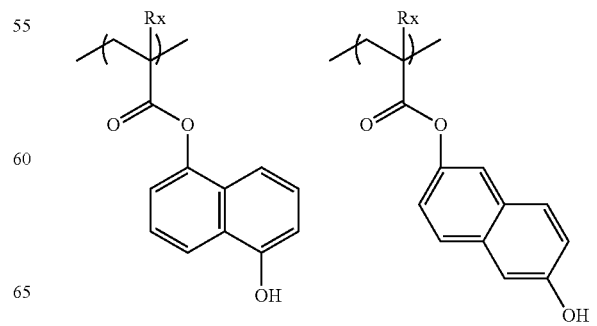

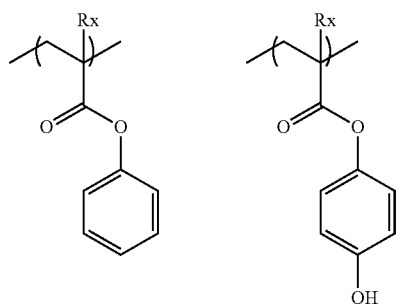

The resin (A) is able to further have a repeating unit which has an alicyclic hydrocarbon structure which does not have a polar group (for example, the acid group, the hydroxyl group, and the cyano group) and/or an aromatic ring structure, and does not exhibit acid-decomposability.

The content of this repeating unit is preferably 1 mol % to 50 mol % with respect to all of the repeating units in the resin (A), more preferably 5 mol % to 50 mol %, and even more preferably 5 mol % to 30 mol %.

Specific examples of the repeating units which have an alicyclic hydrocarbon structure which does not have a polar group, and which does not exhibit acid-decomposability will be given below; however, the present invention is not limited thereto. In the formula, Ra represents H, $CH_3$, $CH_2OH$, or $CF_3$.

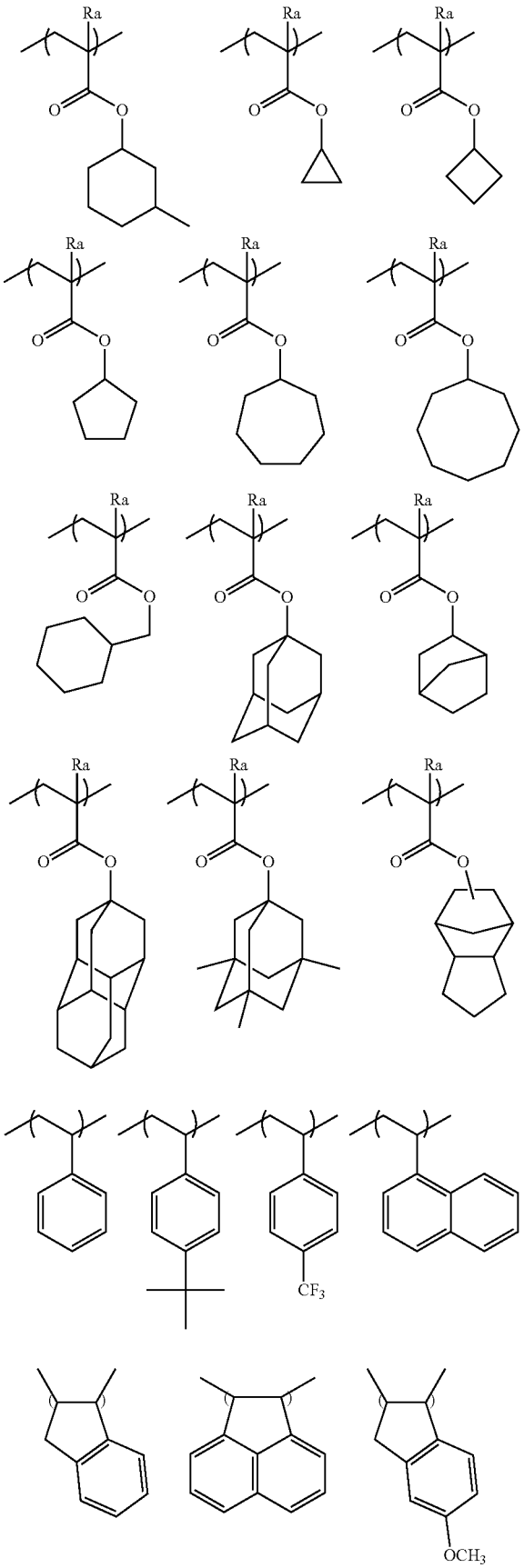

-continued

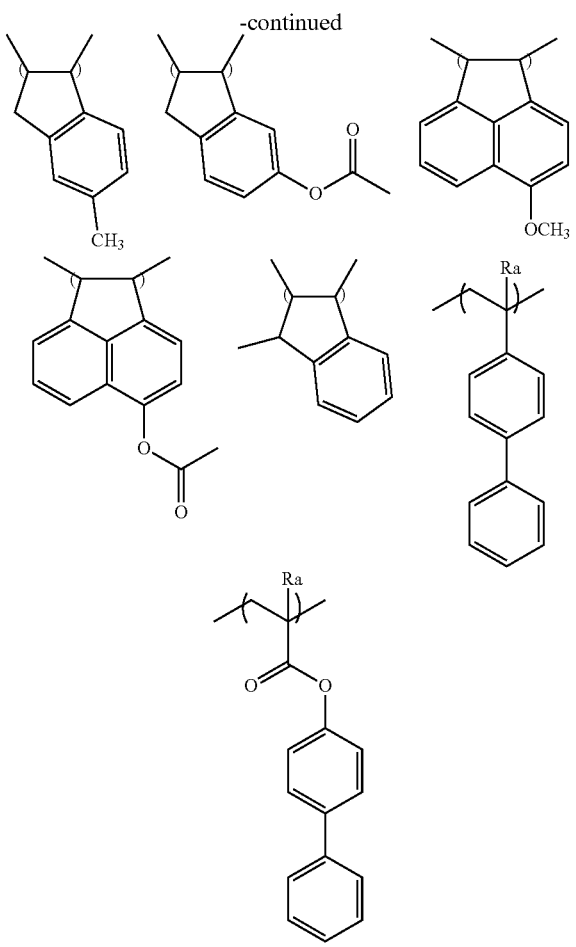

The form of the resin (A) in the present invention may be any form of a random type, a block type, a comb type, or a star type. It is possible to synthesize the resin (A), for example, by radical, cation, or anion polymerization of the unsaturated monomer which corresponds to each structure. In addition, it is also possible to obtain a desired resin by performing a polymer reaction after carrying out polymerization using unsaturated monomers which correspond to the precursor bodies of each structure.

When the resin composition (1) is used for ArF exposure, from the point of the transparency to ArF light, the resin (A) which is used for the resin composition (1) preferably substantially does not have an aromatic ring (in detail, in the resin, the ratio of the repeating units which have an aromatic group is preferably 5 mol % or less, more preferably 3 mol % or less, and ideally 0 mol %, that is, the resin does not have an aromatic group) and the resin (A) preferably has a monocyclic or polycyclic alicyclic hydrocarbon structure.

In a case where the resin composition (1) includes a resin (D) which will be described below, the resin (A) preferably does not contain a fluorine atom or a silicon atom from the viewpoint of mutual solubility with the resin (D).

As the resin (A) which is used for the resin composition (1), a resin where all of the repeating units are formed of (meth)acrylate-based repeating units is preferable. In this case, it is possible to use any of a resin where all of the repeating units are methacrylate-based repeating units, a resin where all of the repeating units are acrylate-based repeating units, and a resin where all of the repeating units are formed by methacrylate-based repeating units and acrylate-based repeating units; however, the acrylate-based repeating units are preferably 50 mol % or less of all of the repeating units.

In a case of irradiating the resin composition (1) with KrF excimer laser light, electron beam, X-rays, and high energy rays with a wavelength of 50 nm or less (EUV and the like), the resin (A) may have a repeating unit which has an aromatic ring. The repeating unit which has an aromatic ring is not particularly limited and, additionally, although examples are given in the description relating to each of the repeating units, examples thereof include a styrene unit, a hydroxyl styrene unit, a phenyl (meth)acrylate unit, a hydroxyphenyl (meth)acrylate units, and the like. In more detail, examples of the resin (A) include a resin which has a hydroxylstrene-based repeating unit and a hydroxyl styrene-based repeating unit which is protected by an acid-decomposable group, a resin which has a repeating unit which has the aromatic ring described above and a repeating unit where a carbonic acid site of (meth)acrylic acid is protected by an acid-decomposable group, and the like. Here, in particular, at the time of EUV exposure, since high sensitivity is generally required, the resin (A) preferably includes a repeating unit which contains a protective group which is easily decomposed by acid. Specifically, as the repeating unit, in the structures described as groups which decomposes by an action of an acid described above, preferable examples include structures which are represented by —$C(R_{36})(R_{37})(OR_{39})$ or —$C(R_{01})(R_{02})(OR_{39})$ (a so-called acetal-type protecting group).

It is possible to synthesize and purify the resin (A) in the present invention using typical methods (for example, radical polymerization). For the synthesizing methods and purifying methods, refer to, for example, paragraph "0201" to paragraph "0202" in JP2008-292975A.

The weight-average molecular weight of the resin (A) in the present invention is generally 1,000 or more as a polystyrene converted value by GPC method, preferably 7,000 to 200,000, more preferably 7,000 to 50,000, even more preferably 7,000 to 40,000, and particularly preferably 7,000 to 30,000. When the weight-average molecular weight is 7,000 or more, it is possible to suppress the solubility with respect to the organic-type developer from becoming excessively high and there is a tendency to easily form a precise pattern.

A resin where the dispersity (molecular weight distribution Mw/Mn) is generally in a range of 1.0 to 3.0, preferably 1.0 to 2.6, more preferably 1.0 to 2.0, and particularly preferably 1.4 to 2.0 is used. A resin with a smaller molecular weight distribution is excellent in terms of the resolution and the resist shape and the side wall of a resist pattern is smooth and has an excellent roughness property.

In the actinic ray-sensitive or radiation-sensitive resin composition which is used in the present invention, the mixing ratio of the resin (A) in entire composition is preferably 30 mass % to 99 mass % in the entirety of the solid content, and more preferably 60 mass % to 95 mass %.

In addition, in the present invention, the resin (A) may be used as one type or a plurality thereof may be used together.

Specific examples of the resin (A) (the composition ratio of the repeating units is a molar ratio) will be given below; however, the present invention is not limited thereto. Here, aspects in a case where a structure which corresponds to an acid generating agent (B) which will be described below is supported by the resin (A) will be also exemplified below.

71
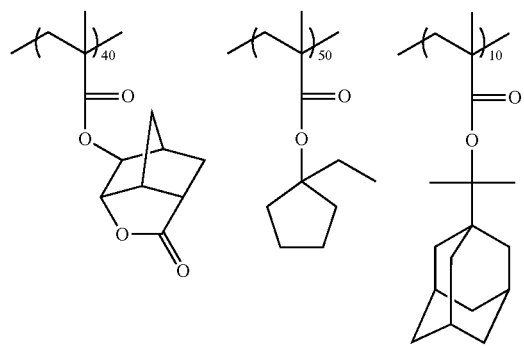
Mw: 9500
Mw/Mn: 1.6
72
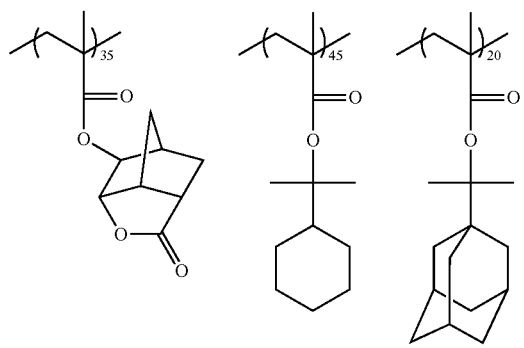
Mw: 16300
Mw/Mn: 1.7
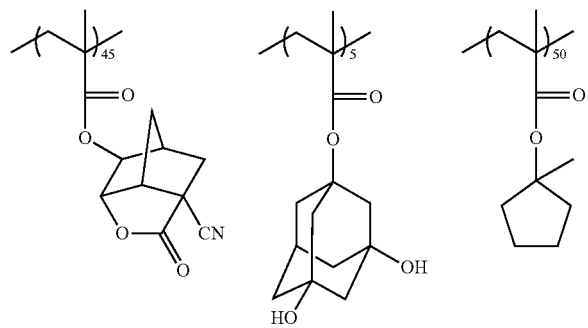
Mw: 11100
Mw/Mn: 1.6
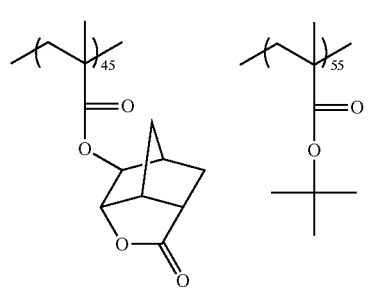
Mw: 18000
Mw/Mn: 1.70
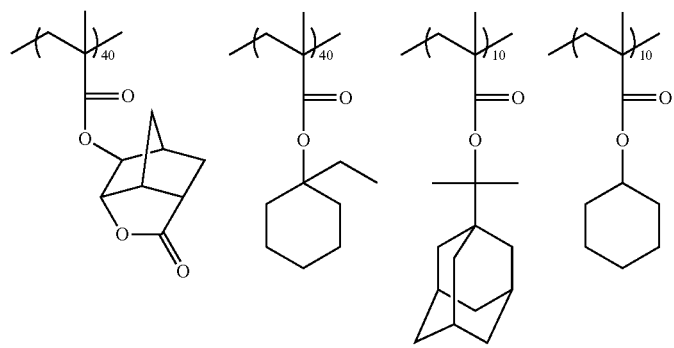
Mw: 13500
Mw/Mn: 1.7
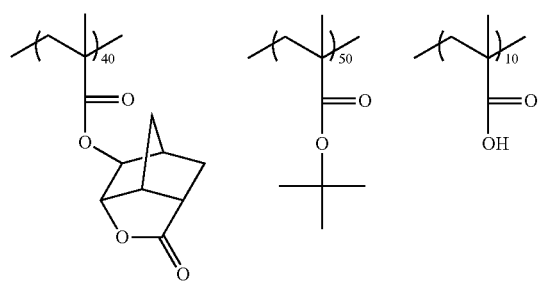
Mw: 15500
Mw/Mn: 1.7

-continued
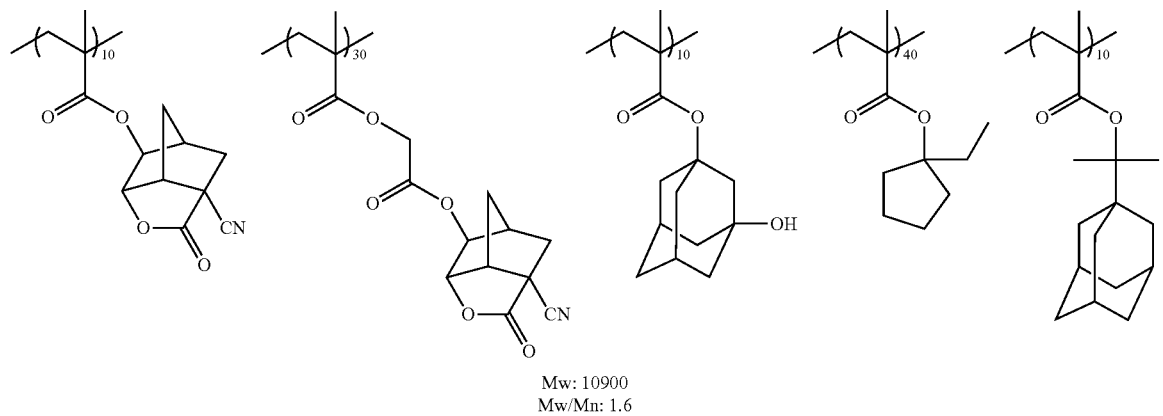
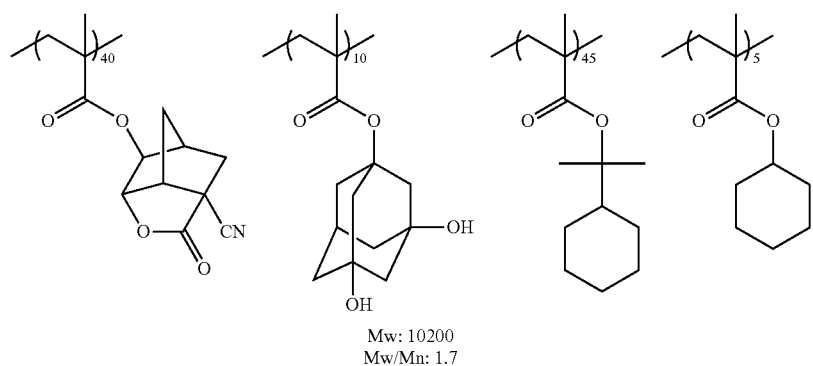
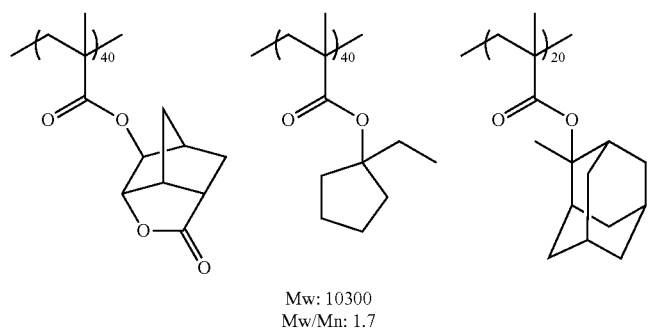
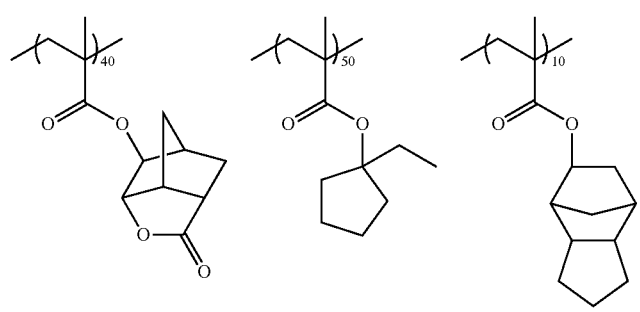

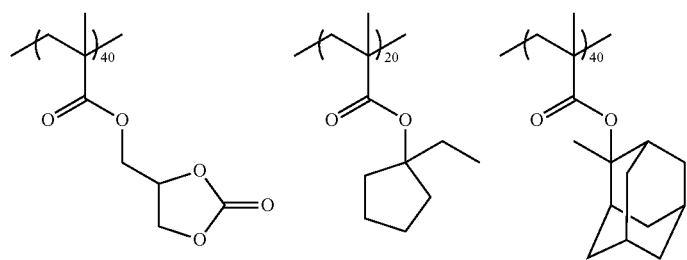
Mw: 7100
Mw/Mn: 1.6
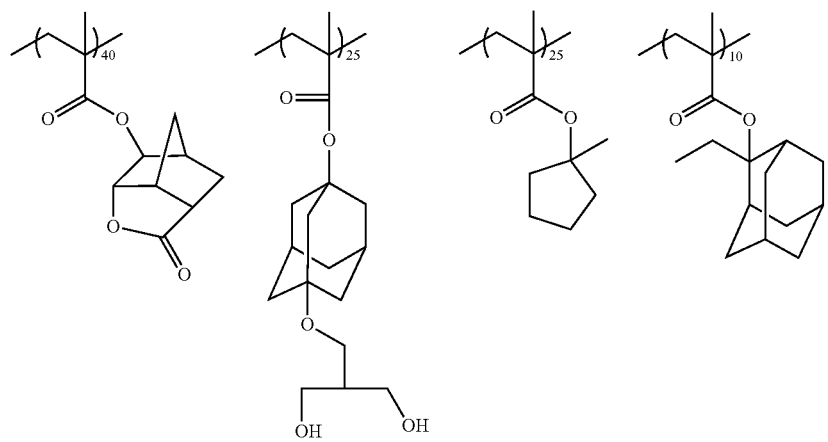
Mw: 6800
Mw/Mn: 1.6
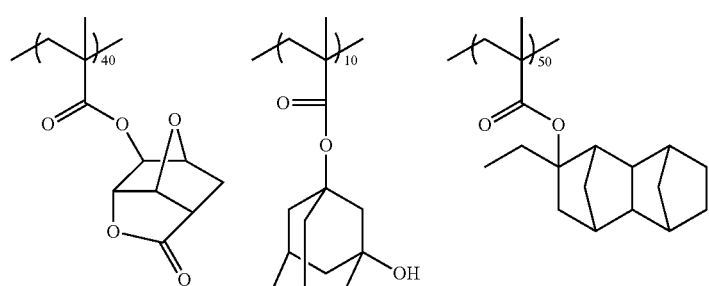
Mw: 10800
Mw/Mn: 1.7
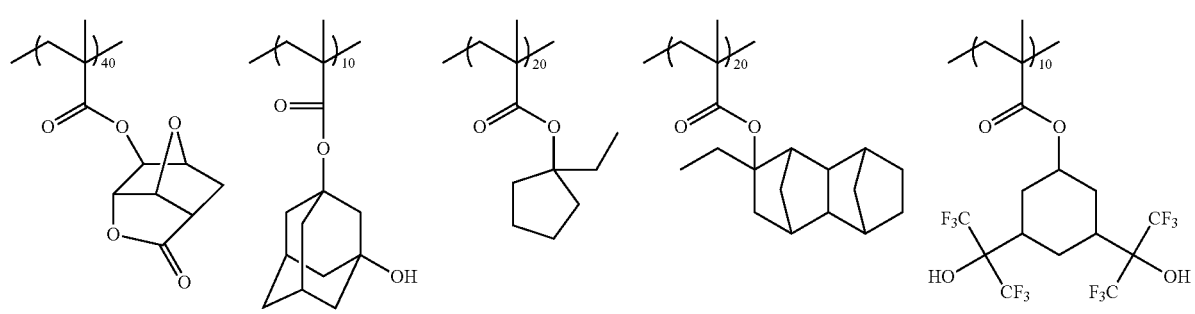
Mw: 9600
Mw/Mn: 1.7

-continued
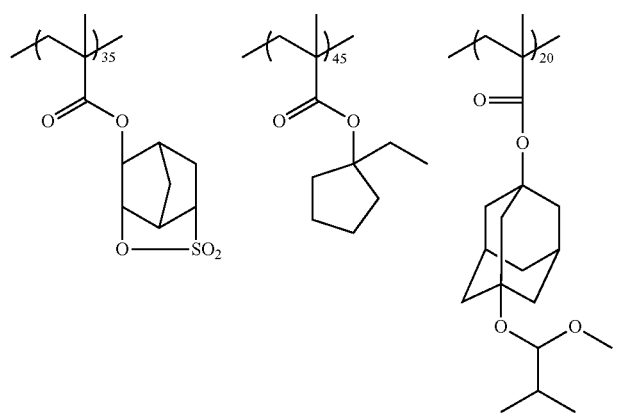
Mw: 10500
Mw/Mn: 1.6
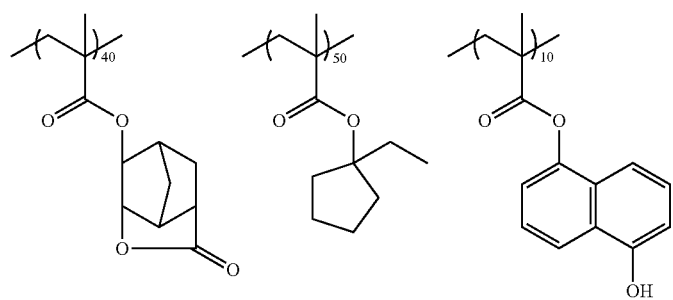
Mw: 8900
Mw/Mn: 1.7
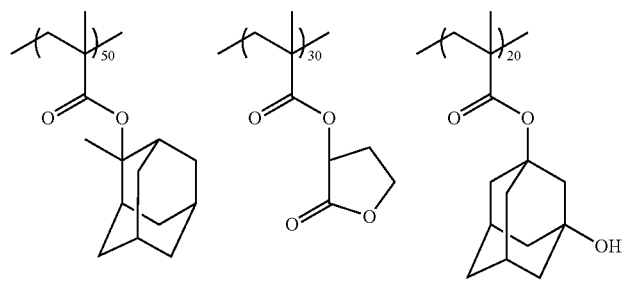
Mw: 11000
Mw/Mn: 1.7
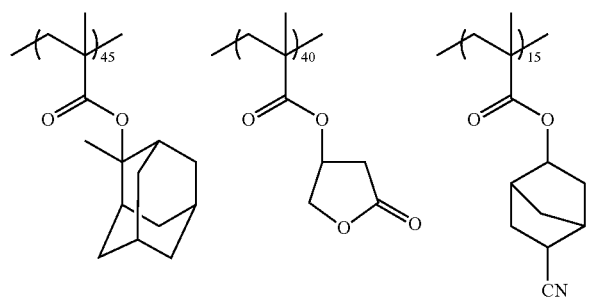
Mw: 9800
Mw/Mn: 1.7

-continued
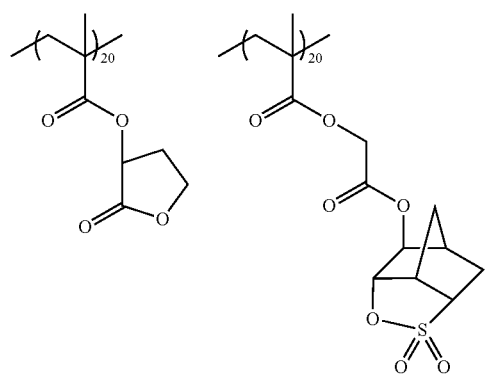
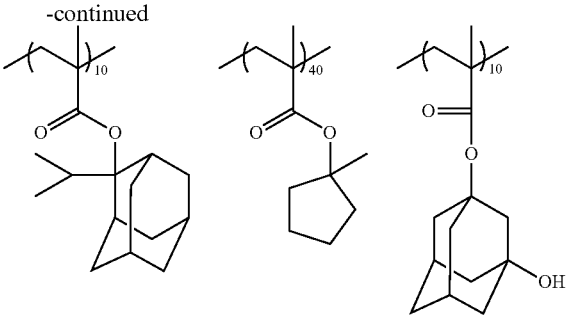
Mw: 11200
Mw/Mn: 1.6
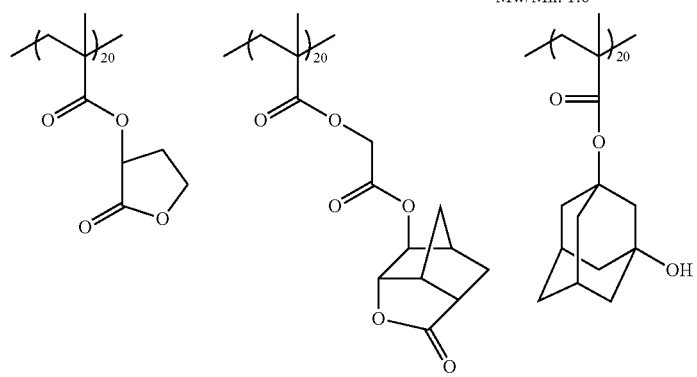
Mw: 9500
Mw/Mn: 1.7
The resins which are exemplified below are the examples of resins that are particularly favorably used at the time of EUV exposure or electron beam exposure.
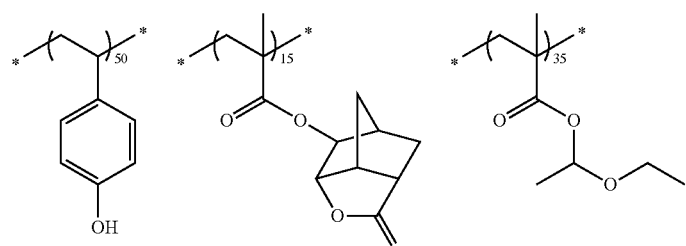
Mw: 10000
Mw/Mn: 1.6
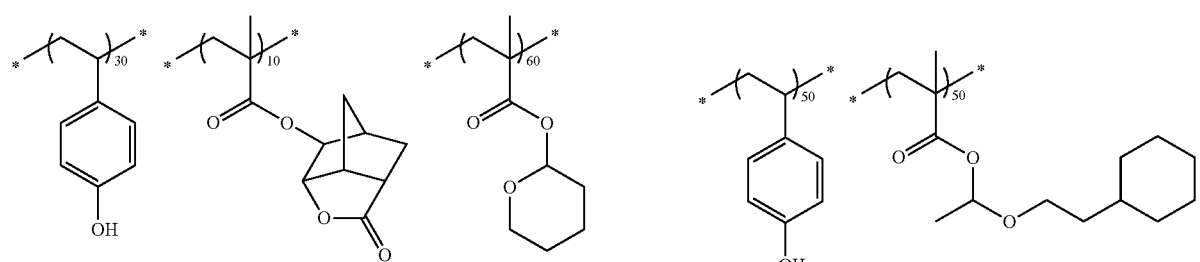
Mw: 8800
Mw/Mn: 1.7
Mw: 12000
Mw/Mn: 1.7

-continued
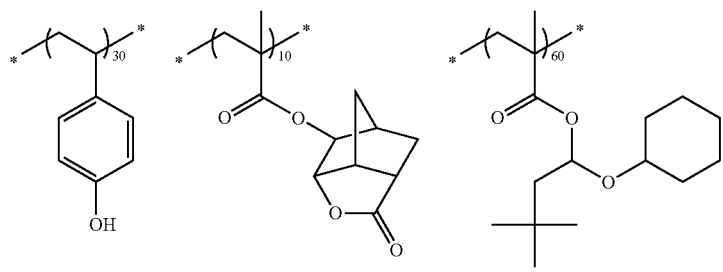
Mw: 20000
Mw/Mn: 1.7
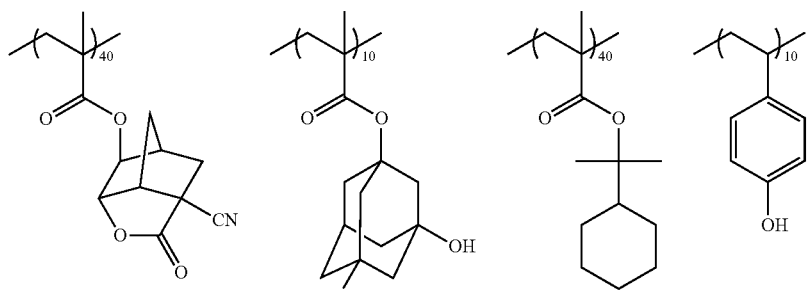
Mw = 10000
Mw/Mn = 1.60
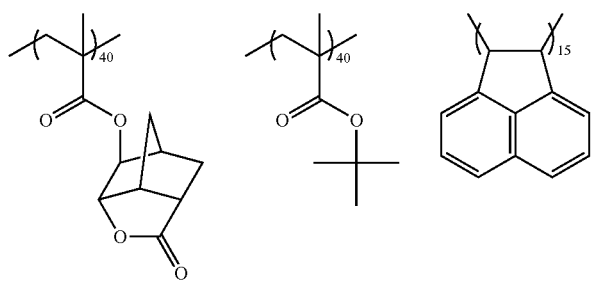
Mw = 7500
Mw/Mn = 1.50
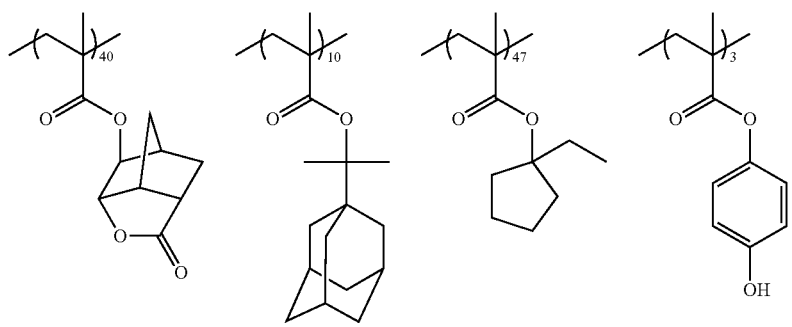
Mw = 11000
Mw/Mn = 1.85

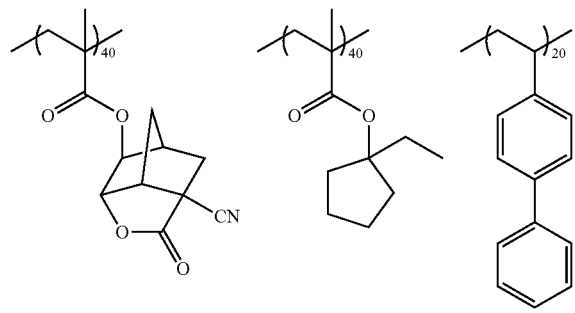
Mw = 7000
Mw/Mn = 1.65
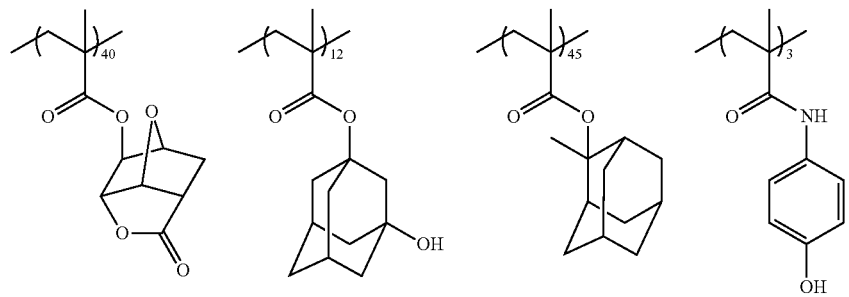
Mw = 8000
Mw/Mn = 1.65
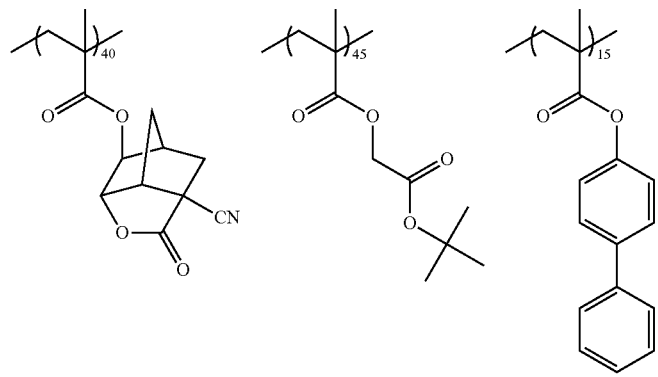
Mw = 19000
Mw/Mn = 1.70
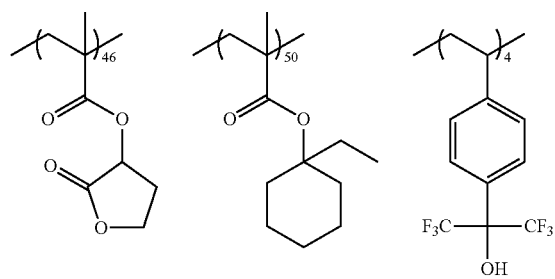
Mw = 26000
Mw/Mn = 1.65

-continued
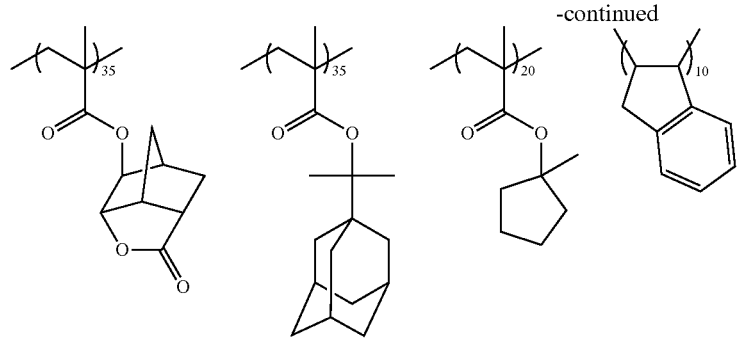
Mw = 21000
Mw/Mn = 1.60
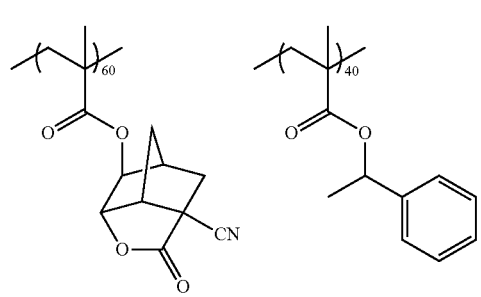
Mw = 6500
Mw/Mn = 1.50
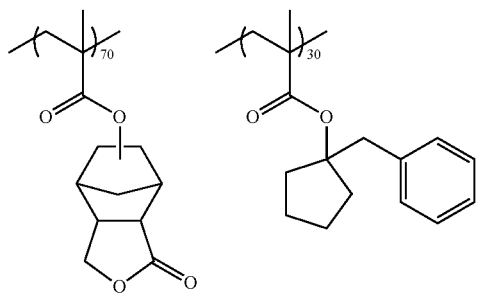
Mw = 8000
Mw/Mn = 1.85
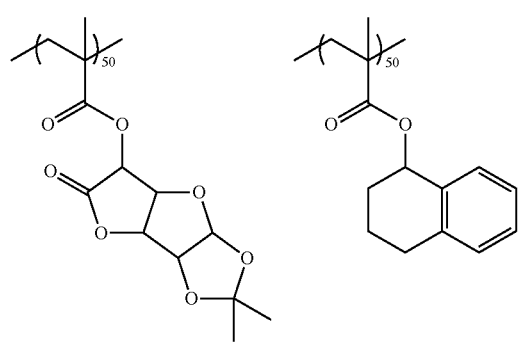
Mw = 28500
Mw/Mn = 1.55
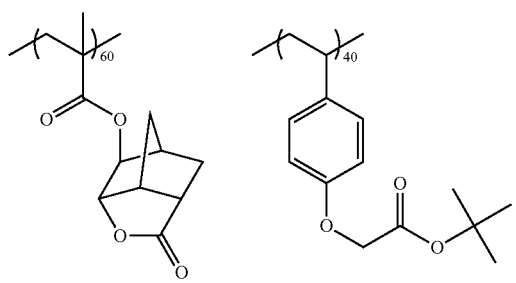
Mw = 7000
Mw/Mn = 1.65
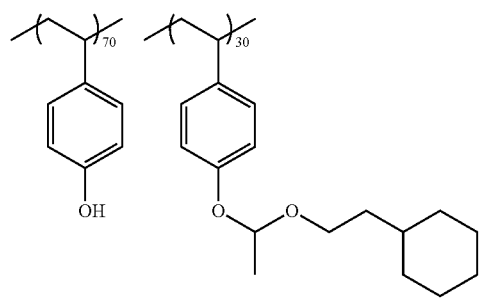
Mw = 15100
Mw/Mn = 1.40
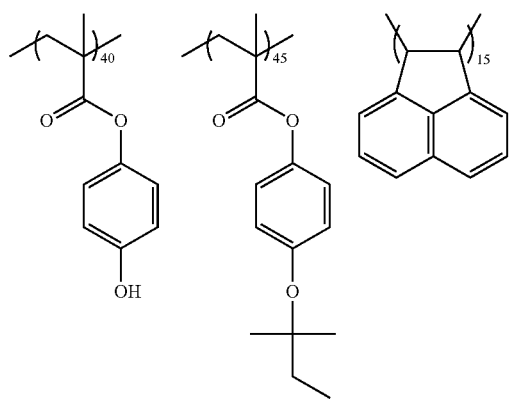
Mw = 8000
Mw/Mn = 1.35

-continued
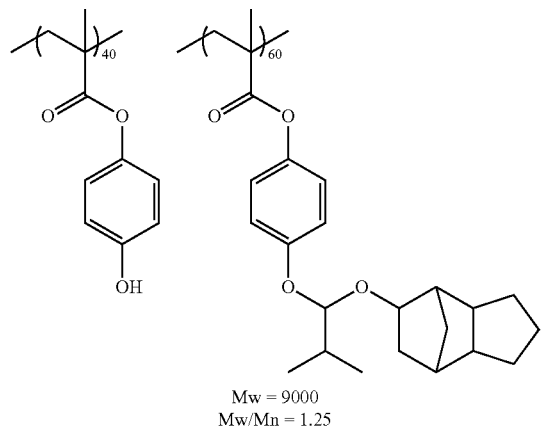
Mw = 9000
Mw/Mn = 1.25
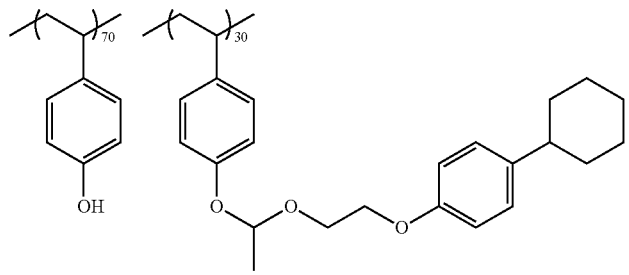
Mw = 4800
Mw/Mn = 1.15
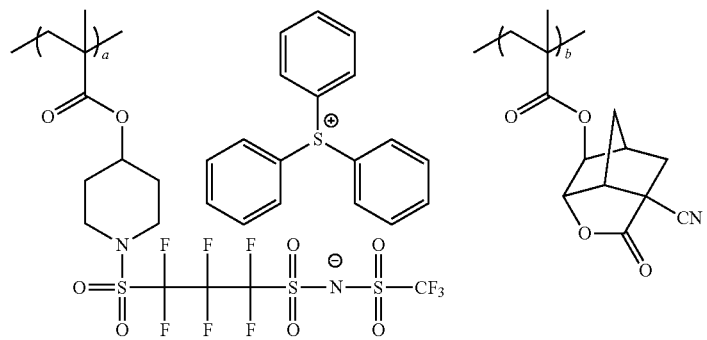
a/b/c/d = 5/43/37/15
Mw = 10500, Mw/Mn = 1.77
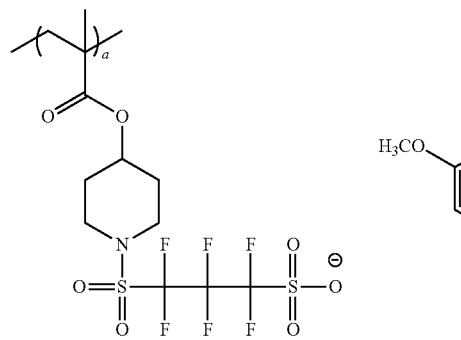
a/b/c = 10/30/60
Mw = 8500, Mw/Mn = 1.78
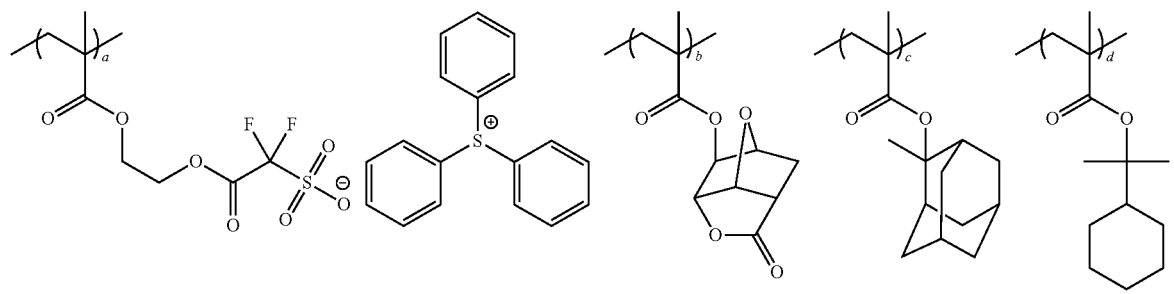
a/b/c/d = 10/40/10/40
Mw = 11500, Mw/Mn = 1.82

-continued
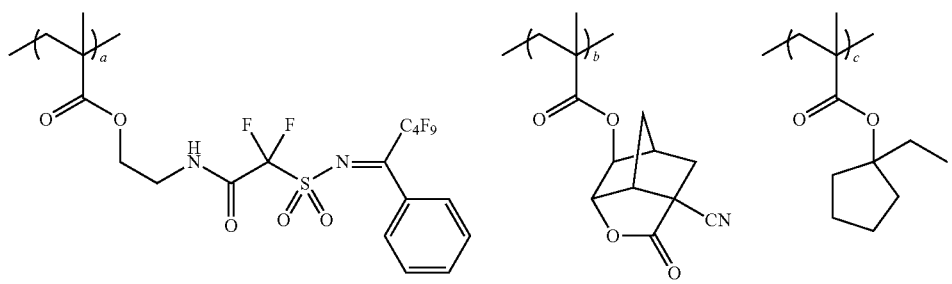
a/b/c = 20/35/45
Mw = 9000, Mw/Mn = 1.68
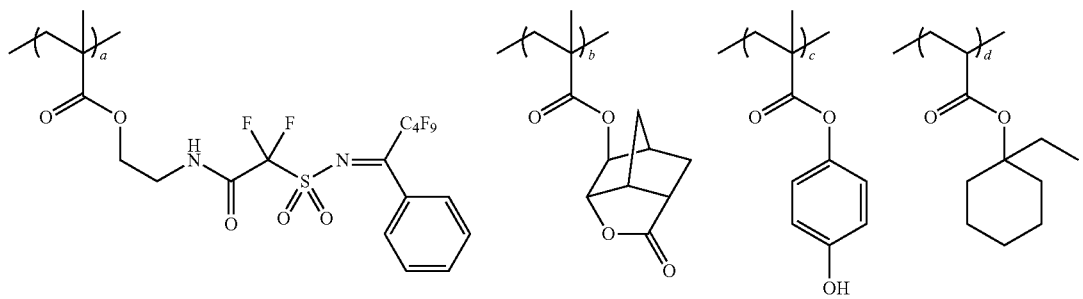
a/b/c/d = 20/15/15/50
Mw = 16000, Mw/Mn = 1.65
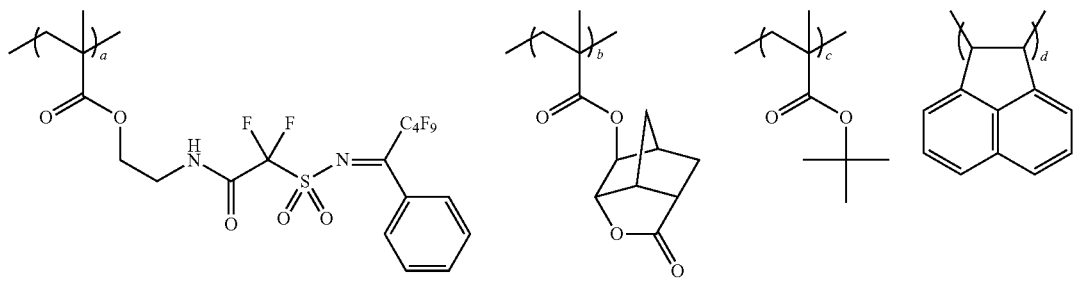
a/b/c/d = 20/20/50/10
Mw = 9500, Mw/Mn = 1.74
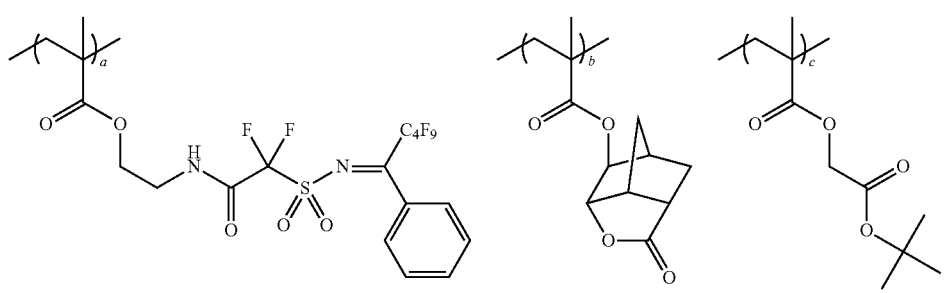
a/b/c = 20/35/45
Mw = 7500, Mw/Mn = 1.55

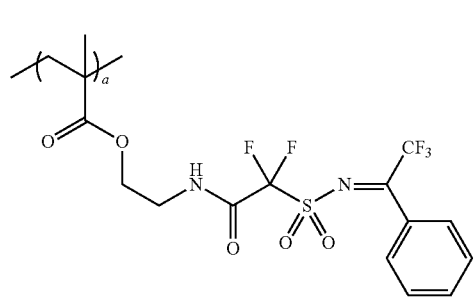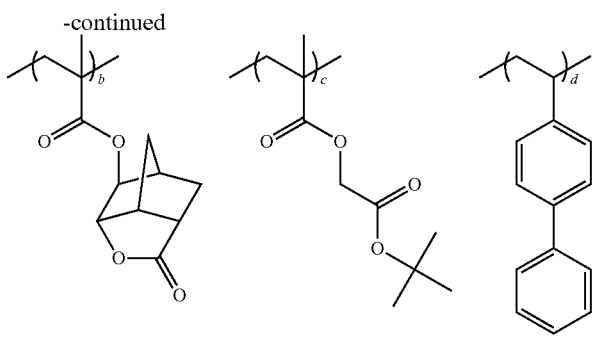
a/b/c/d = 15/30/50/5
Mw = 10000, Mw/Mn = 1.75
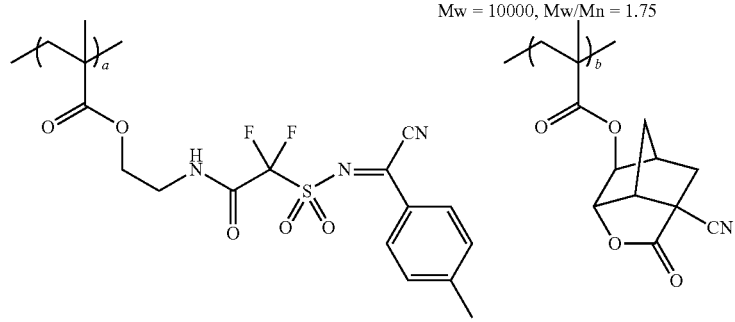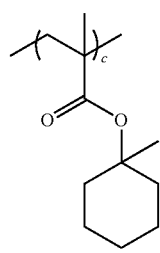
a/b/c = 15/40/45
Mw = 8500, Mw/Mn = 1.72
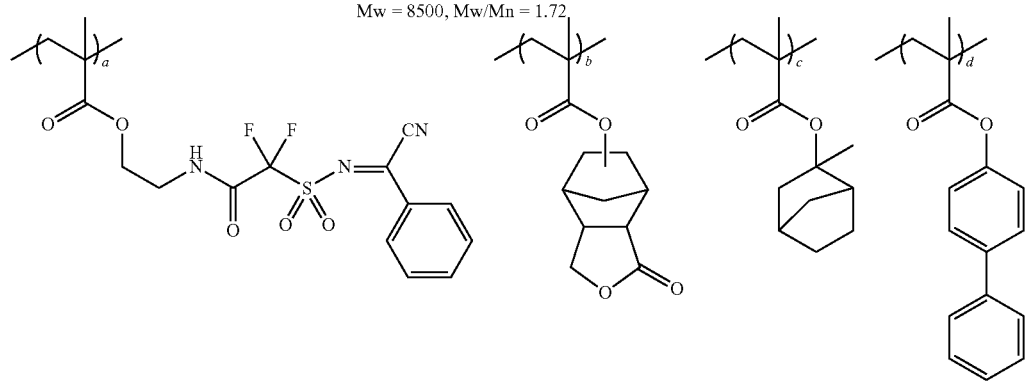
a/b/c/d = 15/25/45/15
Mw = 13000, Mw/Mn = 1.90
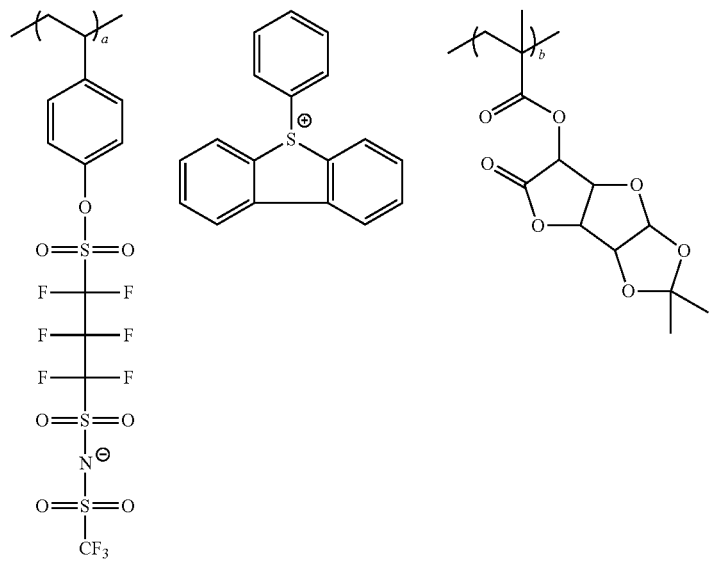
a/b/c = 10/35/55
Mw = 16000, Mw/Mn = 1.80

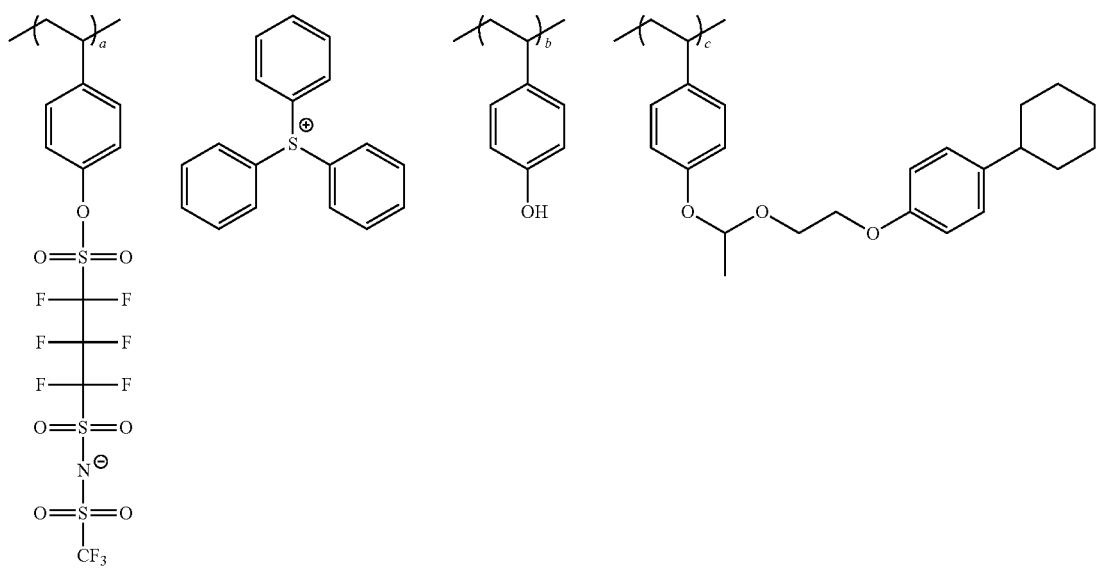
a/b/c = 15/20/65
Mw = 5800, Mw/Mn = 1.15
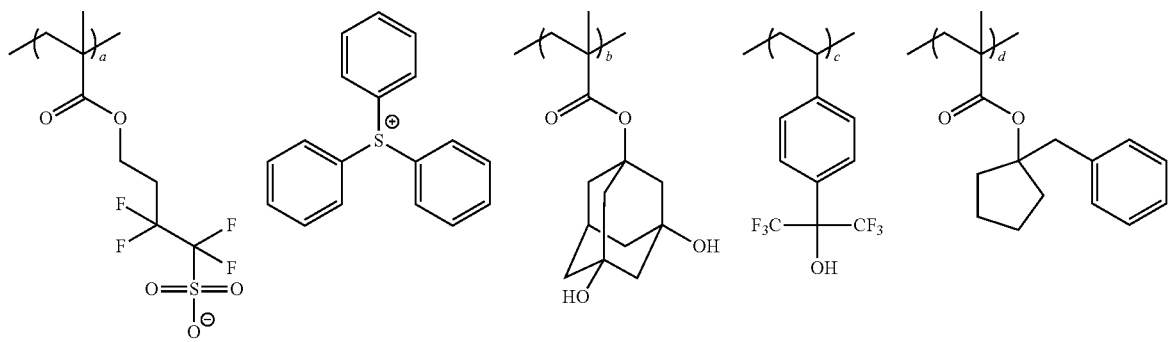
a/b/c/d = 10/30/10/50
Mw = 25000, Mw/Mn = 2.00
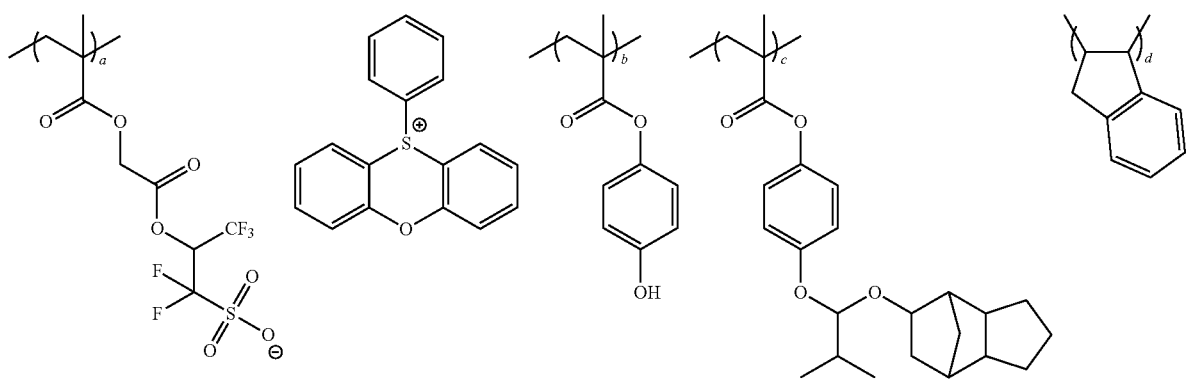
a/b/c/d = 10/25/60/15
Mw = 19000, Mw/Mn = 1.80

-continued
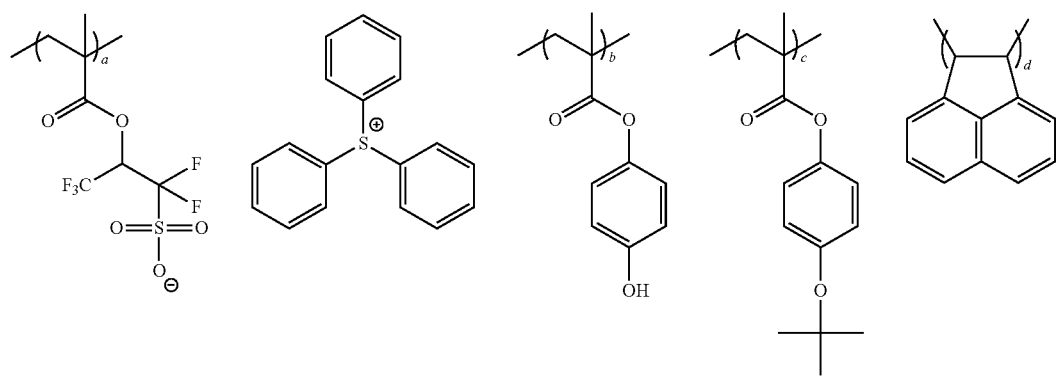
a/b/c/d = 15/15/55/15
Mw = 8500, Mw/Mn = 1.45
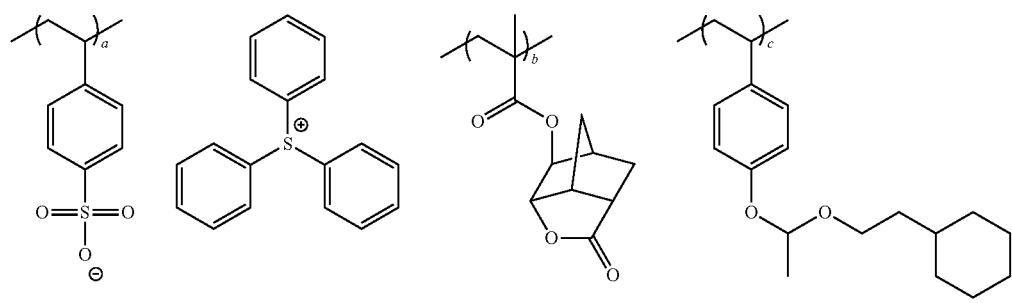
a/b/c = 15/30/55
Mw = 6500, Mw/Mn = 1.40
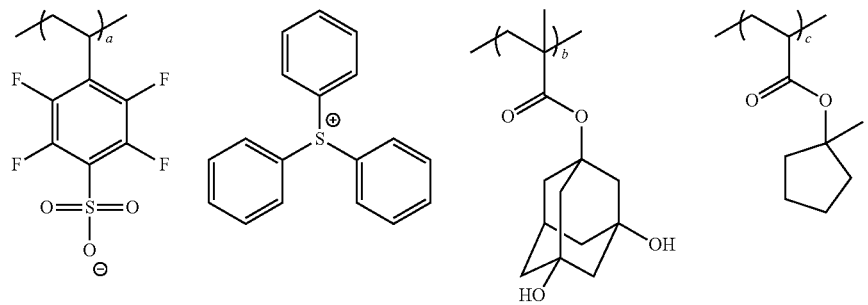
a/b/c = 15/40/45
Mw = 8000, Mw/Mn = 1.50
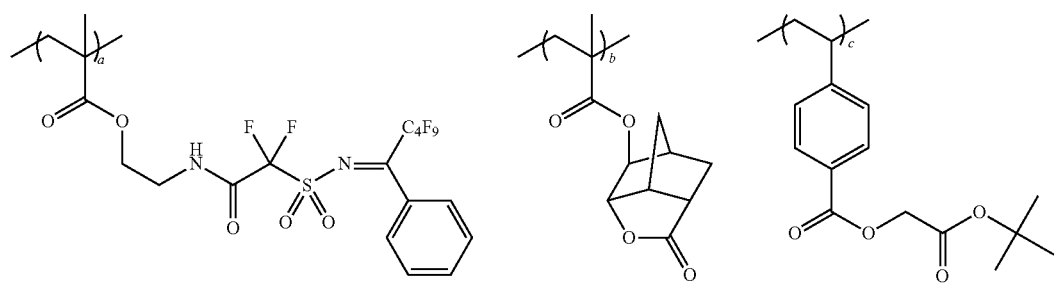
a/b/c = 20/30/50
Mw = 8000, Mw/Mn = 1.75

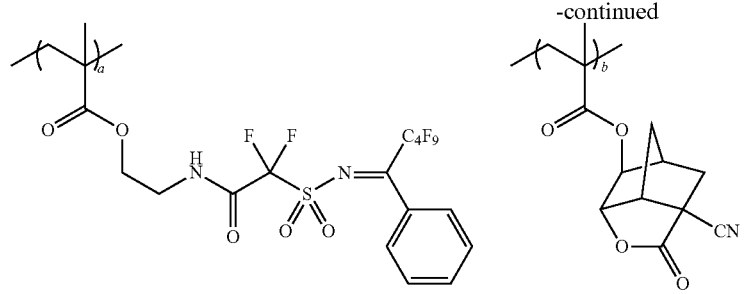

a/b/c/d = 15/25/10/50
Mw = 9000, Mw/Mn = 1.75

[2] Compound which Generates an Acid when Irradiated with Active Rays or Radiation The resin composition (1) generally contains a compound (also referred to below as "compound (B) or an "acid generating agent") which generates an acid when irradiated with active rays or radiation. The compound (B) which generates an acid when irradiated with active rays or radiation is preferably a compound which generates an organic acid when irradiated with active rays or radiation.

As the acid generating agent, it is possible to appropriately select and use a photo-cationic polymerization photoinitiator, a photo-radical polymerization photoinitiator, a colored light-decolorizer, a photodiscoloration agent, a compound known in the art which generates an acid when irradiated with active rays or radiation which is used for microresists and the like, or mixtures thereof.

Examples thereof include diazonium salt, phosphonium salt, sulfonium salt, iodonium salt, imidosulfonate, oxime sulfonate, diazodisulfone, disulfone, and o-nitrobenzyl sulfonate.

Among the acid generating agents, particularly preferable examples will be given below.

(z1)

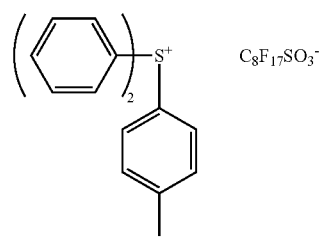

(z2)

(z3)

(z4)

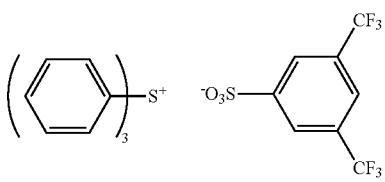

(z5)

(z6)

(z7)

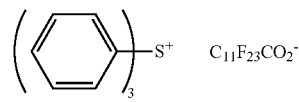

(z8)

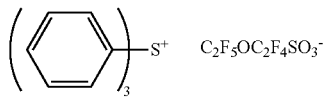

(z9)

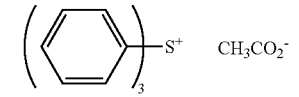

(z10)

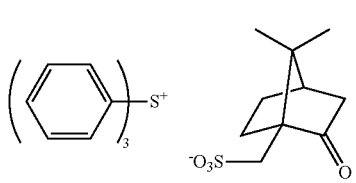

(z11)

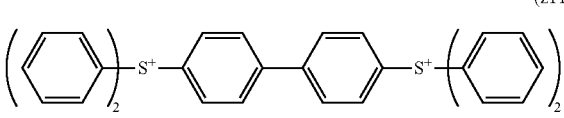
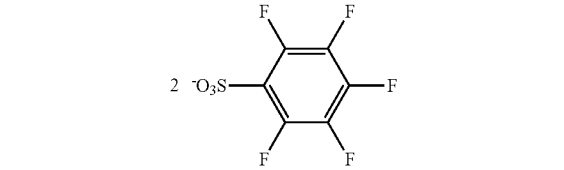

-continued
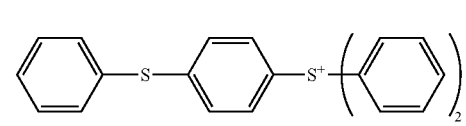 (z12)
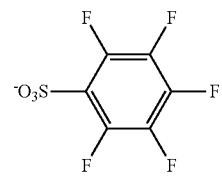
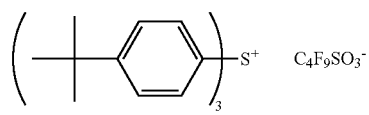 (z13)
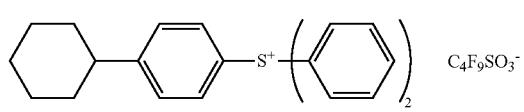 (z14)
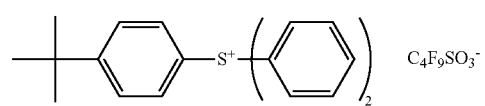 (z15)
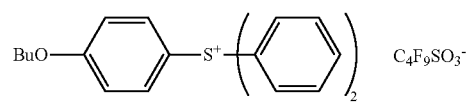 (z16)
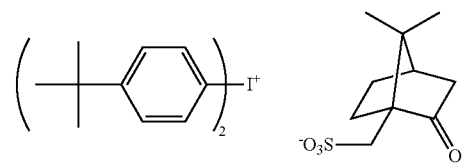 (z17)
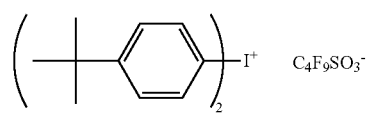 (z18)
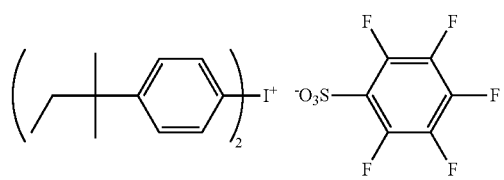 (z19)
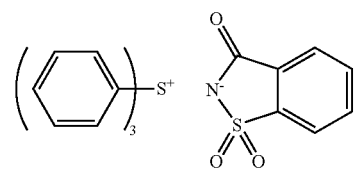 (z20)
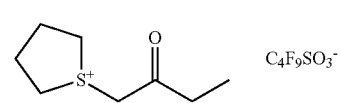 (z21)
-continued
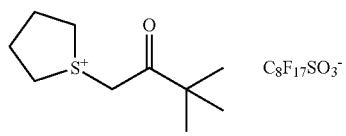 (z22)
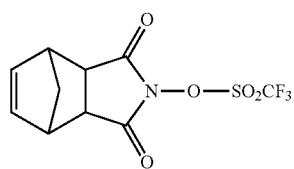 (z23)
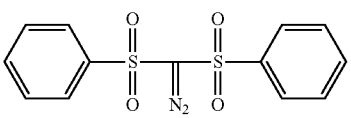 (z24)
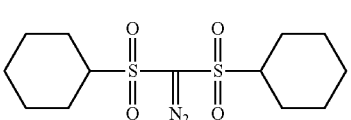 (z25)
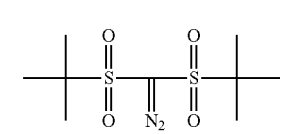 (z26)
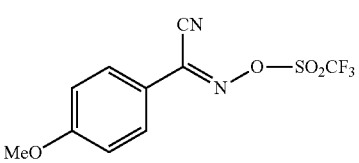 (z27)
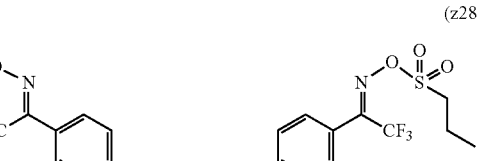 (z28)
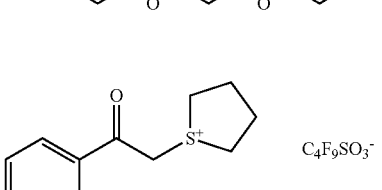 (z29)
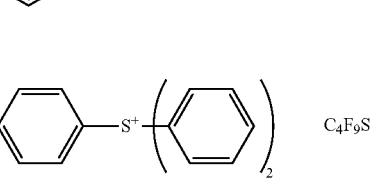 (z30)
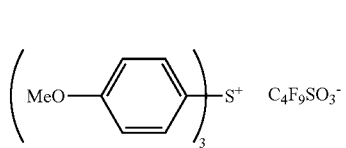 (z31)

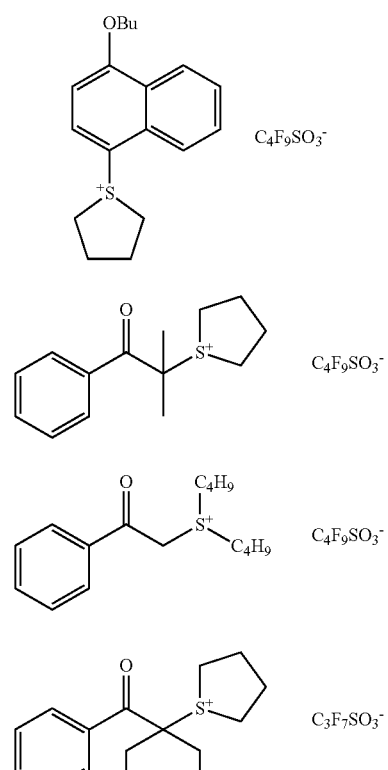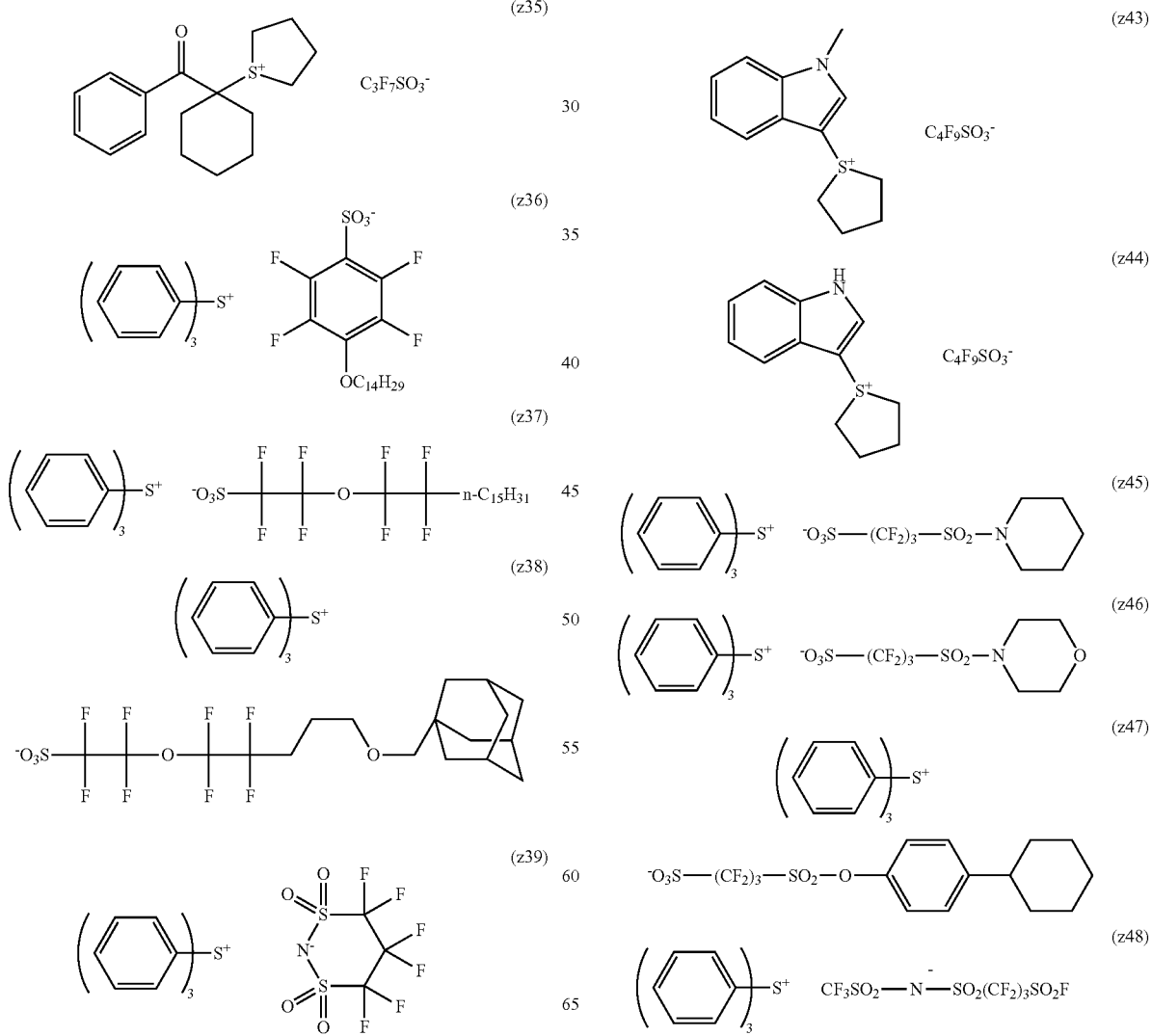

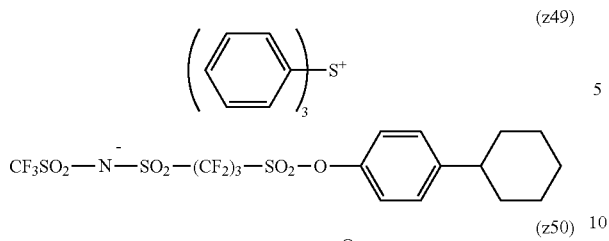
(z49)
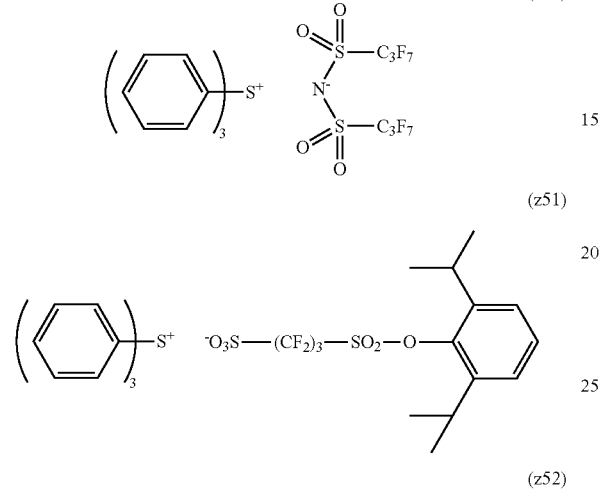
(z50)
(z51)
(z52)
(z53)
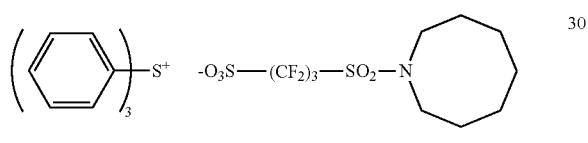
(z54)
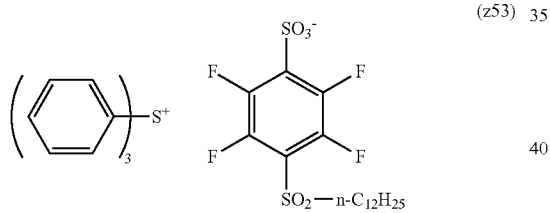
(z55)
(z56)
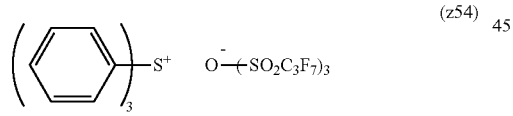
(z57)
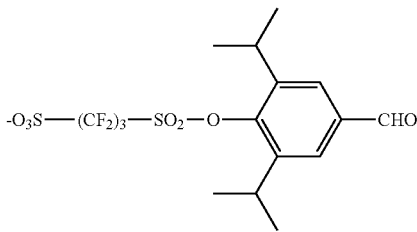
(z57 continued)
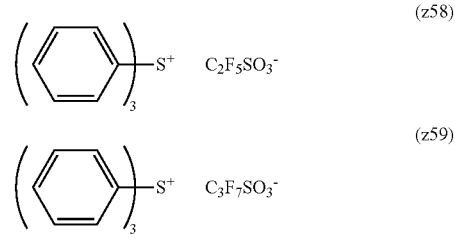
(z58)
(z59)
(z60)
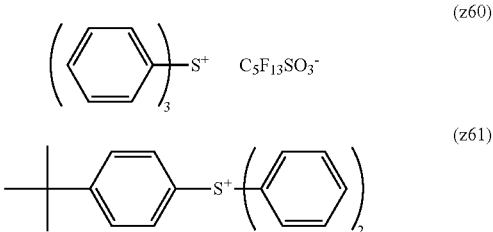
(z61)
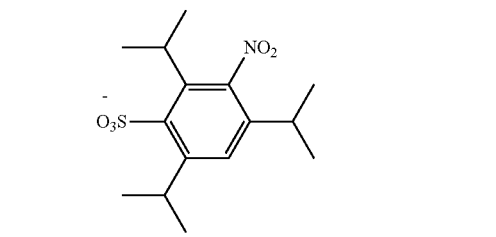
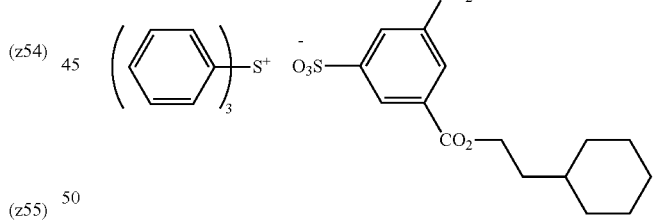
(z62)
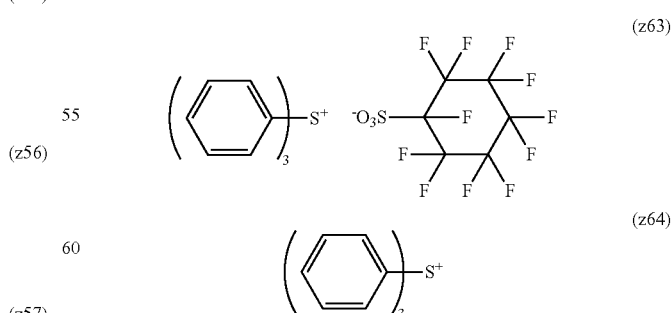
(z63)
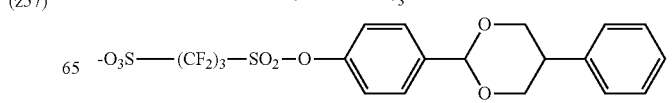
(z64)

-continued
(z65)
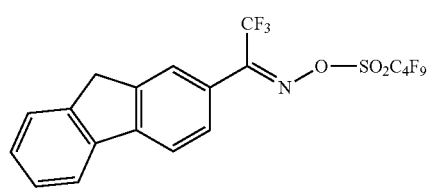
(z66)
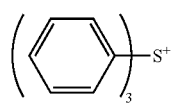
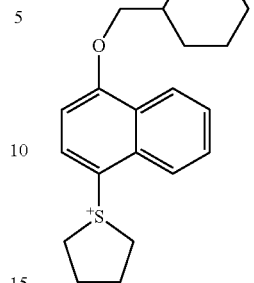
(z67)
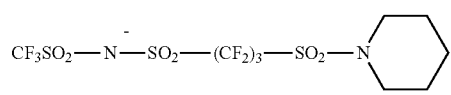
(z68)
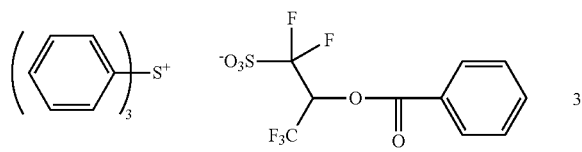
(z69)
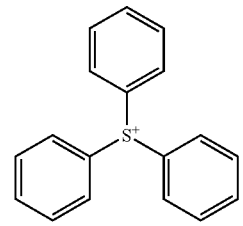 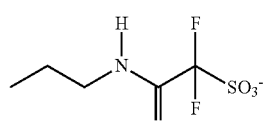
(z70)
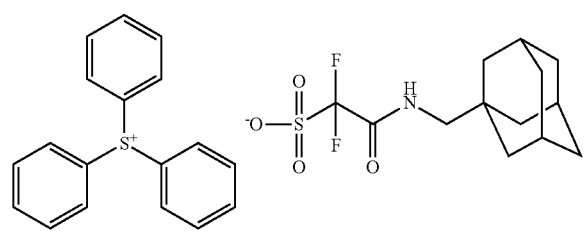
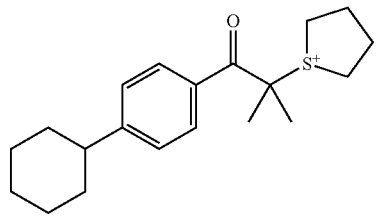
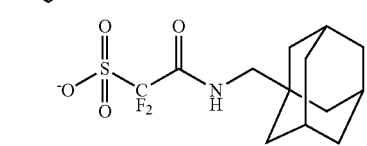
-continued
(z71)
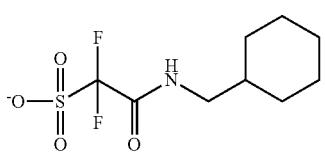
(z72)
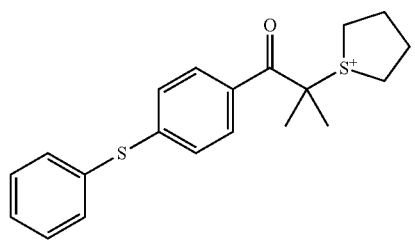
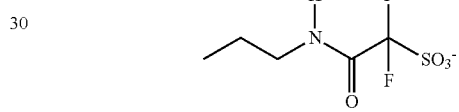
(z73)
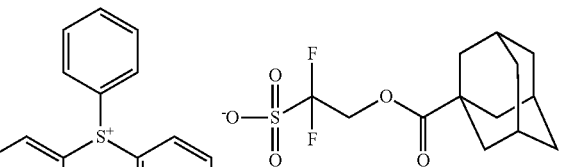
(z74)
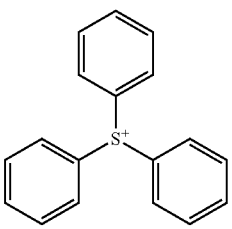
(z75)
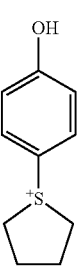 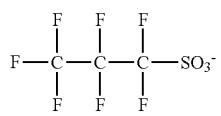

(z76)
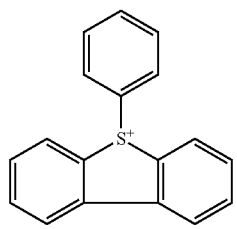 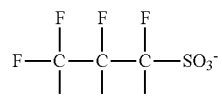
(z77)
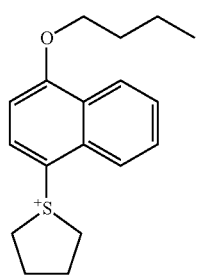 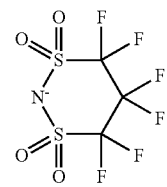
(z78)
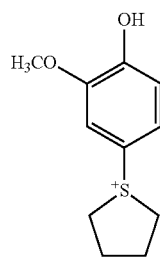 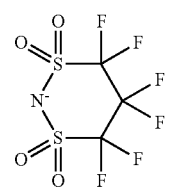
(z79)
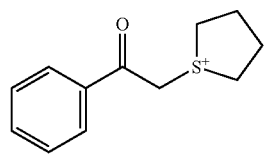
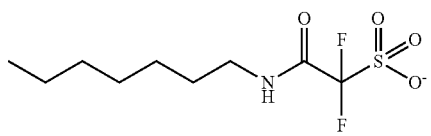
(z80)
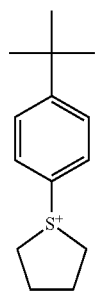 C$_4$F$_9$SO$_3^-$
(z81)
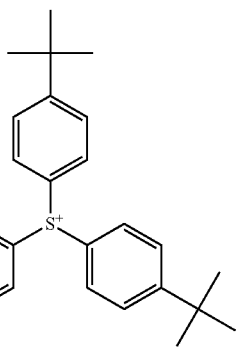
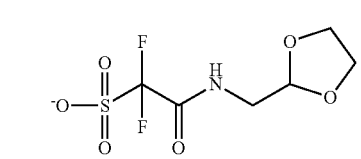
(z82)
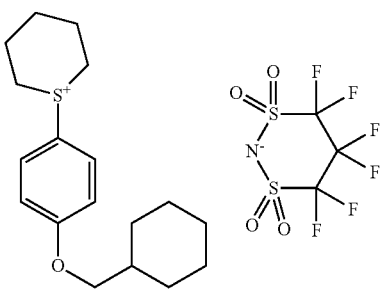
(z83)
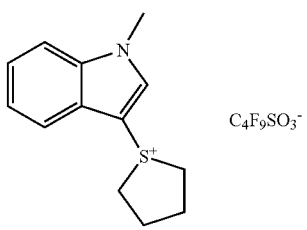 C$_4$F$_9$SO$_3^-$
(z84)
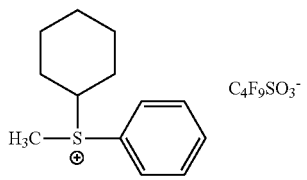 C$_4$F$_9$SO$_3^-$
(z85)
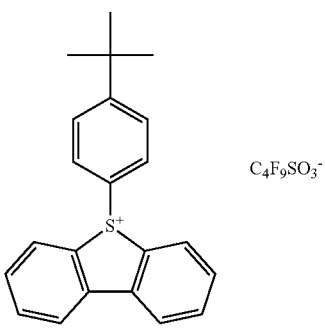 C$_4$F$_9$SO$_3^-$

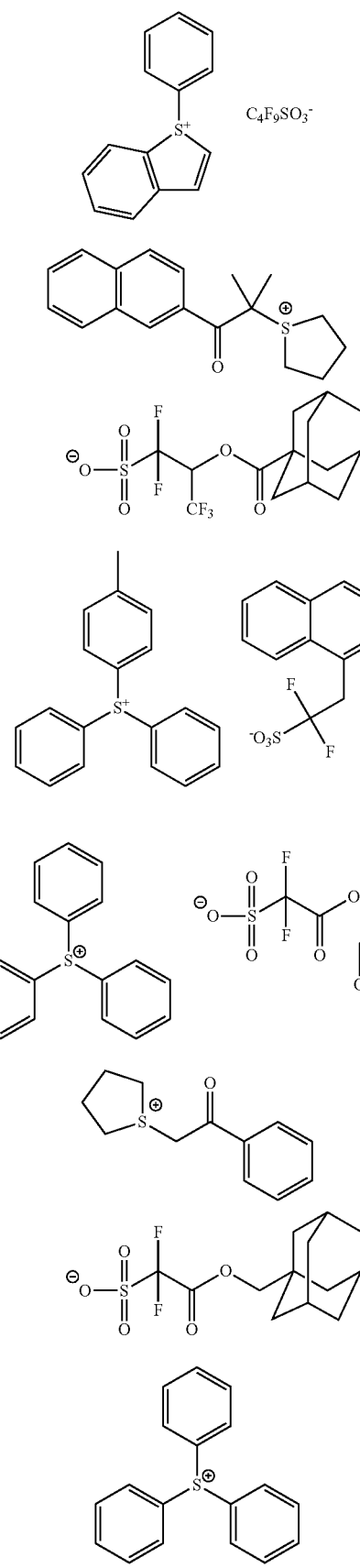
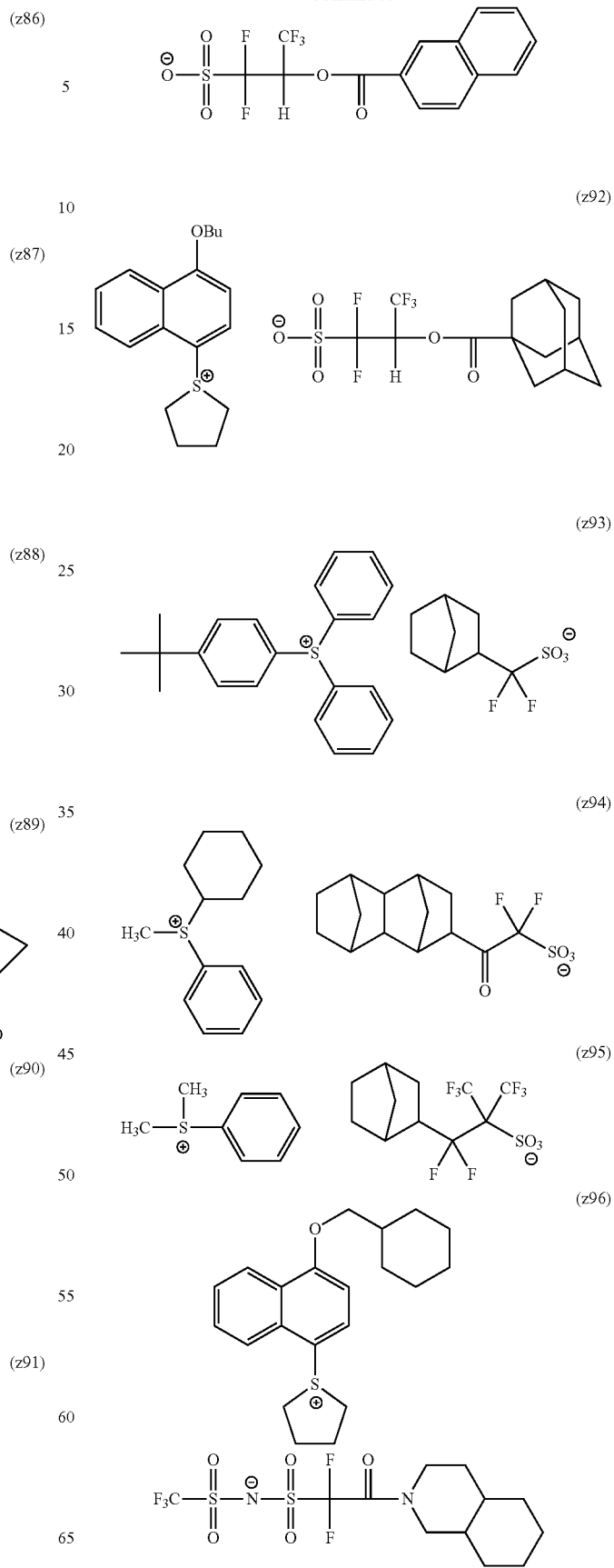

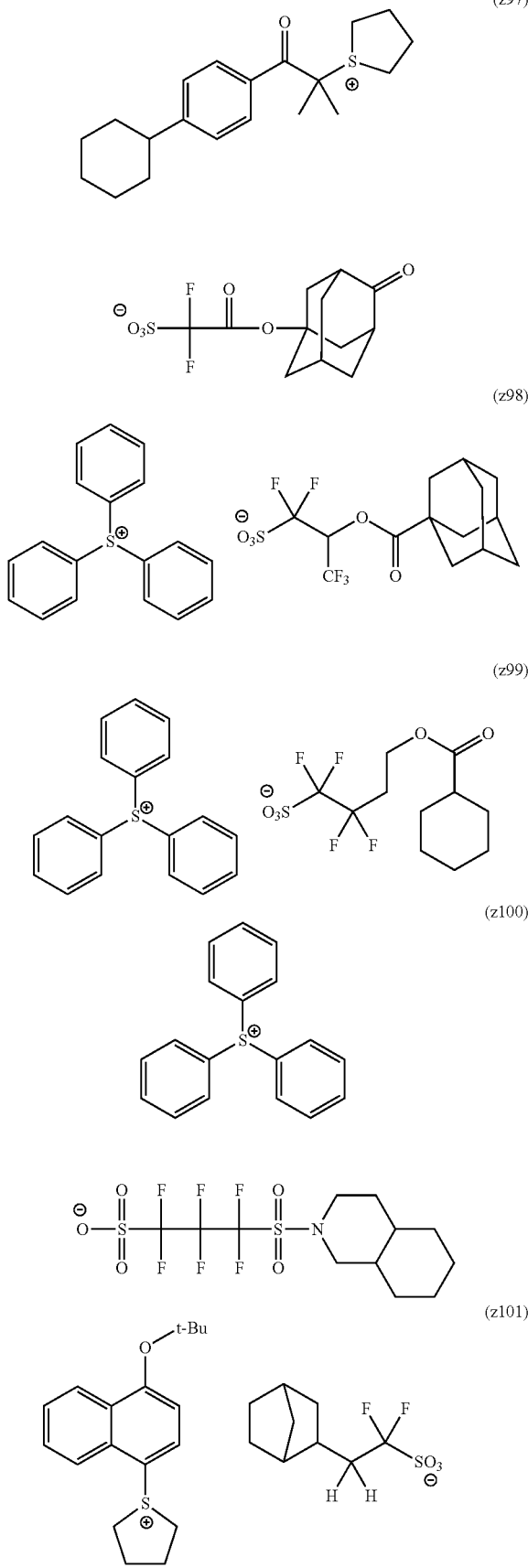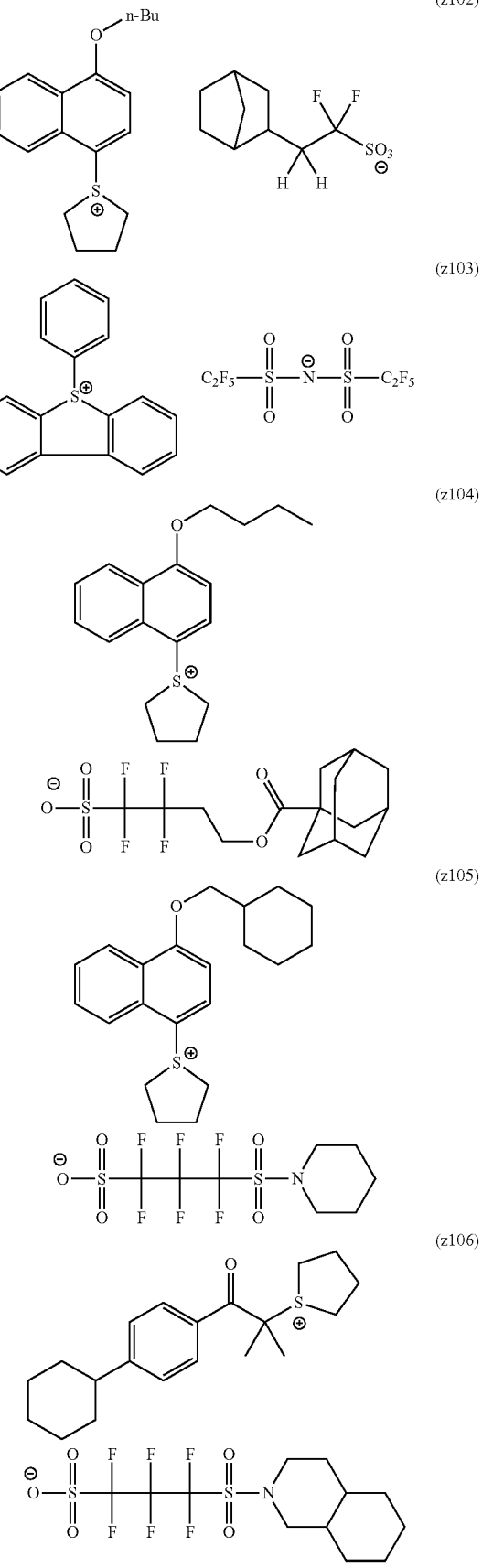

-continued
(z107)
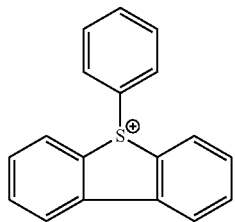
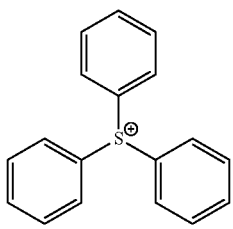
(z108)
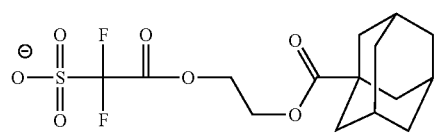
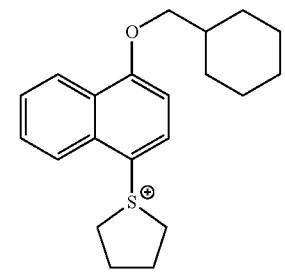
(z111)
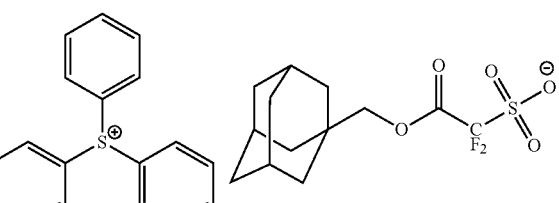
(z109)
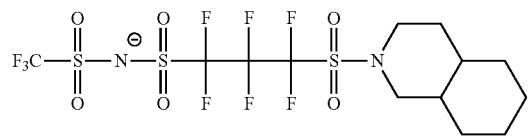
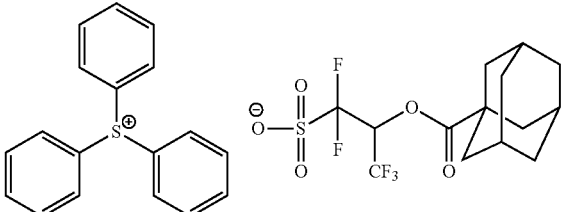
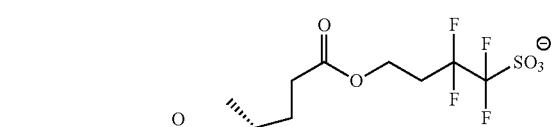
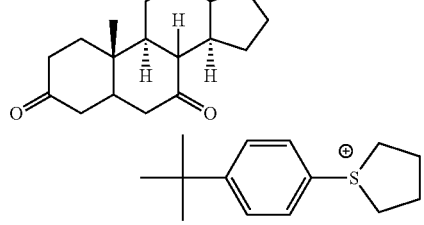
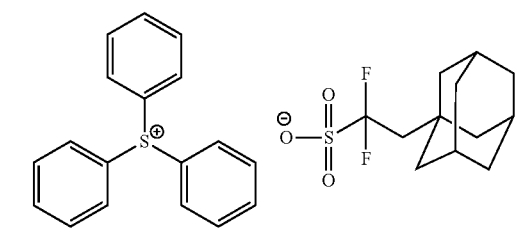
(z110)
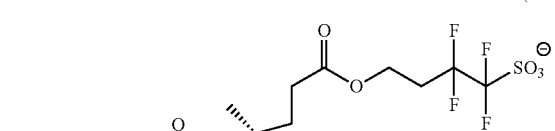
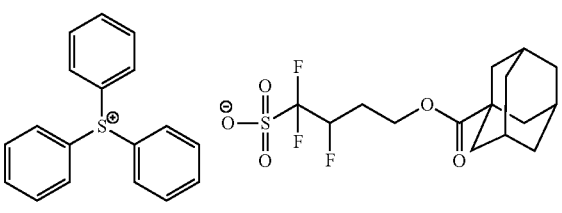
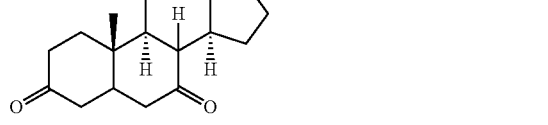
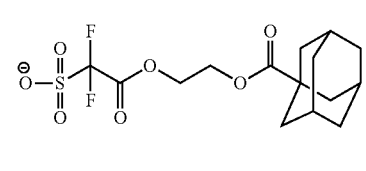

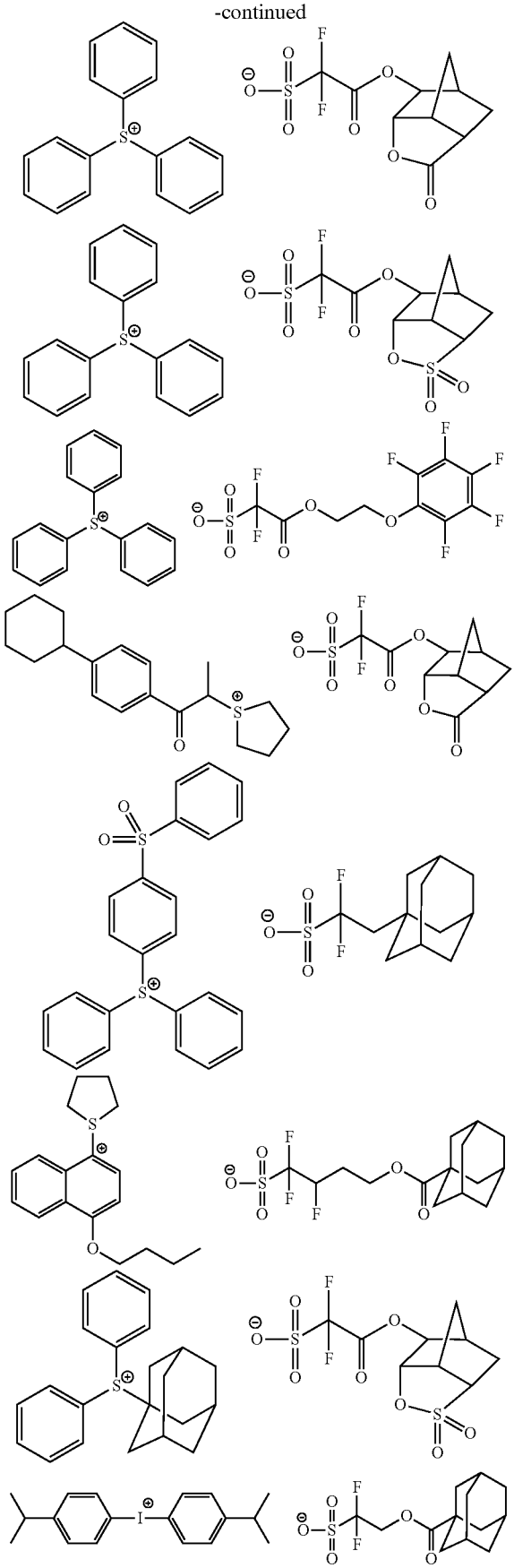
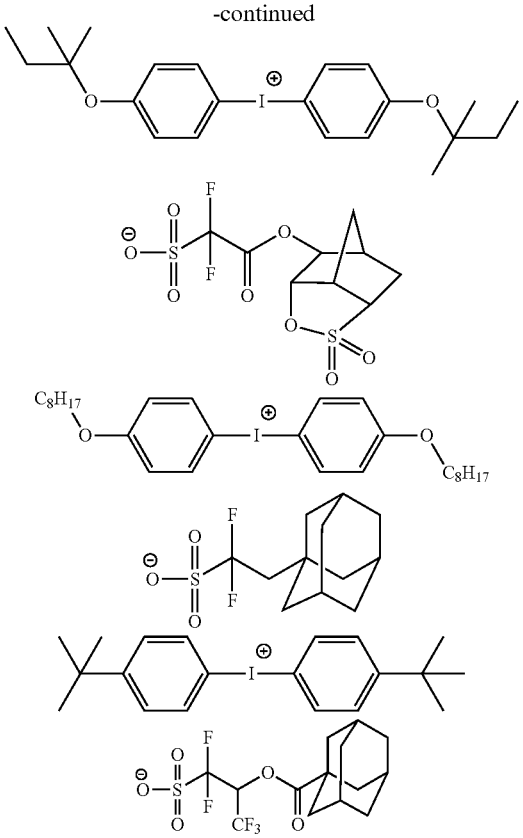

It is possible to synthesize the acid generating agent using a method known in the art and, for example, synthesis is possible on the basis of the methods described in JP2007-161707A, "0200" to "0210" in JP2010-100595A, "0051" to "0058" in WO2011/093280A, "0382" to "0385" in WO2008/153110A, and the like.

It is possible to use the acid generating agent as one type individually or in a combination of 2 or more types.

The content ratio of the compounds which generate an acid when irradiated with active rays or radiation in the composition is preferably 0.1 mass % to 30 mass % on the basis of the total solid content of the resin composition (1), more preferably 0.5 mass % to 25 mass %, even more preferably 3 mass % to 20 mass %, and particularly preferably 3 mass % to 15 mass %.

Here, depending on the actinic ray-sensitive or radiation-sensitive resin composition, there is also an aspect (B') where a structure which corresponds to an acid generating agent is supported by the resin (A). Specific examples of this aspect include the structure described in JP2011-248019A (in particular, the structure described in paragraph "0164" to paragraph "0191" and the structure which is included in a resin which is described in the Examples in paragraph "0555") and a repeating unit (R) which is illustrated in paragraph "0023" to "0210" in JP2013-80002A, and the like, and the contents thereof are included in the present specification. Here, even in an aspect in which the structure which corresponds to an acid generating agent is supported by the resin (A), the actinic ray-sensitive or radiation-sensitive resin composition may additionally include an acid generating agent which is not supported by the resin (A).

Examples of the aspect (B') include the repeating units as follows; however, the present invention is not limited thereto.

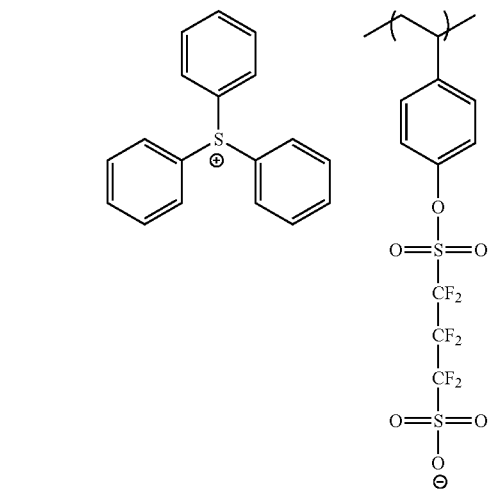

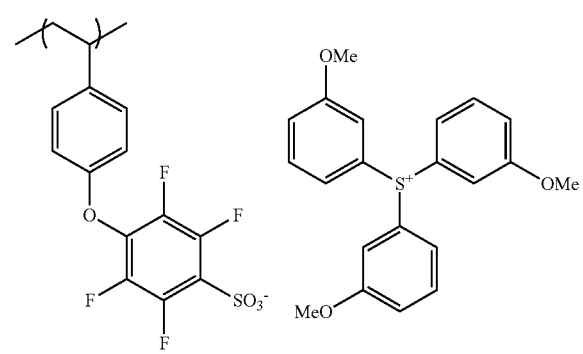

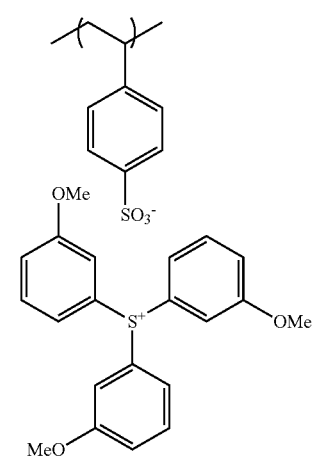

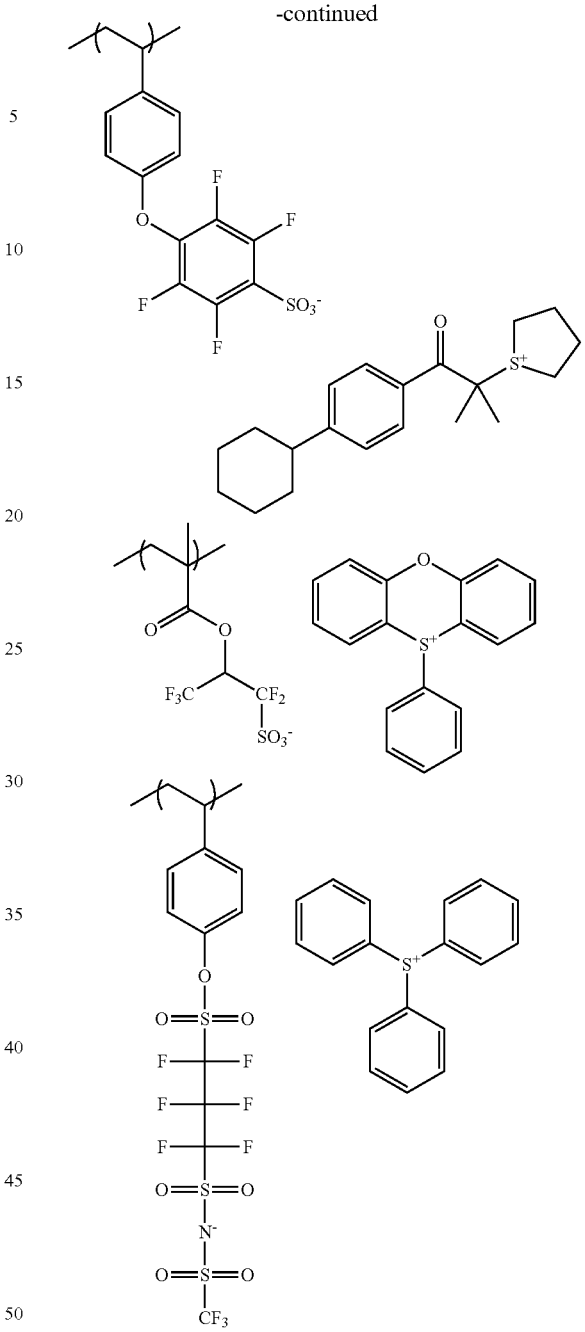

[3] Solvent

The resin composition (1) generally contains a solvent.

Examples of solvents which are able to be used when preparing the resin composition (1) include organic solvents such as alkylene glycol monoalkyl ether carboxylate, alkylene glycol monoalkyl ether, alkyl lactate ester, alkyl alkoxypropionate, cyclic lactone (preferably with 4 to 10 carbon atoms), monoketone compounds which may have a ring (preferably with 4 to 10 carbon atoms), alkylene carbonate, alkoxy acetate alkyl, and alkyl pyruvate.

Specific examples of the solvents include the solvents described in "0441" to "0455" in US2008/0187860A.

The solvents in the present invention may be used by mixing a plurality of types of organic solvents. For example, a mixed solvent where a solvent which contains a hydroxyl group as an organic solvent in the structure and a solvent which does not contain a hydroxyl group are mixed may be used. It is possible to appropriately select example compounds described above as a solvent which contains a hydroxyl group and a solvent which does not contain a hydroxyl group; however, the solvent which contains a hydroxyl group is preferably alkylene glycol monoalkyl ether, alkyl lactate, and the like, and more preferably propylene glycol monomethyl ether (PGME, also called 1-methoxy-2-propanol), ethyl lactate, and 2-hydroxy methyl isobutyrate. In addition, the solvent which does not contain a hydroxyl group is preferably alkylene glycol monoalkyl ether acetate, alkyl alkoxy propionate, monoketone compounds which may contain a ring, cyclic lactone, alkyl acetate, and the like, among these, propylene glycol monomethyl ether acetate (PGMEA, also called 1-methoxy-2-acetoxy propane), ethyl ethoxypropionate, 2-heptanone, γ-butyrolactone, cyclohexanone, and butyl acetate are particularly preferable, propylene glycol monomethyl ether acetate, ethyl ethoxypropionate, and 2-heptanone are most preferable.

In addition, a plurality of solvents which do not contain a hydroxyl group in the structure may be used together. Examples of combinations thereof include PGMEA and cyclohexanone, PGMEA and cyclopentanone, PGMEA and γ-butyrolactone, PGMEA and 2-heptanone, and the like.

For example, in a case where two types of solvents are used, the mixing ratio (mass ratio) is 1/99 to 99/1, preferably 10/90 to 90/10, more preferably 20/80 to 60/40.

The solvent preferably includes propylene glycol monomethyl ether acetate and is more preferably a propylene glycol monomethyl ether acetate single solvent or a mixed solvent of 2 or more types which contains propylene glycol monomethyl ether acetate.

Here, when an appropriate amount of solvent with relatively high boiling point such as γ-butyrolactone is used, the hydrophobic resin (D) which will be described below is more unevenly distributed on the surface, and it is possible to expect to improve the performance with respect to the liquid immersion exposure.

In addition, three or more types of solvent may be used. Due to this, delicate resist shape adjustment or viscosity adjustment or the like may be performed. The combination thereof include PGMEA PGME γ-butyrolactone, PGMEA PGME cyclohexanone, PGMEA PGME 2-heptanone, PGMEA cyclohexanone γ-butyrolactone, PGMEA γ-butyrolactone 2-heptanone, and the like.

It is preferable to use a solvent where the peroxide content is reduced, and due to this, the storage stability of the resist composition is improved. The content of the peroxide in the solvent is preferably 2.0 mmol % or less, more preferably 1.0 mmol % or less, even more preferably 0.5 mmol % or less, and peroxide is particularly preferably substantially not contained.

[4] Hydrophobic Resin (D)

Particularly when applied to the liquid immersion exposure, the resin composition (1) may contain a hydrophobic resin (also referred to below as "hydrophobic resin (D)" or simply "resin (D)"). Here, the hydrophobic resin (D) is preferably different from the rein (A) described above.

Due to this, in a case where the hydrophobic resin (D) is unevenly distributed on the film surface layer and the liquid immersion medium is water, it is possible to improve the static/dynamic contact angle of a resist film surface with respect to water and improve the liquid immersion liquid conformance.

Here, the hydrophobic resin (D) may include various purposes even in a case where the resin composition (1) is not applied to liquid immersion exposure. For example, when applying the resin composition (1) to EUV exposure, it is also preferable to use the hydrophobic resin (D) for outgas suppression, adjustment of the pattern shape, and the like.

The hydrophobic resin (D) is preferably designed so as to be unevenly distributed on an interface as described above; however, unlike a surfactant, it is not necessary to have a hydrophilic group in the molecule and it is not necessary to contribute to the even mixing of polar/non-polar substances.

The hydrophobic resin (D) preferably has any one or more types of a "fluorine atom", a "silicon atom", and a "$CH_3$ partial structure which is contained in a side chain portion of a resin" from the point of view of being unevenly distributed on the film surface layer, and more preferably has 2 or more types thereof.

The weight-average molecular weight of the hydrophobic resin (D) in standard polystyrene conversion is preferably 1,000 to 100,000, more preferably 1,000 to 50,000, and even more preferably 2,000 to 15,000.

In addition, the hydrophobic resin (D) may be used as one type or plurality thereof may be used together.

The content of the hydrophobic resin (D) in the resin composition (1) is preferably 0.01 mass % to 10 mass % with respect to the total solid content in the resin composition (1), more preferably 0.05 mass % to 8 mass %, and even more preferably 0.1 mass % to 7 mass %.

While the hydrophobic resin (D) naturally has few impurities such as metals in the same manner as the resin (A), the residual monomers or oligomer components are preferably 0.01 mass % to 5 mass %, more preferably 0.01 mass % to 3 mass %, and even more preferably 0.05 mass % to 1 mass %. Due to this, it is possible to obtain a resin composition (1) where there is no foreign matter in the liquid and there is no change over time in the sensitivity or the like. In addition, from the point of view of the resolution, the resist shape, the side wall of the resist pattern, the roughness, and the like, the molecular weight distribution is preferably in a range of 1 to 5, more preferably in a range of 1 to 3, and even more preferably in a range of 1 to 2.

It is also possible to use various commercially available products as the hydrophobic resin (D), or to synthesize the hydrophobic resin (D) according to typical methods (for example, radical polymerization). Examples of general synthesis methods include a collective polymerization method for performing polymerization by dissolving monomers and an initiator in a solvent and heating the result, a dripping polymerization method for adding a solution of monomers and an initiator to a heated solvent by dripping over 1 to 10 hours, and the like, and the dripping polymerization method is preferable.

The reaction solvent, the polymerization initiator, the reaction conditions (temperature, concentration, and the like), and the purifying method after reaction are the same as in the content described for the resin (A); however, in the synthesis of the hydrophobic resin (D), the reaction concentration is preferably 30 mass % to 50 mass %. For more detail, refer to paragraph "0320" to paragraph "0329" and the surrounding text in JP2008-292975A.

Specific examples of the hydrophobic resin (D) will be given below. In addition, the molar ratio of repeating units in each resin (corresponding to each repeating unit in order from the left), the weight-average molecular weight, and dispersity will be shown in the Tables 1 to 3 below.

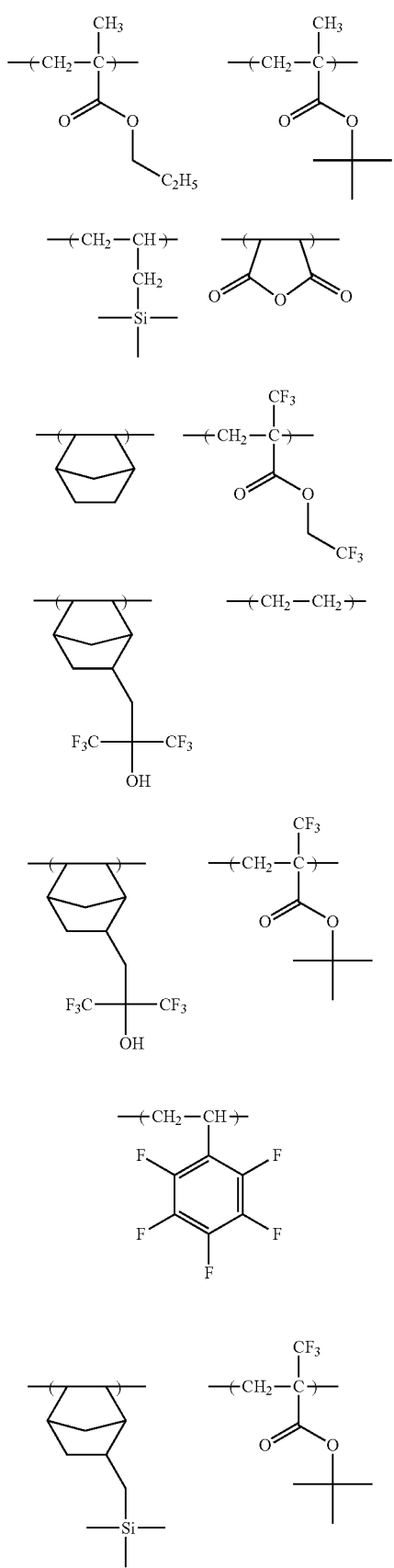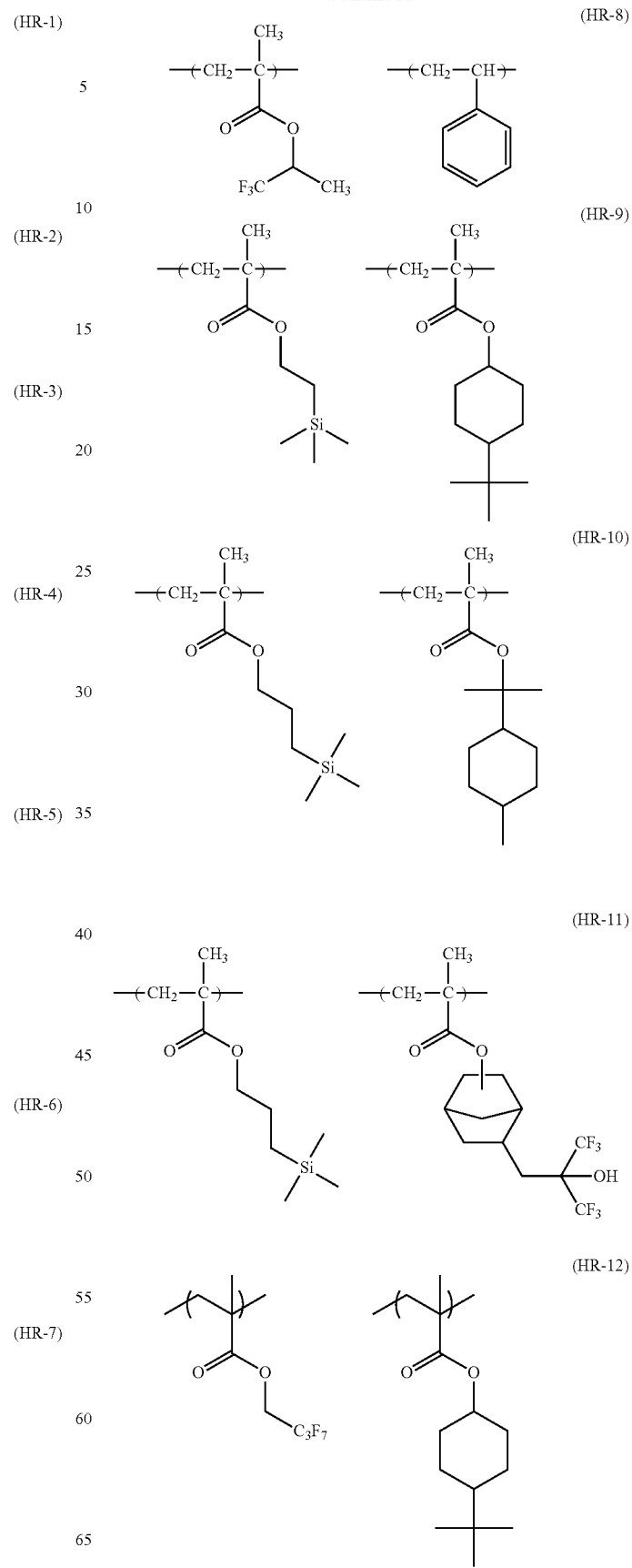

(HR-13)
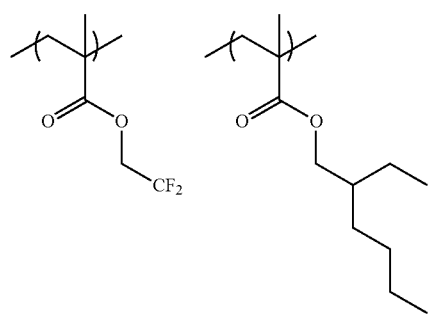
(HR-14)
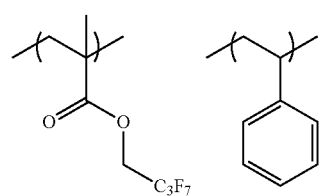
(HR-15)
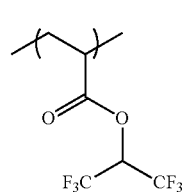
(HR-16)
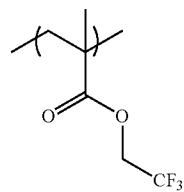
(HR-17)
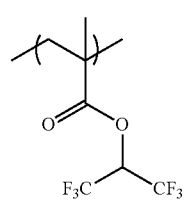
(HR-18)
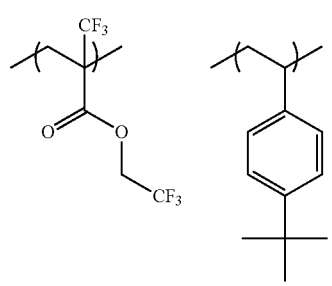
(HR-19)
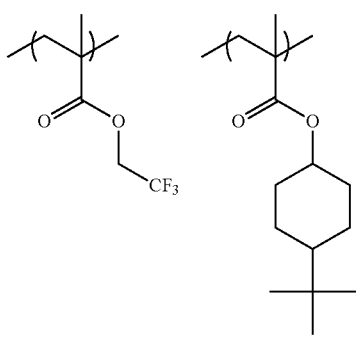
(HR-20)
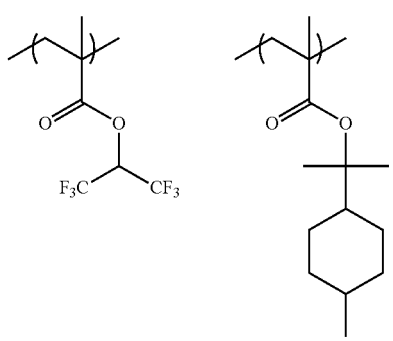
(HR-21)
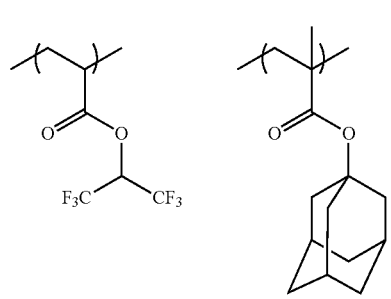
(HR-22)
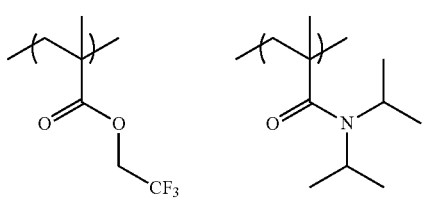
(HR-23)
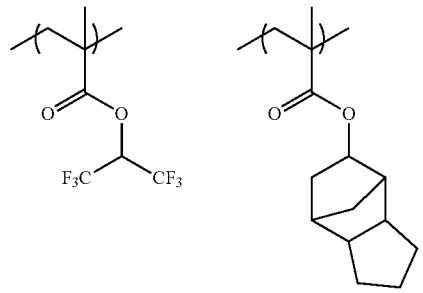

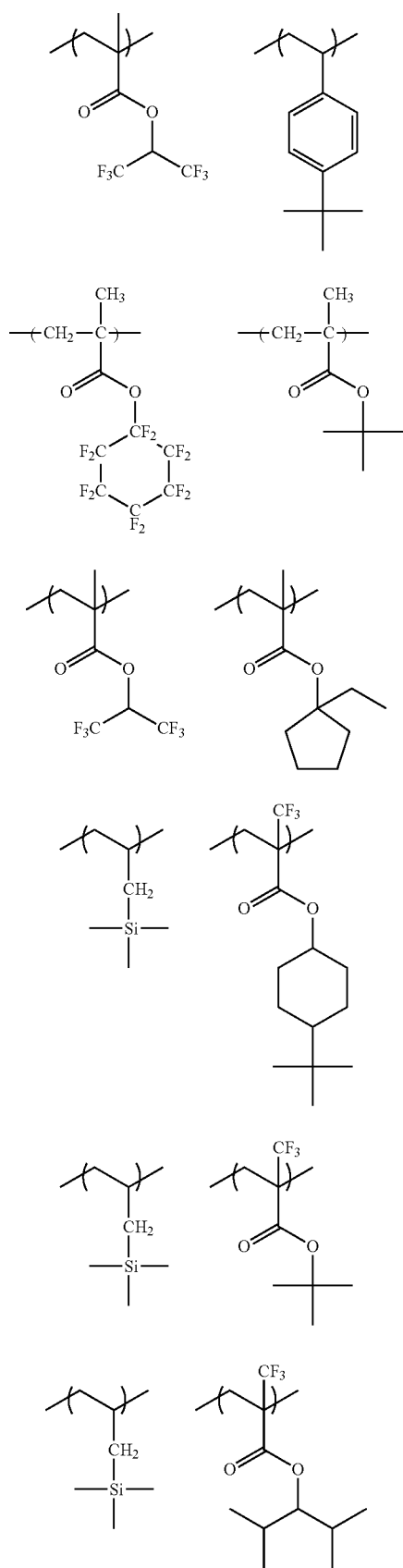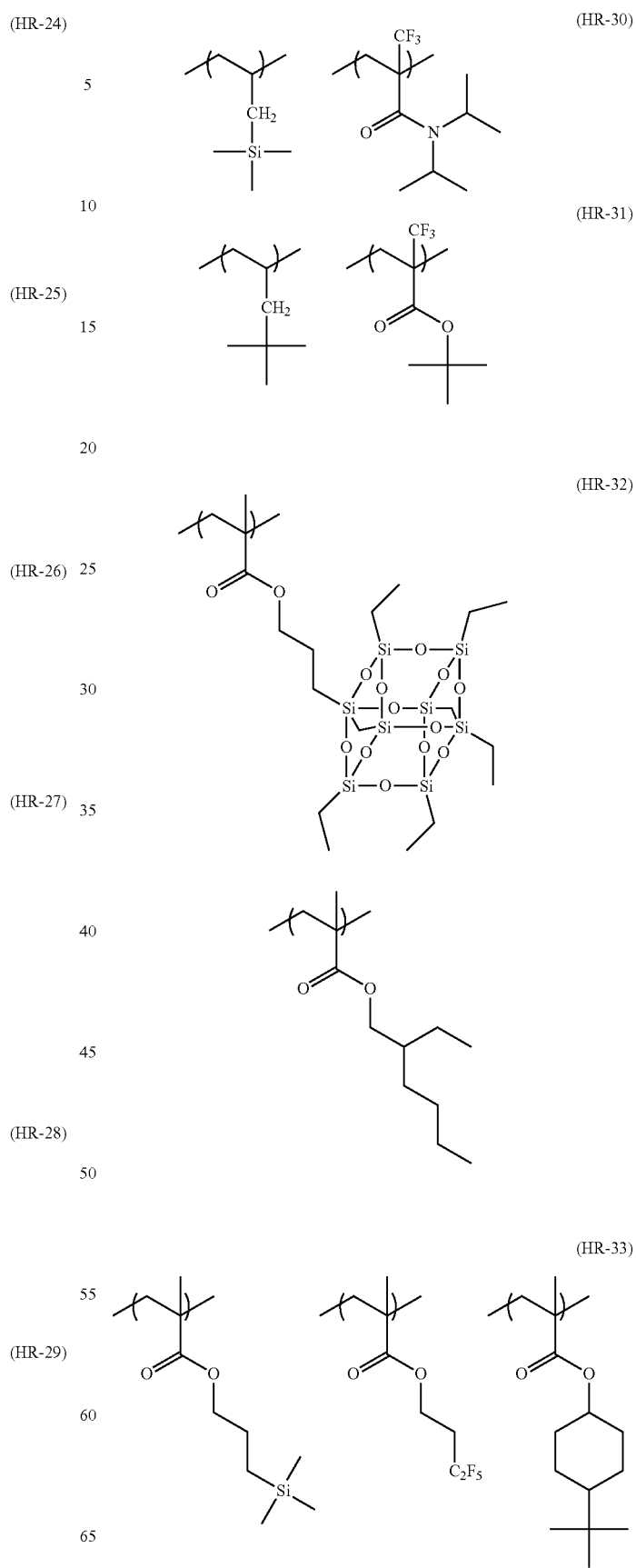

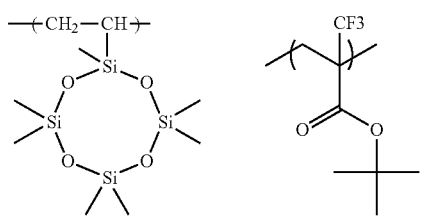
(HR-34)
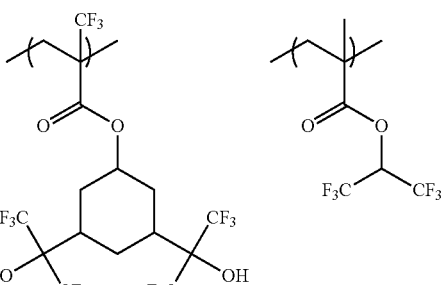
(HR-39)
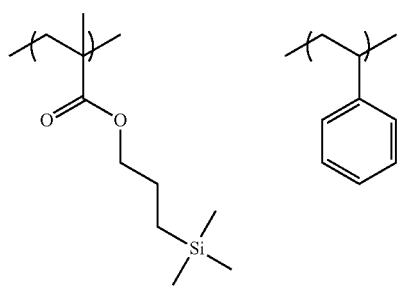
(HR-35)
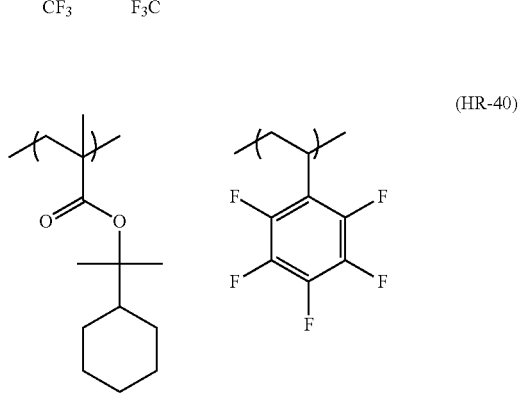
(HR-40)
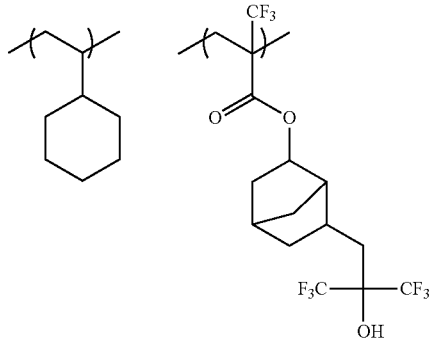
(HR-36)
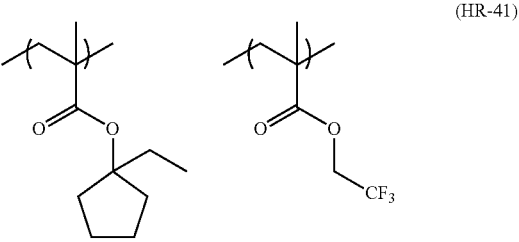
(HR-41)
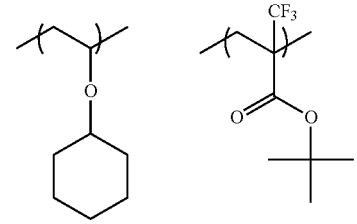
(HR-37)
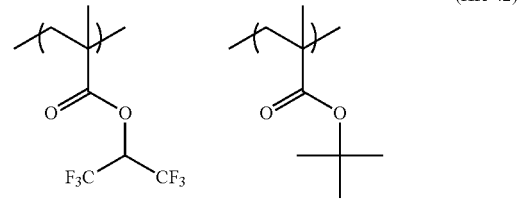
(HR-42)
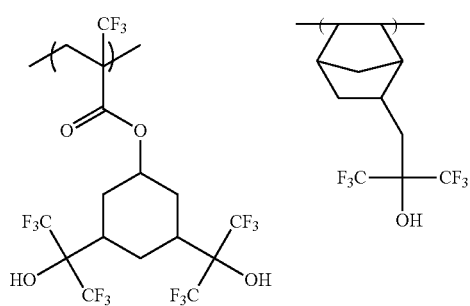
(HR-38)
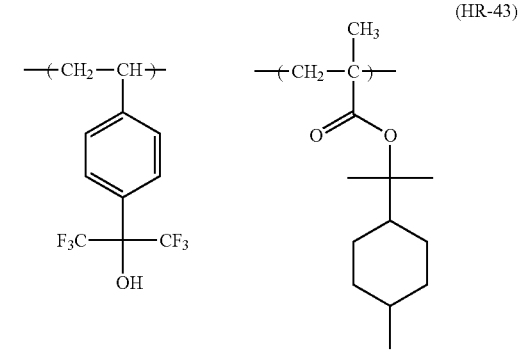
(HR-43)

(HR-44)
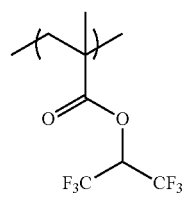 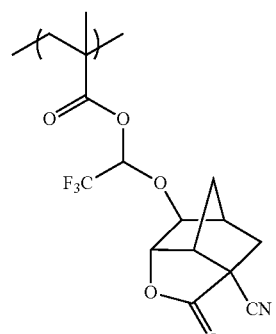
(HR-45)
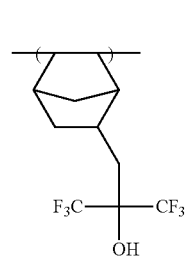 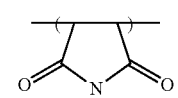 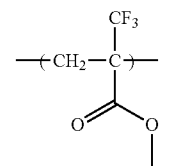
(HR-46)
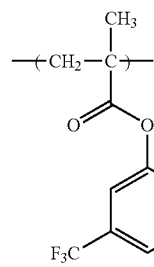 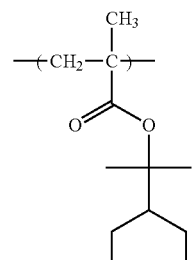
(HR-47)
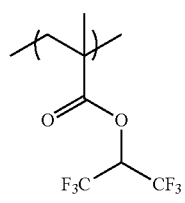 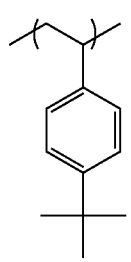 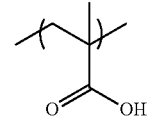
(HR-48)
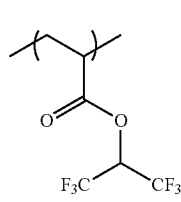 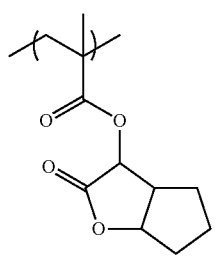
(HR-49)
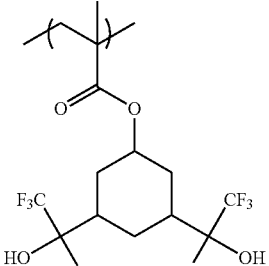
(HR-50)
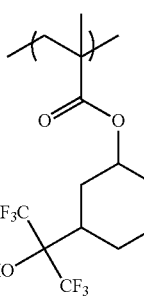 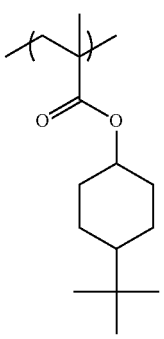
(HR-51)
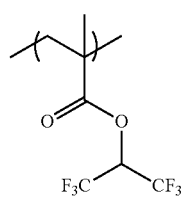 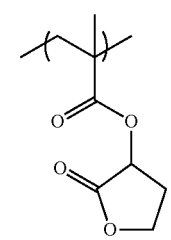 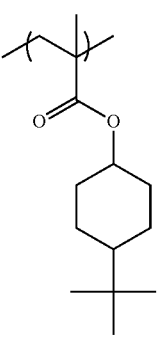
(HR-52)
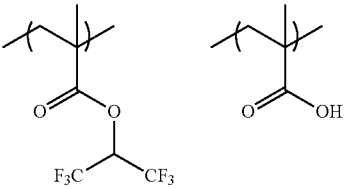
(HR-53)
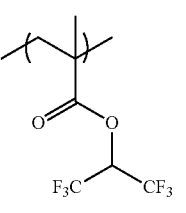 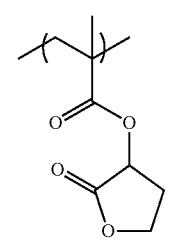 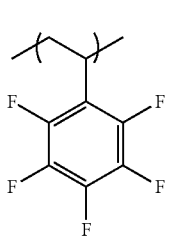

(HR-54)
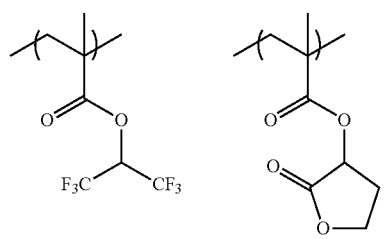
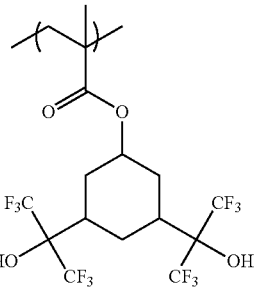
(HR-55)
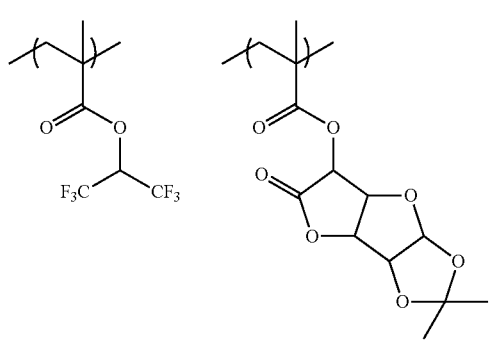
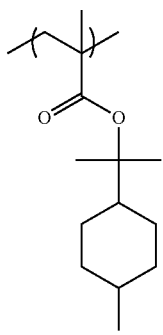
(HR-56)
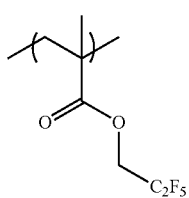
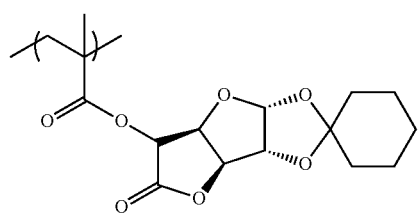
(HR-57)
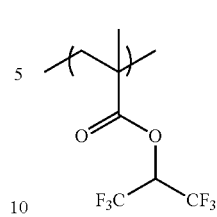 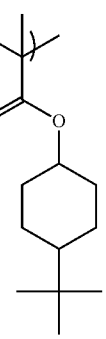 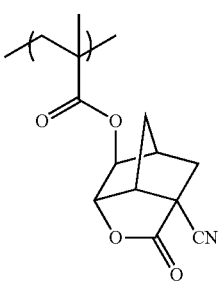
(HR-58)
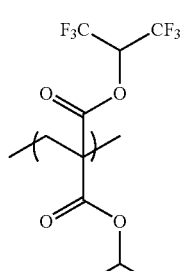 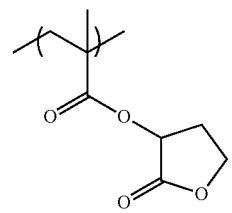
(HR-59)
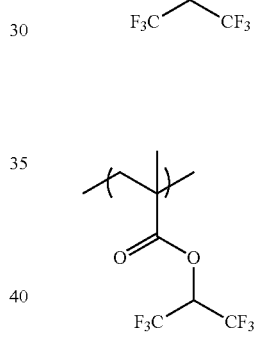 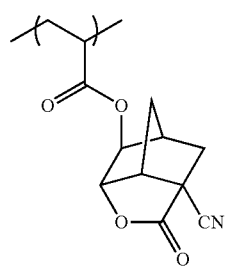
(HR-60)
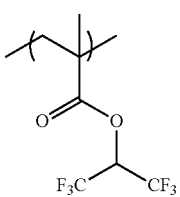 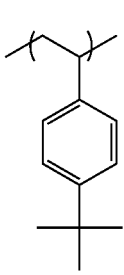 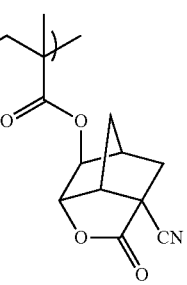
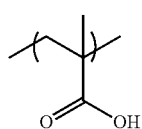

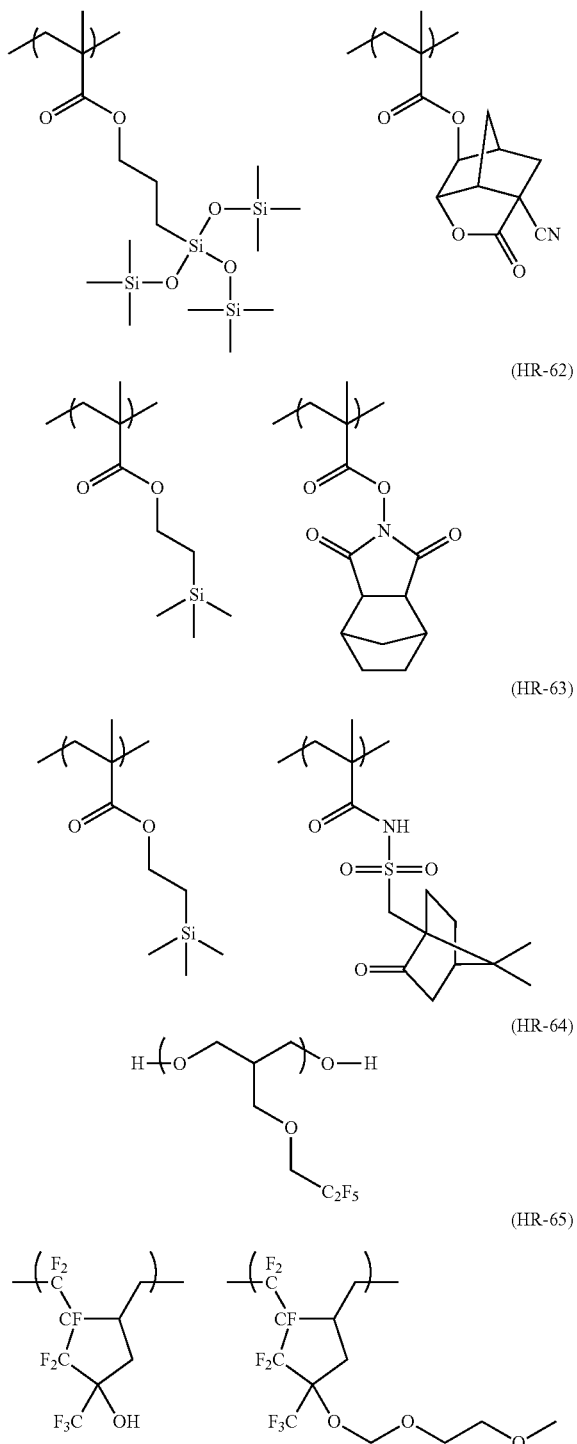
TABLE 1-continued
| Resin | Composition | Mw | Mw/Mn |
|---|---|---|---|
| HR-5 | 50/50 | 4500 | 1.4 |
| HR-6 | 100 | 5500 | 1.6 |
| HR-7 | 50/50 | 5800 | 1.9 |
| HR-8 | 50/50 | 4200 | 1.3 |
| HR-9 | 50/50 | 5500 | 1.8 |
| HR-10 | 40/60 | 7500 | 1.6 |
| HR-11 | 70/30 | 6600 | 1.8 |
| HR-12 | 40/60 | 3900 | 1.3 |
| HR-13 | 50/50 | 9500 | 1.8 |
| HR-14 | 50/50 | 5300 | 1.6 |
| HR-15 | 100 | 6200 | 1.2 |
| HR-16 | 100 | 5600 | 1.6 |
| HR-17 | 100 | 4400 | 1.3 |
| HR-18 | 50/50 | 4300 | 1.3 |
| HR-19 | 50/50 | 6500 | 1.6 |
| HR-20 | 30/70 | 6500 | 1.5 |
| HR-21 | 50/50 | 6000 | 1.6 |
| HR-22 | 50/50 | 3000 | 1.2 |
| HR-23 | 50/50 | 5000 | 1.5 |
| HR-24 | 50/50 | 4500 | 1.4 |
| HR-25 | 30/70 | 5000 | 1.4 |
| HR-26 | 50/50 | 5500 | 1.6 |
| HR-27 | 50/50 | 3500 | 1.3 |
| HR-28 | 50/50 | 6200 | 1.4 |
| HR-29 | 50/50 | 6500 | 1.6 |
| HR-30 | 50/50 | 6500 | 1.6 |
| HR-31 | 50/50 | 4500 | 1.4 |
| HR-32 | 30/70 | 5000 | 1.6 |
| HR-33 | 30/30/40 | 6500 | 1.8 |
| HR-34 | 50/50 | 4000 | 1.3 |
| HR-35 | 50/50 | 6500 | 1.7 |
| HR-36 | 50/50 | 6000 | 1.5 |
| HR-37 | 50/50 | 5000 | 1.6 |
| HR-38 | 50/50 | 4000 | 1.4 |
| HR-39 | 20/80 | 6000 | 1.4 |
| HR-40 | 50/50 | 7000 | 1.4 |
| HR-41 | 50/50 | 6500 | 1.6 |
| HR-42 | 50/50 | 5200 | 1.6 |
| HR-43 | 50/50 | 6000 | 1.4 |
| HR-44 | 70/30 | 5500 | 1.6 |
| HR-45 | 50/20/30 | 4200 | 1.4 |
| HR-46 | 30/70 | 7500 | 1.6 |
| HR-47 | 40/58/2 | 4300 | 1.4 |
| HR-48 | 50/50 | 6800 | 1.6 |
| HR-49 | 100 | 6500 | 1.5 |
| HR-50 | 50/50 | 6600 | 1.6 |
| HR-51 | 30/20/50 | 6800 | 1.7 |
| HR-52 | 95/5 | 5900 | 1.6 |
| HR-53 | 40/30/30 | 4500 | 1.3 |
| HR-54 | 50/30/20 | 6500 | 1.8 |
| HR-55 | 30/40/30 | 7000 | 1.5 |
| HR-56 | 60/40 | 5500 | 1.7 |
| HR-57 | 40/40/20 | 4000 | 1.3 |
| HR-58 | 60/40 | 3800 | 1.4 |
| HR-59 | 80/20 | 7400 | 1.6 |
| HR-60 | 40/40/15/5 | 4800 | 1.5 |
| HR-61 | 60/40 | 5600 | 1.5 |
| HR-62 | 50/50 | 5900 | 2.1 |
| HR-63 | 80/20 | 7000 | 1.7 |
| HR-64 | 100 | 5500 | 1.8 |
| HR-65 | 50/50 | 9500 | 1.9 |
TABLE 1
| Resin | Composition | Mw | Mw/Mn |
|---|---|---|---|
| HR-1 | 50/50 | 4900 | 1.4 |
| HR-2 | 50/50 | 5100 | 1.6 |
| HR-3 | 50/50 | 4800 | 1.5 |
| HR-4 | 50/50 | 5300 | 1.6 |

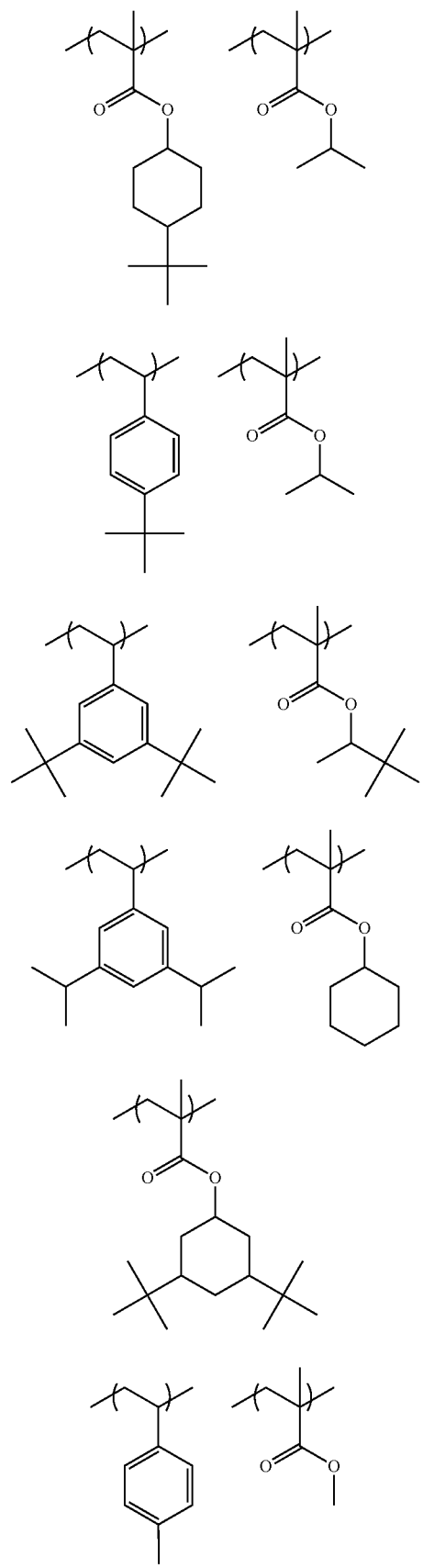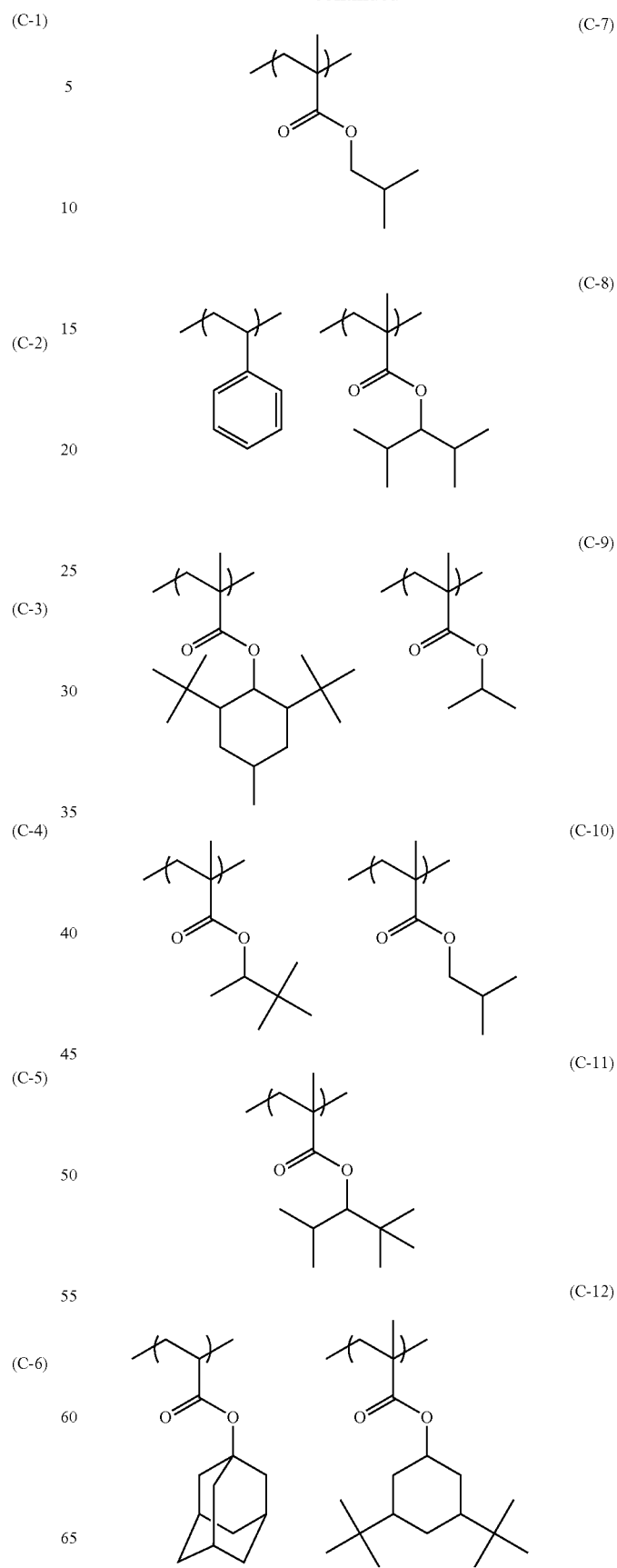

(C-13)
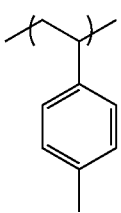
(C-14)
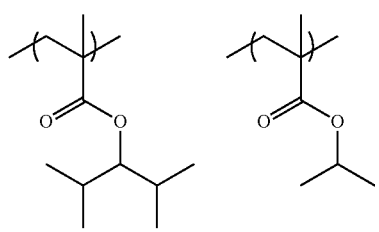
(C-15)
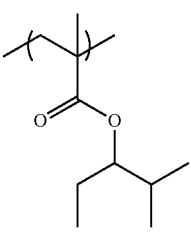
(C-16)
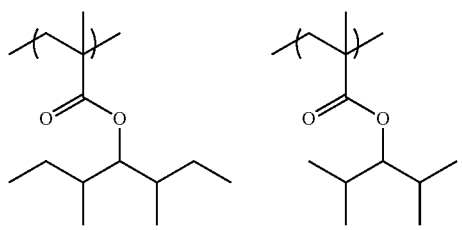
(C-17)
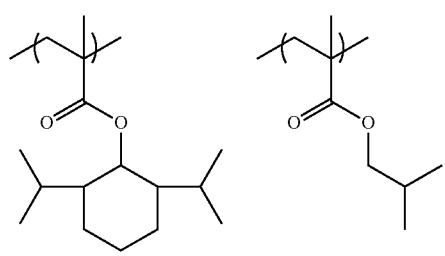
(C-18)
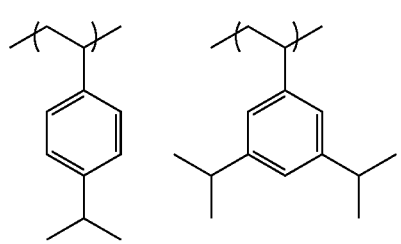
(C-19)
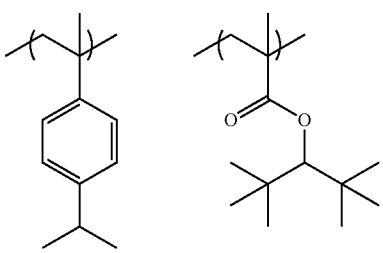
(C-20)
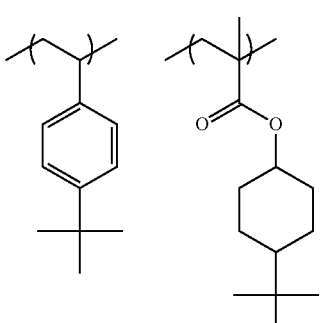
(C-21)
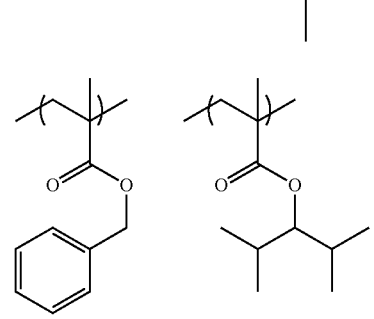
(C-22)
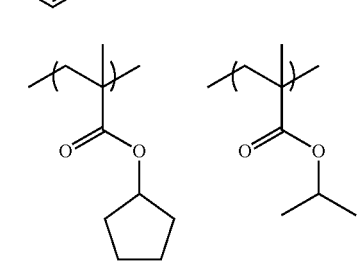
(C-23)
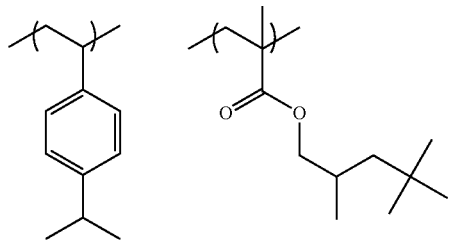
(C-24)
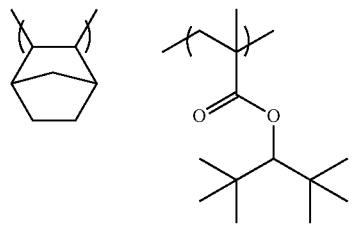

(C-25) 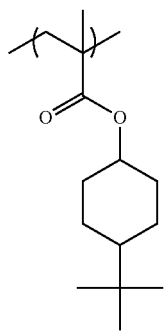 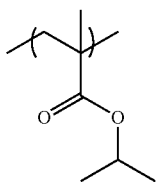 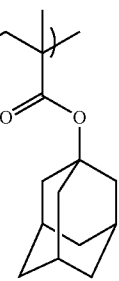
(C-26) 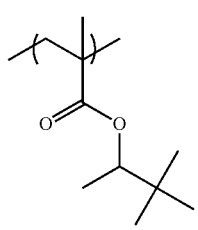 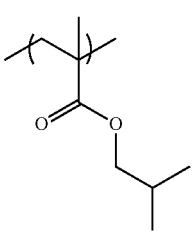 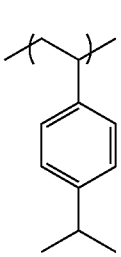
(C-27) 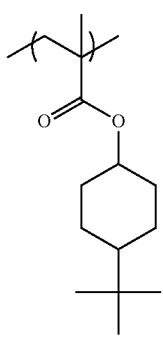 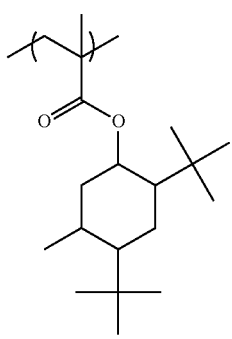
(C-28) 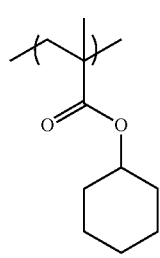 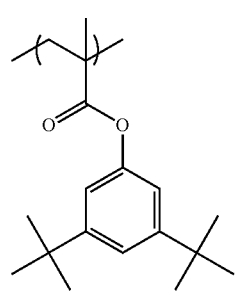
(D-1) 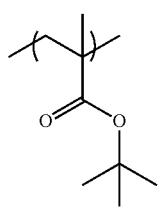 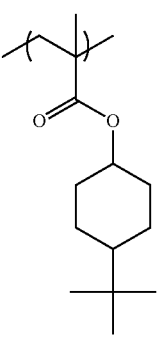
(D-2) 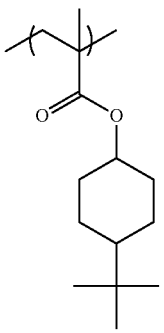 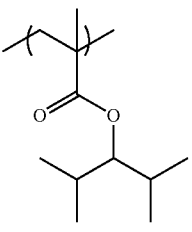
(D-3) 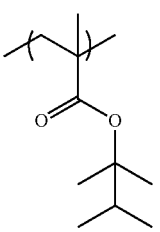 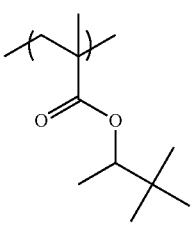
(D-4) 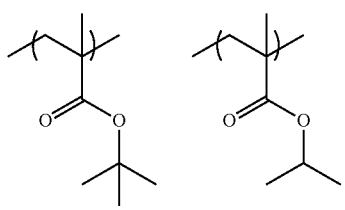 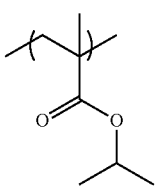
(D-5) 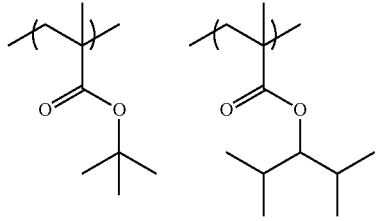 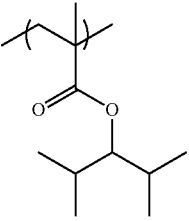
(D-6) 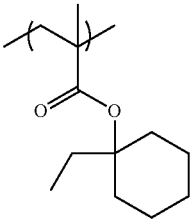 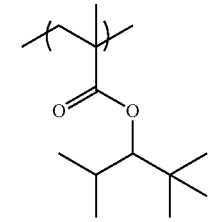
(D-7) 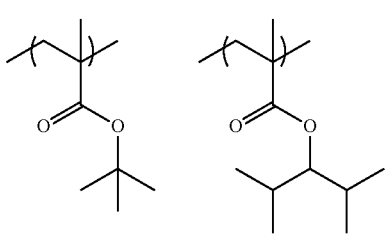 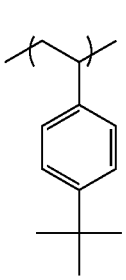

(D-8)
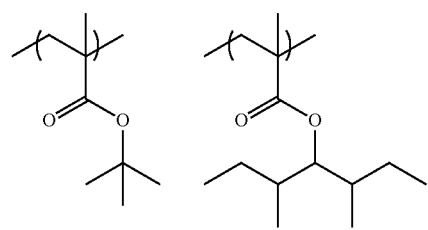
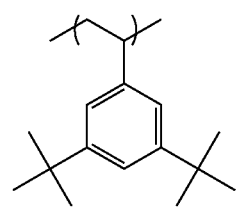
(D-9)
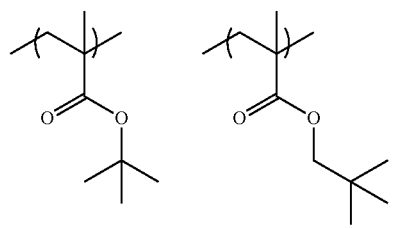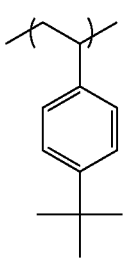
(D-10)
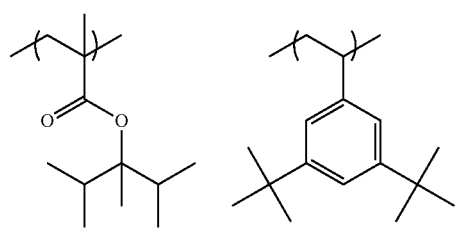
(D-11)
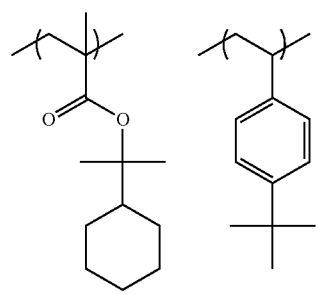
(D-12)
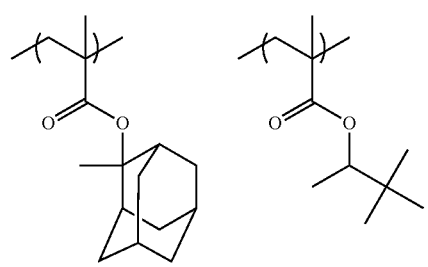
(D-13)
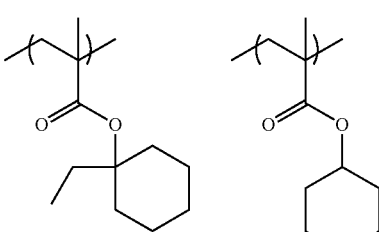
(D-14)
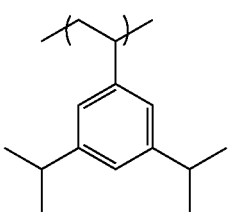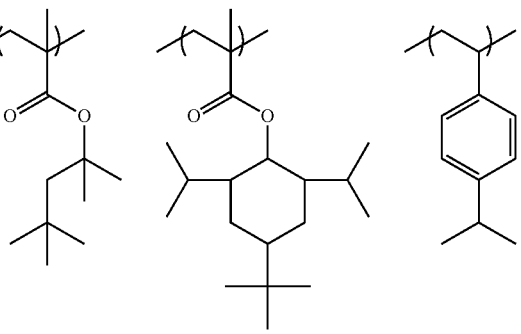
(D-15)
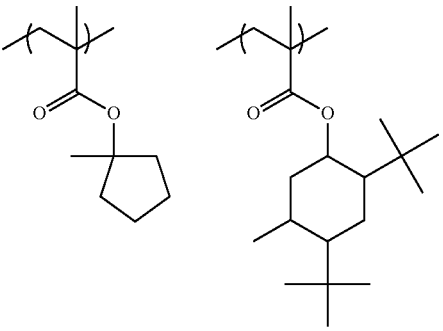
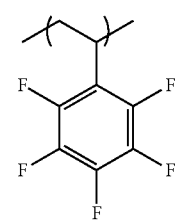

-continued

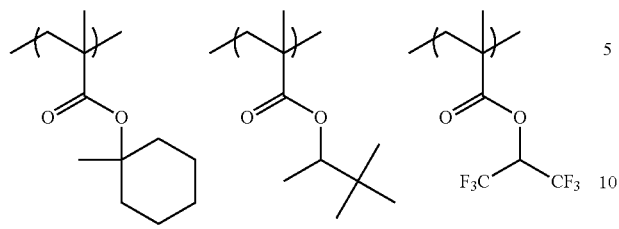

(D-16)

TABLE 2

| Resin | Composition | Mw | Mw/Mn |
|---|---|---|---|
| C-1 | 50/50 | 9600 | 1.74 |
| C-2 | 60/40 | 34500 | 1.43 |
| C-3 | 30/70 | 19300 | 1.69 |
| C-4 | 90/10 | 26400 | 1.41 |
| C-5 | 100 | 27600 | 1.87 |
| C-6 | 80/20 | 4400 | 1.96 |
| C-7 | 100 | 16300 | 1.83 |
| C-8 | 5/95 | 24500 | 1.79 |
| C-9 | 20/80 | 15400 | 1.68 |
| C-10 | 50/50 | 23800 | 1.46 |
| C-11 | 100 | 22400 | 1.57 |
| C-12 | 10/90 | 21600 | 1.52 |
| C-13 | 100 | 28400 | 1.58 |
| C-14 | 50/50 | 16700 | 1.82 |
| C-15 | 100 | 23400 | 1.73 |
| C-16 | 60/40 | 18600 | 1.44 |
| C-17 | 80/20 | 12300 | 1.78 |
| C-18 | 40/60 | 18400 | 1.58 |
| C-19 | 70/30 | 12400 | 1.49 |
| C-20 | 50/50 | 23500 | 1.94 |
| C-21 | 10/90 | 7600 | 1.75 |
| C-22 | 5/95 | 14100 | 1.39 |
| C-23 | 50/50 | 17900 | 1.61 |
| C-24 | 10/90 | 24600 | 1.72 |
| C-25 | 50/40/10 | 23500 | 1.65 |
| C-26 | 60/30/10 | 13100 | 1.51 |
| C-27 | 50/50 | 21200 | 1.84 |
| C-28 | 10/90 | 19500 | 1.66 |

TABLE 3

| Resin | Composition | Mw | Mw/Mn |
|---|---|---|---|
| D-1 | 50/50 | 16500 | 1.72 |
| D-2 | 10/50/40 | 18000 | 1.77 |
| D-3 | 5/50/45 | 27100 | 1.69 |
| D-4 | 20/80 | 26500 | 1.79 |
| D-5 | 10/90 | 24700 | 1.83 |
| D-6 | 10/90 | 15700 | 1.99 |
| D-7 | 5/90/5 | 21500 | 1.92 |
| D-8 | 5/60/35 | 17700 | 2.10 |
| D-9 | 35/35/30 | 25100 | 2.02 |
| D-10 | 70/30 | 19700 | 1.85 |
| D-11 | 75/25 | 23700 | 1.80 |
| D-12 | 10/90 | 20100 | 2.02 |
| D-13 | 5/35/60 | 30100 | 2.17 |
| D-14 | 5/45/50 | 22900 | 2.02 |
| D-15 | 15/75/10 | 28600 | 1.81 |
| D-16 | 25/55/20 | 27400 | 1.87 |

[5] Basic Compound

The resin composition (1) preferably contains a basic compound.

(1) In one aspect, resin composition (1) preferably contains a basic compound or an ammonium salt compound (also referred to below as "compound (N)") where the basicity decreases when irradiated with active rays or radiation as a basic compound.

The compound (N) is preferably a compound (N-1) which has a basic functional group or an ammonium group and a group which generates an acid functional group when irradiated with active rays or radiation. That is, the compound (N) is preferably a basic compound which has a basic functional group and a group which generates an acid functional group when irradiated with active rays or radiation, or an ammonium salt compound which has an ammonium group and a group which generates an acid functional group when irradiated with active rays or radiation.

Specific examples of the compound (N) include the following. In addition, other than the compounds given below, it is possible to preferably use, for example, the compounds in (A-1) to (A-44) described in the specification of US2010/0233629A or the compounds (A-1) to (A-23) described in the specification of US2012/0156617A as the compound (N) in the present invention.

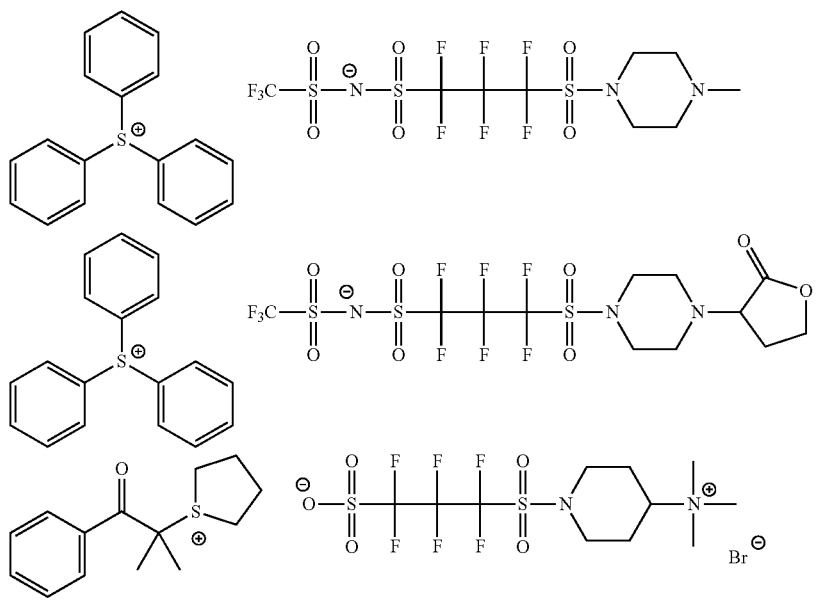

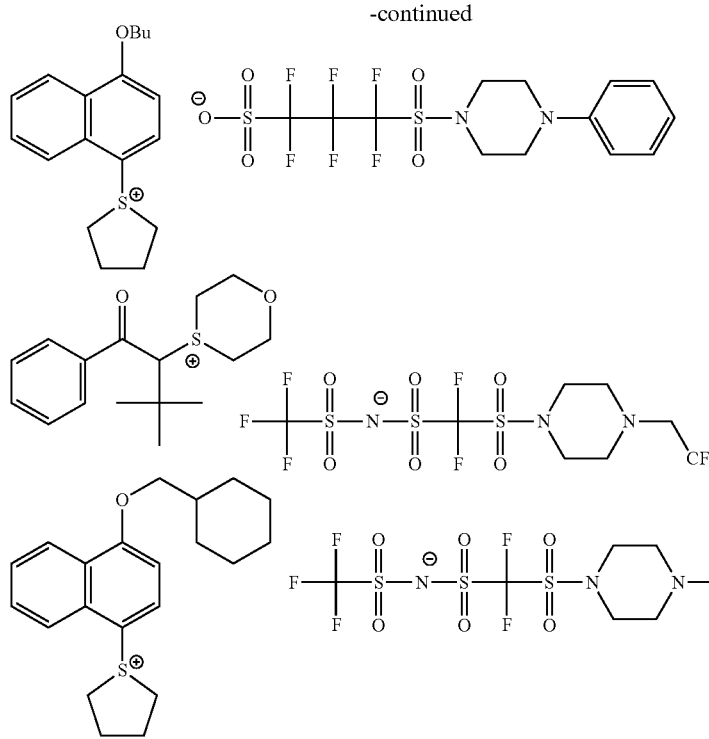

It is possible to synthesize the compounds on the basis of the synthesis examples described in JP2006-330098A and the like.

The molecular weight of the compound (N) is preferably 500 to 1,000.

The resin composition (1) may or may not contain the compound (N); however, when contained, the content ratio of the compound (N) is preferably 0.1 mass % to 20 mass % on the basis of the solid content of the composition (1), and more preferably 0.1 mass % to 10 mass %.

(2) In another aspect, the resin composition (1) may contain a basic compound (N') which is different from the compound (N) as the basic compound in order to reduce changes in performance over time from the exposure to the heating.

Preferable examples of the basic compound (N') include compounds which have structures represented by the following Formulas (A') to (E').

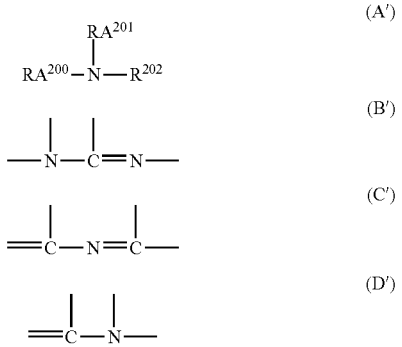

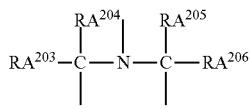

In General Formulas (A') and (E'), $RA^{200}$, $RA^{201}$ and $RA^{202}$ may be the same or may be different and represent a hydrogen atom, an alkyl group (preferably with 1 to 20 carbon atoms), a cycloalkyl group (preferably with 3 to 20 carbon atoms), or an aryl group (with 6 to 20 carbon atoms). $RA^{201}$ and $RA^{202}$ may bond with each other to form a ring. $RA^{203}$, $RA^{204}$, $RA^{205}$, and $RA^{206}$ may be the same or may be different and represent an alkyl group (preferably with 1 to 20 carbon atoms).

The alkyl group described above may have a substituent group and the alkyl group which has a substituent group is preferably an aminoalkyl group with 1 to 20 carbon atoms, a hydroxy alkyl group with 1 to 20 carbon atoms, or a cyanoalkyl group with 1 to 20 carbon atoms.

The alkyl groups in Genera Formulas (A)' and (E') are more preferably unsubstituted.

Preferable examples of the basic compound (N') include guanidine, aminopyrrolidine, pyrazole, pyrazoline, piperazine, aminomorpholine, aminoalkylmorpholine, piperidine, and the like, and more preferable specific examples include compounds which have an imidazole structure, a diazabicyclo structure, an onium hydroxide structure, an onium carboxylate structure, a trialkylamine structure, an aniline structure, or a pyridine structure, an alkyl amine derivative which has a hydroxyl group and/or an ether bond, an aniline derivative which has a hydroxyl group and/or an ether bond, and the like.

Examples of the compound which has an imidazole structure include imidazole, 2,4,5-triphenyl imidazole, benzimidazole, and the like. Examples of the compound which has a diazabicyclo structure include 1,4-diazabicyclo [2,2,2] octane, 1,5-diazabicyclo [4,3,0] non-5-ene, 1,8-diazabicyclo [5,4,0] undec-7-ene, and the like. Examples of the compound which has an onium hydroxide structure include triarylsulfonium hydroxide, phenacylsulfonium hydroxide, sulfonium hydroxide which has a 2-oxoalkyl group, specifically, triphenylsulfonium hydroxide, tris(t-butylphenyl) sulfonium hydroxide, bis(t-butylphenyl) iodonium hydroxide, phenacyl thiophenium hydroxide, 2-oxopropyl thiophenium hydroxide, and the like. The compound which has an onium carboxylate structure is a compound where an anion portion of a compound which has an onium hydroxide structure is a carboxylate and examples thereof include acetate, adamantane-1-carboxylate, perfluoroalkyl carboxylate, and the like. Examples of the compound which has a trialkylamine structure include tri (n-butyl) amine, tri (n-octyl) amine, and the like. Examples of the compound which has an aniline structure include 2,6-diisopropyl aniline, N,N-dimethyl aniline, N,N-dibutyl aniline, N,N-dihexyl aniline, and the like. Examples of the alkylamine derivative which has a hydroxyl group and/or an ether bond include ethanolamine, diethanolamine, triethanolamine, tris(methoxyethoxyethyl) amine, and the like. Examples of the aniline derivative which has a hydroxyl group and/or an ether bond include N,N-bis(hydroxyethyl) aniline and the like.

Examples of preferable basic compounds further include an amine compound which has a phenoxy group, an ammonium salt compound which has a phenoxy group, an amine compound which has a sulfonic acid ester group, and an ammonium salt compound which has a sulfonic acid ester group. Specific examples thereof include the compounds (C1-1) to (C3-3) exemplified in "0066" of the specification in US 2007/0224539A; however, the present invention is not limited thereto.

The resin composition (1) may or may not contain compound (N'); however, when contained, the content ratio of the compound (N') is preferably 0.001 mass % to 10 mass % on the basis of the solid content of the resin composition (1), and more preferably 0.01 mass % to 5 mass %.

(3) In another aspect, the resin composition (1) may contain a nitrogen-containing organic compound which has a group which is desorbed due to an action of an acid as one type of the basic compound (also referred to below as the "basic compound (N")"). As examples of the compound are shown below.

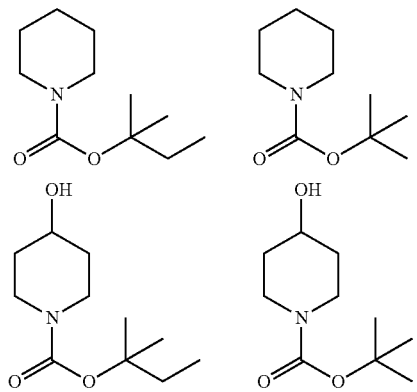

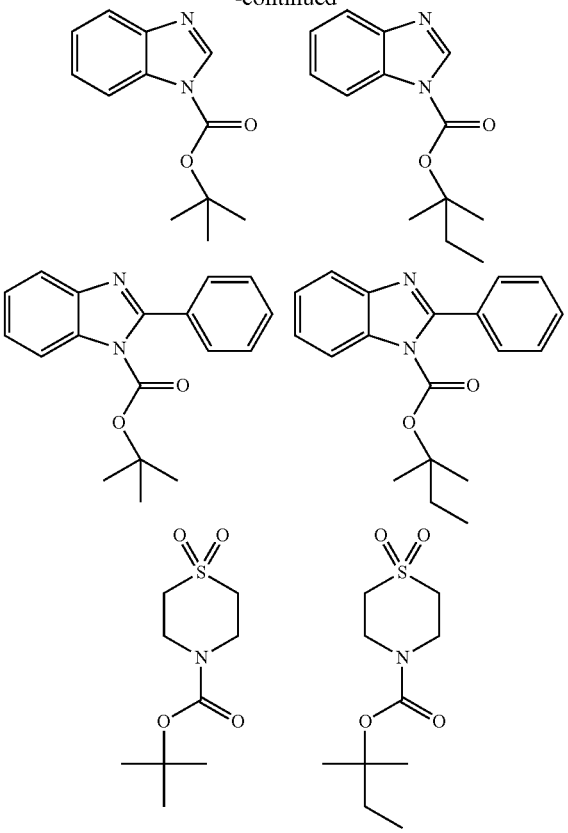

It is possible to synthesize the compounds described above on the basis of, for example, the method described in JP2009-199021A.

In addition, it is also possible to use a compound which has an amine oxide structure as the basic compound (N"). As specific examples of the compound, it is possible to use triethylamine pyridine N-oxide, tributylamine N-oxide, triethanolamine N-oxide, tris(methoxyethyl) amine N-oxide, tris(2-(methoxymethoxy)ethyl) amine oxide, 2,2', 2"-nitrilotriethyl propionate N-oxide, N-2-(2-methoxyethoxy) methoxyethyl morpholine N-oxide, and other amine oxide compounds exemplified in JP2008-102383A.

The molecular weight of the basic compound (N") is preferably 250 to 2,000, and more preferably 400 to 1,000. From the point of view of further reduction of the LWR and of the local uniformity of the pattern dimensions, the molecular weight of the basic compound is preferably 400 or more, more preferably 500 or more, and even more preferably 600 or more.

The basic compound (N") may be used together with the compound (N) and may be used individually or as 2 or more types together.

The resin composition (1) in the present invention may or may not contain compound (N"); however, when contained, the usage amount of the compound (N") is generally 0.001 mass % to 10 mass % on the basis of the solid content of the resin composition (1), and preferably 0.01 mass % to 5 mass %.

(4) The resin composition (1) may include an onium salt which is represented by General Formulas (6A) or (6B) below as a basic compound in another aspect. The onium salt is expected to control the diffusion of generated acid in a resist system in relation to the acid strength of a photoacid generator which is generally used in resist compositions.

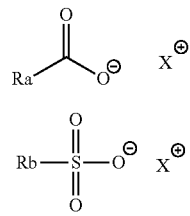

(6A)

(6B)

In General Formula (6A),

Ra represents an organic group. However, an organic group where carbon atoms which are directly bonded with the carboxylic acid group in the formula are substituted with fluorine atoms is excluded.

$X^+$ represents an onium cation.

In General Formula (6B),

Rb represents an organic group. However, an organic group where carbon atoms which are directly bonded with the sulfonic acid group in the formula are substituted with fluorine atoms is excluded.

$X^+$ represents an onium cation.

With regard to an organic group which is represented by Ra and Rb, atoms which are directly bonded with the carboxylic acid group or a sulfonic acid group in the formula are preferably carbon atoms. However, in this case, in order to make an acid relatively weaker than the acid which is generated from the photoacid generator described above, the carbon atoms which are directly bonded with a sulfonic acid group or a carboxylic acid group are not substituted with fluorine atoms.

Examples of the organic group which is represented by Ra and Rb include an alkyl group with 1 to 20 carbon atoms, a cycloalkyl group with 3 to 20 carbon atoms, an aryl group with 6 to 30 carbon atoms, an aralkyl group with 7 to 30 carbon atoms, or a heterocyclic group with 3 to 30 carbon atoms, or the like. A part or all of the hydrogen atoms of these groups may be substituted.

Examples of a substituent group which the alkyl group, the cycloalkyl group, the aryl group, the aralkyl group and the heterocyclic group described above may have include a hydroxyl group, a halogen atom, an alkoxy group, a lactone group, an alkylcarbonyl group, and the like.

Examples of the onium cation which is represented by $X^+$ in General Formulas (6A) and (6B) include a sulfonium cation, an ammonium cation, an iodonium cation, a phosphonium cation, a diazonium cation, and the like, and a sulfonium cation is more preferable among these.

The sulfonium cation is preferably, for example, an arylsulfonium cation which has at least one aryl group, and more preferably a triarylsulfonium cation. The aryl group may have a substituent group and the aryl group is preferably a phenyl group.

Preferable examples of the sulfonium cation and the iodonium cation also include the structures described for the compound (B).

Specific structures of the onium salt which is represented by General Formulas (6A) and (6B) will be shown below.

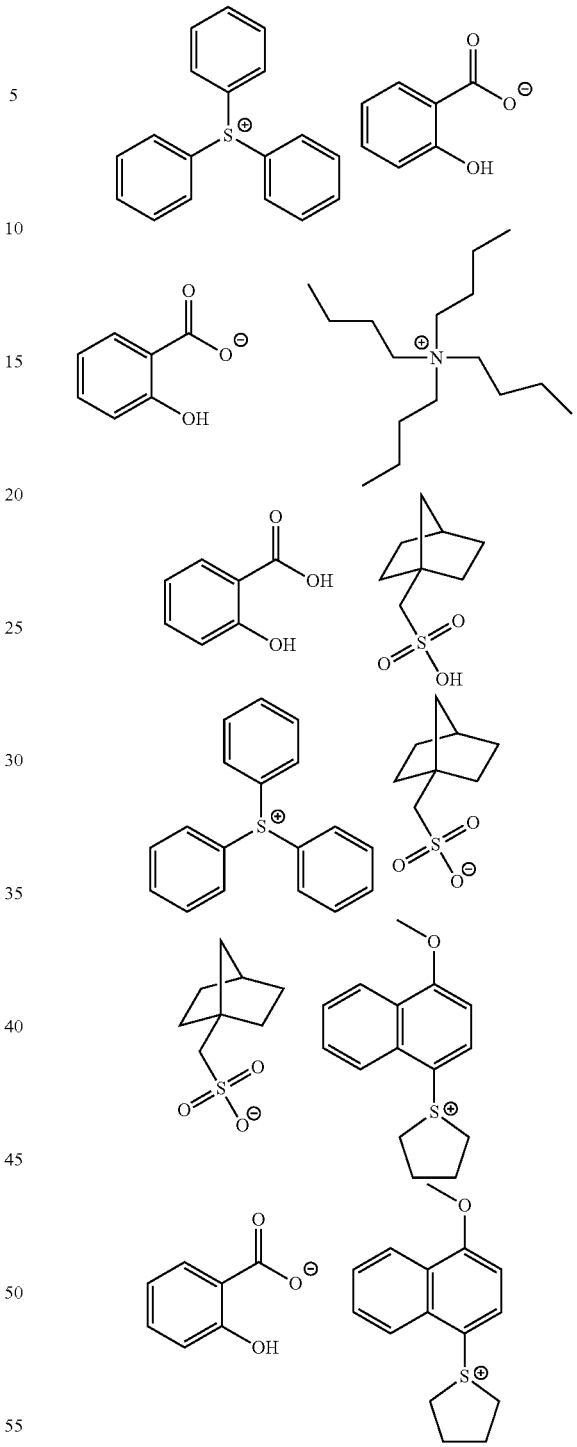

The resin composition (1) may or may not contain the onium salt described above; however, when contained, the content ratio of the onium salt described above is preferably 0.001 mass % to 20 mass % on the basis of the solid content of the resin composition (1), and more preferably 0.01 mass % to 10 mass %.

(5) In another aspect, the resin composition (1) may contain compounds which have both an onium salt structure and an acid anion structure in one molecule (also referred to below as a "betaine compound") such as the compounds which are included in Formula (I) in JP2012-189977A, the compounds which are represented by Formula (I) in JP2013-6827A, the compounds which are represented by Formula (I) in JP2013-8020A, and the compounds which are represented by Formula (I) in JP2012-252124A as the basic compound. Examples of the onium salt structure include sulfonium, iodonium, ammonium salt structure, and the like, and the sulfonium or the iodonium salt structure are preferable. In addition, the acid anion structure is preferably a sulfonic acid anion or a carboxylic acid anion. Examples of the compounds include the following.

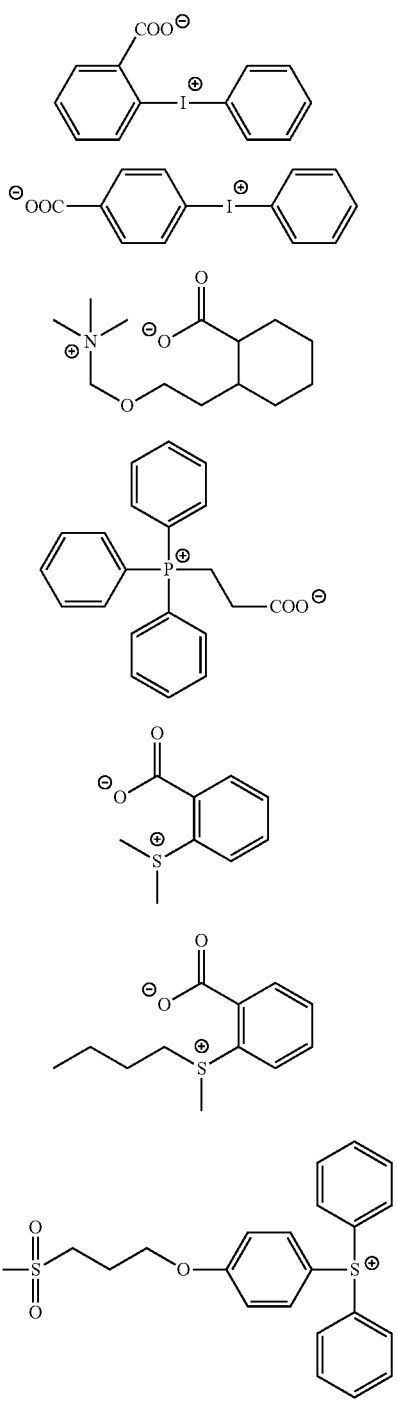

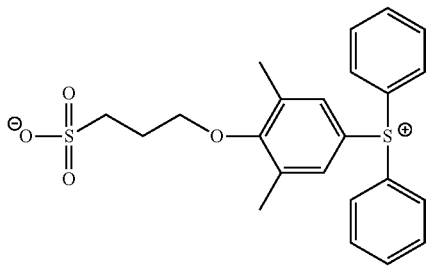

The resin composition (1) may or may not contain the betaine compound described above; however, when contained, the content ratio of the betaine compound described above is preferably 0.001 mass % to 20 mass % on the basis of the solid content of the resin composition (1), and more preferably 0.01 mass % to 10 mass %.

[6] Surfactant

The resin composition (1) may further contain a surfactant. In a case where the resin composition (1) contains a surfactant, the resin preferably contains any of a fluorine and/or silicon-based surfactant (a fluorine-based surfactant, a silicon-based surfactant, or a surfactant which has both fluorine atoms and silicon atoms) or 2 or more types thereof.

By the resin composition (1) containing a surfactant, it is possible to impart a resist pattern with fewer adhesion and developing defects with a favorable sensitivity and resolution while using an exposure light source of 250 nm or less, particularly 220 nm or less.

Examples of the fluorine-based and/or silicon-based surfactant include the surfactants described in "0276" of the specification in US2008/0248425A and are, for example, Fluorad FC430, 431, and 4430 (produced by Sumitomo 3M Inc.), MEGAFACE series (produced by DIC Inc.), SURFLON S-382, SC101, 102, 103, 104, 105, and 106, KH-20 (produced by Asahi Glass Co., Ltd.), TROYZOL S-366 (produced by Troy Chemical Industries, Inc.), GF-300 and GF-150 (produced by Toagosei Co., Ltd.), SURFLON S-393 (produced by Seimi Chemical Co., Ltd.), EFTOP EF121, EF122A, EF122B, RF122C, EF125M, EF135M, EF351, EF352, EF801, EF802, EF601 (produced by Gemco Inc.), PF636, PF656, PF6320, PF6520 (produced by OMNOVA Corporation), FTX-204G, 208G, 218G, 230G, 204D, 208D, 212D, 218D, 222D (produced by Neos Co., Ltd.), and the like. In addition, it is also possible to use polysiloxane polymer KP-341 (produced by Shin-Etsu Chemical Co., Ltd.) as a silicon-based surfactant.

In addition, as a surfactant, other than the surfactants known in the art as described above, it is possible to use a surfactant which uses a polymer which has a fluoro aliphatic group which is derived from a fluoro aliphatic compound which is produced by a telomerisation method (also referred to as a telomer method) or an oligomerization method (also referred to as an oligomer method). It is possible to synthesize the fluoro aliphatic compound using the method described in JP2002-90991A.

Examples of surfactants which correspond to the described above include MEGAFACE F178, F-470, F-473, F-475, F-476, F-472 (produced by DIC Inc.), a copolymers of acrylate (or methacrylate) which has a $C_6F_{13}$ group and (poly(oxyalkylene))acylate (or methacrylate), a copolymer of acrylate (or methacrylate) which has a $C_3F_7$ group, (poly(oxyethylene))acrylate (or methacrylate), and (poly(oxypropylene))acrylate (or methacrylate), and the like.

In addition, in the present invention, it is also possible to use other surfactants than the fluorine-based and/or the silicon-based surfactants described in "0280" of the specification in US2008/0248425A.

The surfactants may be used individually or may also be used in various combinations.

In a case where the resin composition (1) contains a surfactant, the usage amount of the surfactant is preferably 0.0001 mass % to 2 mass % with respect to all of the resin composition (1) (excluding a solvent), and more preferably 0.0005 mass % to 1 mass %.

On the other hand, by setting the added amount of the surfactant to 10 ppm or less with respect to all of the resin composition (1) (excluding a solvent), the surface uneven distribution characteristics of a hydrophobic resin are increased and, due to this, it is possible to make the resist film surface more hydrophobic, and it is possible to improve the water conformance at the time of liquid immersion exposure.

[7] Other Additive Agents (G)

The resin composition (1) may contain carboxylic acid onium salt. Examples of the carboxylic acid onium salt include the carboxylic acid onium salt described in "0605" to "0606" of the specification in US2008/0187860A.

In a case where the resin composition (1) contains carboxylic acid onium salt, the content ratio is generally 0.1 mass % to 20 mass % with respect to the total solid content of the resin composition (1), preferably 0.5 mass % to 10 mass %, and more preferably 1 mass % to 7 mass %.

In addition, the resin composition (1) may include a so-called acid multiplication agent as necessary. An acid multiplication agent is particularly preferably used when performing the pattern formation method of the present invention using EUV exposure or electron beam irradiation. Specific examples of the acid multiplication agents are not particularly limited; however, examples include the following.

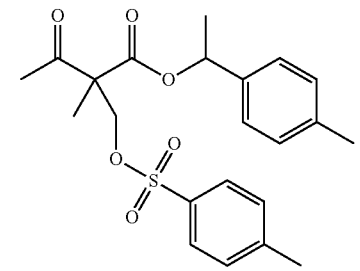

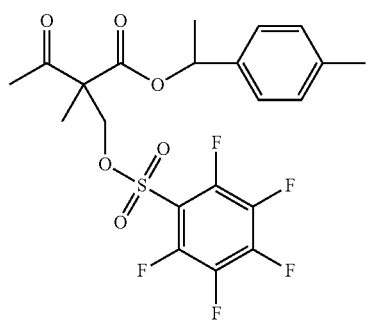

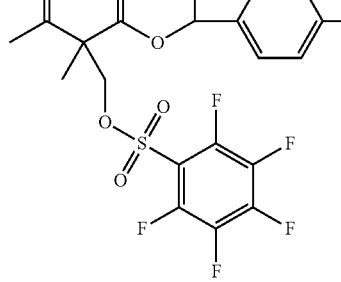

-continued

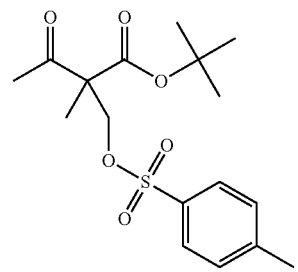

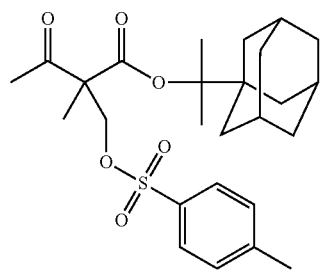

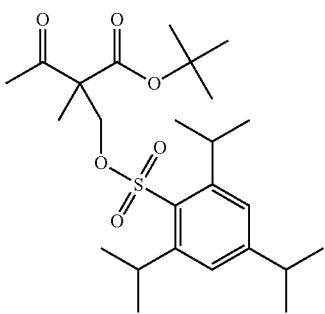

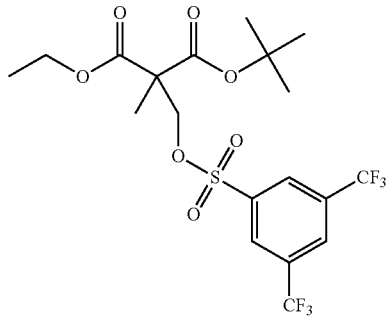

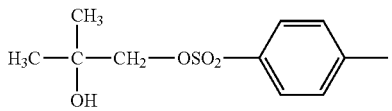

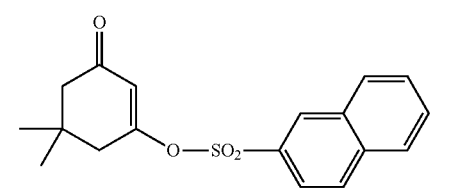

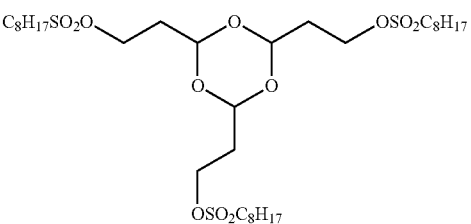

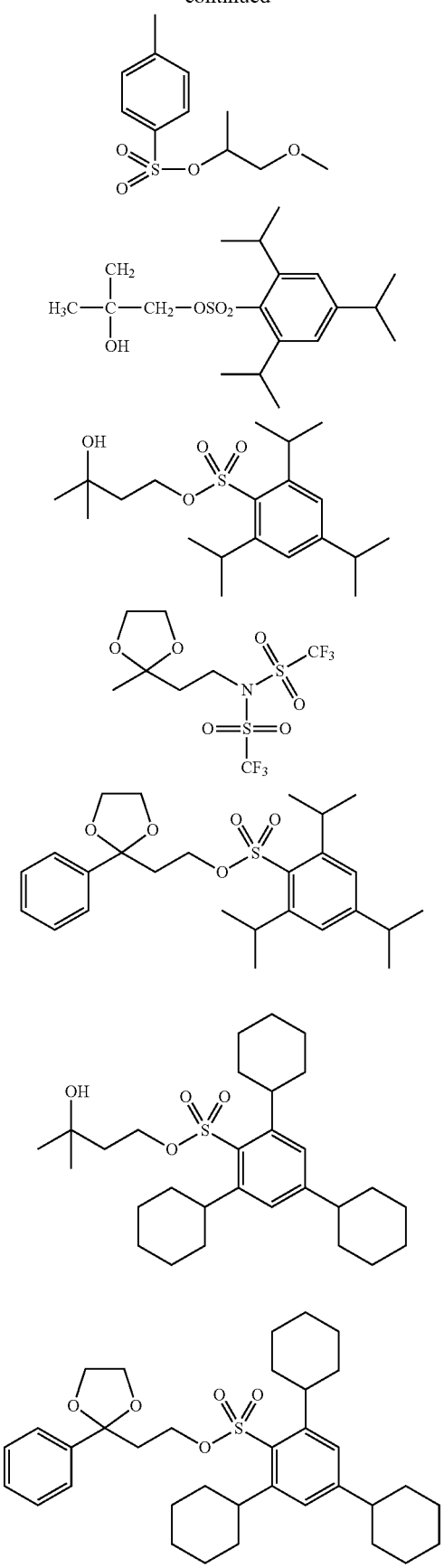

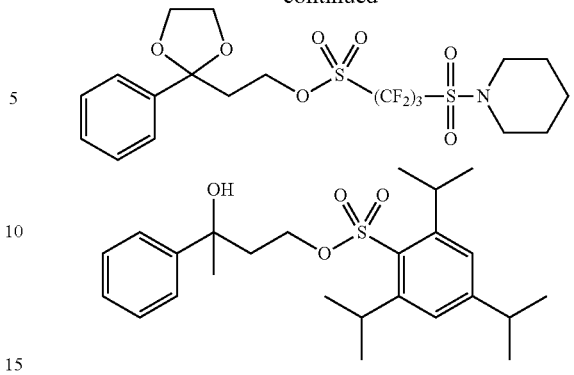

It is possible for the resin composition (1) to further contain a compound which promotes the solubility with respect to a dye, a plasticizer, a photosensitizer, a light absorption agent, an alkali-soluble resin, a dissolution inhibitor, and a developer (for example, a phenol compound with a molecular weight of 1,000 or less, an alicyclic or aliphatic compound which has a carboxyl group), or the like as necessary.

<Actinic Ray-Sensitive or Radiation-Sensitive Resin Composition (2)>

Next, description will be given of the actinic ray-sensitive or radiation-sensitive resin composition (2) which is used in the pattern formation method of the present invention (also simply referred to as "resin composition (2)").

The resin composition (2) contains a resin of which, due to a polarity being increased by an action of an acid, a solubility decreases with respect to a developer which includes an organic solvent.

Examples of such resins include the same resins as described in the resin composition (1), of which, due to a polarity being increased by an action of an acid, a solubility decreases with respect to a developer, and the preferable range of the content of the resins with respect to all of the resin composition (1) is also the same as described for the resin composition (1).

In addition, it is possible for the resin composition (2) to contain each of the components which the resin composition (1) may contain, and the preferable ranges of the content of each of the components with respect to all of the resin composition (2) are also the same as described for the resin composition (1).

The solid content concentration of the resin composition (1) and (2) is generally 1.0 mass % to 10 mass %, preferably 2.0 mass % to 5.7 mass %, and more preferably 2.0 mass % to 5.3 mass %. Setting the solid content concentration to this range makes it possible to uniformly coat a resist solution on a substrate.

The solid content concentration is a weight percentage of the weight of other resist components excluding solvents with respect to the total weight of the actinic ray-sensitive or radiation-sensitive resin composition.

The resin compositions (1) and (2) are used by being coated on a predetermined support (a substrate) after dissolving the components described above in a predetermined organic solvent, preferably a mixed solvent, and carrying out filtration with a filter. The filter which is used for the filtration with a filter is preferably made of polytetrafluoroethylene, polyethylene, or nylon with a pore size of 0.1 µm or less, more preferably 0.05 µm or less, and even more preferably 0.03 µm or less. In the filter filtration, for example, cyclic filtration may be performed or filtration may be performed by connecting a plurality of types of filters in series or in parallel as in JP2002-62667A. In addition, the resin compositions (1) and (2) may be filtered a plurality of times. Furthermore, a degassing process or the like may be performed with respect to the resin composition (1) and (2) before or after the filter filtration.

The resin composition (1) and the resin composition (2) may be the same or different from each other. In a case where the exposure light source in step (v) and the exposure light source in step (i-2) are the same, the resin composition (1) and the resin composition (2) are preferably the same.

Here, for example, in a case where heat curing (heating) as in heating step (ii) is carried out after forming a first negative type pattern in step (i-3), this does not tend to cause a problem; however, it does not preclude carrying out the resist design in consideration of the problem of intermixing.

For intermixing suppression, for example, selecting a solvent, which dissolves the resin in the resin composition (2) while not dissolving the resin in the resin composition (1), as a solvent contained in the resin composition (2) may be considered. For such a design, examples of the solvent contained in the resin composition (2) include a solvent which was given as the rinsing liquid which includes an organic solvent described above and, among these, alcohol-based solvents or ether-based solvents are preferable.

EXAMPLES

Detailed description will be given below of the present invention using examples. However, the present invention is not limited to the examples below.

1. Examples 1 to 32

<Preparation of Actinic Ray-Sensitive or Radiation-Sensitive Resin Composition>

Actinic ray-sensitive or radiation-sensitive resin compositions Ar-01 to 33 were prepared by dissolving 3.8 mass % of the components shown in Table 4 in the total solid content using the solvents shown in the same Table and filtering each resin composition using a polyethylene filter having a pore size of 0.1 μm.

TABLE 4

| Resin Composition | Resin | Mass/g | Combined Resin | Mass/g | Evaluation | Acid Generator | Mass/g | Combined Acid Generator | Mass/g | Evaluation | Basic Compound |
|---|---|---|---|---|---|---|---|---|---|---|---|
| Ar-01 | Pol-01 | 10 | — | — | 10 | PAG-1 | 0.3 | PAG-2 | 0.2 | 5 | N-1 |
| Ar-02 | Pol-02 | 10 | — | — | 10 | PAG-8 | 0.3 | PAG-9 | 0.2 | 5 | N-2 |
| Ar-03 | Pol-03 | 10 | — | — | 10 | PAG-11 | 0.3 | PAG-12 | 0.2 | 5 | N-2 |
| Ar-04 | Pol-04 | 10 | — | — | 6 | PAG-5 | 0.3 | PAG-6 | 0.2 | 5 | N-1 |
| Ar-05 | Pol-05 | 10 | — | — | 6 | PAG-10 | 0.3 | PAG-9 | 0.2 | 5 | N-9 |
| Ar-06 | Pol-06 | 10 | — | — | 6 | PAG-12 | 0.5 | — | — | 5 | N-3 |
| Ar-07 | Pol-01 | 8 | Pol-07 | 2 | 10 | PAG-2 | 0.5 | — | — | 5 | N-3 |
| Ar-08 | Pol-07 | 10 | — | — | 9 | PAG-7 | 0.3 | PAG-2 | 0.2 | 5 | N-4 |
| Ar-09 | Pol-08 | 10 | — | — | 9 | PAG-8 | 0.3 | PAG-4 | 0.2 | 5 | N-1 |
| Ar-10 | Pol-09 | 8 | Pol-08 | 2 | 9 | PAG-13 | 0.3 | PAG-12 | 0.2 | 5 | N-3 |
| Ar-11 | Pol-10 | 10 | — | — | 5 | PAG-1 | 0.3 | PAG-3 | 0.2 | 5 | N-8 |
| Ar-12 | Pol-11 | 10 | — | — | 5 | PAG-7 | 0.3 | PAG-9 | 0.2 | 5 | N-2 |
| Ar-13 | Pol-12 | 10 | — | — | 5 | PAG-5 | 0.3 | PAG-12 | 0.2 | 5 | N-2 |
| Ar-14 | Pol-13 | 10 | — | — | 8 | PAG-8 | 0.3 | PAG-9 | 0.2 | 5 | N-1 |
| Ar-15 | Pol-14 | 10 | — | — | 8 | PAG-12 | 0.5 | — | — | 5 | N-3 |
| Ar-16 | Pol-15 | 10 | — | — | 8 | PAG-10 | 0.3 | PAG-9 | 0.2 | 5 | N-1 |
| Ar-17 | Pol-16 | 10 | — | — | 4 | PAG-6 | 0.5 | — | — | 5 | N-4 |
| Ar-18 | Pol-17 | 10 | — | — | 4 | PAG-7 | 0.3 | PAG-2 | 0.2 | 5 | N-4 |
| Ar-19 | Pol-18 | 10 | — | — | 4 | PAG-11 | 0.3 | PAG-4 | 0.2 | 5 | N-2 |
| Ar-20 | Pol-19 | 10 | — | — | 7 | PAG-6 | 0.5 | — | — | 5 | N-3 |
| Ar-21 | Pol-20 | 10 | — | — | 3 | PAG-1 | 0.3 | PAG-9 | 0.2 | 5 | N-4 |
| Ar-22 | Pol-01 | 10 | — | — | 10 | PAG-1 | 0.5 | — | — | 3 | N-1 |
| Ar-23 | Pol-02 | 10 | — | — | 10 | PAG-8 | 0.5 | — | — | 3 | N-6 |
| Ar-24 | Pol-03 | 10 | — | — | 10 | PAG-11 | 0.5 | — | — | 3 | N-3 |
| Ar-25 | Pol-07 | 10 | — | — | 9 | PAG-5 | 0.5 | — | — | 3 | N-2 |
| Ar-26 | Pol-08 | 10 | — | — | 9 | PAG-10 | 0.5 | — | — | 3 | N-1 |
| Ar-27 | Pol-09 | 10 | — | — | 9 | PAG-13 | 0.5 | — | — | 3 | N-4 |
| Ar-28 | Pol-10 | 10 | — | — | 5 | PAG-10 | 0.5 | — | — | 3 | N-2 |
| Ar-29 | Pol-11 | 10 | — | — | 5 | PAG-7 | 0.5 | — | — | 3 | N-7 |
| Ar-30 | Pol-12 | 10 | — | — | 5 | PAG-10 | 0.5 | — | — | 3 | N-3 |
| Ar-31 | Pol-03 | 10 | — | — | — | PAG-14 | 0.5 | — | — | — | N-3 |
| Ar-32 | Pol-21 | 10 | — | — | — | PAG-11 | 0.3 | PAG-12 | 0.2 | — | N-1 |
| Ar-33 | Pol-22 | 10 | — | — | — | PAG-1 | 0.8 | — | — | — | N-1 |

| Resin Composition | Mass/g | Combined Basic Compound | Mass/g | Surfactant | Mass/g | Additive | Mass/g | Solvent | Ratio (Mass Ratio) |
|---|---|---|---|---|---|---|---|---|---|
| Ar-01 | 0.02 | N-5 | 0.01 | W-1 | 0.03 | 1b | 0.05 | SL-1/SL-4 | 80/20 |
| Ar-02 | 0.02 | N-6 | 0.01 | — | — | 4b | 0.05 | SL-1/SL-4 | 70/30 |
| Ar-03 | 0.03 | — | — | W-2 | 0.03 | 2b | 0.05 | SL-1/SL-5 | 98/2 |
| Ar-04 | 0.02 | N-8 | 0.01 | W-3 | 0.03 | 3b | 0.05 | SL-1/SL-2 | 80/20 |
| Ar-05 | 0.03 | — | — | — | — | 1b | 0.05 | SL-1 | 100 |
| Ar-06 | 0.03 | — | — | W-1 | 0.03 | 4b | 0.05 | SL-1/SL-3 | 70/30 |
| Ar-07 | 0.02 | N-7 | 0.01 | — | — | 4b | 0.05 | SL-1/SL-2 | 80/20 |
| Ar-08 | 0.02 | N-5 | 0.01 | W-4 | 0.03 | 3b | 0.05 | SL-1/SL-4 | 95/5 |
| Ar-09 | 0.03 | — | — | — | — | 2b | 0.05 | SL-1/SL-3/SL-5 | 80/17/3 |
| Ar-10 | 0.02 | N-6 | 0.01 | W-1 | 0.03 | 1b | 0.05 | SL-1/SL-2 | 90/10 |
| Ar-11 | 0.03 | — | — | — | — | 1b | 0.05 | SL-1/SL-3 | 65/35 |

TABLE 4-continued

| | | | | | | | | | |
|---|---|---|---|---|---|---|---|---|---|
| Ar-12 | 0.03 | — | — | W-1 | 0.03 | 2b | 0.05 | SL-1/SL-4 | 70/30 |
| Ar-13 | 0.02 | N-6 | 0.01 | — | — | 4b | 0.05 | SL-1/SL-3 | 70/30 |
| Ar-14 | 0.02 | N-7 | 0.01 | W-6 | 0.03 | 4b | 0.05 | SL-1/SL-4 | 65/35 |
| Ar-15 | 0.03 | — | — | W-5 | 0.03 | 2b | 0.05 | SL-1/SL-4/SL-5 | 55/40/5 |
| Ar-16 | 0.02 | N-9 | 0.01 | — | — | 1b | 0.05 | SL-1/SL-4 | 90/10 |
| Ar-17 | 0.02 | N-7 | 0.01 | — | — | 3b | 0.05 | SL-1 | 100 |
| Ar-18 | 0.03 | — | — | — | — | 4b | 0.05 | SL-1/SL-4 | 80/20 |
| Ar-19 | 0.02 | N-8 | 0.01 | W-4 | 0.03 | 1b | 0.05 | SL-1/SL-3 | 65/35 |
| Ar-20 | 0.02 | N-7 | 0.01 | — | — | 1b | 0.05 | SL-1 | 100 |
| Ar-21 | 0.03 | — | — | — | — | 4b | 0.05 | SL-1/SL-4 | 95/5 |
| Ar-22 | 0.02 | N-6 | 0.01 | — | — | 3b | 0.05 | SL-1/SL-4 | 85/15 |
| Ar-23 | 0.03 | — | — | W-6 | 0.03 | 2b | 0.05 | SL-1/SL-4 | 80/20 |
| Ar-24 | 0.03 | — | — | — | — | 4b | 0.05 | SL-1/SL-5 | 95/5 |
| Ar-25 | 0.02 | N-9 | 0.01 | W-1 | 0.03 | 4b | 0.05 | SL-1/SL-3 | 70/30 |
| Ar-26 | 0.02 | N-8 | 0.01 | W-1 | 0.03 | 4b | 0.05 | SL-1/SL-4 | 70/30 |
| Ar-27 | 0.03 | — | — | — | — | 2b | 0.05 | SL-1/SL-4 | 95/5 |
| Ar-28 | 0.02 | N-9 | 0.01 | W-3 | 0.03 | 1b | 0.05 | SL-1/SL-4 | 90/10 |
| Ar-29 | 0.03 | — | — | — | — | 1b | 0.05 | SL-1/SL-4 | 95/5 |
| Ar-30 | 0.03 | — | — | — | — | 1b | 0.05 | SL-1/SL-4 | 95/5 |
| Ar-31 | 0.03 | — | — | W-1 | 0.03 | 1b | 0.05 | SL-1/SL-3 | 70/30 |
| Ar-32 | 0.03 | — | — | — | — | 2b | 0.05 | SL-1/SL-4 | 95/5 |
| Ar-33 | 0.2 | N-1 | 0.06 | W-1 | 0.04 | 1b | 0.05 | SL-6 | 100 |

<Resin (A)>

The resins in Table 4 are the same as in the following Table 5 and Table 6.

The resins were synthesized as follows.

Synthesis Examples

Synthesis of Resin Pol-02

102.3 parts by mass of cyclohexanone was heated to 80° C. in a nitrogen stream. While stirring the liquid, 22.2 parts by mass of a monomer which is represented to by structural formula Unit-1 below, 22.8 parts by mass of a monomer which is represented by structural formula Unit-2 below, 6.6 parts by mass of a monomer which is represented by structural formula Unit-3 below, and a mixed solution of 189.9 parts by mass of cyclohexanone and 2.40 parts by mass of 2,2'-azobisisobutyrate dimethyl ([V-601, produced by Wako Pure Chemical Industries, Ltd.]) were added dropwise thereto over 5 hours. After finishing the dropwise addition, further stirring was carried out at 80° C. for 2 hours. After cooling the reaction liquid, 41.1 parts by mass of a resin Pol-02 were obtained by vacuum drying the obtained solid by re-precipitating and carrying out filtering in a large amount of hexane/ethyl acetate (mass ratio 9:1).

The weight-average molecular weight (Mw:polystyrene conversion) of the obtained Pol-02 which was determined by GPC (carrier: tetrahydrofuran (THF)) was Mw=9500 and the dispersity was Mw/Mn=1.60. The composition ratio (molar ratio) of the repeating units in the resin Pol-02 which was measured by $^{13}$C-NMR was 40/50/10.

Synthesis of resin Pol-01 and resins Pol-03 to 22 was carried out in the same manner as the synthesis of resin Pol-02 except that the monomers and the usage amounts thereof were respectively changed in the synthesis of resin Pol-02. The composition ratio of the repeating units in the resins Pol-01 to 22 (molar ratio; in order from the left), the weight-average molecular weight (Mw), and the dispersity (Mw/Mn) will be described below.

TABLE 5

| Resin | Unit-1 | Unit-2 | Unit-3 |
|---|---|---|---|
| Pol-01 | | | |

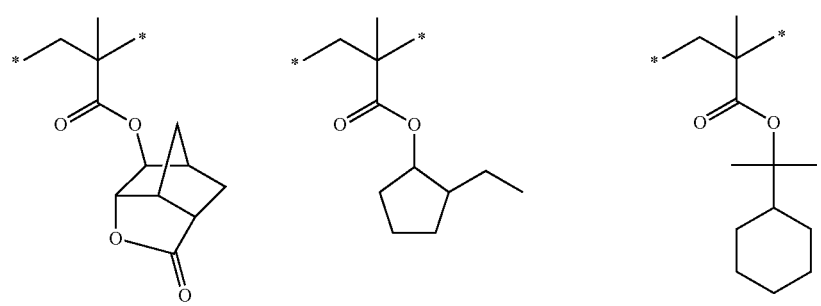

TABLE 5-continued
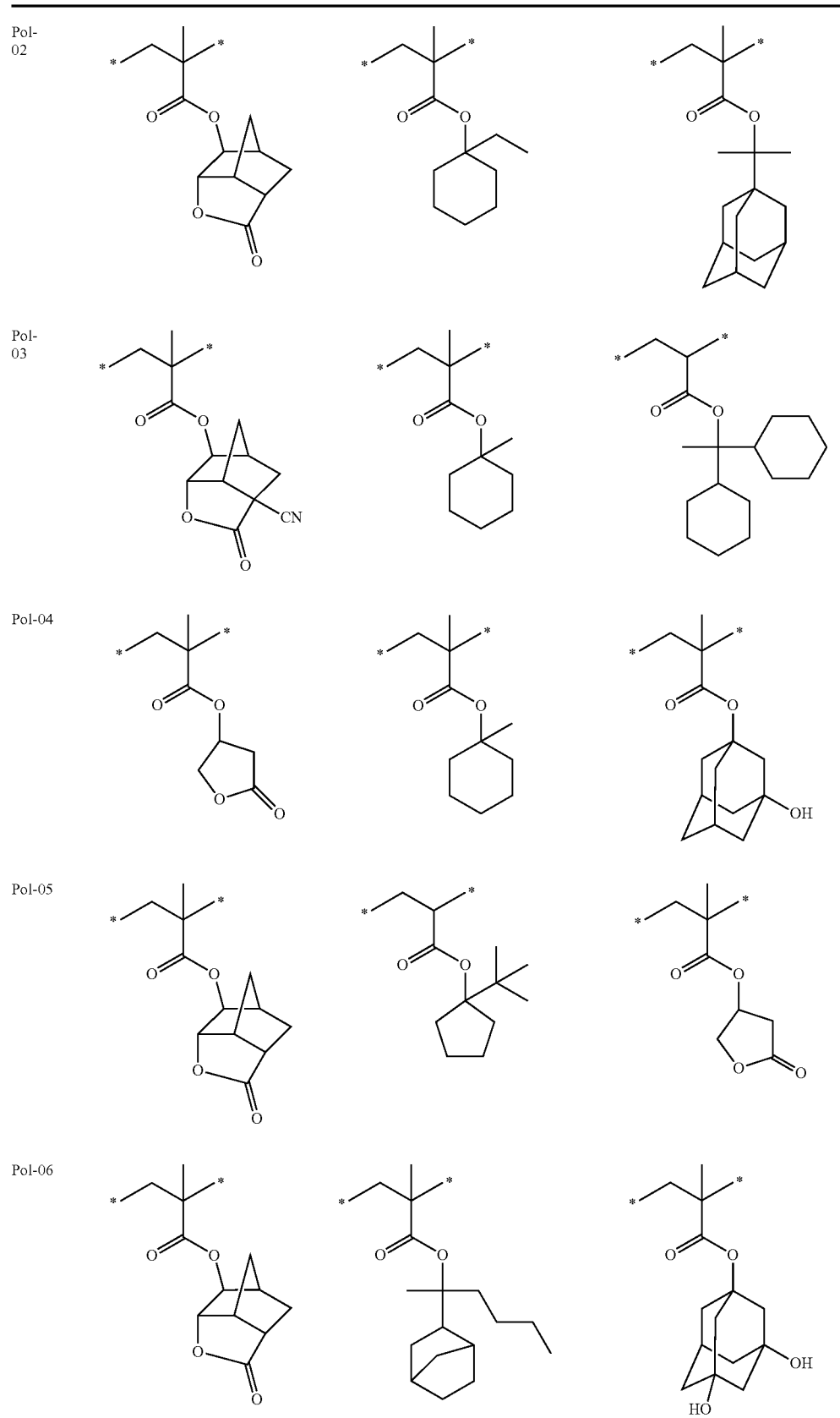

TABLE 5-continued
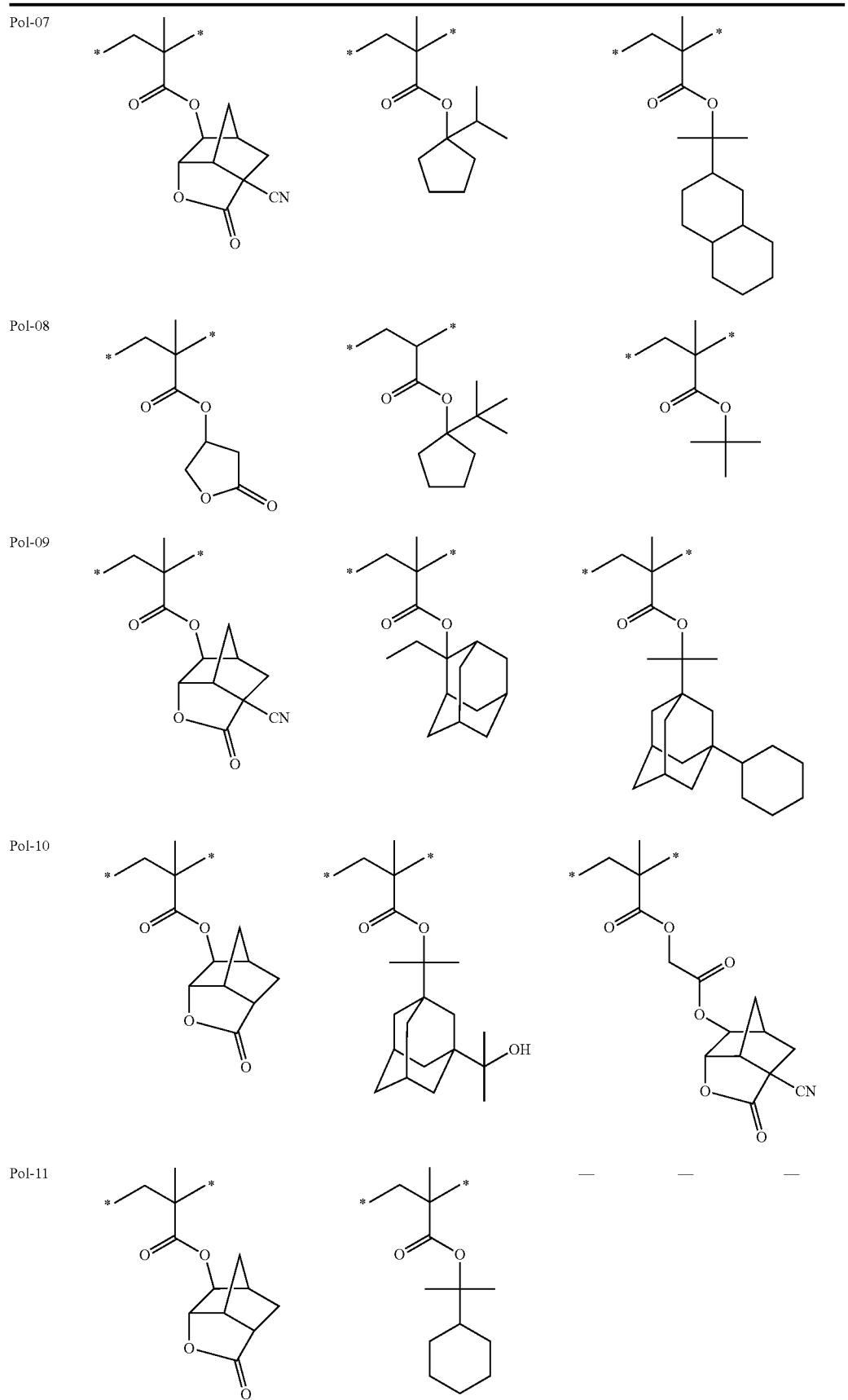

TABLE 5-continued

| Resin | Unit-4 | Unit-5 | Composition Ratio (Molar Ratio) | Mw | Dispersity |
|---|---|---|---|---|---|
| Pol-01 | ![structure: methacrylate with cyclohexyl ester] | — | 30/40/25/5 | 11200 | 1.5 |
| Pol-02 | — | — | 40/50/10 | 9600 | 1.6 |
| Pol-03 | ![structure: acrylate with dihydroxyadamantyl ester] | ![structure: methacrylic acid] | 45/40/5/5/5 | 9800 | 1.6 |
| Pol-04 | — | — | 45/50/10 | 10500 | 1.7 |
| Pol-05 | — | — | 30/60/10 | 20300 | 1.6 |
| Pol-06 | — | — | 40/55/5 | 15300 | 1.6 |
| Pol-07 | ![structure: methacrylate with adamantyl ester] | — | 40/20/35/5 | 9400 | 1.5 |
| Pol-08 | ![structure: methacrylate with cyano lactone group] | — | 35/25/35/5 | 13200 | 1.6 |
| Pol-09 | — | — | 30/35/35 | 11400 | 1.7 |
| Pol-10 | — | — | 30/65/5 | 13200 | 1.7 |
| Pol-11 | — | — | 35/65 | 16900 | 1.6 |

TABLE 6

| Resin | Unit-1 | Unit-2 | Unit-3 |
| --- | --- | --- | --- |
| Pol-12 | | | |
| Pol-13 | | | |
| Pol-14 | | | |
| Pol-15 | | | |

TABLE 6-continued
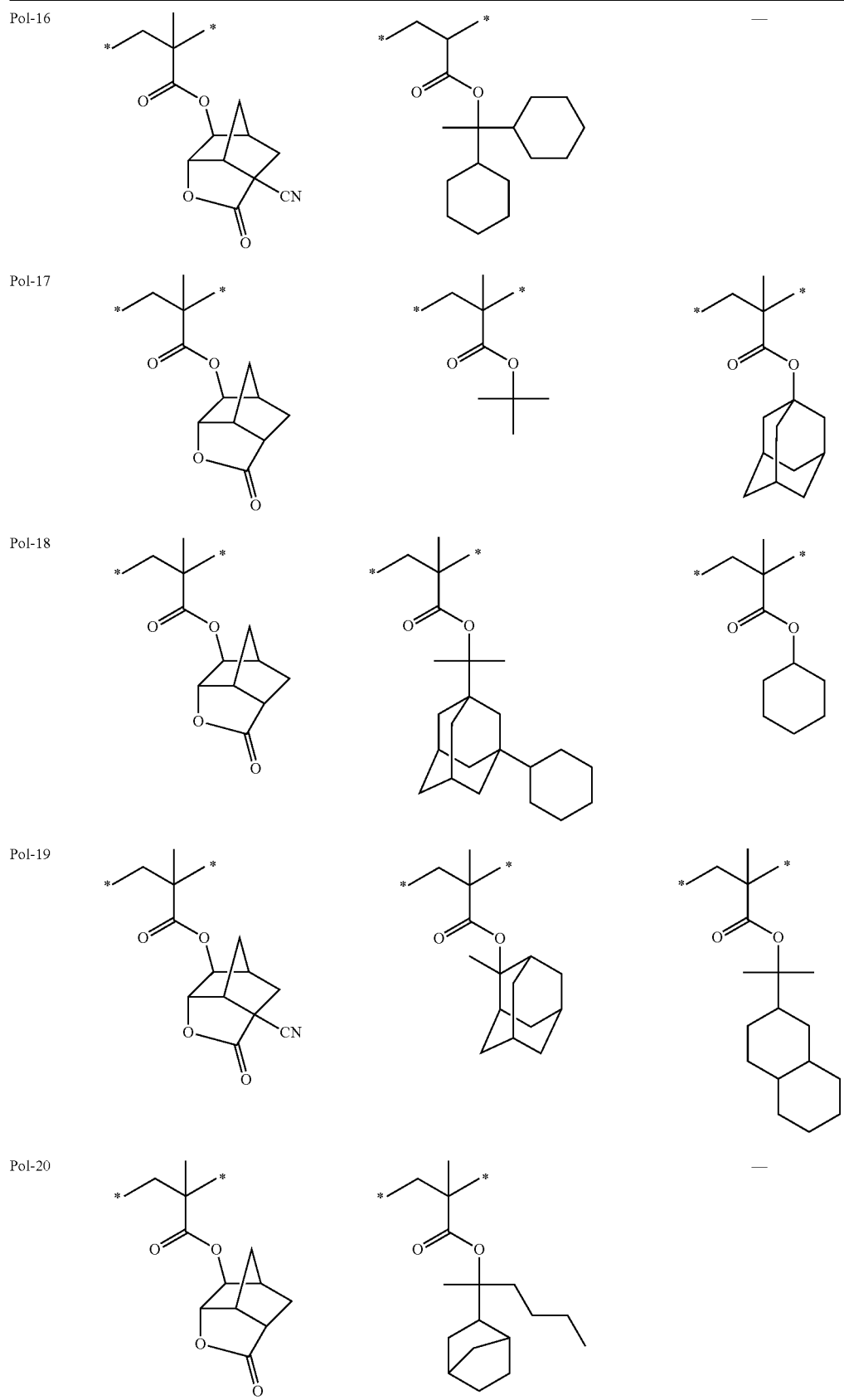

TABLE 6-continued
Pol-21
Pol-22
| Resin | Unit-4 | Unit-5 | Composition Ratio (Molar Ratio) | Mw | Dispersity |
|---|---|---|---|---|---|
| Pol-12 | — | — | 25/65/10 | 14400 | 1.6 |
| Pol-13 | — | — | 50/10/40 | 8400 | 1.5 |
| Pol-14 | — | — | 20/40/40 | 10900 | 1.6 |
| Pol-15 | — | — | 35/25/40 | 11000 | 1.7 |
| Pol-16 | — | — | 30/70 | 15200 | 1.7 |
| Pol-17 | — | — | 20/70/10 | 13100 | 1.6 |
| Pol-18 | — | — | 20/70/10 | 9900 | 1.5 |
| Pol-19 | — | — | 45/10/45 | 10400 | 1.6 |
| Pol-20 | — | — | 20/80 | 11200 | 1.6 |
| Pol-21 | — | — | 40/50/10 | 10600 | 1.5 |
| Pol-22 | — | — | 10/90 | 13000 | 1.7 |
The acid generators in Table 4 are as follows.
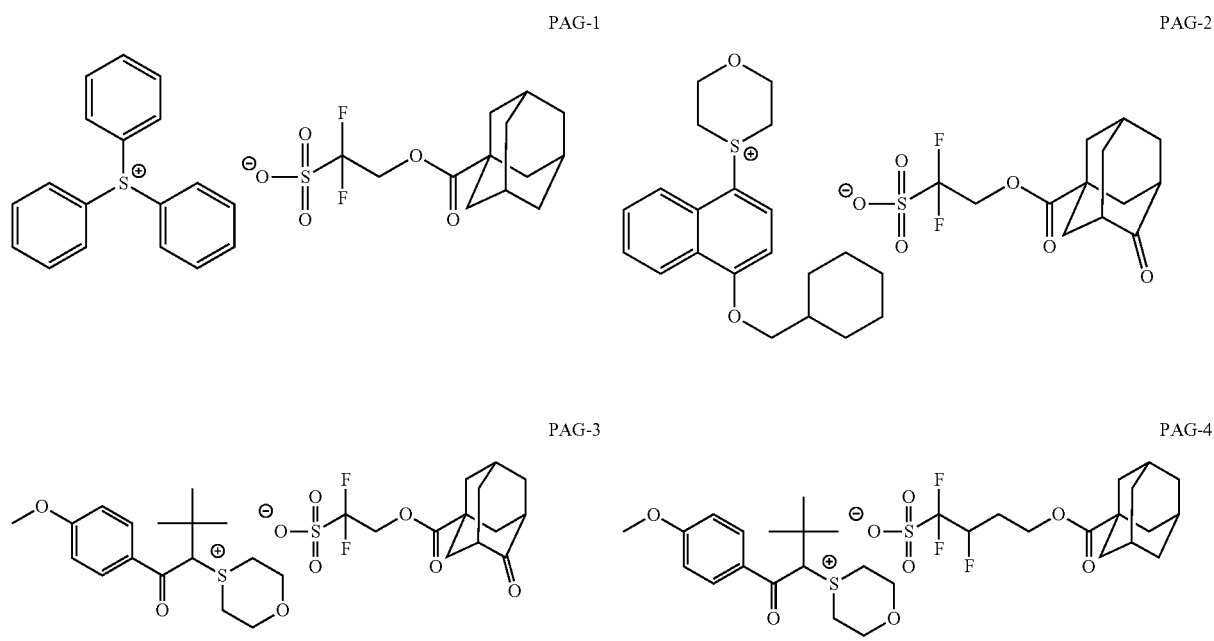
PAG-1  PAG-2  PAG-3  PAG-4

-continued
PAG-5
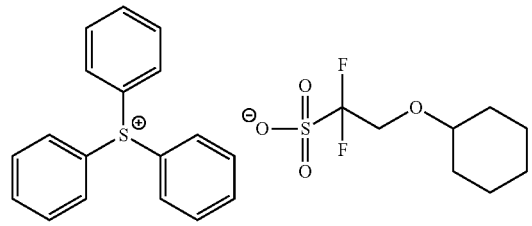
PAG-6
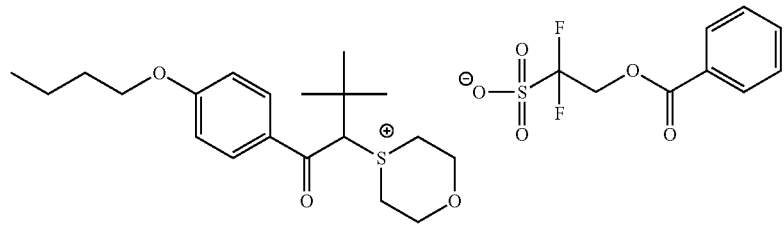
PAG-7
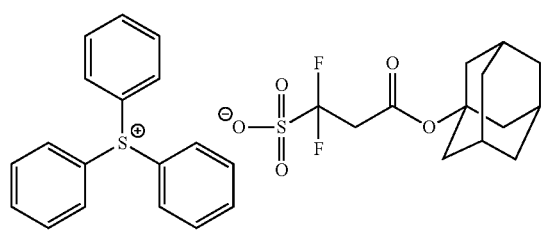
PAG-8
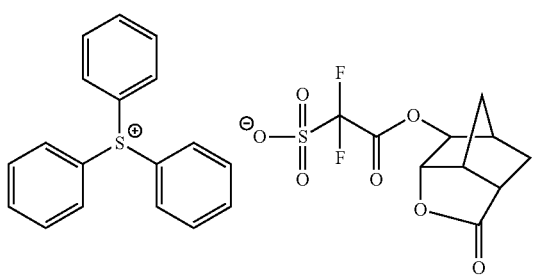
PAG-9
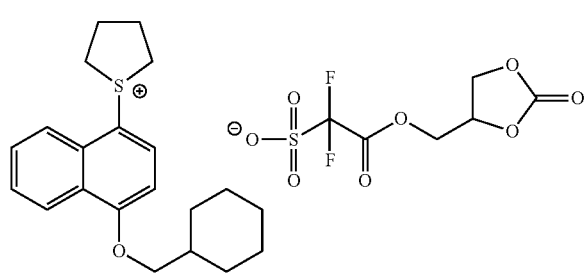
PAG-10
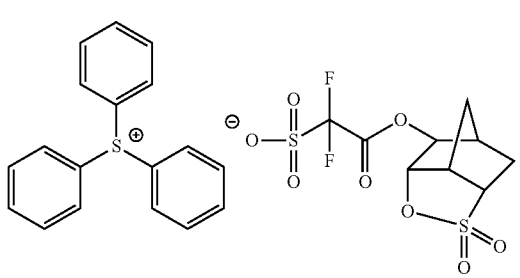
PAG-11
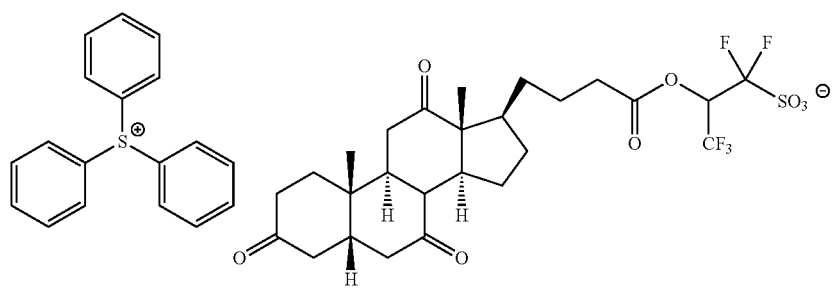
PAG-12
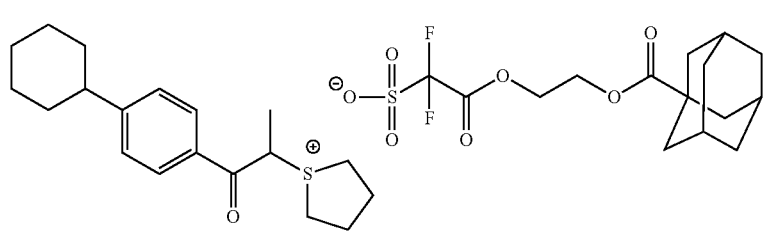

-continued
PAG-13
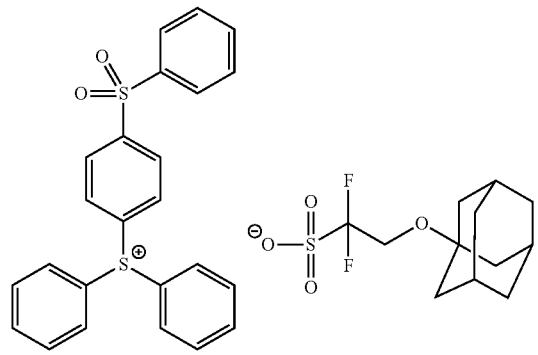
PAG-14
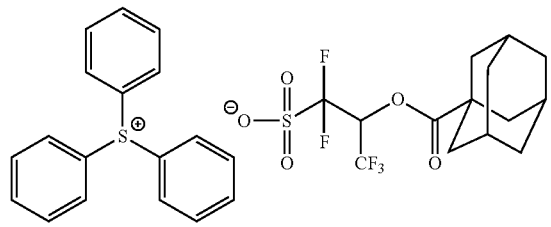
<Basic Compound (N)>
The basic compounds in Table 4 are as follows.
N-1
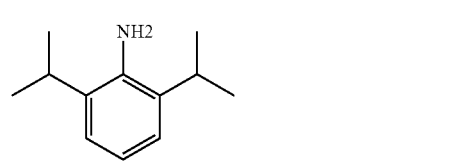
N-2
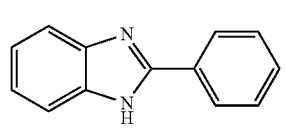
N-3
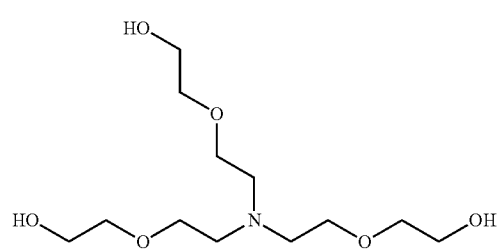
N-4
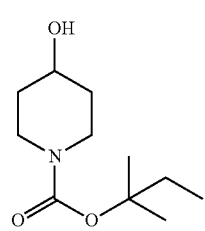
N-5
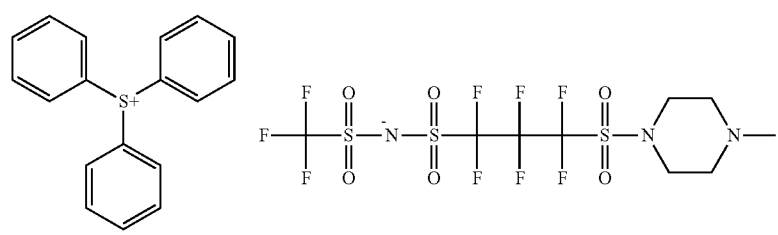
N-6
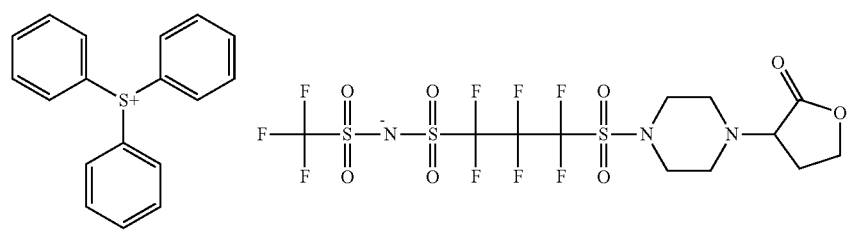
N-7
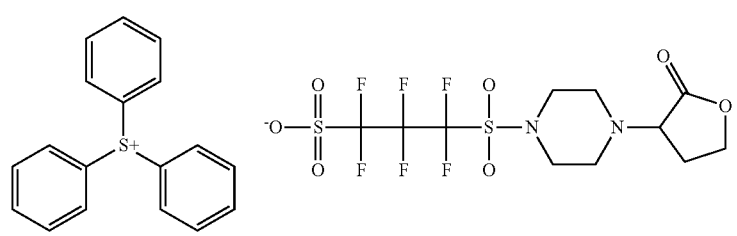

N-8
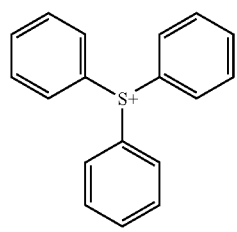 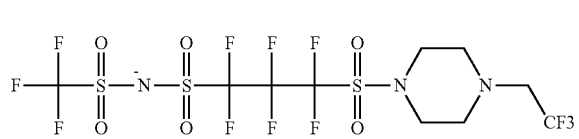
N-9
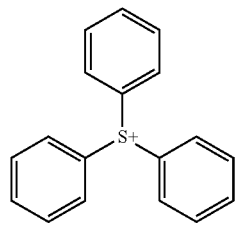 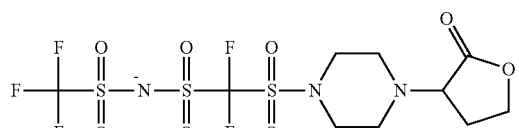
<Hydrophobic Resin (D)>
The additive agents (hydrophobic resin) in Table 4 are as follows.
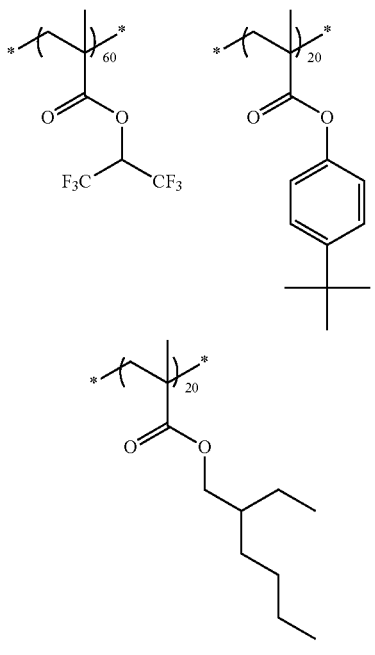
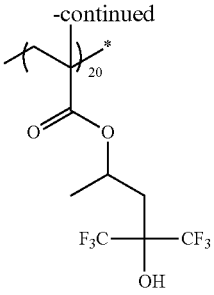
Mw: 9500
Mw/Mn: 1.44
(3c)
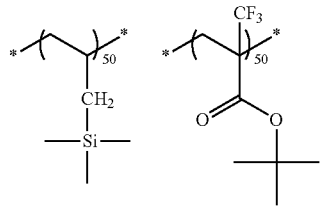
Mw: 6200
Mw/Mn: 1.40
(4b)
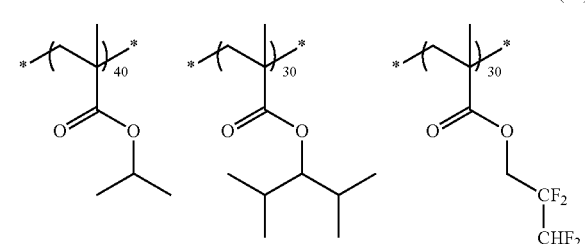
Mw: 8500
Mw/Mn: 1.55
<Surfactant>
The surfactants in Table 4 are as follows.
W-1: MEGAFACE F176 (produced by DIC Inc.; fluorine-based)
W-2: MEGAFACE R08 (produced by DIC Inc.; fluorine and silicon-based)

W-3: Polysiloxane polymer KP-341 (produced by Shin-Etsu Chemical Co., Ltd.; silicon-based)
W-4: TROYZOL S-366 (produced by Troy Chemical Industries, Inc.)
W-5: KH-20 (produced by Asahi Glass Co., Ltd.)
W-6: POLYFOX PF-6320 (produced by OMNOVA Solutions Inc.; fluorine-based)
<Solvent>
The solvents in Table 4 are as follows.
SL-1: Propylene glycol monomethyl ether acetate (PGMEA)
SL-2: Ethyl lactate
SL-3: Propylene glycol monomethyl ether (PGME)
SL-4: Cyclohexanone
SL-5: γ-butyrolactone
SL-6: 4-methyl-2-pentanol Examples 1 to 32

Pattern Formation Method (Formation of First Film)
First, an antireflection film-forming composition ARC29SR (produced by Nissan Chemical Industries, Ltd.) was coated on a silicon wafer, baking was carried out at 205° C. for 60 seconds, and an antireflection film with a film thickness of 96 nm was formed. The resin composition (1) described in Table 7 below was coated thereon, first heating (PB1) was carried out at 100° C. for 60 seconds, and a first film with a film thickness of 100 nm was formed. Here, in Example 32, a top coat layer with a thickness of 100 nm was provided on the resist film using a top coat composition which includes 2.5 mass % of a resin which will be shown below, 0.5 mass % of a polyethylene glycol compound, and 97 mass % of 4-methyl-2-pentanol solvent.

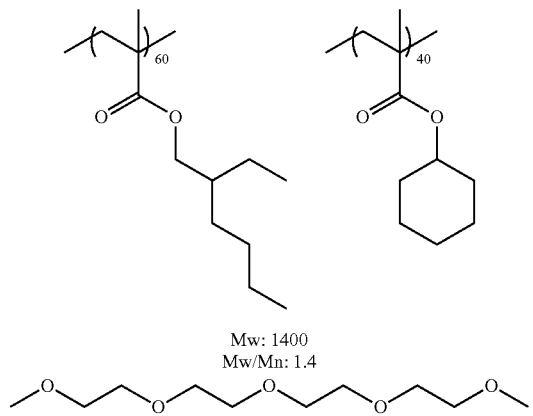

(First Negative Type Pattern Formation)
Pattern exposure (first exposure) was carried out on the first film via a mask (6% half-tone hole patterns, pattern pitch: 90 nm, critical dimension: 45 nm) using an ArF excimer laser immersion scanner (manufactured by ASML Corporation; XT1700i, NA1.20, C-quad20, X-Y polarization, σout/in 0.981/0.895). Next, second heating (PEB1) was carried out at 100° C. for 60 seconds. Subsequently, the first negative type pattern was obtained by carrying out organic solvent development using butyl acetate.
(Heating First Negative Type Pattern Formation)
A third heating (post bake 1) of the first negative type pattern which was obtained as described above was carried out at 200° C. for 60 seconds.

(Second Film Formation)
A second film with a film thickness of 100 nm was formed by coating the resin composition (2) shown in Table 7 below on the substrate where the first negative type pattern was formed, and carrying out a fourth heating (PB2) at 100° C. for 60 seconds. Here, the same top coat layer as in the first film was provided on the second film in Example 32.
(Second Negative Pattern Formation)
Pattern exposure (first exposure) was carried out on the second film via a mask (6% half-tone line and space patterns, pattern pitch: 200 nm, critical dimension: 100 nm) using an ArF excimer laser immersion scanner (manufactured by ASML Corporation; XT1700i, NA0.75, Annular X-Y polarization, σout/in 0.97/0.740). Next, a fifth heating (PEB2) was carried out at 100° C. for 60 seconds. Subsequently, the second negative type pattern was obtained by carrying out organic solvent development using butyl acetate.
A sixth heating (post bake 2) of the second negative type pattern which was obtained as described above was carried out at 100° C. for 60 seconds.

TABLE 7

| | Resin Composition (1) | Resin Composition (2) |
|---|---|---|
| Example 1 | Ar-01 | Ar-33 |
| Example 2 | Ar-02 | Ar-02 |
| Example 3 | Ar-03 | Ar-03 |
| Example 4 | Ar-04 | Ar-08 |
| Example 5 | Ar-05 | Ar-02 |
| Example 6 | Ar-06 | Ar-01 |
| Example 7 | Ar-07 | Ar-33 |
| Example 8 | Ar-08 | Ar-01 |
| Example 9 | Ar-09 | Ar-02 |
| Example 10 | Ar-10 | Ar-04 |
| Example 11 | Ar-11 | Ar-05 |
| Example 12 | Ar-12 | Ar-17 |
| Example 13 | Ar-13 | Ar-18 |
| Example 14 | Ar-14 | Ar-33 |
| Example 15 | Ar-15 | Ar-02 |
| Example 16 | Ar-16 | Ar-03 |
| Example 17 | Ar-17 | Ar-25 |
| Example 18 | Ar-18 | Ar-26 |
| Example 19 | Ar-19 | Ar-27 |
| Example 20 | Ar-20 | Ar-15 |
| Example 21 | Ar-21 | Ar-16 |
| Example 22 | Ar-22 | Ar-17 |
| Example 23 | Ar-23 | Ar-01 |
| Example 24 | Ar-24 | Ar-33 |
| Example 25 | Ar-25 | Ar-03 |
| Example 26 | Ar-26 | Ar-04 |
| Example 27 | Ar-27 | Ar-05 |
| Example 28 | Ar-28 | Ar-28 |
| Example 29 | Ar-29 | Ar-29 |
| Example 30 | Ar-30 | Ar-30 |
| Example 31 | Ar-31 | Ar-31 |
| Example 32 | Ar-32 | Ar-32 |

Figure 3A:
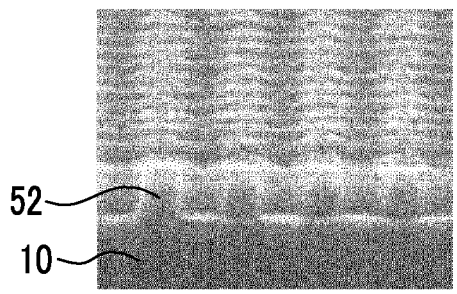
FIG. 3A is a cross-sectional SEM photograph (magnification: 100K) of Example 1.
Figure 3B:
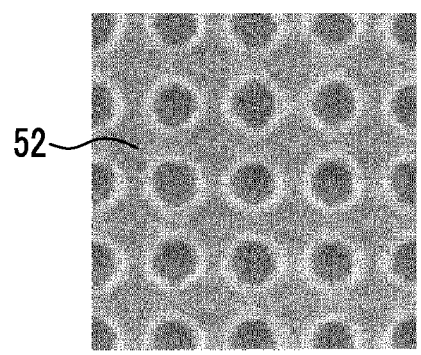
FIG. 3B is an upper surface SEM photograph (magnification: 250K) of Example 1.

In each of the Examples, firstly, after the third heating was carried out and before forming the second film, the first negative type pattern was observed using a scanning electron microscope (S9380 manufactured by Hitachi Ltd.).
FIG. 3A is a cross-sectional SEM photograph (magnification: 100K) of the first negative type pattern of Example 1 and FIG. 3B is a top surface SEM photograph (magnification: 250K) of the first negative type pattern of Example 1.
As a result of the observation, in each of the Examples, it was clearly confirmed that hole patterns (the first negative type patterns) were formed as shown in FIG. 3A and FIG. 3B.

Next, in each of the Examples, after forming the second negative type pattern and carrying out the sixth heating, the second negative type pattern was observed in the same manner as in the observation of the first negative type pattern using a scanning electron microscope (S9380 manufactured by Hitachi Ltd.).

Figure 4A:
FIG. 4A is a cross-sectional SEM photograph (magnification: 100K) of Example 1
Figure 4B:
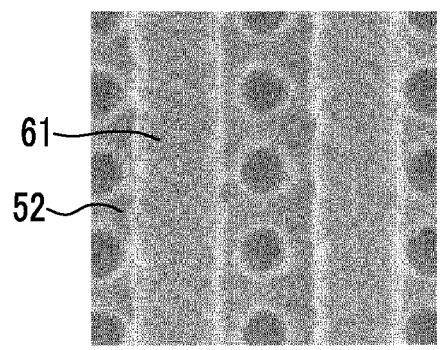
FIG. 4B is an upper surface SEM photograph (magnification: 250K) of Example 1.

FIG. 4A is a cross-sectional SEM photograph (magnification: 100K) of the second negative type pattern of Example 1 and FIG. 4B is a top surface SEM photograph (magnification: 250K) of the second negative type pattern of Example 1.

As a result of the observation, in each of the Examples, it was clearly confirmed that a multi-stage resist pattern was formed in which line patterns (the second negative type patterns) were laminated on the hole patterns (the first negative type patterns).

2. Examples 33 to 38

The main changes in Examples 33 to 38 from Examples 1 to 32 described above were that the light source during exposure was changed to a KrF excimer laser from an ArF excimer laser.

<Preparation of Actinic Ray-Sensitive or Radiation-Sensitive Resin Composition>

The actinic ray-sensitive or radiation-sensitive resin compositions (resin compositions) Kr-01 to 10 were prepared by dissolving the components shown in Table 8 using the solvent shown in the same Table to be 7.2 mass % in total solid content and filtering each resin composition using a polyethylene filter having a pore size of 0.1 μm.

TABLE 8

| Resin Composition | Resin A Concentration in solid content | Resin B Concentration in solid content | Acid generator-A Concentration in solid content | Acid generator-B Concentration in solid content | Basic Compound Concentration in solid content | Surfactant Concentration in solid content | Compound (D) Concentration in solid content | Solvent Mass Ratio |
|---|---|---|---|---|---|---|---|---|
| Kr-01 | Pol-101 92.1 Mass % | — | PAG-101 6.8 Mass % | — | N-1 0.8 Mass % | W-6 0.3 Mass % | — | SL-11/SL-12 90/10 |
| Kr-02 | Pol-102 90.6 Mass % | — | PAG-108 6.2 Mass % | — | N-2 0.9 Mass % | W-6 0.3 Mass % | Ad-2 2.0 Mass % | SL-11/SL-15 70/30 |
| Kr-03 | Pol-103 71.9 Mass % | Pol-101 18.0 Mass % | PAG-105 3.2 Mass % | PAG-104 3.3 Mass % | N-3 1.3 Mass % | W-3 0.3 Mass % | Ad-1 2.0 Mass % | SL-11 100 |
| Kr-04 | Pol-104 92.0 Mass % | — | PAG-106 6.9 Mass % | — | N-1 0.8 Mass % | W-4 0.3 Mass % | — | SL-11/SL-14 80/20 |
| Kr-05 | Pol-105 90.2 Mass % | — | PAG-103 6.6 Mass % | — | N-2 0.9 Mass % | W-5 0.3 Mass % | Ad-2 2.0 Mass % | SL-11/SL-16 95/5 |
| Kr-06 | Pol-106 92.1 Mass % | — | PAG-102 3.8 Mass % | PAG-107 2.8 Mass % | N-4 1.0 Mass % | W-6 0.3 Mass % | — | SL-11/SL-13 95/5 |
| Kr-07 | Pol-107 88.3 Mass % | — | PAG-102 7.6 Mass % | — | N-3 1.3 Mass % | W-1 0.3 Mass % | Ad-2 2.5 Mass % | SL-11/SL-17 98/2 |
| Kr-08 | Pol-108 92.0 Mass % | — | PAG-101 6.8 Mass % | — | N-2 0.9 Mass % | W-2 0.3 Mass % | — | SL-11 100 |
| Kr-09 | Pol-109 92.0 Mass % | — | PAG-106 6.9 Mass % | — | N-1 0.8 Mass % | W-6 0.3 Mass % | — | SL-11/SL-15 60/40 |
| Kr-10 | Pol-110 92.3 Mass % | — | PAG-103 6.6 Mass % | — | N-1 0.8 Mass % | W-6 0.3 Mass % | — | SL-11 100 |

<Resin>

Details of the resins shown in Table 8 (Resin A and Resin B) are as in Table 9 below.

Regarding the resins in Table 9, the resins Pol-101 to 110 were synthesized in the same manner as in the synthesis of Pol-02 described above, except that the monomers and the usage amounts thereof were changed. For the resins Pol-101 to 110, the type of the repeating units (Unit-101 to 121), the composition ratio of the repeating units, the weight-average molecular weight (Mw), and the dispersity (Mw/Mn) are shown in Table 9.

TABLE 9

| | Repeating Unit 1 | | Repeating Unit 2 | | Repeating Unit 3 | | Repeating Unit 4 | | | |
|---|---|---|---|---|---|---|---|---|---|---|
| Resin | Type | Composition Ratio | Type | Composition Ratio | Type | Composition Ratio | Type | Composition Ratio | Mw | Dispersity |
| Pol-101 | Unit-101 | 40 | Unit-112 | 50 | Unit-117 | 10 | — | — | 30000 | 1.7 |
| Pol-102 | Unit-103 | 40 | Unit-108 | 40 | Unit-116 | 20 | — | — | 10000 | 1.6 |
| Pol-103 | Unit-106 | 20 | Unit-114 | 80 | — | — | — | — | 12000 | 1.6 |
| Pol-104 | Unit-106 | 20 | Unit-107 | 20 | Unit-109 | 40 | Unit-118 | 20 | 21000 | 1.7 |
| Pol-105 | Unit-104 | 10 | Unit-110 | 50 | Unit-120 | 40 | — | — | 16000 | 1.6 |
| Pol-106 | Unit-103 | 30 | Unit-115 | 60 | Unit-116 | 10 | — | — | 20000 | 1.7 |
| Pol-107 | Unit-102 | 45 | Unit-111 | 35 | Unit-119 | 20 | — | — | 15000 | 1.6 |
| Pol-108 | Unit-106 | 10 | Unit-112 | 60 | Unit-121 | 30 | — | — | 21000 | 1.6 |

TABLE 9-continued
| | Repeating Unit 1 | | Repeating Unit 2 | | Repeating Unit 3 | | Repeating Unit 4 | | | |
|---|---|---|---|---|---|---|---|---|---|---|
| Resin | Type | Composition Ratio | Type | Composition Ratio | Type | Composition Ratio | Type | Composition Ratio | Mw | Dispersity |
| Pol-109 | Unit-101 | 40 | Unit-113 | 40 | Unit-116 | 20 | — | — | 11000 | 1.6 |
| Pol-110 | Unit-101 | 65 | Unit-113 | 35 | — | — | — | — | 20000 | 1.7 |
The structure of the repeating units (Unit-101 to 121) in Table 9 will be shown below.
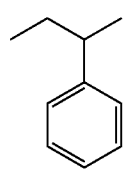
Unit-101
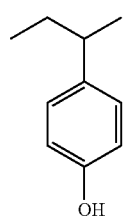
Unit-102
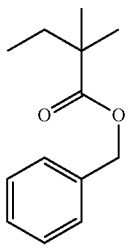
Unit-103
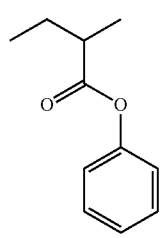
Unit-104
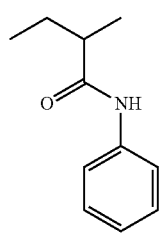
Unit-105
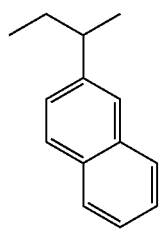
Unit-106
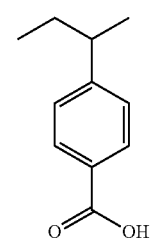
Unit-107
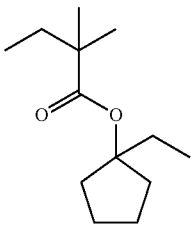
Unit-108
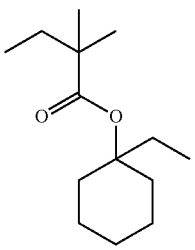
Unit-109
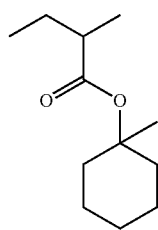
Unit-110

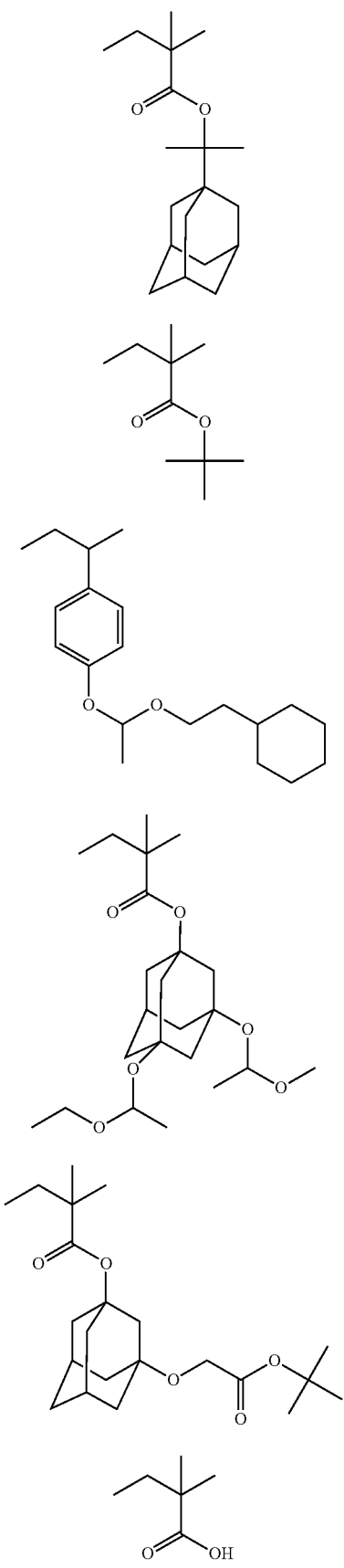
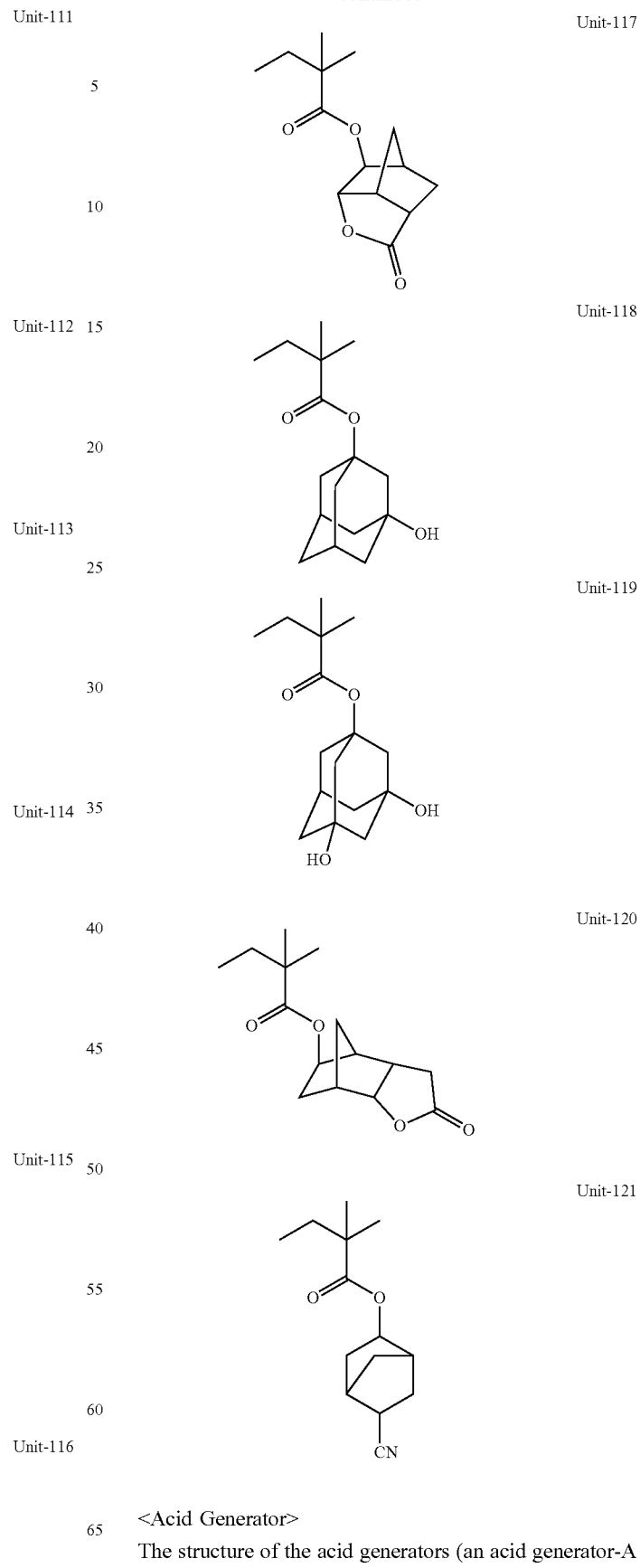
<Acid Generator>
The structure of the acid generators (an acid generator-A and acid generator-B) in Table 8 are shown below.

PAG-101
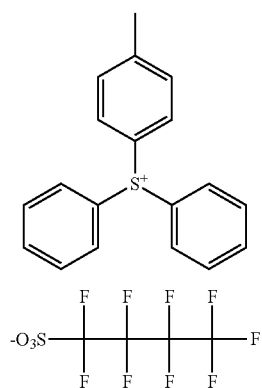
PAG-102
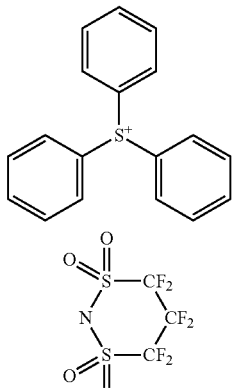
PAG-103
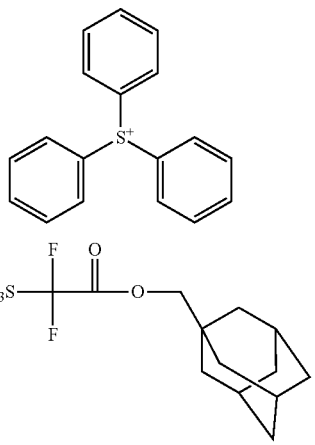
PAG-104
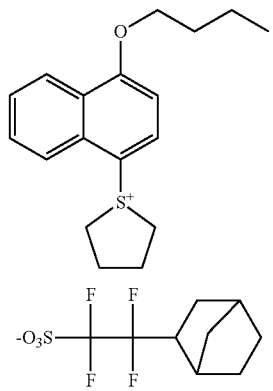
PAG-105
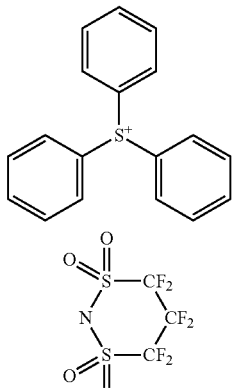
PAG-106
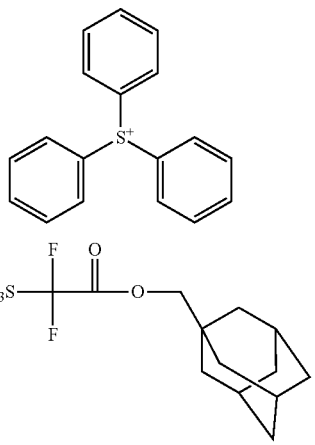
PAG-107
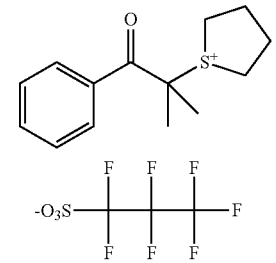
PAG-108
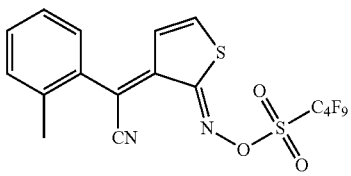
<Basic Compound>
The structure of the basic compounds in Table 8 will be shown below.
N-1
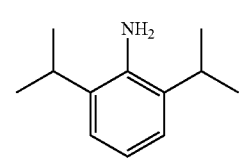

-continued

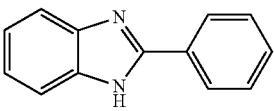
N-2

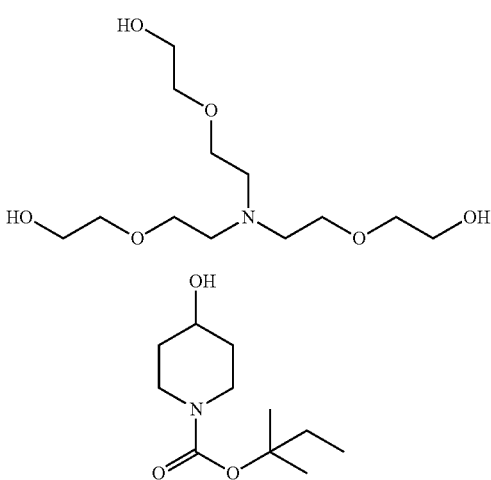
N-3

N-4

<Compound (D)>
The structure of the compound (D) (a light absorption agent) in Table 8 will be shown below.

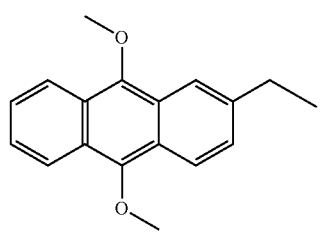
Ad-1

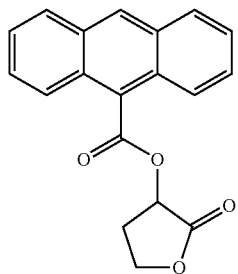
Ad-2

<Surfactant>
The surfactants W-1 to W-6 in Table 8 are the same surfactants W-1 to W-6 as used in Examples 1 to 32.
<Solvent>
The solvents SL-11 to SL-17 in Table 8 are as follows.
SL-11: propylene glycol monomethyl ether acetate (PGMEA)
SL-12: propylene glycol monomethyl ether propionate
SL-13: ethyl lactate
SL-14: propylene glycol monomethyl ether (PGME)
SL-15: cyclohexanone
SL-16: γ-butyrolactone
SL-17: propylene carbonate Examples 33 to 38

Pattern Formation Method (Formation of First Film)

First, an antireflection film-forming composition DUV44 (produced by Brewer Science, Inc.) was coated on a silicon wafer, and baking was carried out at 205° C. for 60 seconds, and an antireflection film with a film thickness of 60 nm was formed. The resin composition (1) described in Table 10 below was coated thereon, first heating (PB1) was carried out at 100° C. for 60 seconds, and a first film with a film thickness of 300 nm was formed.

(First Negative Type Pattern Formation)

Pattern exposure (first exposure) was carried out on the first film via an exposure mask (6% half-tone hole patterns, pattern pitch: 240 nm, critical dimension: 120 nm) using a KrF excimer laser immersion scanner (manufactured by ASML Corporation; PAS 5500/850, NA0.80). Next, a second heating (PEB1) was carried out at 100° C. for 60 seconds. Subsequently, the first negative type pattern was obtained by carrying out organic solvent development using butyl acetate.

(Heating First Negative Pattern Formation)

A third heating (post bake 1) of the first negative type pattern which was obtained as described above was carried out at 200° C. for 60 seconds.

(Second Film Formation)

The resin composition (2) shown in Table 10 below was coated on the substrate on which the first negative type patterns was formed, a fourth heating (PB2) was carried out at 100° C. for 60 seconds, and a second film with a film thickness of 300 nm was formed.

(Second Negative Type Pattern Formation)

Pattern exposure (first exposure) was carried out on the second film via a mask (6% half-tone line and space patterns, pattern pitch: 520 nm, critical dimension: 260 nm) using a KrF excimer laser immersion scanner (manufactured by ASML Corporation; PAS 5500/850, NA0.80). A fifth heating (PEB2) was carried out at 100° C. for 60 seconds. Subsequently, the second negative type pattern was obtained by carrying out organic solvent development using butyl acetate.

A sixth heating (post bake 2) of the second negative type pattern which was obtained as described above was carried out at 100° C. for 60 seconds.

TABLE 10

|  | Resin Composition (1) | Resin Composition (2) |
| --- | --- | --- |
| Example 33 | Kr-01 | Kr-08 |
| Example 34 | Kr-02 | Kr-02 |
| Example 35 | Kr-03 | Kr-09 |
| Example 36 | Kr-04 | Kr-10 |
| Example 37 | Kr-05 | Kr-01 |
| Example 38 | Kr-06 | Kr-07 |

In each of the Examples, the first and second negative type patterns were observed in the same manner as Examples 1 to 32 using a scanning electron microscope (S9380 manufactured by Hitachi Ltd.).

In each of the Examples, it was clearly confirmed that a multi-stage resist pattern was formed in which line patterns (the second negative type patterns) were laminated on the hole patterns (the first negative type patterns).

Description has been given above of Examples; however, the present invention is not limited only to the Examples, and it is considered that pattern formation is also possible, for example, with the aspects below.

An aspect in which negative type development is carried out by adding approximately 1 mass % of a nitrogen-containing basic compound, such as trioctylamine, to a developer which contains an organic solvent in each of the Examples.

An aspect of using EUV exposure instead of exposure using an ArF excimer laser in each of the Examples. Furthermore, an aspect in which a resin (a resin which contains an aromatic group) which was introduced as a resin in the "resins that are particularly favorably used at the time of EUV exposure or electron beam exposure" described above, is used as the resin in the actinic ray-sensitive or radiation-sensitive resin composition, and the like.

Explanation of References
- 10: substrate
- 51, 52: first negative type pattern
- 60: second film
- 61: second negative type pattern

What is claimed is:

1. A pattern formation method comprising:
    step (i) of forming a first negative type pattern on a substrate by performing step (i-1) below, step (i-2) below and step (i-3) below in this order;
    step (i-1) of forming a first film on the substrate using an actinic ray-sensitive or radiation-sensitive resin composition (1) which contains a resin of which, due to a polarity being increased by an action of an acid, a solubility decreases with respect to a developer which includes an organic solvent;
    step (i-2) of exposing the first film;
    step (i-3) of developing the exposed first film using the developer which includes an organic solvent to form the first negative type pattern,
    wherein the first negative type pattern contains hole patterns;
    step (ii) of heating the first negative type pattern;
    step (iii) of forming a second film at least on the first negative type pattern using an actinic ray-sensitive or radiation-sensitive resin composition (2) which contains a resin of which, due to a polarity being increased by an action of an acid, a solubility decreases with respect to the developer which includes an organic solvent;
    step (v) of exposing the second film; and
    step (vi) of developing the exposed second film using the developer which includes an organic solvent to form a second negative type pattern at least on the first negative type pattern,
    wherein the second negative type pattern contains line and space patterns, and the space portions of the second negative type pattern are placed on the hole portions of the first negative type pattern, and the line portions of the second negative type pattern are placed so as not to cover the hole portions of the first negative type pattern; and
    wherein the step (ii) is carried out between the step (i-3) and the step (iii).

2. The pattern formation method according to claim 1, further comprising:
    a heating step (ii)' after the step (vi).

3. The pattern formation method according to claim 1, wherein the actinic ray-sensitive or radiation-sensitive resin composition (1) is different from the actinic ray-sensitive or radiation-sensitive resin composition (2).

4. The pattern formation method according to claim 1, wherein the actinic ray-sensitive or radiation-sensitive resin composition (1) is the same as the actinic ray-sensitive or radiation-sensitive resin composition (2).

5. The pattern formation method according to claim 1, wherein the step (i) of forming the first negative type pattern includes a plurality of pattern formation step having the step (i-1), the step (i-2) and the step (i-3) in this order.

6. The pattern formation method according to claim 5, wherein the step (i) of forming the first negative type pattern further has a heating step (i-4), and has the step (i-3), the step (i-4) and the step (i-1) in this order.

7. The pattern formation method according to claim 1, further comprising:
    a step of heating the exposed first film between the step (i-2) and the step (i-3).

8. The pattern formation method according to claim 1, wherein the exposure of step (i-2) is carried out with a KrF excimer laser.

9. The pattern formation method according to claim 1, wherein the actinic ray-sensitive or radiation-sensitive resin composition (1) contains a photoacid generator.

10. The pattern formation method according to claim 1, wherein the actinic ray-sensitive or radiation-sensitive resin composition (2) contains a photoacid generator.

11. The pattern formation method according to claim 1, wherein the resin of the actinic ray-sensitive or radiation-sensitive resin composition (1) has a repeating unit which has an aromatic ring.

12. The pattern formation method according to claim 1, wherein the resin of the actinic ray-sensitive or radiation-sensitive resin composition (2) has a repeating unit which has an aromatic ring.

13. An etching method for performing an etching process with respect to the substrate by setting a pattern formed by pattern formation method according to claim 1 as a mask.

* * * * *